US005136458A

United States Patent [19]

Durivage, III

[11] Patent Number: 5,136,458

[45] Date of Patent: Aug. 4, 1992

[54] MICROCOMPUTER BASED ELECTRONIC TRIP SYSTEM FOR CIRCUIT BREAKERS

[75] Inventor: Leon W. Durivage, III, Marion, Iowa

[73] Assignee: Square D Company, Palatine, Ill.

[21] Appl. No.: 403,506

[22] Filed: Aug. 31, 1989

[51] Int. Cl.[5] .............. H02H 3/26

[52] U.S. Cl. .............. 361/93; 364/481; 364/483

[58] Field of Search .............. 361/93, 94, 96, 54; 364/481, 483

[56] References Cited

U.S. PATENT DOCUMENTS

| | | | |
|---|---|---|---|
| 4,096,539 | 6/1978 | Scaturro | 361/93 |
| 4,121,269 | 10/1978 | Hobson | 361/44 |
| 4,208,693 | 6/1980 | Dickens et al. | 361/94 |
| 4,331,997 | 5/1982 | Engel et al. | 361/93 |
| 4,331,998 | 5/1982 | Matsko et al. | 361/93 |
| 4,331,999 | 5/1982 | Engel et al. | 361/94 |
| 4,335,413 | 6/1982 | Engel et al. | 361/93 |
| 4,335,437 | 6/1982 | Wilson et al. | 364/483 |
| 4,338,647 | 7/1982 | Wilson et al. | 361/96 |
| 4,351,012 | 9/1982 | Elms et al. | 361/96 |
| 4,351,013 | 9/1982 | Matsko et al. | 361/96 |
| 4,377,836 | 3/1983 | Elms et al. | 361/96 |
| 4,377,837 | 3/1983 | Matsko et al. | 361/105 |
| 4,380,785 | 4/1983 | Demeyer et al. | 361/96 |
| 4,419,619 | 12/1983 | Jindrick et al. | 323/257 |
| 4,428,022 | 1/1984 | Engel et al. | 361/96 |
| 4,476,511 | 10/1984 | Saletta et al. | 361/96 |
| 4,486,803 | 12/1984 | Zylstra | 361/96 |
| 4,535,409 | 8/1989 | Jindrick et al. | 364/481 |
| 4,550,360 | 10/1985 | Dougherty | 361/93 |
| 4,631,625 | 12/1986 | Alexander et al. | 361/94 |
| 4,680,706 | 7/1987 | Bray | 364/492 |
| 4,682,264 | 7/1987 | Demeyer | 361/96 |
| 4,689,712 | 7/1987 | Demeyer | 361/96 |
| 4,706,155 | 11/1987 | Durivage et al. | 361/64 |
| 4,709,339 | 11/1987 | Fernandes | 364/492 |
| 4,717,985 | 1/1988 | Demeyer | 361/96 |
| 4,747,061 | 5/1988 | Lagree et al. | 364/483 |
| 4,783,748 | 11/1988 | Swarztrauber | 364/483 |
| 4,794,369 | 12/1988 | Haferd | 344/166 |
| 4,794,484 | 12/1988 | Matsko et al. | 361/93 |
| 4,803,635 | 2/1989 | Andow | 364/483 |
| 4,833,564 | 5/1989 | Pardue et al. | 361/93 |
| 4,853,819 | 8/1989 | Suwa et al. | 361/96 |

FOREIGN PATENT DOCUMENTS

| | | | |
|---|---|---|---|
| 2400084 | 8/1974 | Fed. Rep. of Germany | 361/94 |
| 0169152 | 3/1922 | United Kingdom | 361/94 |
| 0387476 | 2/1933 | United Kingdom | 361/93 |

OTHER PUBLICATIONS

Schmeatic of test circuit of Square D–no date.
General Electric Publication GEH–4291.

*Primary Examiner*—Steven L. Stephan
*Assistant Examiner*—Thomas M. Dougherty
*Attorney, Agent, or Firm*—Jose W. Jimenez; Robert J. Crawford

[57] ABSTRACT

A processor-based tripping system uses a precise three phase current detection circuit using a minimal number of components. A set of current sensors is situated adjacent the current path to sense respective phases of current therein. The current sensors provide respective current signals therefrom which are fed to a ground fault transformer. The ground fault transformer includes input inductors connected to respective ones of the current sensors such that current flowing through each respective current sensor also flows through one of the input inductors. An output inductor in the ground fault transformer is coupled with the input inductors for adding the current signals from the current sensors and for producing an output current signal in the presence of a ground fault. The output current signal is then rectified to provide a rectified signal corresponding to the output current. The processor receives the rectified signal to detect the ground fault in the three phase current path and provides a trip signal to a solenoid to break the current path. The ground fault transformer also includes a test input inductor for receiving an external AC signal to simulate a ground fault.

2 Claims, 10 Drawing Sheets

MICROCOMPUTER BASED ELECTRONIC TRIP SYSTEM FOR CIRCUIT BREAKERS

TECHNICAL FIELD

The present invention relates generally to circuit breakers, and, more particularly, to processor controlled trip arrangements for circuit breakers.

BACKGROUND ART

Trip systems are designed to respond to power faults detected in circuit breakers. Most simple trip systems employ an electromagnet to trip the circuit in response to short circuit or overload faults. The electromagnet provides a magnetic field in response to the current flowing through the breaker. When the current level increases beyond a predetermined threshold, the magnetic field "trips" a mechanism which causes a set of circuit breaker contacts to release, thereby "breaking" the circuit path.

Many simple trip systems also employ a slower responding bi-metallic strip, which is useful for detecting a more subtle overload fault. This is because the extent of the strip's deflection represents an accurate thermal history of the circuit breaker and, therefore, even slight current overloads. Generally, the heat generated by the current overload will cause the bi-metallic strip to deflect into the tripping mechanism to break the circuit path.

The tripping systems described above are generally adequate for many simple circuit breaker applications, but there has been an increasing demand for a more intelligent and precise tripping system. For example, many businesses today use expensive 3-phase power equipment which provides critical functions to the business and its customers. Due to the cost of the equipment and the functions that the equipment provides, the power supplied to the equipment must be precisely measured and controlled. For this reason, processor-based tripping systems have been developed to attempt to provide programmable control to the equipment operator (user).

A major problem in the design of processor-based tripping systems has been to accurately and reliably measure the power provided to the equipment. On the other hand, small size and low cost are also desirable characteristics for the tripping systems. But the power measurement circuitry necessarily limits the size of the tripping system, and is also relatively expensive due to the component tolerances and circuit complexity required for precise current measurement.

Accordingly, in addition to requiring user-flexibility to power distribution systems, processor-based tripping systems must also accurately and reliably measure the current provided to the loads. Failing to perform in this manner often results in inadvertent (nuisance) trips or missed trips which may damage the equipment powered through the circuit breaker and the circuit breaker itself.

DISCLOSURE OF THE INVENTION

In view of the above, a preferred embodiment of the present invention includes a processor-based circuit breaker tripping system for measuring and interrupting AC current. The system utilizes a precise three phase current detection circuit which may be used to detect a ground fault condition. A set of current sensors, each situated adjacent the current path to sense a respective phase of current therein, provide respective current signals to a ground fault transformer. The ground fault transformer includes a set of input inductors respectively connected to the set of current sensors such that current flowing through each respective current sensor also flows through one of the associated input inductors. The ground fault transformer includes an output inductor, coupled with the set of input inductors, which adds the induced current from each current sensor and produces a current signal therefrom in the presence of a ground fault. The added currents are provided to a bridge rectifier which provides a rectified signal corresponding to the current signal. The processor receives the rectified signal to detect a ground fault in the three phase current path and provides a trip signal to a solenoid to break the current path.

BRIEF DESCRIPTION OF THE DRAWINGS

Other objects and advantages of the invention will become apparent upon reading the following detailed description and upon reference to the accompanying drawings, in which.

Figure 1:
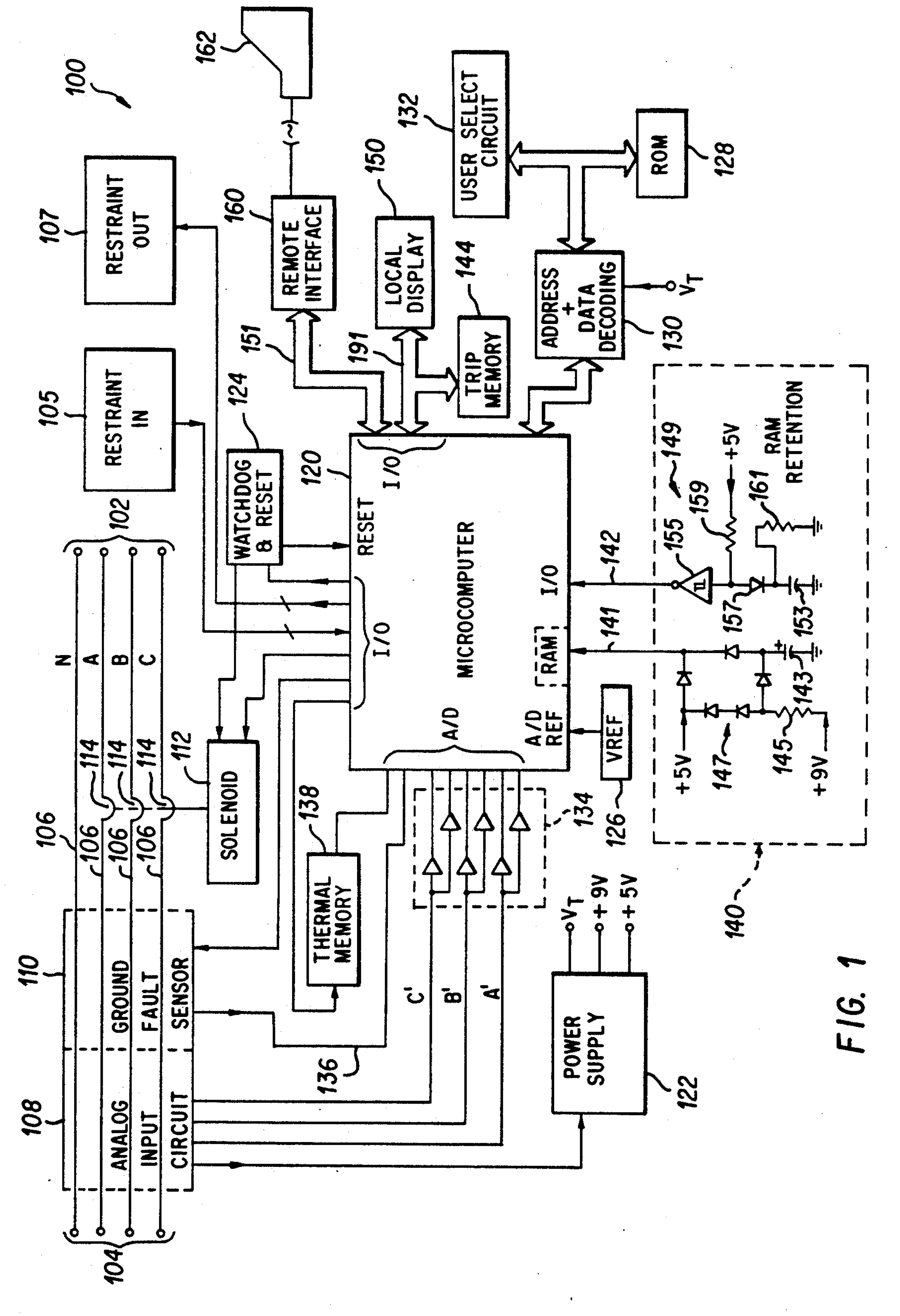
FIG. 1 is a block diagram of a microprocessor based circuit breaker tripping system, according to the present invention.

While the invention is susceptible to various modifications and alternative forms, a specific embodiment thereof has been shown by way of example in the drawings and will herein be described in detail. It should be understood, however, that it is not intended to limit the invention to the particular form disclosed, but on the contrary, the intention is to cover all modifications, equivalents, and alternatives falling within the spirit and scope of the invention as defined by the appended claims.

BEST MODES FOR CARRYING OUT THE INVENTION

System Overview

The present invention has direct application for monitoring and interrupting a current path in an electrical distribution system according to specifications that may be programmed by the user. While any type of current path would benefit from the present invention, it is particularly useful for monitoring and interrupting a three phase current path.

Turning now to the drawings, FIG. 1 shows a block diagram of an integral microprocessor controlled tripping system 100 for use with a three-phase current path on lines 106 having source inputs 102 and load outputs 104. The tripping system 100 uses an analog input circuit 108 and a ground fault sensor 110 to detect three-phase current on the current path 106. When the tripping system detects an overload, short circuit or ground fault condition, or otherwise determines that the current path should be interrupted, it engages a solenoid 112 which trips a set of contactors 114 to break the current path carrying phases A, B and C. Consequently, any ground-fault circuit through the earth ground path or through an optional neutral line (N) is also broken.

The tripping system 100 of FIG. 1 utilizes a number of circuits to determine when the current path should be interrupted. This determination is centralized at a microcomputer 120, preferably an MC68HC11A1, which is described in *MC*68HC11 HCMOS Single Chic Microcomputer Programmer's Reference Manual, 1985 and *MC*68HC11A8 Advance Information HCMOS Single Chip Microcomputer, 1985, all being available from Motorola, Inc., Schaumburg, Illin. Peripheral circuits that support the microcomputer 120 include a reset circuit 124 that verifies the sanity of the tripping system 100, a voltage reference circuit 126 that provides a stable and reliable reference for analog to digital (A/D) circuitry located within the microcomputer 120, ROM 128 that stores the operating instructions for the microcomputer 120, and a conventional address and data decoding circuit 130 for interfacing the microcomputer 120 with various circuits including the ROM 128 and a user select circuit 132. The address and data decoding circuit 130, for example, includes an address decoder part No. 74HC138, and an eight-bit latch, part No. 74HC373, to latch the lower eight address bits which are alternately multiplexed with eight data bits in conventional fashion. The ROM, for example, is part No. 27C64. The user select circuit 132 allows the user to designate tripping characteristics for the tripping system 100, such as overload and phase imbalance fault conditions.

The tripping system 100 is operatively coupled with a conventional electrical distribution system (not shown) through input and output restraint circuits 105 and 107. Signals received from the input restraint circuit 105 indicate that a downstream circuit breaker is in an overload (or over current) condition. The output restraint circuit 107 is used to send signals to upstream circuit breakers to indicate the status of its own and all downstream circuit breaker conditions. In general, the tripping system 100 will delay tripping of the contactors 114 when a downstream breaker is in an overload (or over current) condition, assuming that the downstream circuit breaker opens and clears the condition. Otherwise, the tripping system 100 should not delay tripping of the contactors 114. For further detail regarding restraint-in/restraint-out electrical distribution systems, reference may be made to U.S. Pat. No. 4,706,155 to Durivage et al.

Other circuits are used along with the above circuits to provide reliability and integrity to the tripping system 100. For instance, the microcomputer 120 utilizes the analog input circuit 108 along with a gain circuit 134 to measure precisely the RMS (Root Mean Squared) current on each phase of the lines 106. The accuracy of this measurement is maintained even in the presence of non-linear loads.

The analog input circuit 108 develops phase signals A', B' and C' that are representative of the current on lines 106. The gain circuit 134 amplifies each phase signal A', B' and C' through respective dual gain sections, from which the microcomputer 120 measures each amplified signal using its A/D circuitry. By providing two gain stages for each signal A', B' and C', the microcomputer 120 can immediately perform a high gain or low gain measurement for each current phase depending on the resolution needed at any given time.

The analog input circuit 108 is also utilized to provide a reliable power source to the tripping system 100. Using current developed from the lines 106, the analog input circuit 108 operates with a power supply 122 to provide three power signals (VT, +9 v and +5 v) to the tripping system 100. The power signal VT is monitored by the microcomputer 120 through decoding circuit 130 to enhance system dependability.

System dependability is further enhanced through the use of a thermal memory 138 which the microcomputer 120 interacts with to simulate a bi-metal deflection mechanism. The thermal memory 138 provides an accurate secondary estimate of the heat in the tripping system 100 in the event power to the microcomputer 120 is interrupted.

The ground fault sensor 110 is used to detect the presence of ground faults on one or more of the lines 106, and to report the faults to the microcomputer 120. Using user selected trip characteristics, the microcomputer 120 determines whether or not the ground fault is present for a sufficient time period at a sufficient level to trip the contactors 114. The microcomputer 120 accumulates the ground fault delay time in its internal RAM. A RAM retention circuit 140 is used to preserve the ground fault history for a certain period of time during power interruptions.

The RAM retention circuit 140 exploits the built-in capability of the microcomputer 120 to hold the contents of its internal RAM provided that an external supply voltage is applied to its MOPDB/Vstby input 141. This external supply voltage is stored on a 150 microfarad electrolytic capacitor 143 that is charged from the +9 volt supply through a 6.2 K ohm resistor 145. The capacitor 143 is charged from the +9 volt supply, and clamped by diodes to the +5 volt supply, so that the capacitor will be rapidly charged during power-up.

The ground fault delay time stored in internal RAM becomes insignificant after a power interruption that lasts longer than about 3.6 seconds. To test whether such an interruption has occurred, the RAM retention circuit 140 includes an analog timer 149 having a resistor 161 and a capacitor 153 establishing a certain time constant, and a Schmitt trigger inverter 155 sensing whether the supply of power to the microcomputer 120 has been interrupted for a time sufficient for the capacitor 153 to discharge. Shortly after the microcomputer reads the Schmitt trigger 155 during power-up, the capacitor 153 becomes recharged through a diode 157 and a pull-up resistor 159. Preferred component values, for example, are 365 K ohms for resistor 161, 10 microfarads for capacitor 153, part No. 74HC14 for Schmitt trigger 155, 1N4-148 for diode 157, and 47 K ohms for resistor 159.

Another important aspect of the tripping system 100 is its ability to transfer information between itself and the user. This information includes the real-time current and phase measurements on the lines 106, the system configuration of the tripping system 100 and information relating to the history of trip causes (reasons why the microcomputer 120 tripped the contactors 114). As discussed above, the real-time line measurements are precisely determined using the analog input circuitry 108 and the gain circuit 134. The system configuration of the tripping system 100 and other related information is readily available from ROM 128 and the user select circuit 132. The information relating to the history of trip causes is available from a nonvolatile trip memory 144. Information of this type is displayed for the user either locally at a local display 150 or remotely at a conventional display terminal 162 via remote interface 160. To communicate with the display terminal 162, the tripping system utilizes an asynchronous communication interface, internal to the microcomputer 120. Using the MC68HC11, the serial communications interface (SCI) may be utilized.

Figure 2:
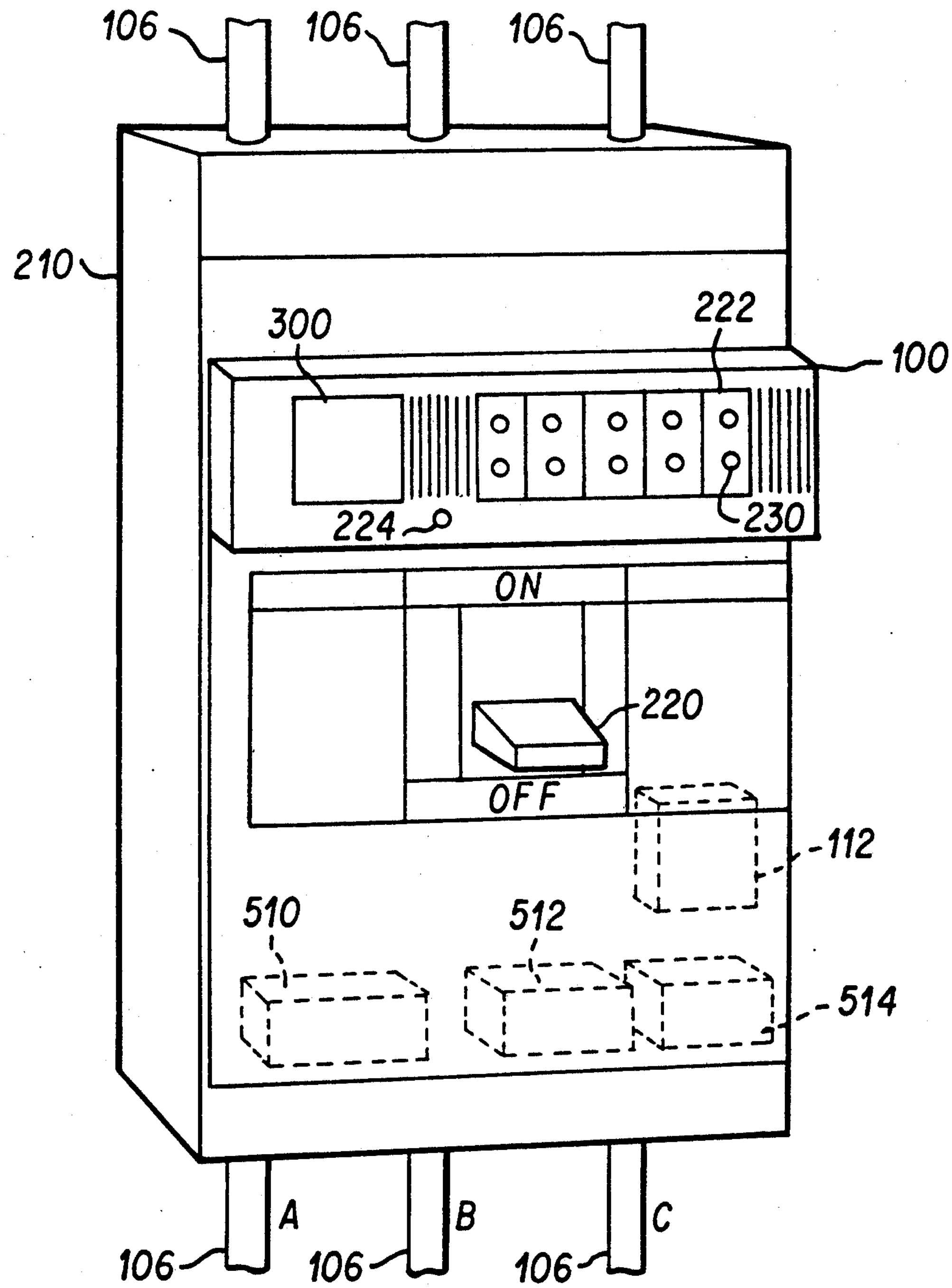
FIG. 2 is a perspective view of the circuit breaker tripping system as set forth in the block diagram of FIG. 1.

FIG. 2 is a perspective view of the tripping system 100 as utilized in a circuit breaker housing or frame 210. The lines 106 carrying phase currents A, B and C are shown passing through line embedded current transformers 510, 512 and 514 (in dashed lines) which are part of the analog input circuit 108. Once the solenoid 112 (also in dashed lines) breaks the current path in lines 106, the user reconnects the current path using a circuit breaker handle 220.

Except for the circuit breaker handle 220, the interface between the tripping system 100 and the user is included at a switch panel 222, an LCD display panel 300 and a communication port 224. The switch panel 222 provides access holes 230 to permit the user to adjust binary coded decimal (BCD) dials (FIG. 8) in the user select circuit 132. The communication port 224 may be used to transfer information to the display terminal 162 via an optic link (not shown).

In the following sections, the tripping system 100 is further described in detail.

A. Local Display

Figure 3A:
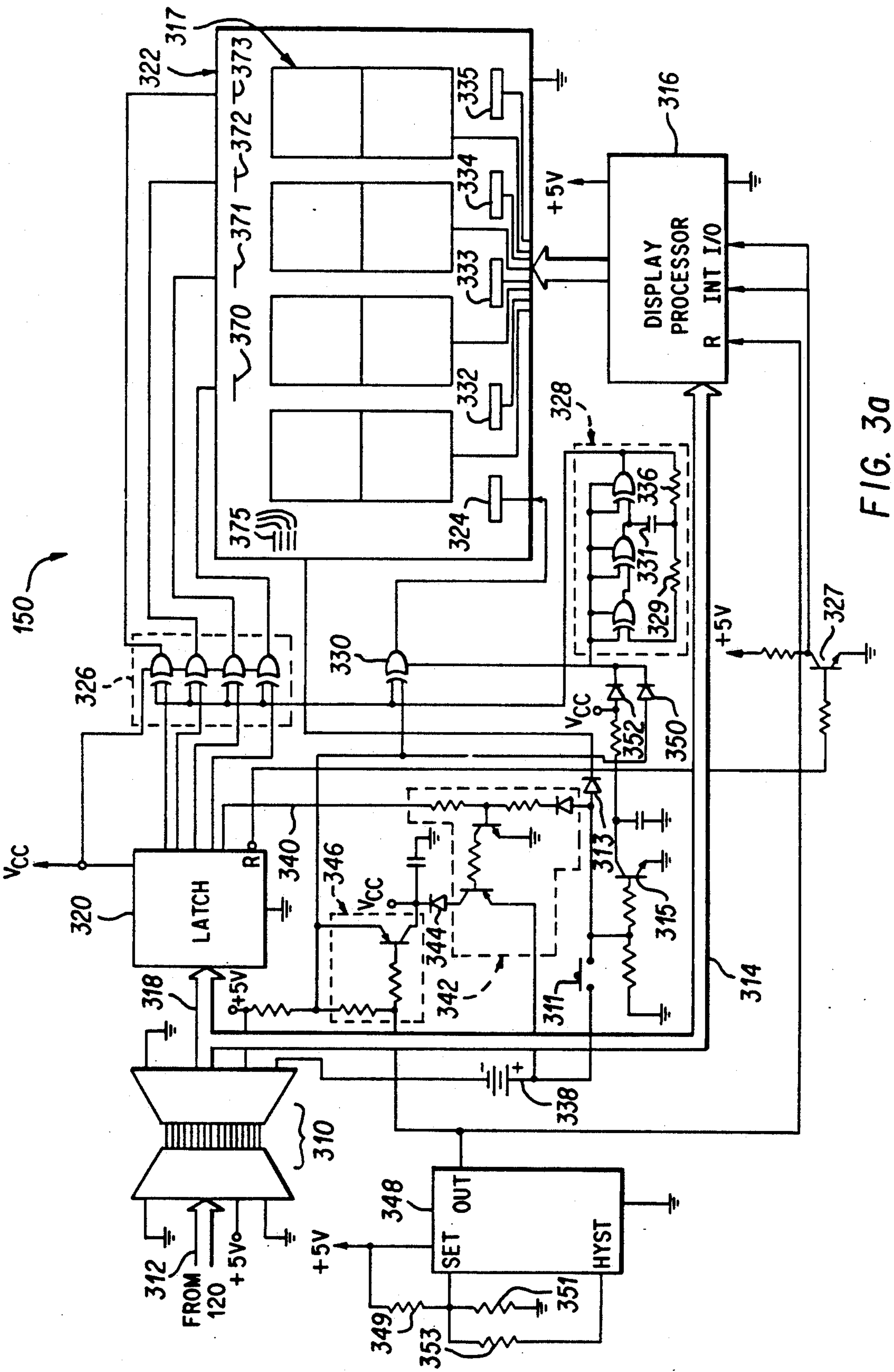
FIG. 3*a* is a diagram illustrating a local display 150 of FIG. 1.

FIG. 3*a* is a schematic diagram of the local display 150 of FIG. 1. The local display 150 is physically separated from the remaining portion of the tripping system 100, but coupled thereto using a conventional connector assembly 310. The connector assembly 310 carries a plurality of communication lines 312 from the microcomputer 120 to the local display 150. These lines 312 include tripping system ground, the +5 V signal from the power supply 122, serial communication lines 314 for a display processor 316, and data lines 318 for a latch 320. The data lines 318 include four trip indication lines (overload, short circuit, ground fault and phase unbalance) which are clocked into the latch 320 by yet another one of the lines 318.

An LCD display 322 displays status information provided by the latch 320 and the display processor 316. Different segments of the LCD display 322 may be implemented using a variety of devices including a combination static drive/multiplex custom or semi-custom LCD available from Hamlin, Inc., Lake Mills, Wis. For additional information on custom or semi-custom displays, reference may be made to a brochure available from Hamlin, Inc. and entitled Liquid Crystal Display.

The latch 320 controls the segments 370–373 to respectively indicate the trip conditions listed above. Each of these segments 370-373 is controlled by the latch 320 using an LCD driver circuit 326 and an oscillator circuit 328. The corresponding segment 370–373 illuminates when the associated output signal from the latch 320 is at a logic high level.

The display processor 316 controls four seven-segment digits 317 as an ammeter to display the current in the lines 106. The display processor 316, for example, is an NEC part No. UPD7502 LCD Controller/Driver which includes a four-bit CMOS microprocessor and a 2 k ROM. This NEC part is described in *NEC UPD*7501/02/03 *CMOS* 4-*Bit Single Chip Microprocessor User's Manual*, available from NEC, Mountain View, Calif. Other segments 375 of the LCD display 322 may be controlled by the display processor 316 or by other means to display various types of status messages.

For example, a push button switch 311 may be utilized to test a battery 338. To perform this test, the battery 338 is connected through a diode 313 to one of the segments 375 so that when the switch 311 is pressed, the condition of the battery is indicated. The push-button switch 311 preferably resets the latch 320 when the switch is depressed. For this purpose the switch 311 activates a transistor 315. The latch, for example, is a 40174 integrated circuit.

Additionally, the switch 311 may be used to select the phase current to be displayed on the LCD display 322 and to control segments 375 such that they identify the phase current (A, B, C or N) on lines 106 being displayed on the four seven-segment digits 317. For this purpose the switch 311 activates a transistor 327 to invert a signal provided from the battery and to interrupt the display processor 316. Each time the display processor 316 is interrupted, the phase current that is displayed changes, for example, from phase A to B to C to ground fault to A, etc.

An optional bar segment 324 is included in the LCD display 322 to indicate a percentage of the maximum allowable continuous current in the current path. The bar segment 324 is controlled by the +5 V signal via a separate LCD driver 330. The LCD driver 330 operates in conjunction with the oscillator circuit 328 in the same manner as the LCD driver 326. However, the LCD driver 330 and the oscillator circuit 328 will function at a relatively low operating voltage, approximately two to three volts. An MC14070 integrated circuit, available from Motorola, Inc., may used to implement the LCD drivers 330 and 326. Thus, when the tripping system fails to provide the display processor 316 with sufficient operating power (or current), the LCD driver 330 is still able to drive the bar segment 324. The LCD driver 330 drives the bar segment 324 whenever the tripping system detects that less than about 20% of the rated trip current is being carried on lines 106 to the load.

As an alternative embodiment, the bar segment 324 may be disabled by disconnecting the LCD driver 330.

Additional bar segments 332–335 are driven by the display processor 316 to respectively indicate when at least 20–40%, 40–60%, 60–80% and 80–100% of the rated trip current is being carried on lines 106 to the load.

The oscillator 328 also uses part No. MC-14070 in a standard CMOS oscillator circuit including resistors 329, 336 and a capacitor 331 that have values, for example, of 1 megohm, 1 megohm, and 0.001 microfarads, respectively. Even when a power fault causes the system to trip and interrupt the current on lines 106, the local display is still able to operate on a limited basis. This sustained operation is performed using the battery 338 as a secondary power source. The battery, for example, is a 3 to 3.6 volt lithium battery having a projected seventeen year life. The battery 338 supplies power to portions of the local display 150 only when two conditions are present: (1) the latch 320 has received a trip signal from the microcomputer 120 (or the test switch 311 is activated), and (2) the output voltage level of the +5 V power supply is less than the voltage level from the battery 338. When the latch 320 latches in any one of the four trip indication lines from the data lines 318, a control signal is generated on a latch output line 340. The control signal turns on an electronic switch 342 which allows the battery 338 to provide power at Vcc so long as a diode 344 is forward biased.

The diode 344 is forward biased whenever the second condition is also present. Thus, when the output voltage level of the +5 V power supply is less than the voltage level from the battery 338, the diode 344 is forward biased and the battery 338 provides power to the local display 150. In addition, the diode 344 is forward biased until a switch 346, activated by a power-up circuit 348, allows the +5 V signal to provide power at Vcc. The power-up circuit 348 activates the electronic switch 346 only after resetting the display processor 316. The power-up circuit 348, for example, is part No. ICL7665 working in connection with resistors 349, 351, and 353 having values of 620 K ohms, 300 K ohms and 10 megohms, respectively.

Power is provided from Vcc only to the latch 320, the LCD driver 326, the LCD driver 330, and the oscillator circuit 328. The LCD driver 330 and the oscillator circuit 328 receive power from either the battery 338 or the +5 V power supply output via diodes 350 and 352. This arrangement minimizes current drain from the battery 338 while allowing the user to view the status of the tripping system 100 during any power fault situation.

Power cannot be drawn from the battery 338 unless the battery 338 is interconnected with the remaining portion of the tripping system via connector 310, because the connector 310 provides the ground connection for the negative terminal of the battery 338. This aspect of the local display 150 further prolongs battery life and therefore minimizes system maintenance.

Figure 3B:
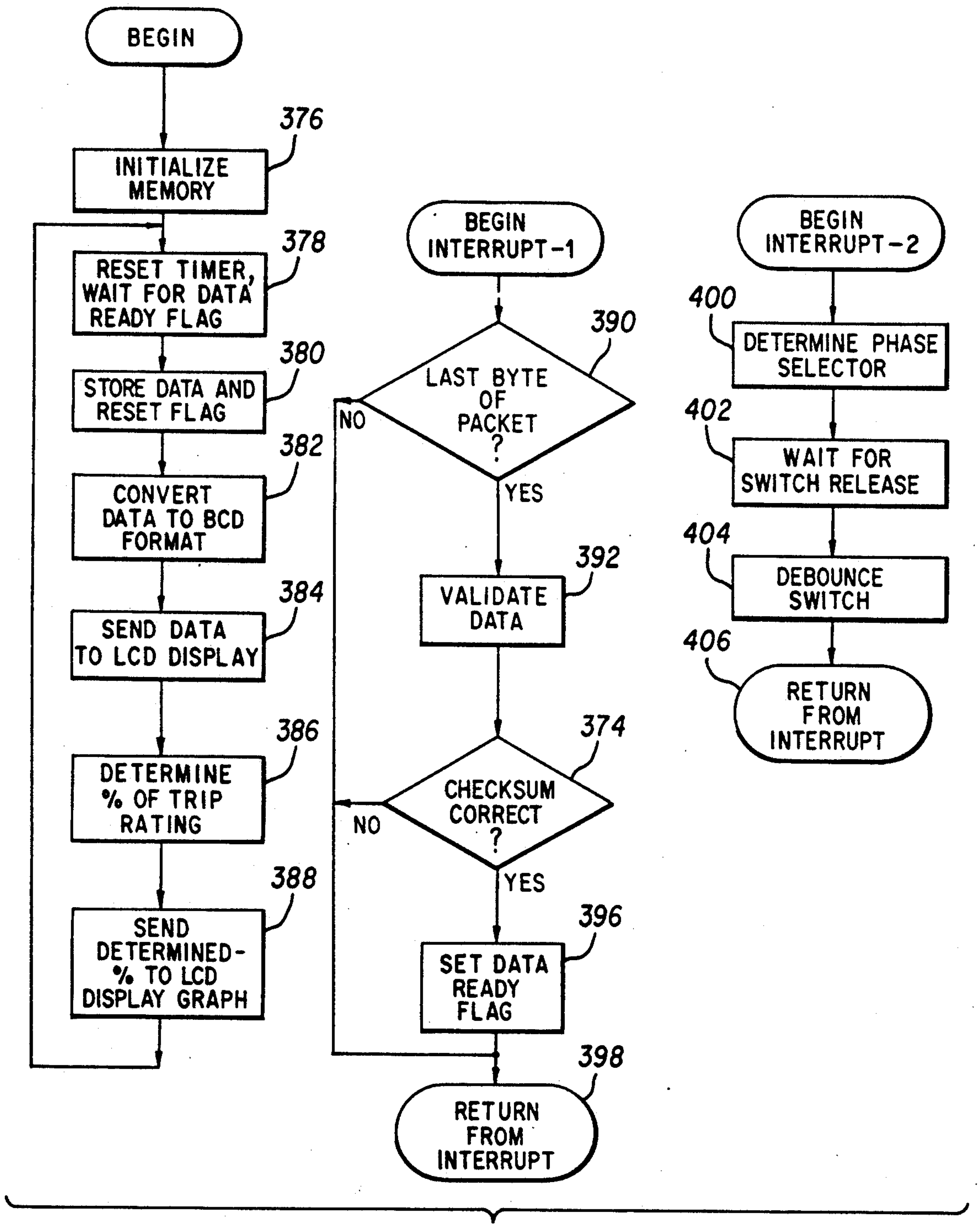
FIG. 3*b* is a flow chart illustrating a manner in which a display processor 316 of FIG. 3*a* may be programmed to control an LCD display 322 of FIG. 3*a*.

In FIG. 3*b*, a flow chart illustrates the preferred programming of the display processor 316. The flow chart begins at block 376 where the memory internal to the display processor is initialized. The memory initialization includes clearing internal RAM, inputoutput ports and interrupt and stack registers.

At block 378, a software timer is reset and the display processor waits for a data ready flag which indicates that data has been received from the microcomputer 120 of FIG. 1. The software timer provides a conventional software watchdog function to maintain the sanity of the display processor. If the software timer is not reset periodically (within a certain time interval), the display processor resets itself.

The data ready flag is set in an interrupt routine, illustrated by blocks 390 through 398 of FIG. 3*b*. The display processor is programmed to execute the interrupt routine when it receives data from the microcomputer 120 of FIG. 1. At block 390 of the interrupt routine, a test is performed to determine if the data byte just received is the last data byte of the packet sent from the microcomputer. If the data byte just received is not the last data byte, flow proceeds to block 398 where a return-from-interrupt instruction is executed. If the data byte just received is the last data byte, flow proceeds to block 392.

At block 392, a test is performed to determine the integrity of the received data packet. This is accomplished by comparing the 8-bit sum of the previously received 7 bytes with the most recently received byte (last byte). If the 8-bit sum and the last byte are different, flow proceeds to block 398. If the 8-bit sum and the last byte are the same, the display processor sets the previously referred to data ready flag, depicted at block 396, and returns from the interrupt, via block 398, to block 380.

At block 380, the received data is stored in memory and the data ready flag is reset.

At blocks 382 and 384, the display processor utilizes a conventional conversion technique to convert the stored data to BCD format for display at the LCD display 322 of FIG. 3*a*. The data that is sent and displayed at the LCD display 322 is chosen by the operator using the switch 311 to sequence through each of the three phase currents and the ground fault current, as indicated in the data that is received from the microcomputer 120 of FIG. 1.

At block 386, the display processor utilizes received data, including the sensor identification, the rating plug type and the long-time pickup level, to determine the percentage of rated trip current being carried on lines 106 of FIG. 1. At block 388, the bar segments (324 and 332-335 of FIG. 3*a*) are driven by the display processor in response to this determination. From block 388, flow returns to block 378.

Blocks 400-406 of FIG. 3*b* represent a second interrupt routine which the display processor may be programmed to execute in response to the depression of the switch 311. At block 400 of this second interrupt routine, the display processor determines which phase (or ground fault) current the operator has selected by depressing the switch 311. At blocks 402 and 404, the display processor monitors its I/O port to determine when the switch 311 is released and to debounce the signal received from the switch 311. At block 406, the display processor executes a return from interrupt command.

It should be noted that the display processor 316 is optional for the local display 150 and therefore not required for its operation. Further, the local display 150 is itself an option to the tripping system and is not required for operating the tripping system.

B. Current and Ground Fault Detection

Figure 4:
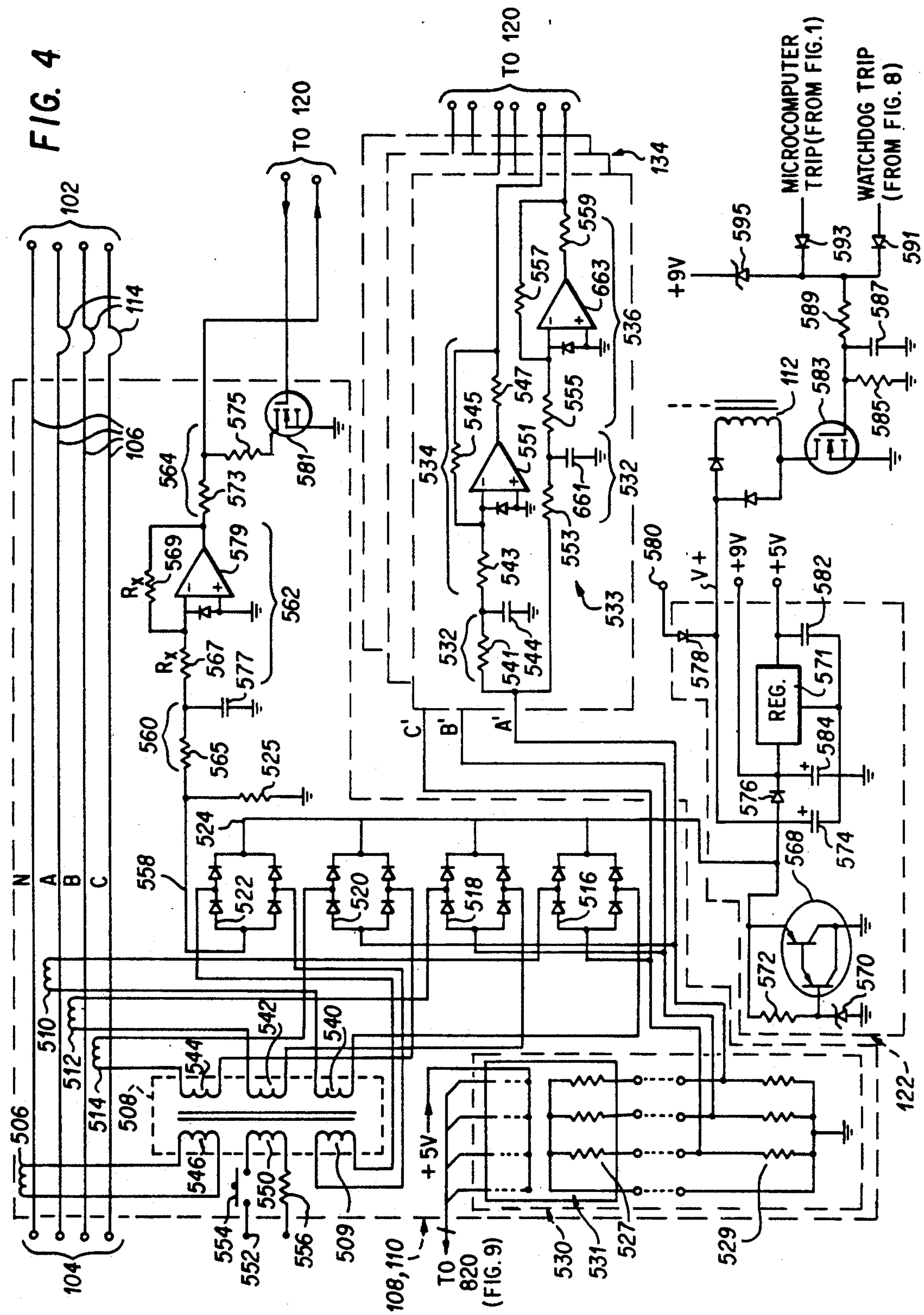
FIG. 4 is a schematic diagram illustrating an analog input circuit 108, a ground fault sensor circuit 110, a gain circuit 134 and a power supply 122 of FIG. 1.

FIG. 4 illustrates an expanded view of the analog input circuit 108, the ground fault sensor 110, the power supply 122 and the gain circuit 134 of FIG. 1. Each of these circuits receives power from the three-phase current lines 106. Using this power, these circuits provide signals from which the tripping system 100: (1) determines the phase and current levels on lines 106, (2) detects the presence of any ground fault, (3) provides system power and (4) establishes its current rating.

(1) Determining Phase and Current Levels

In FIG. 4, the analog input and ground fault sensing circuits 108 and 110 include current transformers 510, 512 and 514 that are suitably located adjacent the lines 106 for receiving energy from each respective phase current path A, B, and C. Each current transformer 510, 512 and 514 is constructed to produce a current output that is proportional to the primary current in a fixed ratio. This ratio is set so that when the primary current is 100% of the rated current transformer size (or sensor size), the current transformer is producing a fixed output current level. For example, for a 200 Amp circuit breaker, each current transformer 510, 512 and 514 will produce the same current output signal when operating at 100% (200 Amps) as a current transformer in a 4000 Amp circuit breaker which it is operating at 100% (4000 Amps). The preferred construction yields a current transformer output current of 282.8 milliamperes (RMS) when the primary current is 100% of the rated current.

The output currents provided by the transformers 510, 512 and 514 are routed through a ground fault sensing toroid 508, full wave rectifier bridges 516, 518 and 520 and the power supply 122 to tripping system ground. The output currents are returned from tripping system ground through a burden resistor arrangement 530. The ground fault sensing toroid 508 sums the output currents from the transformers 510, 512 and 514. In a system utilizing a neutral (N) line 106, the ground fault sensing toroid also sums the output current from a transformer 506, which is coupled to the neutral line (N) to sense any return current. A signal representing this current summation is produced at an output winding 509 and is carried to a fourth rectifier bridge 522. The rectifier bridge 522 is used to detect ground fault conditions and is discussed in the second part of this section.

On the right (positive) side of the rectifier bridges 516–522, positive phase current signals are produced and added together at lead 524. The current at lead 524 is used for the power supply 122 which is discussed in the third part of this section.

On the left (negative) side of the rectifier bridges 516–520, negative phase current signals are carried through the burden resistor arrangement 530 and tripping system ground, and are returned to the rectifier bridges 516–520 through the power supply 122. This current path establishes voltage signals A′, B′ and C′, each referred to as a burden voltage, for measurement by the microcomputer 120 via the gain circuit 134.

In FIG. 4, the signals A′, B′ and C′ are presented to the respective dual gain sections for inversion and amplification. The gain circuit 134 of FIG. 4 is shown with one of its three identical dual gain sections, generally designated as 533, in expanded form. The dual gain section 533 receives phase signal A′. Each dual gain section includes a pair of low pass filters 532 and a pair of amplifiers 534 and 536. The low pass filters 532 provide noise suppression, and the amplifiers 534 and 536 reduce the signal magnitude by 0.5 and increase the signal magnitude by a factor of 3, respectively, for the desired resolution. This arrangement allows the microcomputer 120 to instantaneously measure these current levels without wasting time changing any gain circuitry. Preferred component values are, for example, 10 K ohms for resistors 541, 543, 545, 553 and 555; 4.75 K ohms for resistors 547 and 559; 60 K ohms for resistor 557; and 0.03 microfarads for capacitors 549 and 561. The amplifiers 551 and 663 are, for example, part No. LM124.

Using the gain circuit 134, the microcomputer 120 measures the true RMS current levels on lines 106 by sampling the burden voltages developed at signals A′, B′ and C′. The RMS calculations are based on the formula:

$$I^2_{RMS} = \frac{\sum_{t=0}^{N} I(t)^2}{N}$$

where:

N=the number of samples;

t=time at discrete intervals (determined by sample rate); and

I(t)=the instantaneous value of the current flowing through the breaker.

The current flowing through the circuit breaker is sampled at fixed time intervals, thereby developing I(t). The value of this instantaneous current sample is squared and summed with other squared samples for a fixed number of samples N. The mean of this summation is found by dividing it by N. The final RMS current value is then found by taking the square root of the mean.

Figure 5:
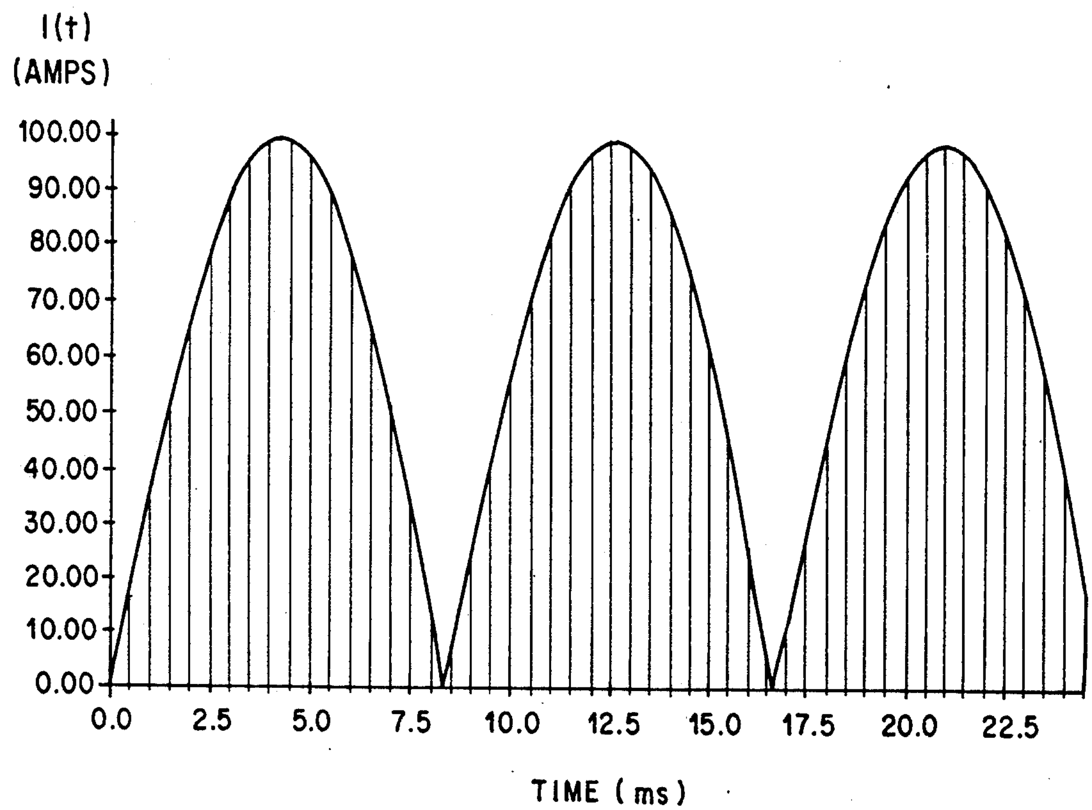
FIG. 5 is a timing diagram illustrating the preferred manner in which signals received from the gain circuit 134 are sampled by the microcomputer 120 of FIG. 1.

In FIG. 5, an example of a rectified sinusoidal current waveform is illustrated for 1.5 cycles of a 60 hertz signal with a peak amplitude of 100 amps. The sampled current is full wave rectified. The vertical lines represent the discrete points in time that a value of current is sampled. With a sample rate of 0.5 milliseconds, over 25 milliseconds of time, 50 samples will be taken.

In TABLE 1, the data for the samples from FIG. 4 are illustrated in the column labeled I(t) (Amps). The column labeled I(t) SQUARED (Amps) gives the squared values, and the column labeled SUMMATION (Amps) shows the accumulation of the squared current values over time. The mean of the summation, depicted at the bottom of TABLE 1, is equal to the final accumulation divided by the number of samples, or 50. The square root of this value yields 70.7106854, which is less than 0.00001% in error.

The other columns in TABLE 1 detail the binary equivalent data that the microcomputer would process using the ratio that 100 amps equals 255 binary.

The value $I_{RMS}$ will accurately reflect the heating effect of the current waveform that existed from t=0 to t =N. This current waveform is typically an A.C. waveform with a fundamental frequency of 50 to 60 Hertz, but may contain many upper harmonics (i.e., multiples of the fundamental frequency).

In practical implementations, several factors affect the accuracy of the $I_{RMS}$ calculation, including the sample rate and the number of samples. In the preferred embodiment, the sample rate is 2,000 Hertz and at least 128 samples are taken before the current magnitude is estimated.

(2) Detecting The Presence Of A Ground Fault

The ground fault sensing toroid 508 magnetically adds the current signals from the input windings 540, 542, 544 and 546 to indicate whether or not a ground fault is present on lines 106. The toroid 508 is constructed with four identical input windings 540, 542, 544 and 546; one for each of the current transformers 510, 512 and 514 and one for the neutral current path transformer 506, which is optional. The toroid 508 has a single output winding 509 which provides a summed current signal.

The ground fault sensing toroid 508 includes another winding 550 to allow a test signal to be applied at terminals 552. Using momentary switch 554, the test signal creates a pseudo ground fault for the tripping system. The tripping system reacts to this pseudo ground fault in the same manner as a true ground fault. The test winding 550 is protected by a positive coefficient resistor 556 that increases its resistance as it heats, thereby limiting the current through it and the winding 550. The positive coefficient resistor is, for example, a Keystone PTC Resettable Fuse, part No. RL3510-110-120-PTF. The test winding 550 eliminates the need for a separate test transformer which has been utilized by systems in the prior art.

The operation of the ground fault sensing toroid 508 is best understood by considering the operation of the tripping system with a ground fault and without a ground fault. In a balanced three phase system without a ground fault, the current magnitude in each phase is equal but 120 degrees out of phase with the other phases, and no neutral current exists; thus, the output winding 509 produces no current. As the current through any phase (A, B or C) increases, the current in the neutral path is vectorially equal in magnitude but opposite in direction to the increase in phase current, and the magnetic summation is still zero. When a ground fault is present, current flows through an inadvertent path to an earth grounded object, by-passing the neutral transformer 506 and creating a current signal in the transformer 509. Thus, the transformer 509 produces a current signal only when a ground fault is present.

The current signal from the output transformer 509 of the ground fault sensing toroid 508 is routed through the rectifier bridge 522, the power supply 122 and returned through the burden resistor arrangement 530. The burden resistor arrangement 530 and the rectifier bridge 522 convert that current signal into an A.C. rectified signal 558 that is inverted with respect to tripping system ground, and that has a voltage that is proportional to the current in the transformer 509.

The A.C. rectified signal 558 is filtered by filter 560 for noise suppression and then inverted using analog invertor 562. From the analog invertor 562, a positive going signal is carried to an A/D input at the microcomputer 120. The microcomputer 120 measures the peak levels at the output of the analog invertor 562 to detect the presence of a ground fault. A conventional voltage divider switch 564 is controlled by the microcomputer 120 to selectively reduce that signal by two thirds, as may be required under severe ground fault conditions. Preferred component values are, for example, 10 K ohms for resistors 565 and 567; 20 K ohms for resistor 569; 19.6 K ohms for resistor 573; 10 K ohms for resistor 575; 0.033 microfarads for capacitor 577; part No. LM124 for amplifier 579; and part No. BS170 for IGFET 581.

(3) Providing System Power

Power for the tripping system is provided directly from the current on lines 106, and current on any one of the lines 106 can be used. This feature allows the tripping system to power-up on any one of the three phases and to be powered when a ground fault on one or more of the phase lines 106 is present.

The output currents which are induced by the transformers 510, 512 and 514 are routed through the rectifier bridges 516, 518, 520 and 522 to provide the current for the power supply 122. On the right side of the rectifier bridges 516–522, at lead 524, the output currents are summed and fed directly to a Darlington transistor 568, a 9.1 volts zener diode 570 and a bias resistor 572. Most of this current flows directly through the transistor 568 to ground, to create a constant 9.1 volt level at the base of the transistor 568. Because it has a nominal emitter to base voltage (Veb) of about 1.0 volts, the emitter of the transistor 568 is at approximately 10 volts. The transistor 568 will strive to maintain 10 volts across it from emitter to collector, regardless of the current through it. Preferred component values are, for example, part No. 2N6285 for Darlington transistor 568; 1N4739 for zener diode 570; and 220 ohms for resistor 572.

At the emitter of the transistor 568, the power signal VT ("trip voltage") is provided.

The +5 v signal is a regulated +5 v power supply output signal that is provided using a voltage regulator 571 (part No. LP2950ACZ-5.0) and a capacitor 582 which prevents the output of the regulator 571 from oscillating. The voltage regulator takes its input from VT via a diode 576. The diode 576 charges capacitor 584 to within one diode drop (0.6 v) of VT and creates a second supply source of approximately +9 v, which is referred to as the +9 V power supply. The energy stored in the capacitor 584 enables the electronic circuitry being powered by the +9 V power supply to remain powered for some time after a trip occurs. A capacitor 574, connected at the emitter of the transistor 568, aids in filtering voltage ripple. The capacitor 574 is also utilized as the energy storage element for the solenoid 112 which is activated when a power IGFET 583 is turned on by "trip" signals from the microcomputer (120 in FIG. 1) or from a watchdog circuit (712 in FIG. 8). The trip signals are combined by respective diodes 591, 593. The solenoid 112 is also activated by an overvoltage condition sensed by a 16-volt zener diode 595, such as part No. 1N5246. Preferred component values are, for example, 220 microfarads for capacitor 574, 100 microfarads for capacitor 584, 10 microfarads for capacitor 582, 100 K ohms for resistor 585, 10 K ohms for resistor 589, 0.1 microfarads for capacitor 587, and part No. 6660 for IGFET 583.

Diodes 576 and 578 are used to receive current from an optional external power supply (not shown).

(4) Establishing The Current Rating

On the left side of the rectifier bridges, negative phase signals (A', B' and C') from the bridges are provided to the burden resistor arrangement 530, including a rating plug 531, to set the current rating for the tripping system. As previously discussed, when the primary current is 100% of the rated current or "sensor size", which is designated using the user select circuit 132, the current transformer output current will be 282.8 milliamperes (RMS). Thus, when the microcomputer 120 reads the burden voltages using the gain circuit 134 (FIG. 1), the microcomputer 120 can calculate the actual current in the lines 106.

FIG. 4 illustrates parallel connections between respective resistors 527 and 529 which are used to establish the maximum allowable continuous current passing through the lines 106. The resistors 527 are part of the rating plug 531, and the resistors 529 are separate from the rating plug 531. The resistors 529, for example, are each 4.99 ohm, 1%, 5 watt resistors. This value should be compared to a corresponding value of 12.4 ohms for the burden resistor 525 for the ground fault signal. The resistors 527 of the rating plug are connected in parallel with the resistors 529 and hence cause a decrease in the combined resistance. Therefore, the resistors 529 set the minimum current rating for the tripping system. In a preferred arrangement, for example, the minimum current rating corresponds to 40% of the maximum current rating. The resistors 527 in the rating plug scale the voltages (A', B', C') read by the microcomputer. This enables the resolution of the A/D converter in the microcomputer to be the same in terms of a fraction of the rated current for both the minimum and maximum current rating. Consequently, there is not any sacrifice in converter resolution for the minimum current rating.

Figure 6A:
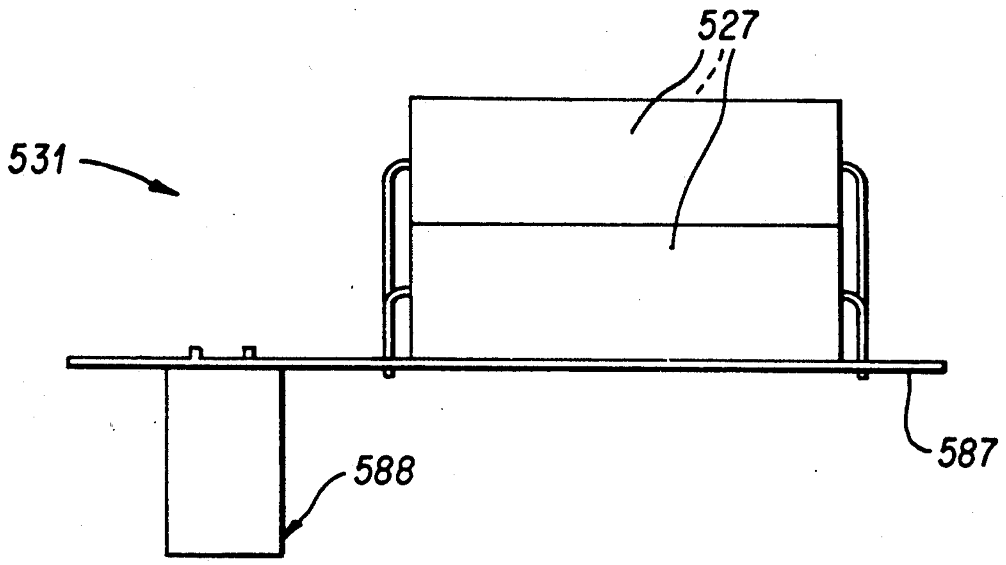
FIG. 6*a* is a side view of a rating plug 531 of FIG. 4.
Figure 6B:
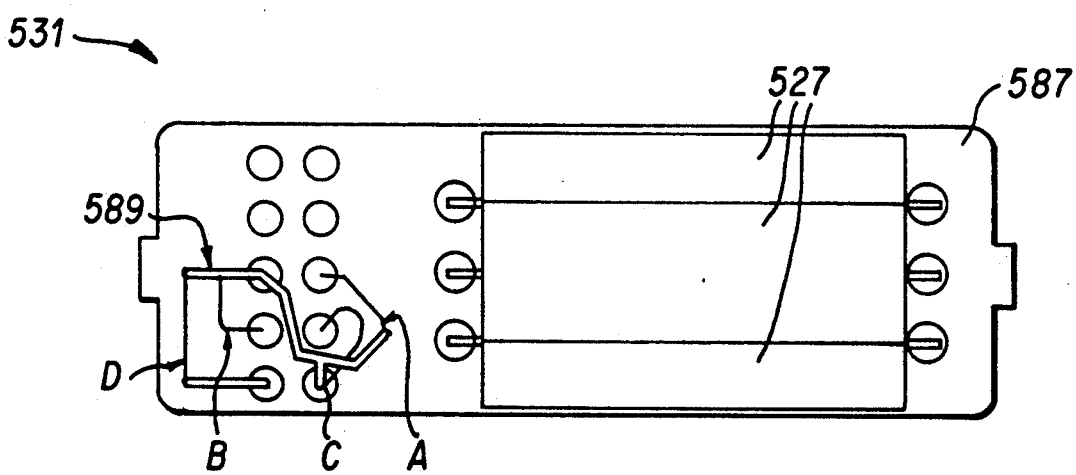
FIG. 6*b* is a top view of the rating plug 531 of FIG. 4.

In FIGS. 6a and 6b, the rating plug 531 is shown to include the resistors 527 mounted on a printed circuit board 587. A connector 588 is used to interconnect the rating plug with the remaining portion of the tripping system 100. When the rating plug is absent from the tripping system, the system reverts to its minimum rating.

The rating plug 531 further includes copper fusible printed circuit links A, B, C and D which are selectively disconnected (opened) from a printed circuit connection 589 to inform the microcomputer 120 of the resistor values, or the burden voltage/current ratio, in the burden resistor arrangement 530. The printed circuit connection 589 is connected to the +5 V signal via one of the contact points on the connector 588. This connection 589 allows the tripping system to encode the printed circuit links A, B, C and D in binary logic such that one of 16 values of each parallel resistor arrangement is defined therefrom. In a preferred arrangement, the binary codes "1111" and "1110" are reserved for testing purposes, and the fourteen codes "0000" to "1101" correspond to current rating multipliers of 0.400 to 1.000 as follows:

| Code | Current Rating/ Multiplier |
|---|---|
| 0000 | 0.400 |
| 0001 | 0.500 |
| 0010 | 0.536 |
| 0011 | 0.583 |
| 0100 | 0.600 |
| 0101 | 0.625 |
| 0110 | 0.667 |
| 0111 | 0.700 |
| 1000 | 0.750 |
| 1001 | 0.800 |
| 1010 | 0.833 |
| 1011 | 0.875 |
| 1100 | 0.900 |
| 1101 | 1.000 |

Figure 9:
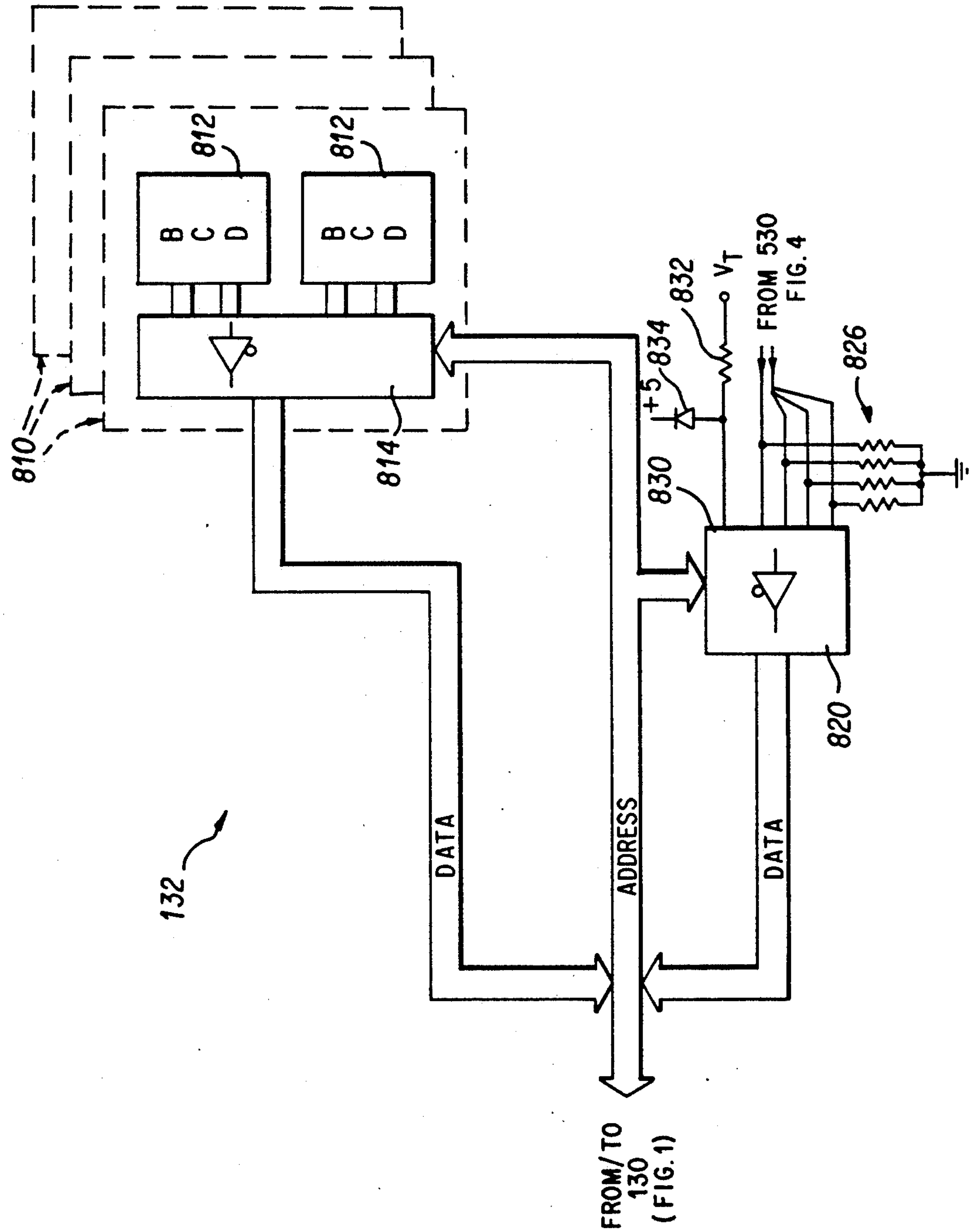
FIG. 9 is an illustration of a user select circuit 132 of FIG. 1.

The user select circuit 132 of FIG. 9 includes the interface circuit used by the microcomputer 120 to read the binary coded resistor value from the rating plug 531. A tri-state buffer 820 allows the microcomputer 120 to selectively read the logic level of each of the four leads representing the status of the four fusible printed circuit links on the rating plug 531. A logic high at the input of the buffer 820, provided by the connection between the fusible printed circuit link and +5 V signal, indicates that the corresponding link is closed. A logic low at the input of the buffer 820, provided by pull-down resistors 826 at the input of the buffer 820, indicates that the corresponding link is open. The fusible printed circuit links A, B, C and D may be opened using a current generator to send an excessive amount of current through the links, thereby causing the copper links to burn. This is preferably performed before the rating plug 531 is installed in the tripping system. Thus, once installed, the rating plug 531 automatically informs the microcomputer 120 of its resistor values, and there is no need to adjust any settings or otherwise inform the microcomputer of the type of rating plug being used. The microcomputer may adjust the values read from its A/D converter by a predetermined scale factor corresponding to the binary coded resistor value to compute actual current values which are independent of the resistor values in the rating plug 531.

C. Bi-metal Deflection Simulation

The microcomputer 120 is programmed to simulate accurately the bi-metal deflection mechanism that is commonly used in processor-less tripping systems. This is accomplished by accumulating the squared values of the measured current samples that are sensed by the analog input circuit 108. The sum of the squared values of that current is proportional to the accumulated heat in the tripping system 100.

To simulate the bi-metal deflection during cooling, the microcomputer 120 is programmed to decrement logarithmically the accumulated square of the current. In other words, during a sampling interval, the accumulated value A of $I(t)^2$ is decremented by an amount proportional to A to account for the fact that the rate of heat loss is proportional to the temperature of the power system conductors above ambient temperature. In particular, the temperature in the tripping system 100 decreases in response to the current path in lines 106 being broken or intermittent. When this occurs, however, the microcomputer 120 loses operating power and therefore can no longer maintain this numerical simulation.

Figure 7:
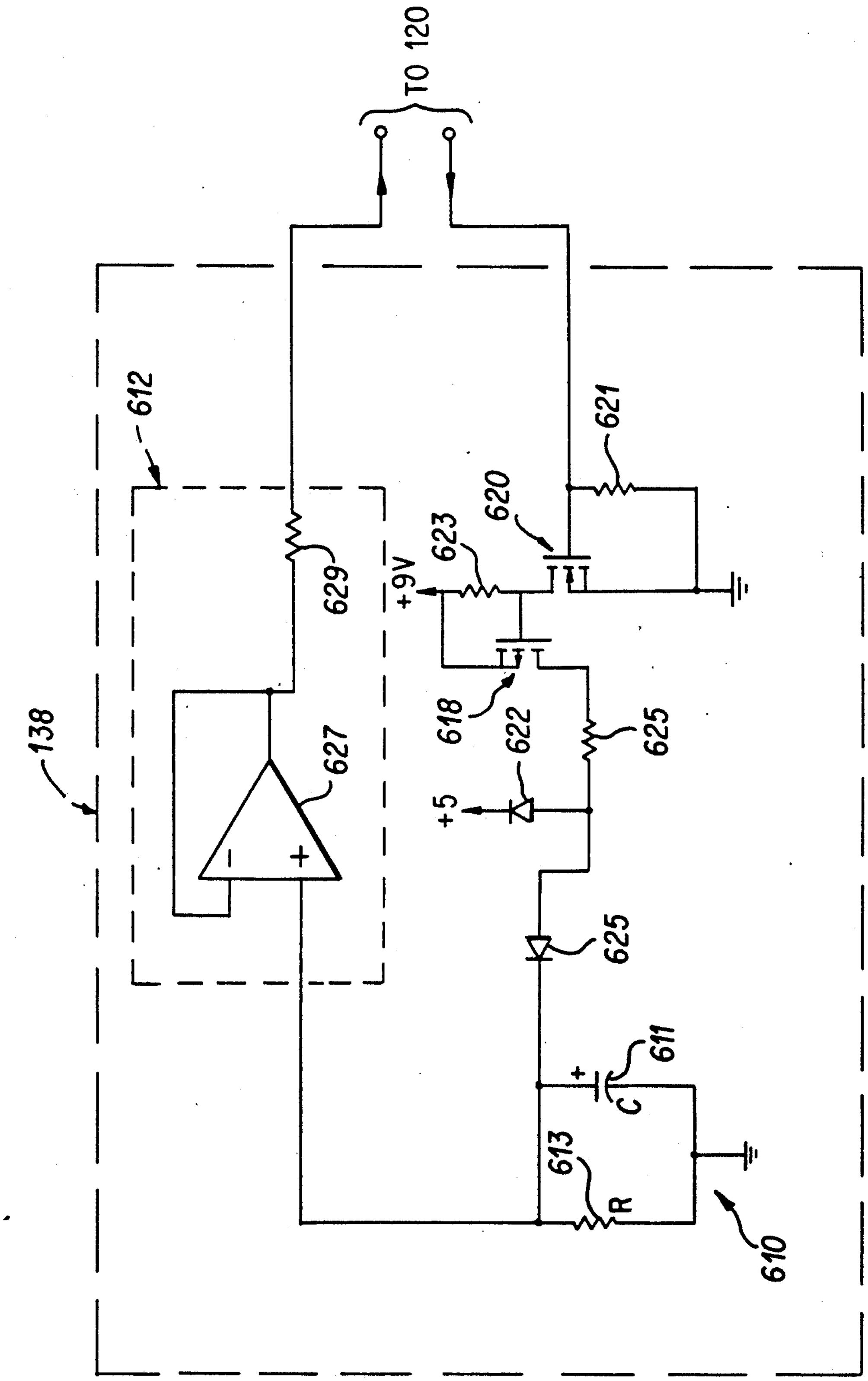
FIG. 7 is a schematic diagram illustrating a thermal memory 138 of FIG. 1.

This problem is overcome by utilizing the thermal memory 138 of FIG. 1 to maintain a history of the accumulated current for a predetermined period of time during which the operating power to the microcomputer 120 is lost. As illustrated in FIG. 7, this is accomplished using an RC circuit 610 that is monitored and controlled by the microcomputer 120 to maintain a voltage on the capacitor 611 that is proportional to the accumulated square of the current. When the microcomputer loses power, the voltage across the RC circuit 610 logarithmically decays. (The decay is governed by the equation $V=V_0\exp(-t/RC)$.) Should the microcomputer power-up again before the voltage reaches zero, the microcomputer 120 reads the voltage across the RC circuit 610 using a conventional analog buffer 612 and initializes its delay accumulator to the correct value. The analog buffer 612, for example, includes an amplifier 627 such as part No. LM714 and a 4.7 K ohm resistor 629.

The preferred RC circuit 610, including a 100 microfarad capacitor 611 and a 3.24 megohm resistor 613, provides a fixed time constant of 324 seconds, or approximately 5.4 minutes.

Control over the voltage on the RC circuit 610 is provided using IGFET transistors 618 and 620, such as part Nos. VP0808 and BS170, respectively. During normal, quiescent conditions, the microcomputer 120 will not be in an overload condition and will drive a logic low at the gate of the transistor 620, thereby disabling transistors 620 and 622 and allowing the capacitor 611 to discharge to tripping system ground. Transistors 618 and 620 work in connection with resistors 621, 623 and 625, which have values, for example, of 100 K ohms, 47 K ohms, and 5.1 K ohms, respectively.

During overload conditions, the microcomputer 120 accumulates current information in its internal RAM to simulate the heat level, and drives a logic high at the gate of the transistor 620 to allow the capacitor 611 to charge to a selected corresponding level. While the capacitor 611 is charging, the microcomputer 120 monitors the voltage level using the analog buffer 612. When the selected level is reached, the microcomputer drives a logic low at the gate of the transistor 620 to prevent further charging. The voltage on the capacitor 611 is limited to five volts using a clamping diode 622. The forward voltage drop across the clamping diode 622 is balanced by the voltage drop through a series diode 625.

For example, assume that an overload condition suddenly occurs and the microcomputer 120 has been programmed to allow for a two minute delay before generating a trip signal at this overload fault level. After one minute in this overload condition, the microcomputer 120 will have accumulated current information which indicates that it is 50% of the way to tripping. The microcomputer will also have enabled the RC circuit 610 to charge to 2.5 v; that is, 50% of the maximum 5 v. Assuming, for the purpose of this example, that the overload fault condition is removed at this point and the electronic trip system loses operating power, when the power to the microcomputer 120 drops to 0 v, the internally stored current accumulation is lost. However, the voltage across the RC circuit 610 is still present and will start to decay by approximately 63.2% every 5.4 minutes (the time constant for the RC circuit 610). Therefore, after 5.4 minutes without current, the voltage across the RC circuit 610 will be 36.8% of 2.5 v, or 0.92 v.

If the overload condition would occur again at this point, the microcomputer 120 would power up and measure 0.92 v across the RC circuit 610. The microcomputer 120 would then initialize its internal current accumulation to approximately 18% (0.92 v divided by the maximum of 5.0 v) of the pre-programmed full trip delay time.

The accumulation calculations performed by the microcomputer are based on the formula:

$$A = \sum_{t=0}^{N} I(t)^2$$

where:

N = the number of samples;

t = time at discrete intervals (determined by the accumulation rate); and

I(t) = the true RMS value of current through the breaker.

During a fault, the trip unit will begin to sum the current squared value as soon as the current exceeds a predetermined level for a predetermined period of time, or the selected overload condition. The electronic trip system will maintain an internal accumulation register to store a value that is proportional to the square of the current and that is incremented periodically based on the accumulation rate. Assuming a constant fault level of current, a fixed accumulation rate, and a known condition of the accumulation register at t=0, the value in the accumulation register will increase at a determinate rate and will contain a known value at any given time t.

For example, assume that a continuous fault is measured at 70.71 amperes (RMS) with an accumulation period of 64 milliseconds. Further assume that the accumulation register is at zero prior to the fault. The microcomputer 120 will accumulate the squared value of the current every 64 milliseconds into the register, causing it to increase at a constant rate.

With a continuous, fixed level fault, as time increases, the internal accumulation register increases proportionally. In order to protect the system from this fault, this increasing accumulated value is compared periodically against a predetermined threshold value that has been chosen to represent the maximum allowed heat content of the system. When the accumulated value equals or exceeds this predetermined threshold value, the tripping system will trip the breaker.

A valuable aspect of accumulating the current squared value is that as the current doubles, the current squared value quadruples and the internal accumulation register increases at a more rapid rate, resulting in a more rapid trip. Thus, if the delay time (the period before the detected power fault causes a trip) is x seconds at some current level, as the current doubles, the delay time will be x/4 seconds.

The formula for calculating the delay time for any constant current is:

$$T = \frac{A_R \times K}{I^2}$$

where:

$A_R$ = the accumulation rate in seconds;

K = predetermined final accumulation value; and

I = the true RMS value of current flowing through the breaker.

D. Reset Circuitry

Figure 8:
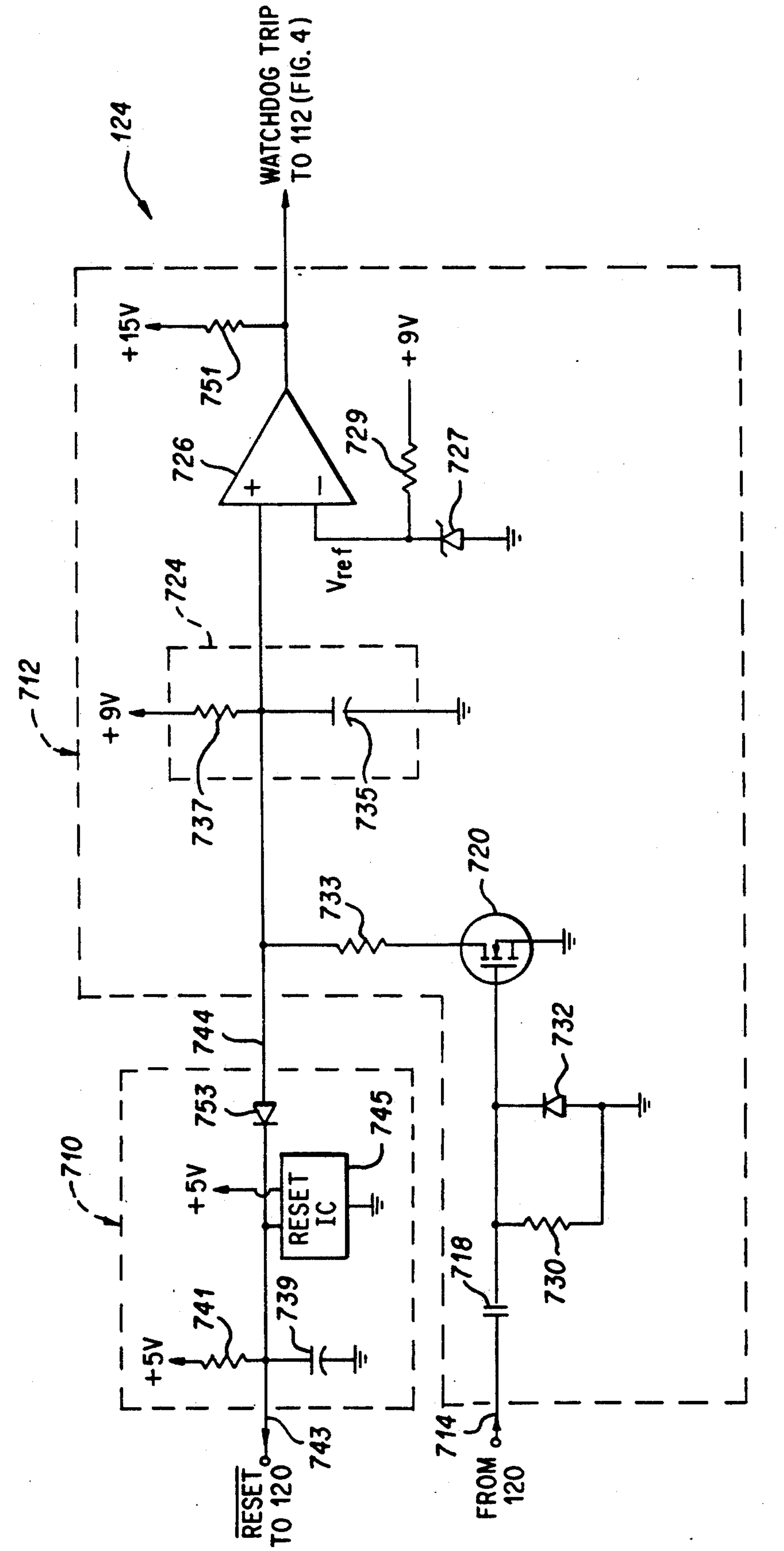
FIG. 8 is a schematic diagram illustrating the reset circuit 124 of FIG. 1.

Referring now to FIG. 8, an expanded view of the reset circuit 124 is shown to include a power-up reset circuit 710 and a watch-dog circuit 712 to maintain the integrity of the tripping system 100. The power-up reset circuit 710 performs two functions, both of which occur during power-up: it provides a reset signal (asserted low) on line 743 to maintain the microcomputer 120 in reset condition until the tripping system 100 develops sufficient operating power from the current lines 106; and it provides a reset signal (asserted low) via lead 744 to the watch-dog circuit 712 to prevent the watch-dog circuit from engaging the solenoid 112 during power-up. This latter function prevents nuisance tripping.

Preferably the power-up reset circuit includes an under-voltage sensing integrated circuit 745 that detects whether or not the output voltage of the +5 volt supply is less than a predetermined reference voltage at which the microcomputer (120 in FIG. 1) may properly function. The integrated circuit 745 is, for example, part No. MC33064P-5, which holds the reset line 743 low until the output voltage of the +5 volt supply rises above 4.6 volts. The microcomputer 120 may operate at 4.5 volts or above. The preferred reset circuit also includes a pull-up resistor 741, a capacitor 739, and a diode 753 connecting the integrated circuit 745 to the watchdog circuit 712. The resistor 741, for example, has a value of 47 K ohms and the capacitor 739 has a value of 0.01 microfarads. The diode 753 ensures that the reset circuit 710 affects the watchdog circuit 712 only when the microcomputer 160 is being reset.

The watch-dog circuit 712 protects the tripping system from microcomputer malfunctions. Thus, it is designed to engage the solenoid 112 if the microcomputer 120 fails to reset the watch-dog circuit 712 within a predetermined time period. The microcomputer 120 resets the watch-dog circuit 712 by regularly generating logic high pulses, preferably about every 200 milliseconds, on lead 714. These pulses are passed through a capacitor 718 to activate an IGFET transistor 720, which in turn discharges an RC timing circuit 724 through a circuit limiting resistor 733. A resistor 730 and a clamping diode 732 are used to reference the pulses from the capacitor 718 to ground.

The pulses on lead 714 prevent the RC timing circuit 724 from charging up past a reference voltage, Vref, at the input of a comparator 726. If the RC timing circuit 724 charges up past Vref, the comparator 726 sends a trip signal to the solenoid 112 to interrupt the current path in lines 106. The reference voltage, for example, is provided by a 4.3 volt zener diode 427 supplied with current through a resistor 729. Preferred component values are, for example, 0.001 microfarads for capacitor 718, 27 K ohms for resistor 730, part No. 1N4148 for diode 732, part No. BS170 for transistor 720, 10 ohms for resistor 733, 820 K megohms for resistor 737, 0.22 microfarads for capacitor 735, part No. LM29031 for comparator 726, part No. 1N4687 for diode 727, 100 K ohms for resistor 729, and 10 K ohms for resistor 751.

E. User Select Switches

As introduced above, the user select circuit 132 is illustrated in FIG. 9. In addition to the buffer 820 for the rating plug, the user select circuit 132 includes a plurality of user interface circuits 810 each having a pair of BCD dials 812 and a tri-state buffer 814 which is enabled through the address and data decoder 130 of FIG. 1. Each BCD dial 812 allows the user to select one of several tripping system characteristics. For example, a pair of BCD switches may be used to designate the longtime pickup and the longtime delay (overload tripping characteristics) and another pair of BCD switches may be used to designate the short time pickup and the short time delay (short circuit tripping characteristics). Other BCD switches may be used to designate sensor and breaker sizes, an instantaneous pickup, ground fault tripping characteristics, and phase unbalance thresholds.

F. Energy validation For Solenoid Activation

The user select circuit 132 of FIG. 1 and 9 also determines if there is sufficient energy to activate the solenoid 112. Using the address and data decoding circuit 130, the buffer 820 is selected to read one of its input lines 830. The VT signal from the power supply 122 of FIG. 1 feeds the input line 830, with the buffer 820 being protected from excessive voltage by a resistor 832 and a clámping diode 834. The resistor 832, for example, has a value of 620 K ohms.

Before the microcomputer 120 engages the solenoid 112, the input line 830 is accessed to determine if VT is read as a logic high or a logic low. The buffer 820 provides a logic high at its output whenever the input is greater than 2.5 v to 3 v. If VT is read as a logic high, the microcomputer 120 determines that there is sufficient power to activate the solenoid 112 and attempts to do so. If VT is read as a logic low, the microcomputer 120 determines that there is insufficient power to activate the solenoid 112 and waits, while repeatedly checking VT, in anticipation that an intermittent power fault caused VT to fall. Once VT rises beyond the 2.5-3.0 volt level, the microcomputer 120 attempts to activate the solenoid once again.

G. Communication For Information Display

The microcomputer 120 sends identical tripping system status information to the local display 150 and the display terminal 162. The information is sent synchronously on a serial peripheral interface 191 to the local display 150 and asynchronously on a serial communication interface 151 to the display terminal 162. The interfaces 151 and 191 may be implemented using the SCI and SPI ports internal to the MC68HC11. The history of the tripping system status information is stored in the nonvolatile trip memory 144. That history includes the specific cause and current level of the last trip and a running accumulation of the different trip causes.

The trip memory 144 is preferably an electrically erasable programmable ROM (EEPROM), for example, a X24C04I, available from Xicor, Inc. of Milpitas, Calif. In this case, the serial peripheral interface 191 is used for bidirectional data transfer between the microcomputer 120 and the EEPROM 144. This data transfer is implemented using one line of the serial peripheral interface 191 to transfer the data and the other line to transmit a clock signal between the microcomputer 120 and the EEPROM 114 for synchronization. During power up of the tripping system 100, the microcomputer 120 transmits to the trip memory 144 a unique bit pattern which is interpreted as a data request code. The microcomputer 120 then sets the bidirectional data line as an input and clocks the requested data in from the trip memory 144.

The microcomputer 120 maintains a copy of the history data in its internal RAM and in the event of a trip, updates it and transmits it back into trip memory 144 via the interface 191, again utilizing the unique bit pattern to set data, trip memory 144 will reprogram its contents, overwriting the old history information with the newly received data.

During normal operation (i.e., after power up and without a trip), the microcomputer 120 transmits operational information over the serial peripheral interface 191. Because this information does not contain the unique bit patterns required to activate the trip memory 144, the trip memory 144 ignores the normal transmissions. However, other devices which may be connected to the serial peripheral interface 191 can receive and interpret the information correctly.

The microcomputer 120, for example, is programmed to execute a communication procedure that permits the tripping system 100 to communicate with a relatively low power processor in the display processor 316. The procedure utilizes a software interrupt mechanism to track the frequency with which information is sent on the interfaces 151 and 191. During normal operation, one 8-bit byte of information is sent every seven milliseconds. During tripping conditions, information is sent continuously as fast as the microcomputer 120 can transmit. This procedure allows the display terminal 162 and the display processor 316 to display continuously status messages from the tripping system 100 without dedicating their processors exclusively to this reception function. Equally important, this procedure permits the microcomputer 120 to perform a variety of tasks, including continuous analysis of the current on lines 106.

Status messages are preferably transmitted using an 8-byte per packet, multi-packet transmission technique. The type of information included in each packet may be categorized into eight different groups, or eight different packets, packet 0 through packet 7. The first byte of each packet is used to identify the byte and packet numbers and the trip status of the tripping system 100. For example, the first byte may contain one bit to identify the byte type, four bits to identify the packet number and three bits to identify the trip status: no trip condition, current overload trip, short circuit trip, instantaneous trip, ground fault trip and phase unbalance trip. Bytes two through six of each packet vary depending on the packet number. Byte 7 is used to identify the tripping system sending the information (for a multiple system configuration), and byte 8 is used as a checksum to verify the integrity of the data.

The microcomputer alternates the type of information included in each packet, depending upon the priority type of the information. During normal (non-tripping) conditions, the trip unit will transmit Packet Number 0, followed by Packet Number 1, followed by one of the remaining defined Packet Numbers, 2 through 7. The sequence is graphically shown as:

| | | |
|---|---|---|
| 1) | Packet 0 - Packet 1 - Packet 2 | Repeat until Trip Occurs |
| 2) | Packet 0 - Packet 1 - Packet 3 | |
| 3) | Packet 0 - Packet 1 - Packet 4 | |
| 4) | Packet 0 - Packet 1 - Packet 5 | |
| 5) | Packet 0 - Packet 1 - Packet 6 | |
| 6) | Packet 0 - Packet 1 - Packet 7 | |

During a trip condition, the normal operation packet transmission sequence is interrupted and Packet number 2 is transmitted continuously until power is lost. The transmission rate will be increased to the fastest rate possible.

The five bytes of each packet that vary according to packet number are configured for a total of eight different packets, 0–7. The information in these bytes is implemented for each packet number as follows:

<u>Packet 0 - (0000)</u>
Data Byte 1 - Phase A Current - High Byte
Data Byte 2 - Phase A Current - Low Byte
Data Byte 3 - Phase B Current - High Byte
Data Byte 4 - Phase B Current - Low Byte
Data Byte 5 - Overload Pickups & Short Circuit Restraint In <u>Packet 1 - (0001)</u>
Data Byte 1 - Phase C Current - High Byte
Data Byte 2 - Phase C Current - Low Byte
Data Byte 3 - Ground Fault Current - High Byte
Data Byte 4 - Ground Fault Current - Low Byte
Data Byte 5 - Short Circuit, Phase Unbalance & Ground Fault Pickups <u>Packet 2 - (0010)</u>
Data Byte 1 - Maximum Phase Current - High Byte
Data Byte 2 - Maximum Phase Current - Low Byte
Data Byte 3 - Maximum Phase Identification (A, B, C or N), Breaker Identification & Ground Fault Restraint In
Data Byte 4 - Trip Unit/Sensor Identification -continued Data Byte 5 - Rating Plug/Options <u>Packet 3 - (0011)</u>
Data Byte 1 - Long Time Switches
Data Byte 2 - Short Time Switches
Data Byte 3 - Instantaneous Phase Unbalance Switches
Data Byte 4 - Ground Fault Switches
Data Byte 5 - Phase Unbalance Trips <u>Packet 4 - (0100)</u>
Data Byte 1 - Long Time Trips
Data Byte 2 - Short Circuit Trips
Data Byte 3 - Ground Fault Trips
Data Byte 4 - Last Maximum Phase Current - High Byte
Data Byte 5 - Last Maximum Phase Current - Low Byte <u>Packet 5 - (0101)</u>
Data Byte 1 - Software Failure Trips
Data Byte 2 - Last Phase A Current - High Byte
Data Byte 3 - Last Phase A Current - Low Byte
Data Byte 4 - Last Phase B Current - High Byte
Data Byte 5 - Last Phase B Current - Low Byte <u>Packet 6 - (0110)</u>
Data Byte 1 - Last Fault System Status Byte
Data Byte 2 - Last Phase C Current - High Byte
Data Byte 3 - Last Phase C Current - Low Byte
Data Byte 4 - Last Ground Fault Current - High Byte
Data Byte 5 - Last Ground Fault Current - Low Byte <u>Packet 7 - (0111)</u>
Data Byte 1 - Long Time Memory Ratio
Data Byte 2 - Phase A % Unbalance
Data Byte 3 - Phase B % Unbalance
Data Byte 4 - Phase C % Unbalance
Data Byte 5 - Software Version Identifier Byte Accordingly, the microcomputer 120 transmits information in four substantive classes. The first class constitutes trip status information, as set forth in the first byte of each packet. The second and third classes involve current measurement information; the second class including current measurement information on each line 106, as set forth in packets 0 and 1, and the third class including the maximum current status information, as set forth in packet 2. The last class of information relates to the present configuration of the tripping system and is contained in packets 3 through 7.

H. Appendices

The attached appendices respectively illustrate the preferred manner in which the microcomputer 120 of FIG. 1 and the display processor 316 of FIG. 3a may be programmed to implement the system as set forth above in the preferred embodiment.

TABLE 1

| SAMPLE Number | TIME (ms) | $I_{(t)}$ (Amps) | $I_{(t)}$ SQUARED (Amps) | SUMMATION (Amps) | $I_{(t)}$ (Binary) | $I_{(t)}$ SQUARED (Binary) | SUMMATION (Binary) |
|---|---|---|---|---|---|---|---|
| 1 | 0.0 | 0.00 | 0.00 | 0.00 | 0 | 0 | 0 |
| 2 | 0.5 | 18.74 | 351.12 | 351.12 | 48 | 2304 | 2304 |
| 3 | 1.0 | 36.81 | 1355.16 | 1706.27 | 94 | 8836 | 11140 |
| 4 | 1.5 | 53.58 | 2871.10 | 4577.38 | 137 | 18769 | 29909 |
| 5 | 2.0 | 68.45 | 4686.05 | 9263.42 | 175 | 30625 | 60534 |
| 6 | 2.5 | 80.90 | 6545.08 | 15808.51 | 206 | 42436 | 102970 |
| 7 | 3.0 | 90.48 | 8187.12 | 23995.62 | 231 | 53361 | 156331 |
| 8 | 3.5 | 96.86 | 9381.53 | 33377.16 | 247 | 61009 | 217340 |
| 9 | 4.0 | 99.80 | 9960.57 | 43337.73 | 254 | 64516 | 281856 |
| 10 | 4.5 | 99.21 | 9842.92 | 53180.65 | 253 | 64009 | 345865 |
| 11 | 5.0 | 95.11 | 9045.09 | 62225.73 | 243 | 59049 | 404914 |
| 12 | 5.5 | 87.63 | 7679.14 | 69904.87 | 223 | 49729 | 454643 |
| 13 | 6.0 | 77.05 | 5936.91 | 75841.78 | 196 | 38416 | 493059 |
| 14 | 6.5 | 63.74 | 4063.10 | 79904.88 | 163 | 26569 | 519628 |
| 15 | 7.0 | 48.18 | 2320.87 | 82225.75 | 123 | 15129 | 534757 |
| 16 | 7.5 | 30.90 | 954.92 | 83180.67 | 79 | 6241 | 540998 |
| 17 | 8.0 | 12.53 | 157.09 | 83337.75 | 32 | 1024 | 542022 |
| 18 | 8.5 | 6.28 | 39.43 | 83377.18 | 16 | 256 | 542278 |
| 19 | 9.0 | 24.87 | 618.46 | 83995.64 | 63 | 3969 | 546247 |
| 20 | 9.5 | 42.58 | 1812.87 | 85808.52 | 109 | 11881 | 558128 |
| 21 | 10.0 | 58.78 | 3454.91 | 89263.43 | 150 | 22500 | 580628 |
| 22 | 10.5 | 72.90 | 5313.94 | 94577.37 | 186 | 34596 | 615224 |

TABLE 1-continued

| SAMPLE Number | TIME (ms) | $I_{(t)}$ (Amps) | $I_{(t)}$ SQUARED (Amps) | SUMMATION (Amps) | $I_{(t)}$ (Binary) | $I_{(t)}$ SQUARED (Binary) | SUMMATION (Binary) |
|---|---|---|---|---|---|---|---|
| 23 | 11.0 | 84.43 | 7128.89 | 101706.26 | 215 | 46225 | 661449 |
| 24 | 11.5 | 92.98 | 8644.84 | 110351.10 | 237 | 56169 | 717618 |
| 25 | 12.0 | 98.23 | 9648.88 | 119999.97 | 250 | 62500 | 780118 |
| 26 | 12.5 | 100.00 | 10000.00 | 129999.97 | 255 | 65025 | 845143 |
| 27 | 13.0 | 98.23 | 9648.89 | 139648.86 | 250 | 62500 | 907643 |
| 28 | 13.5 | 92.98 | 8644.85 | 148293.71 | 237 | 56169 | 963812 |
| 29 | 14.0 | 84.43 | 7128.91 | 155422.62 | 215 | 46225 | 1010037 |
| 30 | 14.5 | 72.90 | 5313.96 | 160736.58 | 186 | 34596 | 1044633 |
| 31 | 15.0 | 58.78 | 3454.93 | 164191.51 | 150 | 22500 | 1067133 |
| 32 | 15.5 | 42.58 | 1812.89 | 166004.40 | 109 | 11881 | 1079014 |
| 33 | 16.0 | 24.87 | 618.47 | 166622.87 | 63 | 3969 | 1082983 |
| 34 | 16.5 | 6.28 | 39.43 | 166662.30 | 16 | 256 | 1083239 |
| 35 | 17.0 | 12.53 | 157.08 | 166819.38 | 32 | 1024 | 1084263 |
| 36 | 17.5 | 30.90 | 954.91 | 167774.29 | 79 | 6241 | 1090504 |
| 37 | 18.0 | 48.18 | 2320.85 | 170095.14 | 123 | 15129 | 1105633 |
| 38 | 18.5 | 63.74 | 4063.08 | 174158.22 | 163 | 26569 | 1132202 |
| 39 | 19.0 | 77.05 | 5936.89 | 180095.11 | 196 | 38416 | 1170618 |
| 40 | 19.5 | 87.63 | 7679.12 | 187774.23 | 223 | 49729 | 1220347 |
| 41 | 20.0 | 95.11 | 9045.08 | 196819.31 | 243 | 59049 | 1279396 |
| 42 | 20.5 | 99.21 | 9842.91 | 206662.22 | 253 | 64009 | 1343405 |
| 43 | 21.0 | 99.80 | 9960.58 | 216622.79 | 254 | 64516 | 1407921 |
| 44 | 21.5 | 96.86 | 9381.54 | 226004.34 | 247 | 61009 | 1468930 |
| 45 | 22.0 | 90.48 | 8187.13 | 234191.47 | 231 | 53361 | 1522291 |
| 46 | 22.5 | 80.90 | 6545.10 | 240736.57 | 206 | 42436 | 1564727 |
| 47 | 23.0 | 68.45 | 4686.07 | 245422.64 | 175 | 30625 | 1595352 |
| 48 | 23.5 | 53.58 | 2871.12 | 248293.76 | 137 | 18769 | 1614121 |
| 49 | 24.0 | 36.81 | 1355.17 | 249648.93 | 94 | 8836 | 1622957 |
| 50 | 24.5 | 18.74 | 351.12 | 250000.05 | 48 | 2304 | 1625261 |
| | | MEAN OF THE SUMMATION | | 5000.00103 | MEAN OF THE SUMMATION | | 32505 |
| | | CALC. RMS VALUE (Amps) | | 70.7106854 | CALC. RMS VALUE (Binary) | | 180 |
| | | ACTUAL RMS VALUE | | 70.7106781 | ACTUAL RMS VALUE | | 180.312229 |

APPENDIX A

```
;*****************************************************************************
.TITLE                  S E R I E S   T H R E E   T R I P   S Y S T E M
;*****************************************************************************
.DATA
;********** Memory Map for SERIES III BOARD **********
RAM_START          EQUAL $0000              ;Start of 256 bytes of RAM
RAM_END            EQUAL $00FF              ;end of 256 byte RAM memory
;
REGSTART           EQUAL $1000              ;Start of 64 byte Register Block
;
RATING_PLUG        EQUAL $2000              ;Memory location of Rating Plug nibble
TRIP_SUPPLY        EQUAL $2001              ;15V supply & Motor
                                            ;Protection sensor location
LTPUSW             EQUAL $4000              ;Long Time Pickup Switch
LTDELSW            EQUAL $4001              ;Long Time Delay Switch
FLCPUSW            EQUAL $4000              ;Full Load Pickup Switch
FLCDELSW           EQUAL $4001              ;Full Load Delay Switch
STPUSW             EQUAL $4002              ;Short Time Pickup Switch
STDELSW            EQUAL $4003              ;Short Time Delay Switch
LRCPUSW            EQUAL $4002              ;Locked Rotor Pickup Switch
LRCDELSW           EQUAL $4003              ;Locked Rotor Delay Switch
INPUSW             EQUAL $4004              ;Instantaneous Pickup Switch
PUPUSW             EQUAL $4005              ;Phase Unbalance Pickup Switch
GFPUSW             EQUAL $4006              ;Ground Fault Pickup Switch
GFDELSW            EQUAL $4007              ;Ground Fault Delay Switch
;
;
SENSOR             EQUAL $8000              ;memory location of sensor nibble
BRKR_TYPE          EQUAL $8001              ;memory location of type of breaker

;
;********** END OF MEMORY MAP **********************************
;
.PAGE
;********** Register Block Address Assignment **********
;  INTERNAL 6811 REGISTERS,OFFSET VALUES FROM HEX 1000
;******************************************************************
```

```
PORTA           EQUAL $00       ;Port A Data Register
PIOC            EQUAL $02       ;Parallel I/O Control Register
PORTC           EQUAL $03       ;Port C Data Register
PORTB           EQUAL $04       ;Port B Data Register
PORTCL          EQUAL $05       ;Port C Latched Data Register
DDRC            EQUAL $07       ;Data Direction Register for Port C
PORTD           EQUAL $08       ;Port D Data Register
DDRD            EQUAL $09       ;Data Direction Register for Port D
PORTE           EQUAL $0A       ;Port E Data Register
CFORC           EQUAL $0B       ;Timer Compare Force Register
OC1M            EQUAL $0C       ;Output Compare 1 Mask Register
OC1D            EQUAL $0D       ;Output Compare 1 Data Register
TCNT            EQUAL $0E       ;Timer Control Register
TIC1            EQUAL $10       ;Timer Input Capture Register 1
TIC2            EQUAL $12       ;Timer Input Capture Register 2
TIC3            EQUAL $14       ;Timer Input Capture Register 3
TOC1            EQUAL $16       ;Timer Output Compare Register 1
TOC2            EQUAL $18       ;Timer Output Compare Register 2
TOC3            EQUAL $1A       ;Timer Output Compare Register 3
TOC4            EQUAL $1C       ;Timer Output Compare Register 4
TOC5            EQUAL $1E       ;Timer Output Compare Register 5
TCTL1           EQUAL $20       ;Timer Control Register 1
TCTL2           EQUAL $21       ;Timer Control Register 2
TMSK1           EQUAL $22       ;Main Timer Interrupt Mask Reg. 1
TFLG1           EQUAL $23       ;Main Timer Interrupt Flag Reg. 1
TMSK2           EQUAL $24       ;Misc. Timer Interrupt Mask Reg. 2
TFLG2           EQUAL $25       ;Misc. Timer Interrupt Flag Reg. 2
PACTL           EQUAL $26       ;Pulse Accumulator Control Register
PACNT           EQUAL $27       ;Pulse Accumulator Count Register
SPCR            EQUAL $28       ;SPI Control Register
SPSR            EQUAL $29       ;SPI Status Register
SPDR            EQUAL $2A       ;SPI Data Register
BAUD            EQUAL $2B       ;SCI Baud Rate Control Register
SCCR1           EQUAL $2C       ;SCI Control Register 1
SCCR2           EQUAL $2D       ;SCI Control Register 2
SCSR            EQUAL $2E       ;SCI Status Register
SCDR            EQUAL $2F       ;SCI Data Register
ADCTL           EQUAL $30       ;A/D Control/Status Register
ADR1            EQUAL $31       ;A/D Result Register 1
ADR2            EQUAL $32       ;A/D Result Register 2
ADR3            EQUAL $33       ;A/D Result Register 3
ADR4            EQUAL $34       ;A/D Result Register 4
OPTION          EQUAL $39       ;System Configuration Options
COPRST          EQUAL $3A       ;ARM/Reset COP Timer Circuitry
PPROG           EQUAL $3B       ;EEPROM Programming Register
HPRIO           EQUAL $3C       ;Highest Priority Interrupt and Misc.
INIT            EQUAL $3D       ;RAM and I/O Mapping Register
TEST1           EQUAL $3E       ;Factory Test Register
CONFIG          EQUAL $3F       ;Configuration Control Register usable only in
                                ;or bootstrap mode
.PAGE
;***************************************************************************
;               SYSTEM CONSTANTS WHICH CAN CHANGE DURING DEVELOPMENT
;***************************************************************************
;
;***** BIT ASSIGNMENTS FOR FLAGS$ (GLOBAL) FLAG REGISTER
KILL_SERIAL_BIT    EQUAL $01    ;is set until valid serial data is
                                ;available(flags$)
WRD_ALIGN_BIT      EQUAL $02    ;if set to 1,word aligned,off is dbl word (fla
REBUILD_GF         EQUAL $04    ;bit set when G.F. memory is true - FLAGS$
KILL_WATCHDOG_BIT  EQUAL $08    ;shutoff watchdog pulses during trip
                                ;sequence(flags$)
I_SQ_BIT           EQUAL $10    ;BIT SET IN FLAGS$ FOR I_SQ IN MUL_16X16
NO_ST_BIT          EQUAL $20    ;this bit on in (flags$),means no short time
NO_GF_BIT          EQUAL $40    ;this bit on in (flags$),means no GF
PE_BRKR_BIT        EQUAL $80    ;high bit of system flags$ set = pe brkr ?????
;***** END OF FLAGS$ BIT DEFINITIONS *************

;************** START OF GF_FLAGS BIT DEFINITIONS (PHASE UNBALANCE) ************
PUPU_BIT           EQUAL $01    ;set when in Phase Unbal. pick up (P.U. flags)
DOUBLE_I2_BIT      EQUAL $08    ;indicates PUP taken into acct for I^2 values
USE_XS_BIT         EQUAL $10    ;for current conversion routine indicates GF c
TURN_ON_DESENSE    EQUAL $20    ;bit set to indicate to turn desense on
GF_PU_BIT          EQUAL $40    ;ground fault pick up flag bit
SUPER_DESENSE      EQUAL $80    ;if peak phase current > 6xP super desense
;************** END OF GF_FLAGS BIT DEFINITIONS (PHASE UNBALANCE) ************

;*****  START OF LT/FLC FLAGS BIT DEFINITIONS ******************************
```

```
LT_PU_BIT           EQUAL $01           ;CURRENT LEVEL IS ABOVE PICK UP
LT_PU90%_BIT        EQUAL $02           ;CURRENT LEVEL IS ABOVE 90% OF PICKUP
FLC_PU_BIT          EQUAL $01           ;CURRENT LEVEL IS ABOVE PICK UP
FLC_PU90%_BIT       EQUAL $02           ;CURRENT LEVEL IS ABOVE 90% OF PICKUP
SET_ACCUM_BIT       EQUAL $04           ;bit set until LT/FLC accum. is set on power u
LT_GTZ_BIT          EQUAL $08           ;LT ACCUM > ZERO
FLC_GTZ_BIT         EQUAL $08           ;FLC ACCUM > ZERO
A_PHASE_CONV        EQUAL $10           ;flag to do A phase serial conversion
B_PHASE_CONV        EQUAL $20           ;flag to do A phase serial conversion
C_PHASE_CONV        EQUAL $40           ;flag to do A phase serial conversion
;***** START OF LT/FLC FLAGS BIT DEFINITIONS *****************************

;***** START OF SC/LRC FLAGS BIT DEFINITIONS *********************************
ST_PU_BIT           EQUAL $01           ;short time pick up flag bit
LRC_PU_BIT          EQUAL $01           ;locked rotor pick up flag bit
DOUBLE_ST_I2_BIT    EQUAL $02           ;double 1st I^2 calculation
INST_PU_BIT         EQUAL $10           ;inst. pickup flag bit
I_TIMR_BIT          EQUAL $20           ;instantaneous timer is active bit
INST_OFF_BIT        EQUAL $40           ;bit set if ST installed & INST is off
;***** END OF SC/LRC FLAGS BIT DEFINITIONS **********************************

;***** START OF INTERRUPT FLAGS BIT ******************************************
ONE_MSBIT           EQUAL $01           ;BIT NUMBER FOR 1 MS ( IFLAGS )
TRIPPING            EQUAL $80           ;BIT SET TO KEEP INST FROM RUNNING IN INTERRUP
;***** END OF FLAG BIT ASSIGNMENTS - START OF PORT BITS USED *****************

TRIP_BIT_O          EQUAL $80           ;BIT OF PORTA FOR TRIP
LED_BIT_O           EQUAL $08           ;BIT OF PORTA FOR FLASHING LED
SC_RESTR_BIT_OUT    EQUAL $10           ;INST/ST restraint output bit
SC_RESTRAINT_BIT_IN      EQUAL          $04   ;restraint input bit
GF_DESENSE_BIT_OUT       EQUAL          $04   ;PIN 2 PORT D ALSO MISO OF SPI
GF_RES_OUT          EQUAL $20           ;ground fault restraint output bit
GF_RES_IN           EQUAL $02           ;ground fault restraint input bit
GF_REST_ACTIVE      EQUAL $40           ;bit in serial comm for GF restraint status
T_INACTIVE_BIT      EQUAL $80           ;if set to one timer is not active
WATCHDOG_BIT        EQUAL $40           ;hardware watchdog bit
MOTOR_PROT_BIT      EQUAL $10           ;this bit set in serial comm for motor code
TRIP_VOLTS_OK       EQUAL $02           ;this bit set means we have 15 Volts for trip
DESENSE_THRESHOLD   EQUAL $171          ;desense threshold (3xP) peak
MEM_CAP_BIT         EQUAL $20           ;bit to charge memory capacitor
SCL                 EQUAL $10           ;bit to toggle for EEPROM serial clock (this &
SDA                 EQUAL $08           ;serial data bit for EEPROM (SDA need switched
TRANSMIT_DONE       EQUAL $80           ;transmit reg empty bit in SCSR register
MAX_SW_POS          EQUAL (2*7)         ;maximum allowable switch position
SWITCH_MASK         EQUAL $1E           ;mask value for switches
PROD_TEST_DESIGNATOR     EQUAL          $1C   ;rating plug value to get to prod. test
SOFTWARE_VERSION    EQUAL $13           ;software version # 1.3  Apr. 25, 1989
HARD_VERSION        EQUAL $10           ;hardware version # 1.0  Feb. 3, 1989
MAX_SERIAL_I        EQUAL $3FFF         ;maximum current value that can be sent (16383
LOW_GAIN            EQUAL $34           ;VALUE TO SET A/D to low gain inputs
HIGH_GAIN           EQUAL $30           ;VALUE TO SET A/D to high gain inputs
DELAY_32MS          EQUAL $11DB         ;value for 32mS delay in VT_CHECK routine
DELAY_2MS           EQUAL $11D          ;value for 2mS delay in VT_CHECK routine

;*****************************************************************************
;                  R A M   D A T A   A R E A
;*****************************************************************************
.ORIGIN             $0000
.ABSOLUTE

START_VARS          RMB   0             ;POINTER TO START OF MEMORY CLEAR
;;********** START OF MEMORY CLEAR WHEN G.F. MEMORY CAP IS NOT CHARGED*****
FLAGS$              RMB   1             ;SYSTEM FLAG BITS
GF_ACCUM            RMB   4             ;GROUND FAULT I**2 ACCUMULATOR
GF_FTIMER           RMB   1             ;GROUND FAULT UNRESTRAINED TIMER
GF_RESTRN_TIME      RMB   1             ;TIMER # FOR 10 MS GF RESTRAINT HOLD
GF_RETN_TIME        RMB   2             ;GF 5 SECOND RETENTION TIMER
GF_LONG_TIME        RMB   2             ;QUE TIMER # FOR GF RESTRAINT DELAYS
ABOVE_GF_VARS       RMB   0             ;start of memory clear when G.F. mem high
;*****************************************************************************

SERIAL_BUF          RMB   0             ;31 character sci transmit buffer
;BBBBBBBBBBBBBBBBBBBBBBBBBBBBBBBBBBBBBBBBBBBBBBBBBBBBBBBBBBBBBBBBBBBBBBBB
;; THE FOLLOWING 31 BYTE DEFINITIONS REPRESENT THE TRANSMIT BUFFER         B
TRIP_STATUS_BYTE    RMB   1             BYTE 00 PICK_UP/TRIP INDICATOR     B
A_PHASE_RMS         RMB   2             PHASE A CURRENT                    B
B_PHASE_RMS         RMB   2             PHASE B CURRENT                    B
```

```
OVPU_SCRIN        RMB   1            OVERLOAD PU / SC RESTR. IN          B
C_PHASE_RMS       RMB   2            PHASE C CURRENT                     B
GF_CURRENT        RMB   2            GROUND FAULT CURRENT                B
SC_PU_GF_PU       RMB   1            S.C. & P.U. & G.F. PICKUPS REPLACES GF_PU_PU_G
MAX_PHASE_I       RMB   2            MAXIMUM PHASE CURRENT
MAX_IDENT         RMB   1            MAXIMUM PHASE IDENTIFIER
SENSR_TU_ID       RMB   1            SENSOR BREAKER ID
RP_OPTIONS        RMB   1            RATING PLUG/OPTIONS
LT_SWITCHES       RMB   1            LONG TIME SWITCHES
ST_SWITCHES       RMB   1            SHORT TIME SWITCHES
IN_PU_SWITCHES    RMB   1            INST/PU SWITCHES
GF_SWITCHES       RMB   1             GF SWITCHES
PU_TRIP_CNT       RMB   1            # OF PHASE UNBAL TRIPS
LT_TRIP_CNT       RMB   1            # OF LT TRIPS
SC_TRIP_CNT       RMB   1            # OF ST TRIPS
GF_TRIP_CNT       RMB   1            # OF GND FAULT TRIPS
LAST_MAX_I        RMB   2            PEAK CURRENT OF PHASE CAUSING TRIP
SOFT_TRIP_CNT     RMB   1            # OF SOFTWARE FAILURE TRIPS
A_PHASE_TRIP_I    RMB   2            PHASE A CURRENT @ LAST TRIP       B
B_PHASE_TRIP_I    RMB   2            PHASE B CURRENT   @ LAST TRIP     B
TRIP_CAUSE        RMB   1            CAUSE OF LAST TRIP                  B
C_PHASE_TRIP_I    RMB   2            PHASE C CURRENT @ LAST TRIP         B
GF_TRIP_CURRENT   RMB   2            GROUND FAULT CURRENT @ LAST TRIP  B
LT_MEM_RATIO      RMB   1            LONG TIME MEMORY RATIO (0-100%)
PHASEA_UNBAL      RMB   1            BYTE 28 PHASE A % UNBALENCE         B
PHASEB_UNBAL      RMB   1            BYTE 29 PHASE B % UNBALENCE       B
PHASEC_UNBAL      RMB   1            BYTE 30 PHASE C % UNBALENCE       B

SOFT_VERS         RMB   1            SOFTWARE VERSION          B
ADDRESS           RMB   1            BREAKER ADDRESS TO MAKE UPWARD COMPATIBLE
CHECK_SUM         RMB   1            CHECKSUM BYTE                     B
SERIAL_BUF_END    RMB   0            ;POINTER TO END OF DISPLAY BUFFER
;;BBBBBBBBBBBBBBBBBBBBBBBBBBBBBBBBBBBBBBBBBBBBBBBBBBBBBBBBBBBBBBBBBBBBBBBBB

;;***** MILLISECOND TIMERS STORED IN THIS AREA
T_2MS_ST          RMB   1            ;2 mS short time timer
T_2MS_GF          RMB   1            ;2 mS ground fault timer
T_07MS            RMB   1            ;7 MS TIMER

T_11MS            RMB   1            ;11 MS TIMER
T_12MS            RMB   1            ;12 MS TIMER
T_13MS            RMB   1            ;13 MS TIMER
T_PHASEA_RMS      RMB   1            ;TIMER FOR PHASE A SQUARE ROOT
T_PHASEB_RMS      RMB   1            ;TIMER FOR PHASE B SQUARE ROOT
T_PHASEC_RMS      RMB   1            ;TIMER FOR PHASE C SQUARE ROOT
T_64MS            RMB   1            ;64 MS TIMER
T_250MS           RMB   1            ;250 MS TIMER
T_1000MS          RMB   1            ;1 SEC TIMER
;;***** END OF MILLISECOND TIMERS

PEAK_FOR_PU       RMB   2            ;peak storage for phase unbalance
ST_PEAK           RMB   2            ;peak of all phases for ST
ST_TABLE_POS      RMB   2            ;table position for STPU (11mS)

GF_PEAK           RMB   2            ;max current to transmit.
GF_TABLE_POS      RMB   2            ;table pos for GF PU (13mS)

LAST_APHASE       RMB   1            ;peak storage pass location
LAST_BPHASE       RMB   1            ;peak storage pass location
LAST_CPHASE       RMB   1            ;peak storage pass location

A_PHASEX6         RMB   2            ;storage for phase pickup
B_PHASEX6         RMB   2            ;storage for phase pickup
C_PHASEX6         RMB   2            ;storage for phase pickup

;;CCCCCCCCCCCCCC ATOD CHANNELS MUST STAY CONTIGUOS CCCCCCCCCCCCCCCCCCCCCC 1
L_PHASEA          RMB   1            ;A phase low gain A/D
L_PHASEB          RMB   1            ;B phase low gain A/D
L_PHASEC          RMB   1            ;C phase low gain A/D

MEM_RATIO         RMB   2            ;channel one atod multiplexor
HI_PHASEA         RMB   1            ;A phase high gain A/D
HI_PHASEB         RMB   1            ;B phase high gain A/D

HI_PHASEC         RMB   1            ;C phase high gain A/D

NEW_GF            RMB   1            ;GF for trip routine usage
;;CCCCCCCCCCCCCCCCCCCCCCCCCCCCCCCCCCCCCCCCCCCCCCCCCCCCCCCCCCCCCCCCCCC 16
```

```
CUR_ATOD_PTR      RMB  0               ;Start of the current working A/D vals
CUR_PHASEA        RMB  2               ;This area contains the current
CUR_PHASEB        RMB  2               ;A/D values that are used for
CUR_PHASEC        RMB  2               ;all calculations.
CUR_GF            RMB  2

;;********************** CHANS FOR SQRT MUST STAY CONTIGUOS**************C
PHAS_SQRTS        RMB  0               ;POINTER TO ALL 3 SQ ROOTS        C
PHASA_SQRT        RMB  2               ;SQRT PHAS A                      C
PHASB_SQRT        RMB  2               ;SQRT PHAS B                      C
PHASC_SQRT        RMB  2               ;SQRT PHAS C                      C
END_SQRTS         RMB  0               ;POINTER TO END OF SQ ROOTS       C
;;**********************************************************************C

;; ***** MOTOR PROTECTION FUNCTION VARIABLE STORAGE
PU_APH            RMB  1               ;.5% phase unbalance
PU_BPH            RMB  1               ;.5% phase unbalance
PU_CPH            RMB  1               ;.5% phase unbalance

LRC_APHASE        RMB  2               ;I' storage for LRC pick up check
LRC_BPHASE        RMB  2               ;I' storage for LRC pick up check
LRC_CPHASE        RMB  2               ;I' storage for LRC pick up check

UNBAL_PEAK        RMB  1               ;peak phase unbalance
THREE_PHASE_SUM   RMB  2               ;SUM OF ADDING PHASE A,B,C
PEAK_SQRT         RMB  2               ;PEAK SQ ROOT FOR LAST 64 MS
PEAK_FLC          RMB  2               ;PEAK OF MODIFIED SQRT FOR MOTOR CODE
LRC_PEAK          RMB  2               ;peak of modified FLC
LRC_MOD_POINTER   RMB  2               ;pointer to modifier  for I' (LRC code )
;; ***** END OF MOTOR PROTECTION USED MEMORY

;;***** START OF SQUARE ROOT CALCULATION USE AREA ******
RMS_MEAN          RMB  2               ;HIGH WORD OF 2 WORD MEAN
RMS_MEAN_LW       RMB  2               ;LOW BYTE OF 2 WORD MEAN

RMS_SQROOT        RMB  2
REMAINDER         RMB  2               ;location for remainder storage
TEMP                                   RMB  2     ;16 BIT WORK AREA
;!!!!! TEMP IS NOT CONFINED TO RMS CALCULATION USE ONLY !!!!!!!
;*************************** SUM OF SQUARES ***************************** X
RMS_SUMSQH_1      RMB  2               ;A phase -HIGHEST OF TWO WORDS    X
RMS_SUMSQ_1       RMB  2               ;          LOW BYTE OF LOW WORD   X
RMS_SUMSQH_2      RMB  2               ;B phase                          X
RMS_SUMSQ_2       RMB  2               ;                                 X
RMS_SUMSQH_3      RMB  2               ;C phase                          X
RMS_SUMSQ_3       RMB  2               ;                                 X
;;**********************************************************************X

;;*********** FLAGS, ACCUMULATORS, & TIMERS FOR FUNCTION USE **************
;********** IN GENERAL, TIMERS USE BIT 7 ($80) FOR THE SLEEP BIT, *********
; ************** AND THE VALUE $FF FOR THE RESET CONDITION ****************
; **************  CHECK ROUTINES FOR ACTUAL CONDITIONS ********************
FLC_FLAGS         RMB  0               ;FLC pointer for flags
LT_FLAGS          RMB  1               ;BITS USED FOR LT LOGIC
FLC_ACCUM         RMB  0               ;pointer for FLC accumulator
LT_ACCUM          RMB  4               ;4 BYTE I**2 ACCUM FOR LONG TIME
ST_FTIMER         RMB  1               ;ST FIXED UNRESTRAINED DELAY AT 33 MS
LRC_ACCUM         RMB  0               ;pointer for LRC accumulator
ST_ACCUM          RMB  4               ;SHORT TIME I**2 4 BYTE ACCUMULATOR MER ROU
ST_RETN_TIMER     RMB  1               ;short time retention timer
ST_I2_OUT_TIMER   RMB  2               ;restrained ST delay timer
SC_RESTRN_TIMER   RMB  1               ;short circuit restraint timer
LRC_FLAGS         RMB  0               ;high bits used for locked rotor logic
ST_FLAGS          RMB  0               ;HIGH BITS USED FOR SHORT TIME LOGIC
INST_FLAGS        RMB  1               ;LOW BITS USED FOR INSTANTANEOUS LOGIC
INST_SWITCH       RMB  1               ;storage for INST switch position
INST_TABLE_VAL    RMB  2               ;storage for table pointer
INST_RESET_TIMER  RMB  1               ;resets the inst timer to 100mS
INST_TIMER        RMB  1               ;100 MS INSTANTANEOUS TIMER
INST_CNTR_4       RMB  1               ;INST COUNTER FOR 4 PU'S IN A ROW
PU_FLAGS          RMB  0               ;HIGH BITS FOR PHASE UNBALANCE LOGIC
GF_FLAGS          RMB  1               ;LOW BITS FOR GROUND FAULT LOGIC
RESULT            RMB  4               ;HOLDS ANSWER FOR MULT_16X16
RES_BUF           RMB  1               ;buffer space

; SERIAL COMMUNICATIONS HOUSEKEEPING VARIABLES ARE HERE
```

```
PACKET_PTR          RMB   1                    ;pointer for current packet being transmitted
BYTE_PTR            RMB   1                    ;POINTER TO NEXT DISP CHAR
SERIAL_POINTER      RMB   2                    ;pointer to byte that was last sent
PACKET_HOLDER       RMB   1                    ;holds 3rd packet to transmit

; INTERRUPT & TRIP FLAG
IFLAGS              RMB   1                    ;CURRENT # VAR MS TIMERS IN USE
TRIP_FLAG           RMB   1                    ;STORAGE LOCATION FOR CAUSE OF TRIP
UNBAL_CTR           RMB   1                    ;counter/timer for phase unbalance delay
 ;; TTTTTTTTTTTTTTTTTTTTTTTTTTTTTTTTTTTTTTTTTTTTTTTTTTTTTTTTTTTTTTTTTTTTTTTTT 1

;;;******** END OF RAM VARIABLES TO BE CLEARED TO ZERO AT STARTUP ***********
END_VARS            RMB   0                    ;POINTER TO END OF MEMORY CLEAR


;;****************** SOFTDOG MEMORY AREA - NOT CLEARED ON POWER UP ************
; This section not cleared so that on softdog errors the error counter isn't
;                   cleared by accident.
SOFT_DOG_TIMER1     RMB   2
SOFT_DOG_TIMER2     RMB   2
SOFT_DOG_CNTR       RMB   1

;;****************** END OF ADDRESS POINTER DEFINITIONS *********************

.RELATIVE
.CODE
.ORIGIN             $E000
CODESTART           DB    AAH,55H
VER                 DB    "SERIES 3 ver.1.3"
COPYRIGHT           DB    "COPYRIGHT 1987 SQUARE D CO."

;!!!!!!!!!!!!!!!!!!!!!!!!!!!!                   MAIN CODE STARTS HERE !!!!!!!!!!!!!!!!!!!!!!!!
INITIALIZE          EQU   $
;;* POWER UP RESET STARTS HERE AND RESETS SOFTDOG COUNTERS AND TIMERS TO ZERO *
                    SEI                        ;disable all interrupts
                    LDD   #0000                ;load double to clear soft dog timers
                    STD   SOFT_DOG_TIMER1      ;clear 1st softdog timer
                    STD   SOFT_DOG_TIMER2      ;clear 2nd soft timer
                    LDAA  #$FF                 ;set high bit to indicate no soft errors
                    STAA  SOFT_DOG_CNTR        ;clear soft error counter

;****************************************************************************

;******* ALL INTERRUPTS EXCEPT RESET AND TIMER 1 JUMP TO THIS POINT *******
;******* ANY INTERRUPTS OTHER THAN RESET AND TIMER 1 ARE ERRORS ************
INIT_1              EQU   $                    ;uCONTROLLER REGISTERS SET UP HERE

                    LDX   #REGSTART            ;set x to point at bottom of registers
                    LDAA  #$89                 ;set softdog to 65 mSec reset time
                    STAA  OPTION,X             ;powerup A/D section & clock monitor,
                                               ; wait 100uS before doing A/D
                    LDAA  #$2B                 ;
                    STAA  HPRIO,X              ;set OC1 as highest priority interrupt
                    CLR   PORTD,X              ;clear PORT D output bit
                    LDAA  #$3E                 ;
                    STAA  DDRD,X               ;enable PORT D as output to charge
                                               ; MEM DEL CAP & turn on DESENSE
                    LDAA  #$03                 ;

                    STAA  PIOC,X               ;set up parallel I/O registler - not used in
                                               ;     expanded
                    LDAA  #$30                 ;
                    STAA  BAUD,X               ;set for 9600 baud
                    LDAA  #$50                 ;
                    STAA  SCCR1,X              ;set for 9 data bits, 1 start & 1 stop bit
                    LDAA  #$08                 ;
                    STAA  SCCR2,X              ;enable transmit mode on the sci
                    LDAA  #$1E                 ;sets SPI for master, idle high, data true on
                    STAA  SPCR,X               ; 125KHz & set up SPI but don't turn it on
                    LDAA  #00                  ;clear to shut off
;******** shut down portA outputs for successful output compares ************
                    STAA  OC1M,X               ;don't set any bits in reg 1 for compares
;*************** shut down output compares for TOC2 thru TOC5 ****************
                    STAA  TCTL1,X              ;output compare 2-5 are not used
;************** shut down input captures for TIC1 thru TIC4 ****************
                    STAA  TCTL2,X              ;disable input capture
```

```
                LDAA  #$80              ;
                STAA  TMSK1,X           ;allow only timer 1 output compare interrupts
                LDAA  TFLG1,X           ;read the interrupt flag register
                STAA  TFLG1,X           ;and store to clear any pending timer interrup

;******************** mask off all TFLAG2 interrupts *******************
                CLR   TMSK2,X           ;mask off all TFLG2 interrupts
                CLR   TFLG2,X           ;turn off unwanted interrupts
                LDAA  #$80              ;
                STAA  PACTL,X           ;PortA bit 7 is set for output, pulse accum. o
                LDS   #RAM_END          ;set stack at end of RAM

;*************** FINISH SETTING REGISTERS UP HERE *****************************

;; SET UP THE ATOD FOR LOW GAIN CHANNEL ZERO
;; SET A/D TO 30 HEX HIGH GAIN & GROUND FAULT
;; SET A/D TO 34 HEX FOR LOW GAIN & MEMORY DELAY CAP
                BSET  ADCTL,X,$34       ;start a conversion for 1st reading w/MEM DELA

; CHECK FOR PRODUCTION TEST DESIGNATOR HERE - RATING PLUG DESIGNATOR = 0EH
                LDAA  RATING_PLUG       ;get RP value
                ANDA  #$1E              ;mask RP designator bits
                CMPA  #PROD_TEST_DESIGNATOR   ;compare to prod test value
                BNE   CONTINUE_INIT     ;ACCA =! 1C=(2*0E)
                JMP   PRODUCTION_TEST   ;go run production tests

CONTINUE_INIT   EQU   $

;THIS CHECKS TO SEE IF GF MEMORY RETENTION IS STILL LIVE
;               If this point is reached from a softdog error, or GF is off - all
;               memory is cleared
;               If GF memory is still active REBUILD_GF flag is set
;               GF timers are put to sleep & any active pick ups are cleared
;**************************************************************************
                LDAA  SOFT_DOG_CNTR     ;get soft dog error counter
                BPL   CLR_ALL_MEM       ;if not $FF this is a softdog reset so clear a
                LDAA  GFPUSW            ;read the GF pick up switch
                ANDA  #SWITCH_MASK      ;mask it
                CMPA  #MAX_SW_POS       ; maximum on position = 8
                BHI   CLR_ALL_MEM       ;GF is off so don't set memory flag
                LDAA  PORTA,X           ;read portA inputs

                ANDA  #$01              ;check for GF memory cap
                BNE   CLR_ALL_MEM       ;if bit is set  clear all memory
                CLR   FLAGS$            ;clr FLAGS$ so only rebuild bit is set
                BSET  FLAGS$,REBUILD_GF ;SET BIT TO rebuild GF accum
                BSET  GF_LONG_TIME,T_INACTIVE_BIT   ;put trip timer to sleep
                BCLR  GF_FLAGS,GF_PU_BIT        ;turn off any GF pick up

;**** GF MEMORY IS STILL ACTIVE SO ONLY CLEAR RAM ABOVE GF VARIABLES *****
WE'RE_FIXED     EQU   $                 ;GF memory active so don't clear GF RAM
                LDX   #ABOVE_GF_VARS    ;don't clear GF variables
                JMP   CLR_MEM           ;go clear memory

;               ******** NO ACTIVE GF MEMORY SO CLEAR ALL RAM LOCATIONS *********

CLR_ALL_MEM     EQU   $
                LDX   #START_VARS       ;SET X TO POINT TO VARS TO CLEAR
CLR_MEM         EQU   $                 ;CLEAR ALL VARIABLES IN RAM
                CLR   0,X               ;CLEAR A BYTE
                INX                     ;STEP TO NEXT BYTE
                CPX   #END_VARS         ;HAVE WE CLEARED ALL VARS?
                BLO   CLR_MEM           ;NO,SO CONTINUE CLEARING
; RAM IS CLEARED AT THIS POINT TO ENSURE CORRECT INITIAL CONDITIONS

;*************** CHECK FOR INSTALLATION OF ST & GF FUNCTIONS ****************
                JSR   SET_TYPE_OF_TRIP_UNIT   ;go set trip-unit type

                LDAA  #SOFTWARE_VERSION ;software version/revision level
                STAA  SOFT_VERS         ;save to transmit buffer location


;;********** SET INST FUNCTION FOR 94 mSEC TO ALLOW FOR POWER UP **********
;; SET INST TO 20 mSEC IF SE/DS WITH INST INSTALLED OR 90 mSEC IF INST
;;              NOT INSTALLED ( DISCRIMINATOR FUNCTION )
                LDAA  #188              ;100ms - 6mS for initialization time
                STAA  INST TIMER        ;set the timer for all except ds
```

```
                LDAB  BRKR_TYPE          ;read type of breaker
                ANDB  #SWITCH_MASK       ;mask off bit 4
                BEQ   SET_PE_BIT         ;0 is undefined brkr so set for PE
                CMPB  #$0C               ;HEX C IS maximum legal defined breaker type
                BHI   SET_PE_BIT         ;brkr type is greater than 0C default = PE
                CMPB  #$0A               ;0A = SE if SE or DS we need a discriminator
                BLO   NOT_AN_SE_BRKR     ;a discriminator isn't needed - don't do one

;**** IF WE ARE HERE, WE HAVE A DS or A SE BREAKER, TEST FOR INSTANEOUS ON ****
                BRSET FLAGS$,NO_ST_BIT,SET_DS_AT_20 ;no ST so INST must be on
                LDAB  INPUSW             ;ST is installed so read the INST PU switch
                ANDB  #MAX_SW_POS        ;mask off unused bits
                CMPB  #MAX_SW_POS        ;is INST in off position (8)
                BNE   SET_DS_AT_20       ;no so set INST to 20 mSec.
                LDAA  #180               ;get 90 mSec value
                STAA  INST_TIMER         ;set INST for 90 mSec to run discriminator
                JMP   START_DISCRIM      ;go turn on discriminator
SET_DS_AT_20    EQU   $
                LDAA  #40                ;DS instantaneous timer=20ms
                STAA  INST_TIMER         ;store to INST timer
START_DISCRIM   EQU   $
                BSET  INST_FLAGS,I_TIMR_BIT   ;set INST timer bit (start INST timer)
                JMP   NO_EEPROM_ERASE    ;can't be PE or erase EEPROM

NOT_AN_SE_BRKR  EQU   $

;****************IF WE HAVE A PE THE BREAKER BIT IS SET HERE********************
CHECK_FOR_PE    EQU   $
                CMPB  #08                ;is it a pe breaker
                BNE   CHECK_EE_ERASE     ;no - branch
SET_PE_BIT      EQU   $                  ;if brkr type is undefined then set to PE
                BSET  FLAGS$,PE_BRKR_BIT        ;set PE breaker bit
                                         ;If PE breaker check is moved then a LDAB BRKR
                                         ;must be added to the CHECK_EE_ERASE routine.


CHECK_EE_ERASE  EQU   $
;;*********** IF BREAKER TYPE CODE IS AN 1E THEN CLEAR THE EEPROM *********
                CMPB  #SWITCH_MASK       ;if breaker type = 1E erase all EEPROM
                BNE   NO_EEPROM_ERASE    ;type != 1E so don't erase EEPROM
                JMP   EEPROM_ERASE       ;go erase the EEPROM & trip the breaker

NO_EEPROM_ERASE EQU   $
                JSR   SENSOR_BREAKR      ;do breaker/sensor conversion for xmit routine

;; SET THE THREE RMS PHASE TIMERS AT STAGGERED TIMES **********************
;; The 3 timers are staggered at 16mSec. intervals to allow system time to
;;              catch up with any exceptionally long RMS calculations
                LDAA  #48                ;begin A PHASE @ 48 mS to stagger RMS calc.
                STAA  T_PHASEA_RMS       ;store to A PHASE timer
                LDAA  #32                ;begin B PHASE @ 32 mS to stagger RMS calc.
                STAA  T_PHASEB_RMS       ;store to B PHASE timer
                LDAA  #16                ;begin C PHASE @ 16 mS to stagger RMS calc.
                STAA  T_PHASEC_RMS       ;store to C PHASE timer
                LDAA  #1
                STAA  T_2MS_ST           ;set ST 2mS timer to 1 mS


READ_MEMORY     EQU   $

;;****** IF OVERLOAD MEMORY CAP VOLTS IS > .3 VOLTS SET BIT SO OVERLOAD
;   ACCUMULATOR IS CALCULATED ON 1st PASS THRU 7mSEC ROUTINE **********

                LDAB  $1034              ;get A/D into ACCB
                CMPB  #$10               ;compare to 10 hex
                BLO   SET_FAST_TIMERS    ;if low bypass setting flag
                BSET  LT_FLAGS,SET_ACCUM_BIT  ;set bit so Ovld Accum is calculated

SET_FAST_TIMERS EQU   $
;; SET SHORT TIME FAST TRIP TIMER TO (33MS - STARTUP TIME)= 27MS
;; SET GROUND FAULT FAST TRIP TIMER TO(33MS - STARTUP TIME)=18MS
;; RETENTION TIMERS ARE STARTED TO RESET THE FAST (UNRESTRAINED) GF & ST TIMERS
                LDAA  #(33-6)            ;load ST unrestrained timer value
                STAA  ST_FTIMER          ;save into unrestrained timer location
DO_ST_RETN      EQU   $
```

```
;*********************************************************************
;; QUE THE SHORT TIME MEMORY RETENTION TIMER FOR 36 MS
;; RETENTION timer is loaded so that after 36mSec. the initialization
;;                  time is added to any timers.
;*********************************************************************
                  LDAA  #0036              ;36 ms timer
                  STAA  ST_RETN_TIMER      ;save it to retention timer

                  LDD   #$FFFF             ;get reset value
                  STD   ST_I2_OUT_TIMER    ;set to reset
                  STAA  SC_RESTRN_TIMER    ;reset the restraint timer
                  LDAB  STDELSW            ;read the delay switch
                  ANDB  #MAX_SW_POS        ;mask off bits not wanted
                  CMPB  #(2*3)             ;maximum I^2 out position
                  BLS   SET_ST_LONG_TIME   ;I^2 out so branch
                  BSET  ST_FLAGS,DOUBLE_ST_I2_BIT     ;set flag to double first I^2 valu
                  JMP   IS_GF_MEM_ACTIVE   ;go do GF initialization
SET_ST_LONG_TIME  EQU   $
                  LDX   #ST_FIXED_DEL      ;GET START LOCATION OF FIXED DELAY TABLE
                  LDY   #STDELSW           ;GF SWITCH ADDRESS
                  LDAA  #8                 ;MULT BY 8 FOR # OF ENTRIES PER ROW
                  BSET  FLAGS$,WRD_ALIGN_BIT    ;1 WORD BOUNDARY
                  JSR   SET_TBL_INDX       ;CALL INDEX ROUTINE
                  LDD   0,X                ;LOAD TIMER VALUE FROM TABLE
                  SUBD  #6                 ;subtract INIT time for ST
                  STD   ST_I2_OUT_TIMER    ;save to timer
                  BSET  ST_I2_OUT_TIMER,T_INACTIVE_BIT      ;put timer to sleep

IS_GF_MEM_ACTIVE  EQU   $
;; QUEUE A 5 SECOND GF RETENTION TIMER IF G.F. MEMORY NOT ACTIVE
;*********************************************************************
;                 This section sets up Short Time to take into account the time to
;                 initialize the trip unit when powering up into a fault.
;                 A reset timer is started to run normal times after 250 mSec.
;*********************************************************************
                  BRCLR FLAGS$,REBUILD_GF,RESET_GF
                  JMP   RESET_INST         ;G.F. mem active so do INST
RESET_GF          EQU   $
                  LDAA  #(33-15)           ;load GF unrestrained timer value
                  STAA  GF_FTIMER          ;set GF unrestrained timer
                  LDD   #250               ;reset GF after 1/4 second
                  STD   GF_RETN_TIME       ;RESET RETENTION TIMER
                  LDD   #$FFFF             ;GET RESET VALUE (NULL)
                  STD   GF_LONG_TIME       ;save to timer
                  STAA  GF_RESTRN_TIME     ;RESET RESTRAINT TIMER
                  LDAB  GFDELSW            ;read the delay switch
                  ANDB  #MAX_SW_POS        ;mask off bits not wanted
                  CMPB  #(2*3)             ;maximum I^2 out position
                  BLS   SET_GF_LONG_TIME   ;I^2 out so branch
                  BSET  GF_FLAGS,DOUBLE_I2_BIT  ;set flag to double first I^2 value
                  JMP   RESET_INST         ;go do INST stuff
SET_GF_LONG_TIME  EQU   $
                  LDX   #GF_FIXED_DEL      ;GET START LOCATION OF FIXED DELAY TABLE
                  LDY   #GFDELSW           ;GF SWITCH ADDRESS
                  LDAA  #8                 ;MULT BY 8 FOR # OF ENTRIES PER ROW
                  BSET  FLAGS$,WRD_ALIGN_BIT    ;1 WORD BOUNDARY
                  JSR   SET_TBL_INDX       ;CALL INDEX ROUTINE
                  LDD   0,X                ;LOAD TIMER VALUE FROM TABLE
                  SUBD  #15                ;subtract INIT time for GF
                  STD   GF_LONG_TIME       ;save to timer
                  BSET  GF_LONG_TIME,T_INACTIVE_BIT  ;put timer to sleep

;; When the retention timers time out the ST & GF will be reset to norm values
;*********************************************************************

RESET_INST        EQU   $

;;set-up to reset INST function after 100 mSec have passed******************
                  JSR   GET_INST_TABLE     ;read INST switches for interrupt use
                  LDAA  #100               ;set time before resetting inst timer
                  STAA  INST_RESET_TIMER   ;set time to reset INST timer

;***** Historic data is read from the EEPROM before SPI is enabled *******
                  JSR   RESET_EE           ;do reset to finish out any bad data
                  JSR   ADDRESS_WEE        ;address the EEPROM for talking
                  JSR   READ_EE            ;read the EEPROM into RAM
```

```
;**** Turn on SPI and set up the micro to start runnung breaker code *****
                LDX   #REGSTART          ;SET 6811 INTERNAL REGISTERS AT 1000 HEX
                LDAA  #$5E               ;this turns SPI on at 125kHz, and as master
                STAA  SPCR,X             ;turn it on
                LDAA  TFLG1,X            ;LOAD AND STORE TIMER INTERRUPTS
                STAA  TFLG1,X            ;TO CLEAR ALL INTERRUPTS
                LDD   TCNT,X             ;get timer count
                ADDD  #1000              ;(1000 * .5usec) = 500usec interrupt
                STD   TOC1,X             ;load back into output compare register 1

                BSET  TMSK1,X,$80        ;allow output compare register 1 interrupt
                CLI                      ;enable all interrupts


; ********** END OF ALL INITIALAZION FOR SERIES III **************************

;;;;;;;;;;;;; P S U E D O   C O D E   FOR   M A I N  E X E C ;;;;;;;;;;;;;
;
;MAIN_FLOW:
;
;               IF(GROUND FAULT PICKUP)
;               {
;                       GF RESTRAINT TIMER = 14 MS;
;               }
;               IF(SHORT CIRCUIT PICKUP)
;               {
;                       ST RESTRAINT TIMER = 10 MS;
;               }
;
;CHECK_FOR_ST:
;               IF(2MS_ST_TIMER => 2)
;               {
;                       2MS_ST_TIMER = 2MS_ST_TIMER-2;
;
;                       SET_PHASEA_PEAK();
;
;                       IS_ST_INSTALLED:
;                                       IF(SHORT TIME IS INSTALLED) GOTO
SHORT_TIME_TEST_PU;
;                                       GOTO EXIT_SHORT_TIME;
;
;                       SHORT_TIME_TEST_PU:
;                                       IF(PE_BREAKER_TYPE) INDEX=ADDRESS OF PE_BREAKE
TABLE;
;                                       INDEX=ADDRESS OF OTHER BREAKER TABLES;
;
;                       IF(PEAK_PHASE >= ST_PU_TABLE) GOTO ST_PICK_UP;
;
;                                       /* CLEAR PICK UP BIT  */
;                                       ST_PU_BIT=0;
;                                       GOTO ST_OFF;
;                       ST_PICK_UP:
;                                       ST_PU_BIT=1;
;                                       RESTRAINT OUTPUT = 1;
;;      /* TEST INPUT RESTRAINT FOR RESTRAINT DELAYS          */
;                       IF(RESTRAINT INPUT == 1) GOTO SHORT_TIME;
;                                       ST_FTIMER-=2;      /*DECREMENT TIMER BY 2 */
;                                       IF(ST_FTIMER==0) GOTO ST_TRIP;
;                       SHORT_TIME:
;                                       ST_RETN_TIMER = 36;
;
;
;               IF(ST_SWICHES == I**2)GOTO EXIT_SHORT_TIME;
;
;               ST_FIXED_DELAY:
;                       IF(ST_I2_OUT_TIMER == RESET) GOTO SCHEDULE_TIMER;
;                                       ELSE IF (ST_I2_OUT_TIMER == INACTIVE) RESTART
TIMER;
;                                               GOTO EXIT_SHORT_TIME;
;
;               SCHEDULT_TIMER:
;                       ST_I2_OUT_TIMER = *(DELAY_TABLE + DELAY_SWITCH_POSITION)

;
;               EXIT_SHORT_TIME:
;               }
```

```
;
;                   /* GROUND FAULT CODE IS EXECUTED HERE */
;
;CHECK_EVEN_MS:
;                   IF(2MS_GF_TIMER => 2)
;                   {
;                         2MS_GF_TIMER = 2MS_GF_TIMER-2;
;
;                         CHECK_FOR_GF();
;                   }
;
;CHECK_07MS:
;                   IF(T_07MS => 7)
;                   {
;                         T_07MS = T_07MS-7;
;
;                         GET_INST_TABLE();
;
;                         IF(KILL_SERIAL_BIT == 1)GOTO CHECK_LT_MEMORY;
;                                               SERIAL();
;
;                   CHECK_LT_MEMORY:
;                         IF(SET_ACCUM_BIT == 0)GOTO CHECK_GTZ_BIT;
;                                               ADJUST_LT_VOLTS(&LT_97%_RATIO);
;                                               GOTO CHECK_11MS;
;
;                   CHECK_GTZ_BIT:
;                         IF(LT_GTZ_BIT == 0)GOTO CHECK_11MS;
;                                               ADJUST_LT_VOLTS(&LT_RATIO_TABLE);
;
;                   }
;
;CHECK_11MS:
;
;                   IF(T_11MS TIMER < 11) GOTO CHECK_12MS;
;                   {
;                         T_11MS = T_11MS - 11;
;                         IF(SERIAL_POINTER == MAX_PHASE_CURRENT) GOTO TEST_ST_INSTALLED;
;                         I_CONVERSION(*ST_PEAK);
;
;TEST_ST_INSTALLED:
;                         IF(ST_PU_BIT == 0) GOTO CLEAR_ST_PEAK;
;                                               ELSE IF(SC_RESTRAINT_BIT_IN == 0) GOTO
CLEAR_ST_PEAK;
;                                                     ELSE IF(MAX_SW_POS <= 6) GOTO CLEAR_ST_P
;                                                           ELSE ST_ISQ_IN();
;
;CLEAR_ST_PEAK:
;                         CHECK_ST_12MS();
;                   }
;
;CHECK_12MS:
;
;                   IF(T_12MS < 12) GOTO CHECK_13MS;
;                   {
;                         T_12MS = T_12MS - 12;
;                         IF(LT_GTZ_BIT == 0) GOTO CHECK_13MS;
;                                               ELSE IF (LT_PU_BIT == 1) GOTO CHECK_13MS;
;                                                     LT_DEC_ACCUM();
;                   }
;
;CHECK_13MS:
;                   IF(T_13MS < 13)GOTO CHECK_17MS;
;                   {
;                         T_13MS = T_13MS - 13;
;
;                         RESET_COP();
;
;                         IF(NO_GF_BIT == 0) GOTO CHECK_GF_ISQ
;                         {
;                                               GF_CURRENT = 0;
;                                               GOTO CHECK_64MS;
;                         }
;CHECK_GF_ISQ:
;                         {
;                         IF(SERIAL_POINTER != &GF_CURRENT) GOTO DO_GF_SERIAL_CONV;
;                                               GOTO TEST_FOR_GF_PU_BIT;
```

```
;                       }
;
;DO_GF_SERIAL_CONV:
;                       {
;                       DO_GF_CONV();
;                       USE_XS_BIT = 0;
;                       }
;
;TEST_FOR_GF_PU_BIT:
;                       {
;                       IF (GF_PU_BIT == 0) GOTO CLEAR_GF_PEAK;
;                                   ELSE IF (GF_RES_IN == 1) GOTO CLEAR_GF_PEAK;
;                                   /* RESTRAINT LINE HAVE INVERTERS ON INPUTS */
;                                         ELSE IF (GF DELAY SWITCH <= 6) GOTO
CLEAR_GF_PEAK;
;                                               ELSE GF_ISQ_IN();
;                       }
;
;CLEAR_GF_PEAK:
;                       CHECK_GF_13MS();
;                 }
;
;
;CHECK_64MS:      /* PHASE A 64 MS TIMER  */
;                 IF(T_PHASEA_RMS < 64) GOTO TEST_PHASEA_2MS;
;                 {
;                       A_PHASE_CONV = 1;
;                       T_PHASEA_RMS =    T_PHASEA_RMS - 64;
;                       AVG(RMS_SUMSQH_1);
;                       PHASEA_SQRT = RMS_SQROOT;
;                       GOTO TEST_64MS;
;                 }
;
;TEST_PHASEA_2MS:
;                 IF (T_PHASEA_RMS < 8) GOTO TEST_PHASEB;
;                       ELSE IF (A_PHASE_CONV == 0) GOTO TEST_PHASEB;
;                                   ELSE
;                                   {
;                                         PHASE_UNBALENCE(PHASA_SQRT);
;                                         IF (SERIAL_POINTER == &A_PHASE_RMS) GOTO
TEST_64MS
;                                               ELSE
;                                               {
;                                                I_CONVERSION(PHASA_SQRT,A_PHASE_R
;                                                A_PHASE_CONV = 0;
;                                                GOTO TEST_64MS:
;                                               }
;                                   }
;
;TEST_PHASEB:
;                 IF(T_PHASEB_RMS < 64) GOTO TEST_PHASEB_2MS;
;                 {
;                       B_PHASE_CONV = 1;
;                       T_PHASEB_RMS =    T_PHASEB_RMS - 64;
;                       AVG(RMS_SUMSQH_2);
;                       PHASEB_SQRT = RMS_SQROOT;
;                       GOTO TEST_64MS;
;                 }
;
;TEST_PHASEB_2MS:
;                 IF (T_PHASEB_RMS < 8) GOTO TEST_PHASEC;
;                       ELSE IF (B_PHASE_CONV == 0) GOTO TEST_PHASEC;
;                                   ELSE
;                                   {
;                                         PHASE_UNBALENCE(PHASB_SQRT);
;                                         IF (SERIAL_POINTER == &B_PHASE_RMS) GOTO
TEST_64MS
;                                               ELSE
;                                               {
;
;                                               I_CONVERSION(PHASB_SQRT,B_PHASE_R
;                                               B_PHASE_CONV = 0;
;                                               GOTO TEST_64MS:
;                                              }
;
;TEST_PHASEC:
;                IF(T_PHASEC_RMS < 64) GOTO TEST_PHASEC_2MS;
```

```
;                    {
;                          C_PHASE_CONV = 1;
;                          T_PHASEC_RMS =     T_PHASEC_RMS - 64;
;                          AVG(RMS_SUMSQH_3);
;                          PHASEC_SQRT = RMS_SQROOT;
;                          GOTO TEST_64MS;
;                    }
;
;TEST_PHASEC_2MS:
;                    {
;                    IF (T_PHASEC_RMS < 8) GOTO TEST_64MS;
;
;                          ELSE IF (C_PHASE_CONV == 0) GOTO TEST_64MS;
;
;                                            ELSE
;                                            {
;                                                  PHASE_UNBALENCE(PHASC_SQRT);
;                                                  IF (SERIAL_POINTER == &C_PHASE_RMS) GOTO
TEST_64MS
;                                                        ELSE
;                                                        {
;                                                         I_CONVERSION(PHASC_SQRT,C_PHASE_R
;                                                         C_PHASE_CONV = 0;
;                                                        }
;                                            }
;                    }
;
;TEST_64MS:
;                    { IF (T_64MS < 64 ) GOTO CHECK_250MS;
;                      ELSE
;                          {
;                            T_64MS = T_64MS - 64;
;                            LT_SERIAL_BITS();
;                            FIND_SQRT_PK();
;                            LONG_TIME();
;                          }
;                    }
;
;CHECK_250MS:
;                    {
;                    IF(250 MS TIMER < 250) GOTO CHECK_1_SEC;
;                     ELSE
;                          {
;                            T_250MS = T_250MS - 250;
;                            T_1000MS++;
;                            KILL_SERIAL_BIT = 0;
;                            CHECK_LED();
;                            SET_TYPE_OF_TRIP_UNIT();
;                            GOTO CHECK_TIMR_Q;
;                          }
;
;CHECK_1_SEC:
;                    {
;                     IF(T_1000MS < 4) GOTO CHECK_TIMR_Q;
;                      ELSE
;                          {
;                            T_1000MS = T_1000MS - 4;
;                            SENSOR_BREAKR();
;                            IF (SOFT_DOG_CNTR = RESET) GOTO CHECK_TIMR_Q;
;                                            ELSE DEC_SOFT_DOG();
;                          }
;                    }
;
;
;CHECK_TIMR_Q:
;                    {
;                     CHECK_ALL_TIMERS();
;                     GOTO MAIN_FLOW;
;                    }
;
;;;;;;;;;;;;;;  E N D   O F   P S U E D O   C O D E  ;;;;;;;;;;;;;;;;;;;;;;;


MAIN_FLOW           EQU   $
;;$$$$$$$$$$$$$$$$$$$$$$ M A I N   E X E C   F L O W $$$$$$$$$$$$$$$$$$$$$$$$$
                    BRSET GF_FLAGS,GF_PU_BIT,CHK_GF_RESTRAINT ;if set go check for restrai
                    JMP   DO_SCPU_CHK        ;NO SHORT CIRCUIT PICK UP check odd/even mSec
```

```
CHK_GF_RESTRAINT  EQU   $
;; IF WE GET HERE WE HAVE A gf PICK UP,SO ADJUST THE RESTRAINT  HOLD TIMER
                  LDAA  #11
                  STAA  GF_RESTRN_TIME      ;start/restart a SC restraint timer
DO_SCPU_CHK       EQU   $
;; IF INST. OR ST PU FLAGS ARE SET,RESET THE RESTRAINT HOLD TIMER
                  BRSET INST_FLAGS,INST_PU_BIT,CHK_RESTRAINT      ;if set go check for
restraint
                  BRSET ST_FLAGS,ST_PU_BIT,CHK_RESTRAINT    ;if set go check for restrai
                  JMP   CHECK_FOR_ST        ;NO SHORT CIRCUIT PICK UP check odd/even mSec
CHK_RESTRAINT     EQU   $
;; IF WE GET HERE WE HAVE A SC PICK UP,SO ADJUST THE RESTRAINT  HOLD TIMER
                  LDAA  #10
                  STAA  SC_RESTRN_TIMER     ;start/restart a SC restraint timer


;; CODE HERE CHECKS 2MS TIMER FOR ST
;; IF TIMER => 2 DO SHORT TIME CODE
CHECK_FOR_ST      EQU   $
                  LDAA  T_2MS_ST            ;get 2 mS short time timer
                  CMPA  #2                  ;check for expired ST timer
                  BHS   DO_PEAK_COMM        ;if ST timer is greater run ST
                  JMP   CHK_EVEN_MS         ;else do GF routines
DO_PEAK_COMM      EQU   $
                  SUBA  #2                  ;subtract 2 from timer to reset
                  STAA  T_2MS_ST            ;save timer again
                  JSR   SET_PHASEA_PEAK     ;do peak routines for ST & Communicatn

IS_ST_INSTALLED   EQU   $
;; DO WE HAVE SHORT TIME INSTALLED IN TRIP SYSTEM
                  BRCLR FLAGS$,NO_ST_BIT,SHORT_TIME_TEST_PU ;IF BIT CLEAR CHECK FOR P.U.

;INSERT CHECK FOR SC PHASE BITS HERE IN CASE OF NO ST

                  JMP   EXIT_SHORT_TIME     ;NO_ST_BIT SET - SO DON'T DO SHORT TIME

;; SHORT ROUTINE TO TEST FOR SHORT TIME PICK UP SSSSSSSSSSSSSSSSSSSSSSSSSSSS

SHORT_TIME_TEST_PU      EQU               $

;; TEST SHORT TIME FOR PE BREAKER OR ALL OTHERS
                  LDX   #ST_PU_TBL          ;set for usual brkr type
                  BRCLR FLAGS$,PE_BRKR_BIT,READ_ST_SW ;if bit set brkr type is PE
                  LDX   #ST_PE_PU_TBL       ;bit was set so use the PE breaker table
                  LDAB  SENSOR              ;get sensor size
                  ANDB  #SWITCH_MASK        ;mask off unused bits
                  CMPB  #$1A                ;1A = max sensor size
                  BLS   CHECK_FOR_PE2000    ;if less check for PE
                  LDAB  #$1A                ;load with max sensor
CHECK_FOR_PE2000  EQU   $
                  CMPB  #$12                ;compare to 2000A sensor
                  BLO   READ_ST_SW          ;if < 2000A sensor use normal PE
                  LDX   #ST_2000A_PE        ;load 2000A table
                  CMPB  #$12                ;compare to 2000A sensor
                  BEQ   READ_ST_SW          ;if = 2000A we have correct table
                  LDX   #ST_2500A_PE        ;sensor = 2500A load correct table
READ_ST_SW        EQU   $
                  LDAB  STPUSW              ;load accb with ST switch
                  ANDB  #MAX_SW_POS         ;mask off bit 0
                  ABX                       ;add sw offset to x reg (table position)
                  STX   ST_TABLE_POS        ;save for use in 11mS routine
                  LDD   0,X                 ;get latest table value
                  CPD   ST_PEAK             ;compare to ST peak
                  BLO   ST_PICK_UP          ;peak => table - we have a pick-up
;; IF WE GET HERE WE DO NOT HAVE A SHORT TIME PICK UP
                  JMP   ST_OFF              ;CHECK FOR ACTIVE TIMER THEN LEAVE ST ROUTINE

;; WE DO HAVE A SHORT TIME PICK UP WHEN WE REACH HERE
ST_PICK_UP        EQU   $
                  LDY   #REGSTART           ;set x to 6811 io base
                  BSET  PORTA,Y,SC_RESTR_BIT_OUT      ;turn on restraint out
; restraint is turned on here to allow for slew rate in self restrained brkrs
                  BSET  ST_FLAGS,ST_PU_BIT        ;SET ST PICK UP FLAG BIT

;; START/RESET THE ST MEMORY RETENTION TIMER

                  LDAA  #36                 ;retention time is 36 mSec.
                  STAA  ST_RETN_TIMER       ;start/reset timer
```

```
TEST_RESTRAINT      EQU   $
;; NOW TEST FOR A RESTRAINT INPUT TO BYPASS THE ST FAST TIMER
                    BRCLR PORTA,Y,SC_RESTRAINT_BIT_IN,RESTRN_DELAY  ;do we have restrained
delays
                    DEC   ST_FTIMER          ;no restraint use fast timer
                    DEC   ST_FTIMER
                    BGT   EXIT_ST            ;timer has not expired
                    JMP   ST_TRIP            ;timer has expired,so trip

EXIT_ST             EQU   $
                    JMP   EXIT_SHORT_TIME    ;GO LEAVE ST ROUTINE

RESTRN_DELAY        EQU   $
                    LDAB  STDELSW            ;READ ST DELAY SWITCH
                    ANDB  #MAX_SW_POS        ;MASK ZERO BIT
                    CMPB  #06                ;IF SW > 6,I**2 IN
                    BHI   EXIT_SHORT_TIME    ;SW SET FOR I**2 IN WAIT FOR 11mS ROUTINE
;; SHORT TIME SWITCH IS SET FOR FIXED DELAY
ST_FIX_DELAY        EQU   $
                    LDD   ST_I2_OUT_TIMER    ;get I squared out timer
                    CPD   #$FFFF             ;compare to null value
                    BEQ   SCHED_TIMER        ;no timer so start one
                    BCLR  ST_I2_OUT_TIMER,T_INACTIVE_BIT      ;timer may be asleep - wake
                    JMP   EXIT_SHORT_TIME    ;we have an active timer so leave

SCHED_TIMER         EQU   $
                    LDX   #ST_FIXED_DEL      ;X=ST FIXED DELAY TABLE START
                    LDY   #STDELSW           ;ST DELAY SW ADDRESS
                    LDAA  #8                 ;MULT BY 8
                    BSET  FLAGS$,WRD_ALIGN_BIT     ;1 WORD BOUNDARY REQUEST
                    JSR   SET_TBL_INDX       ;CALL TABLE CREATE SUBROUTINE
                    LDX   0,X                ;GET TIMER VALUE FROM TABLE
                    STX   ST_I2_OUT_TIMER    ;start a I^2 out timer
                    JMP   EXIT_SHORT_TIME    ;CONTINUE IN MAIN FLOW

ST_OFF              EQU   $
;;CHECK TIMER INACTIVE BIT FOR ANY FIXED DELAY TIMERS THAT ARE RUNNING & PUT THEM TO SLE
                    BRSET ST_FLAGS,ST_PU_BIT,EXIT_SHORT_TIME  ;if have old PU don't clr
                    BSET  ST_I2_OUT_TIMER,T_INACTIVE_BIT      ;put any active timers to sl


EXIT_SHORT_TIME     EQU   $

;; THIS CODE IS EXECUTED EVERY TWO MIILISECONDS ,WHEN THE GROUND FAULT
;; 2mSEC  TIMER COMES DUE
;; ALL GROUND FAULT PICKUP CODE IS EXECUTED HERE
;; TEST TO SEE IF GROUND FAULT IS INSTALALLED

CHK_EVEN_MS         EQU   $
                    LDAA  T_2MS_GF           ;get 2 mS ground fault timer
                    CMPA  #2                 ;has 2 ms passed
                    BLO   CHECK_07MS         ;2 mS hasn't passed - leave
                    SUBA  #2                 ;reset timer
                    STAA  T_2MS_GF           ;save timer
                    JSR   CHECK_FOR_GF       ;time up do GF check
;;*****************************************************************
;;  T E S T   F O R  ANY  F I X E D  MS  T I M E R S
;;*****************************************************************
CHECK_07MS          EQU   $

; LT memory cap is set on power up and adjusted on this time base
;;************************ 7 MS TIMER ****************************
                    LDAA  T_07MS             ;GET 17 MS TIMER
                    CMPA  #07                ;HAS IT EXPIRED YET
                    BLO   CHECK_11MS         ;TIMER HAS NOT EXPIRED
;;*************** THE FOLLOWING CALLS ARE DONE EVERY 7MS **********
                    SUBA  #7                 ;reset timer
                    STAA  T_07MS             ;ALL CALLS DONE CLEAR 7 MS TIMER
                    JSR   GET_INST_TABLE     ;read INST switches for interrupt use

;if serial isn't valid check LT memory
                    BRSET FLAGS$,KILL_SERIAL_BIT,CHECK_LT_MEMORY
                    JSR   SERIAL             ;PUT A CHAR TO DISP EVERY 12 MS
CHECK_LT_MEMORY     EQU   $
                    BRCLR LT_FLAGS,SET_ACCUM_BIT,CHECK_GTZ_BIT
                    LDX   #LT_97%_RATIO
                    JMP   DO_FIRST_PASS
```

```
; if bit set on first pass make sure we calculate a LT accumulator
CHECK_GTZ_BIT       EQU   $
                    BRCLR LT_FLAGS,LT_GTZ_BIT,CHECK_11MS      ;if LTA = 0 check 64mS timer
                    LDX   #LT_RATIO_TABLE
DO_FIRST_PASS       EQU   $
                    JSR   ADJUST_LT_VOLTS    ;ADJUST MEMORY DELAY CAP VOLTAGE
;;***************** END OF 5 MS CALLS ***************************************

;;************************* 11 MS TIMER CHECK ****************************
; Maximum current for communications, Short Time I^2 in is run, and ST Peak
;  Detectors are cleared on this time base.
CHECK_11MS          EQU   $
                    LDAA  T_11MS             ;G.T 11 MS TIMER
                    CMPA  #11                ;HAS IT EXPIRED YET?
                    BLO   CHECK_12MS         ;NO IT HAS NOT EXPIRED YET
;;*************** THE FOLLOWING CALLS ARE DONE EVERY 11 MS *****************
                    SUBA  #11                ;reset timer
                    STAA  T_11MS             ;store reset timer
                    LDX   SERIAL_POINTER     ;get location of byte last sent
                    CPX   #MAX_PHASE_I       ;is ti the first half of max current
                    BNE   DO_MAX_SERIAL_CONV       ;if not OK to do serial conversion
                    JMP   TEST_ST_INSTALLED ;GO CHECK FOR 64 mS
DO_MAX_SERIAL_CONV        EQU                $
                    LDX   #MAX_PHASE_I       ;storage location for max phase current
                    LDY   #ST_PEAK           ;max phase current to convert
                    JSR   I_CONVERSION       ;go do conversion for peak current xmit
TEST_ST_INSTALLED EQU     $
;; IF SHORT TIME PICKUP BIT IS CLEAR,BYPASS SHORT TIME SUBROUTINE ***********
                    BRCLR ST_FLAGS,ST_PU_BIT,CLEAR_ST_PEAK
;; IF SHORT CKT RESTRAINT IN BIT IS SET WE DON'T HAVE A RESTRAINED DELAY
                    LDX   #REGSTART          ;get start of registers
                    BRSET PORTA,X,SC_RESTRAINT_BIT_IN,CLEAR_ST_PEAK
                    LDAB  STDELSW            ;READ ST DELAY SWITCH
                    ANDB  #MAX_SW_POS        ;MASK OFF BIT 0
                    CMPB  #06                ;if  sw > 6 i**2 in
                    BLS   CLEAR_ST_PEAK      ;POSITIONS 0-3 ARE I^2 OUT FIXED TIMERS
                    JSR   ST_ISQ_IN          ;GO DO I^2 IN ST DELAY ROUTINE
CLEAR_ST_PEAK       EQU   $                  ;
                    JSR   CHECK_ST_12MS      ;CLR ST PEAK & STPU AS NEEDED
;;*************** END OF 11 MS OPERATIONS ***********************************

;;************************* 12 MS TIMER CHECK ****************************
; Serial communications and Long Time Accumulator decrement are run on this
;                         time base.
CHECK_12MS          EQU   $
                    LDAA  T_12MS             ;GET 12 MS TIMER .
                    CMPA  #12                ;HAS IT EXPIRED YET?
                    BLO   CHECK_13MS         ;NO IT HAS NOT EXPIRED
;;**************** THE FOLLOWING CALLS ARE DONE EVERY 12 MS **********
                    SUBA  #12                ;reset the timer
                    STAA  T_12MS             ;save reset timer
CHECK_LT:ACCUM      EQU   $
;; IF LT_ACCUM GT ZERO BIT IS NOT SET,DON'T CALL LT_DEC_ACCUM
                    BRCLR LT_FLAGS,LT_GTZ_BIT,CHECK_13MS        ;if LTA = 0 check 13mS timer
                    BRSET LT_FLAGS,LT_PU_BIT,CHECK_13MS ;if LTPU set don't decrement
                    JSR   LT_DEC_ACCUM       ;DEC LT_ACCUM IF BELOW PICKUP

;;**************** END OF THE 12 MS CALLS *****************************

;;********************** 13 MS TIMER CHECK *********************************
; COP ( computer operating proppperly) reset, Ground Fault comm., GF I^2 in
;                  routine, and GF Peak Detector clear  are run on this time base.
CHECK_13MS          EQU   $
                    LDAA  T_13MS             ;GET 13 mS TIMER VALUE
                    CMPA  #13                ;IS IT TIME FOR 13 mS ROUTINES
                    BLO   CHECK_64MS         ;NO IT HAS NOT EXPIRED
;; *********** THE FOLLOWING CALLS ARE DONE EVERY 13 MS ******************
                    SUBA  #13                ;reset the timer
                    STAA  T_13MS             ;save the reset timer
                    JSR   RESET_COP
;; IF GROUND FAULT IS INSTALLED, go check if need to run I square GF routines
                    BRCLR FLAGS$,NO_GF_BIT,CHECK_GF_ISQ
                    CLR   GF_CURRENT         ;ground fault not installed so
                    CLR   GF_CURRENT+1       ;clear any current values
                    JMP   CHECK_64MS         ;don't do GF code - GF not installed
;; IF NO GROUND FAULT PICK UP CONTINUE ON TO 17MS TIMER
CHECK_GF_ISQ        EQU   $
```

```
                    LDX   SERIAL_POINTER     ;get location of byte last sent
                    CPX   #GF_CURRENT        ;did we send half of GF current
                    BNE   DO_GF_SERIAL_CONV ;if not OK to do serial conversion
                    JMP   TEST_FOR_GF_PU_BIT       ;GO CHECK FOR GF PICK UP
DO_GF_SERIAL_CONV EQU   $
                    JSR   DO_GF_CONV         ;go do ground fault conversions for xmit
                    BCLR  GF_FLAGS,USE_XS_BIT      ;clear for correct conversions
TEST_FOR_GF_PU_BIT        EQU              $
                    BRCLR GF_FLAGS,GF_PU_BIT,CLEAR_GF_PEAK     ;no GFPU so branch
                    LDX   #REGSTART          ;get onboard register addresses
                    BRSET PORTA,X,GF_RES_IN,CLEAR_GF_PEAK     ;bit set if restr line is lo
                    LDAB  GFDELSW            ;READ GF DELAY SWITCH
                    ANDB  #MAX_SW_POS        ;MASK OFF BIT 0
                    CMPB  #06                ;CHECK FOR I^2 IN DELAYS
                    BLS   CLEAR_GF_PEAK      ;SWITCH <=6  DON'T DO GF I**2 IN
                    JSR   GF_ISQ_IN          ;CALL GF I**2 DELAY ROUTINE
CLEAR_GF_PEAK       EQU   $
                    JSR   CHECK_GF_13MS      ;GO CHECK IF NEED TO CLR GFPU


;*********************** 64 mSEC CHECKS ********************************
; Four 64 mSec timers are run here. One timer for each phase, and one for
; Long Time pick up check routines. After each phase calculates its RMS value
; a flag is set to do serial comm conversion, and phase unbalance.
CHECK_64MS          EQU   $
                    LDAA  T_PHASEA_RMS       ;GET CURRENT A PHASE TIMER VALUE
TEST_PHASEA         EQU   $
                    CMPA  #64                ;HAS PHASE A MS TIMER EXPIRED YET?
                    BLO   TEST_PHASEA_2MS    ;GO SEE IF 2 MS HAVE EXPIRED SINCE A PHASE RMS
                    SUBA  #64                ;reset the timer
                    STAA  T_PHASEA_RMS       ;save the reset timer
                    BSET  LT_FLAGS,A_PHASE_CONV   ;do conv  so set FLAG
                    LDX   #RMS_SUMSQH_1      ;location of the SUM ^2 FOR CHAN 1 ATOD
                    JSR   AVG                ;AVERAGE I**2 VALUE CHAN 1
                    LDD   RMS_SQROOT         ;SQ ROOT FROM AVG ROUTINE
                    STD   PHASA_SQRT         ;LAST 64 MS SQ ROOT OF CURRENT FOR CHAN 1
                    JMP   TEST_64MS          ;CONTINUE MAIN EXEC LOOP
TEST_PHASEA_2MS     EQU   $                  ;HAS 2 MS EXPIRED YET?
                    CMPA  #8                 ;HAS PHASE A MS TIMER EXPIRED YET?
                    BLO   TEST_PHASEB        ;GO SEE IF TIME TO DO PHASE B RMS
                    BRCLR LT_FLAGS,A_PHASE_CONV,TEST_PHASEB
;  IF A PHASE CONVERSION FLAG IS SET DO SERIAL CONVERSION
                    BCLR  LT_FLAGS,A_PHASE_CONV   ;CONV DONE SO CLEAR FLAG
                    LDX   #PHASA_SQRT        ;GET STORAGE LOCATION FOR A PHASE RMS VALUE
                    JSR   PHASE_UNBALENCE    ;PHASE UNBALENCE FOR DISPLAY
                    LSRB                     ;convert to 1% value for serial comm.
                    STAB  PHASEA_UNBAL       ;STORE TO DISPLAY BUFFER
                    LDX   SERIAL_POINTER     ;check to see if we are sending A phase curren
                    CPX   #A_PHASE_RMS       ;
                    BNE   DO_SERIAL_CONV     ;ok to convert
                    JMP   TEST_64MS          ;GO CHECK FOR 64 mS
DO_SERIAL_CONV      EQU   $
                    LDY   #PHASA_SQRT        ;get a phase square root location
                    LDX   #A_PHASE_RMS       ;storage location
                    JSR   I_CONVERSION       ;go do transmit conversion & storage
                    BCLR  LT_FLAGS,A_PHASE_CONV   ;CONV DONE SO CLEAR FLAG
                    JMP   TEST_64MS          ;GO CHECK FOR 64 mS
TEST_PHASEB         EQU   $
                    LDAA  T_PHASEB_RMS       ;GET B PHASE TIMER
                    CMPA  #64                ;HAS PHASE B MS TIMER EXPIRED YET?
                    BLO   TEST_PHASEB_2MS    ;GO SEE IF 2 MS HAVE EXPIRED
                    SUBA  #64
                    STAA  T_PHASEB_RMS       ;CLEAR THE TIMER
                    LDX   #RMS_SUMSQH_2      ;location of squared SUM FOR CHAN 2 ATOD
                    JSR   AVG                ;AVERAGE I**2 VALUE CHAN 2
                    LDD   RMS_SQROOT         ;SQ ROOT FROM AVG ROUTINE
                    STD   PHASB_SQRT         ;LAST 64 MS SQ ROOT OF I FOR CHAN 2
                    BSET  LT_FLAGS,B_PHASE_CONV   ;CONV DONE SO CLEAR FLAG
                    JMP   TEST_64MS          ;CONTINUE MAIN EXEC LOOP
TEST_PHASEB_2MS     EQU   $
                    CMPA  #8                 ;HAS PHASE B RMS TIMER EXPIRED YET?
                    BLO   TEST_PHASEC        ;GO SEE IF TIME TO DO PHASE B RMS
                    BRCLR LT_FLAGS,B_PHASE_CONV,TEST_PHASEC
;; Conversion bit is set so do serial comm. and phase unbalance routines
                    BCLR  LT_FLAGS,B_PHASE_CONV   ;CONV DONE SO CLEAR FLAG
                    LDX   #PHASB_SQRT        ;GET PHASE B RMS VALUE LOCATION
                    JSR   PHASE_UNBALENCE    ;CALCULATE B PHASE UNBALANCE
```

```
                LSRB                        ;convert to 1% value for serial comm.
                STAB  PHASEB_UNBAL          ;STORE PHASE UNBALANCE
                LDX   SERIAL_POINTER        ;check to see if we are sending A phase curren
                CPX   #B_PHASE_RMS          ;
                BNE   DO_SERIAL_CONV_B      ;ok to convert
                JMP   TEST_64MS             ;GO CHECK FOR 64 mS
DO_SERIAL_CONV_B EQU  $
                LDY   #PHASB_SQRT           ;get a phase square root location
                LDX   #B_PHASE_RMS          ;storage location
                JSR   I_CONVERSION          ;go do transmit conversion & storage
                BCLR  LT_FLAGS,B_PHASE_CONV    ;CONV DONE SO CLEAR FLAG
                JMP   TEST_64MS             ;CHECK FOR 64 mS
TEST_PHASEC     EQU   $
                LDAA  T_PHASEC_RMS          ;GET PHASE C RMS TIMER
                CMPA  #64                   ;HAS 60 MS EXPIRED YET?
                BLO   TEST_PHASEC_2MS       ;HAVE WE CYCLED ALL 64 MS?
                SUBA  #64                   ;reset the timer
                STAA  T_PHASEC_RMS          ;CLEAR PHASE C TIMER
                LDX   #RMS_SUMSQH_3         ;location of squared SUM FOR CHAN 3 ATOD
                JSR   AVG                          ;AVERAGE I**2 VALUE CHAN 3
                LDD   RMS_SQROOT            ;SQ ROOT FROM AVG ROUTINE
                STD   PHASC_SQRT            ;LAST 64 MS SQ ROOT OF I FOR CHAN 3
                BSET  LT_FLAGS,C_PHASE_CONV    ;CONV DONE SO CLEAR FLAG
                JMP   TEST_64MS             ;CONTINUE MAIN EXEC LOOP
TEST_PHASEC_2MS EQU   $
                CMPA  #8                    ;HAS PHASE A MS TIMER EXPIRED YET?
                BLO   TEST_64MS             ;GO SEE IF TIME TO DO PHASE B RMS
                BRCLR LT_FLAGS,C_PHASE_CONV,TEST_64MS
;; Conversion bit is set so do serial comm. and phase unbalance routines
                LDX   #PHASC_SQRT           ;GET PHASE C RMS LOCATION
                JSR   PHASE_UNBALENCE       ;DO PHASE C UNBALANCE
                LSRB                        ;convert to 1% value for serial comm.
                STAB  PHASEC_UNBAL          ;STORE UNBALANCE FOR DISPLAY
                LDX   SERIAL_POINTER        ;get location of byte last sent
                CPX   #C_PHASE_RMS          ;is ti the first half of A phase current
                BNE   DO_SERIAL_CONV_C      ;if not OK to do serial conversion
                JMP   TEST_64MS             ;GO CHECK FOR 64 mS
DO_SERIAL_CONV_C EQU  $
                LDY   #PHASC_SQRT           ;get a phase square root location
                LDX   #C_PHASE_RMS          ;storage location
                JSR   I_CONVERSION          ;go do transmit conversion & storage
                BCLR  LT_FLAGS,C_PHASE_CONV    ;CONV DONE SO CLEAR FLAG
TEST_64MS       EQU   $
                LDAA  T_64MS                ;GET 64 mS TIMER VALUE
                CMPA  #64                   ;HAS ALL 64 MS EXPIRED FOR THIS CYCLE
                BLO   CHECK_250MS           ;CONTINUE MAIN FLOW
                SUBA  #64                   ;reset the timer
                STAA  T_64MS                ;RESET RMS 64 MS CYCLE TIMER
;; RMS 64 MS TIMER HAS EXPIRED ********************************************
;;*******************THE FOLLOWING CALLS ARE DONE EVERY 64 MS *************
                JSR   LT_SERIAL_BITS        ;go set LT serial comm bits
                JSR   FIND_SQRT_PK          ;find peak of RMS for Long Time & serial comm
                JSR   LONG_TIME             ;DO LONG TIME ROUTINES
;;****************** END OF 64 MS ROUTINES ********************************

;;************** THE FOLLOWING ROUTINES ARE DONE EVERY 250 MS ***************
; Every 1/4 Sec. Long Time LED is flashed if needed, 1 Second timer is
; incremented, and Type of Trip Unit is read for serial comm.

CHECK_250MS     EQU   $
                LDAA  T_250MS               ;LOAD 250 MS TIMER
                CMPA  #250                  ;IS IT DUE YET?
                BLO   CHECK_1_SEC           ;NO,IT IS NOT DUE
                SUBA  #250                  ;reset the timer
                STAA  T_250MS               ;ALL ROUTINES DONE, CLEAR TIMER
                INC   T_1000MS              ;increment 1 sec timer
                BCLR  FLAGS$,KILL_SERIAL_BIT  ;after .25 Sec. allow serial comm.
                JSR   CHECK_LED             ;SET LED ON OR OFF AS REQUIRED BY PICKUP
                JSR   SET_TYPE_OF_TRIP_UNIT   ;CHECK SWITCH POSITIONS
DO_TIMR_Q       EQU   $
                JMP   CHECK_TIMR_Q
;;****************** END OF 250 MS ROUTINES *******************************

;;********************* THE FOLLOWING SOFTWARE IS DONE EVERY SEC.***********
; Every Second the Sensor and Breaker type is read for serial transmission,
; and if there are any Softdog errors those routines are run.
```

```
CHECK_1_SEC     EQU   $
                LDAA  T_1000MS          ;LOAD 1 SEC TIMER (4 * 250 mS = 1 Sec.)
                CMPA  #4                ;IS IT DUE YET?
                BLO   CHECK_TIMR_Q      ;NO,IT IS NOT DUE
                SUBA  #4                ;reset the timer
                STAA  T_1000MS          ;save timer back to memory
                JSR   SENSOR_BREAKR     ;go prepare sensor/breaker for xmit buffer
                BRSET SOFT_DOG_CNTR,$80,CHECK_TIMR_Q,     ;if no soft errors do timer
checks
                JSR   DEC_SOFT_DOG      ;go decrement 10 min. softdog timer

CHECK_TIMR_Q
;;*********************************************************************
;; TEST FOR ANY VARIABLE MS TIMERS THAT HAVE EXPIRED
;;*********************************************************************
                JSR   CHECK_ALL_TIMERS  ;check mSec timers
                JMP   MAIN_FLOW         ;CONTINUE MAIN EXEC FLOW



;;$$$$$$$$$$$$$$$$$$$$$$ E N D   M A I N   E X E C   F L O W $$$$$$$$$$$$$$$$$$


.PAGE

;TTTTTTTT  THIS SECTION CHECKS mSEC TIMERS FOR ANY THAT ARE DUE  TTTTTTTTTTTT
;** ACCA and IX do not have any guaranteed values upon exit of this routine **
;               ACCA & IX are used to load timer values for timer due checks.
;               If any routines are called ACCB and IY may also be destroyed .
;*************************************************************************
CHECK_ALL_TIMERS  EQU   $


                LDAA  INST_RESET_TIMER  ;check timer to reset inst timer
                BNE   R_U_RESTRAINED    ;go check SC restraint timer
                JSR   INST_TIMER_RST    ;go reset the instantaneous timer
R_U_RESTRAINED  EQU   $
                LDAA  SC_RESTRN_TIMER   ;get the SC restraint timer
                BNE   HOLD_ST           ;if<>0 check the ST retention timer
                JSR   SC_RESTRN_OFF     ;get restraint timer
HOLD_ST         EQU   $
                LDAA  ST_RETN_TIMER     ;get retention timer for ST
                BNE   ST_TIME_OUT       ;if <> 0 check I^2 out timer
                JSR   ST_RETN_TIMOUT    ;go run ST retention time out code
ST_TIME_OUT     EQU   $
                LDX   ST_I2_OUT_TIMER   ;get ST I^2 out timer
                BNE   GF_TIMERS         ;if <> 0 continue timer check
                JMP   ST_TRIP           ;go trip  don't return

GF_TIMERS       EQU   $
;check GF timers here - if any have timed out run correct routines
                BRSET FLAGS$,NO_GF_BIT,RETURN_TO_TOP     ;if no GF bypass
                LDAA  GF_RESTRN_TIME    ;get restraint time
                BNE   CHECK_FOR_RETN    ;if not 0 continue
                JSR   GF_RESTRN_OFF     ;timer = 0  go kill restraint line
CHECK_FOR_RETN  EQU   $
                LDX   GF_RETN_TIME      ;get retention time
                BNE   CHECK_FOR_FIXED   ;if not 0 continue
                JSR   GF_RETN_TIMOUT    ;timer = 0  go reset timers
CHECK_FOR_FIXED EQU   $
                LDX   GF_LONG_TIME      ;get restraint timer
                BNE   RETURN_TO_TOP     ;if not 0 continue
                JMP   GF_TRIP           ;timer = 0  go trip
RETURN_TO_TOP   EQU   $
                RTS                     ;return to main

;*********************** END OF CHECK ALL TIMERS ROUTINE **********************

;SSSSSSSSSSSSSSSSSSSSSSSSSSSSSSSSSSSSSSSSSSSSSSSSSSSSSSSSSSSSSSSSSSSSSSSSSS
;*** BREAKER TYPE SWITCH READ HERE, AND ANY NON DEFINED TYPE IS SET TO PE ***
;               No calling requirements. reads and reports breaker type.
;   UPON RETURN:
;           ACCB is equal to 2x the breaker type
;                   If breaker type is PE, then PE_BRKR_BIT is set in FLAGS$, else
;                   PE_BRKR_BIT is cleared.
;SSSSSSSSSSSSSS$SSSSSSSSSSSSSSSSSSSSSSSSSSSSSSSSSSSSSSSSSSSSSSSSSSSSSSSSSSS
```

```
READ_BREAKER_SW    EQU   $
                   LDAB  BRKR_TYPE          ;READ BREAKER TYPE SWITCH
                   ANDB  #SWITCH_MASK       ;mask unused bits
                   BEQ   SET_FOR_PE         ;if 0 default to PE
                   CMPB  #$0C               ;0C is a DS breaker
                   BHI   SET_FOR_PE         ;if >$0C default type
                   CMPB  #$08               ;PE is type $08
                   BEQ   SET_FOR_PE         ;set to PE
                   BCLR  FLAGS$,PE_BRKR_BIT       ;clear PE bit in flags$
                   JMP   BRKR_SET
SET_FOR_PE         EQU   $
                   LDAB  #$08               ;get type for PE
                   BSET  FLAGS$,PE_BRKR_BIT       ;set PE bit in flags$
BRKR_SET           EQU   $
                   RTS                      ;all done return to calling routine
;SSSSSSSSSSSSSSSSSSSSSSSSSSSSSSSSSSSSSSSSSSSSSSSSSSSSSSSSSSSSSSSSSSSSSSSSSSSSSS

;PPPPPPPPPPPPPPPPPPPPPPPPPPPPPPPPPPPPPPPPPPPPPPPPPPPPPPPPPPPPPPPPPPPPPPPPPPPPPP
; SHORT TIME PRE-CALCULATION FUNCTIONS ARE DONE HERE
;                  Only IY is not used for calculations in this routine.
;
;                  CALLED:With LAST A, B, and C PHASE holding ***RAW*** low gain A/D valu
;
;                  RETURNS: A, B, and C PHASEX6 holding values to use for ST calculations
;                        LAST A, B, C_PHASE cleared for next 2mSec peak in interrupt.
;                        ST_PEAK and max phase set for communications routine use.
;                        Receiving SC restraint bit set/cleared in comm. buffer.
;******************************************************************************

SET_PHASEA_PEAK    EQU   $
                   LDAA  LAST_APHASE        ;GET LAST A PHASE PEAK
                   LDAB  #6                 ;get multiplier &
                   MUL                      ;multiply it
                   CPD   A_PHASEX6          ;COMPARE TO PEAK OF PHASE
                   BLS   TRY_PHASE_B        ;IF RESULT < SAVE VALUE BRANCH
                   STD   A_PHASEX6          ;and store it
TRY_PHASE_B        EQU   $
                   LDAA  LAST_BPHASE        ;GET LAST B PHASE PEAK
                   LDAB  #6                 ;
                   MUL                      ;
                   CPD   B_PHASEX6          ;COMPARE TO PEAK OF PHASE
                   BLS   TRY_PHASE_C        ;IF RESULT < SAVE VALUE BRANCH
                   STD   B_PHASEX6          ;
TRY_PHASE_C        EQU   $
                   LDAA  LAST_CPHASE        ;GET LAST C PHASE PEAK
                   LDAB  #6                 ;
                   MUL                      ;
                   CPD   C_PHASEX6          ;COMPARE TO PEAK OF PHASE
                   BLS   FIND_PEAK_OF_PHASES      ;IF RESULT < SAVE VALUE BRANCH
                   STD   C_PHASEX6          ;
FIND_PEAK_OF_PHASES      EQU                $
                   LDAA  #00                ;clear all last phases
                   STAA  LAST_APHASE        ;CLEAR LAST 2mSec  PEAK
                   STAA  LAST_BPHASE        ;CLEAR LAST 2mSec  PEAK
                   STAA  LAST_CPHASE        ;CLEAR LAST 2mSec  PEAK
                   LDX   A_PHASEX6          ;get 6x low gain input
                   ;ACCA is left at 0 for A phase max phase
                   CPX   B_PHASEX6          ;compare to B phase
                   BHS   CHK_C_PHASE        ;A > B so branch
                   LDX   B_PHASEX6          ;get B phase
                   LDAA  #01                ; ACCA = for B phase max
CHK_C_PHASE        EQU   $
                   CPX   C_PHASEX6          ;compare to C phase
                   BHS   FOUND_ST_PEAK      ;IX > phase C - branch
                   LDX   C_PHASEX6          ;get phase C
                   LDAA  #02                ;set for C phase peak
FOUND_ST_PEAK      EQU   $
                   CPX   ST_PEAK            ;CHECK FOR PEAK OF 12 mSEC
                   BLS   SCRIN_CODE         ;IF LESS THAN PREVIOUS PEAKS BRANCH
                   STX   ST_PEAK            ;NEW IS GREATER SO SAVE IT
                   BCLR  MAX_IDENT,$03      ;new peak phase so clear
                   ORAA  MAX_IDENT          ;combine max phase with comm. location
                   STAA  MAX_IDENT          ;save back to comm buffer


SCRIN_CODE         EQU   $                  ;controls SC restraint bit in comm buffer
                   LDX   #REGSTART          ;get start of onboard registers
```

```
;IF SC RESTRAINT BIT IS HIGH THERE IS NO SC RESTRAINT COMING IN
                    BRSET PORTA,X,SC_RESTRAINT_BIT_IN,CLR_SCRINBIT
                    BSET  OVPU_SCRIN,$40    ;porta is low - we have restraint
                    JMP   RETURN_TO_CALLER  ;go return
CLR_SCRINBIT        EQU   $
                    BCLR  OVPU_SCRIN,$40    ;no SC restraint so clear bit & chk ST
RETURN_TO_CALLER    EQU   $
                    RTS                     ;return to main/motor

;PPPPPPPPPPPPPPPPPPPPPPPPPPPPPPPPPPPPPPPPPPPPPPPPPPPPPPPPPPPPPPPPPPPPPPPPPPPPPP
;                   CALLED:Relies on PE_BRKR_BIT, and NO_ST_BIT to be set correctly.
;
;                   RETURNS:INST_TABLE_VAL points to table location of INST PU
;                         INST_SWITCH holds value of INSTPU switch.
;                         INST_OFF bit is set/cleared depending on ST & INST switch pos.
;                         INST switch value in serial comm. buffer for transmission.
;
;                   USES: All registers except IY. Uses "TEMP" RAM location to pass row
;                         value through routine. No used registers are restored.
;*****************************************************************************

GET_INST_TABLE      EQU   $
                    LDAB  INPUSW            ;read INST PU switch
                    ANDB  #SWITCH_MASK      ;mask off all but switch actuated bits
                    CMPB  #(2*7)            ;max switch position
                    BLS   INST_SW_GOOD      ;value is good so don't reset it
                    LDAB  #00               ;set to minimum
INST_SW_GOOD        EQU   $
                    STAB  INST_SWITCH       ;save for INST use
                    TBA                     ;move data to ACCA
                    BCLR  IN_PU_SWITCHES,$07     ;clear INST switch data
                    LSRA                    ;shift to position for comm data
                    ORAA  IN_PU_SWITCHES    ;combine with Phase Unbalance data
                    STAA  IN_PU_SWITCHES    ;save to comm buffer
; Starts loading PU table location here
                    LDX   #INST_PU_TBL      ;load x with inst pu table
                    BRCLR FLAGS$,PE_BRKR_BIT,STORE_TABLE;IF NOT PE BREAKER GO READ INST SW
                    LDX   #INST_PE_PU_TBL   ;SET FOR PE BREAKER TYPE
                    LDAB  SENSOR            ;read SENSOR size
                    ANDB  #SWITCH_MASK      ;mask it off
                    CMPB  #(2*9)            ;18 is 2000A sensor
                    BLO   STORE_TABLE       ;if less than 0E use normal PE
                    LDX   #INST_2000A_PE    ;get 2000A PE table
                    CMPB  #(2*9)            ;is it 2000A or 2500A
                    BEQ   STORE_TABLE       ;if equal it is 2000A so branch
                    LDX   #LI_INST_2500A_PE ;we have a 2500A PE
;********* THE CORRECT ROW IS FOUND, SO SAVE IT TO MEMORY *****************
STORE_TABLE         EQU   $
                    STX   TEMP              ;found correct row so save it
                    LDAB  INST_SWITCH       ;get switch for positioning
                    BRSET FLAGS$,NO_ST_BIT,FINISH_TABLE_POINTER     ;ST=off, do INST
                    CMPB  #(2*7)            ;compare to off position if ST = on
                    BHS   INST_IS_OFF       ;if switch => position 8 INST = off
                    ADDB  #2                ;with ST on INST table moves up 1 value
                    JMP   FINISH_TABLE_POINTER    ;ACCB has correct position so finish
INST_IS_OFF         EQU   $
                    BRSET INST_FLAGS,I_TIMR_BIT,FINISH_TABLE_POINTER;if INST active don't
                    CLR   INST_CNTR_4        ;clear INST PU counter
                    LDAA  #(2*100)           ;get INST timer reset value
                    STAA  INST_TIMER         ;reset the INST timer
                    BCLR  INST_FLAGS,INST_PU_BIT  ;clear correct flag bits
                    BSET  INST_FLAGS,INST_OFF_BIT ;INST is off so set bit
                    ABX                           ;switch pos = 8 so set to max
                    STX   INST_TABLE_VAL     ;store trip value
                    JMP   INST_HOMEWORK_DONE      ;all done so leave

FINISH_TABLE_POINTER      EQU               $
                    LDX   TEMP               ;get row value
                    ABX                      ;add column position to row
                    STX   INST_TABLE_VAL     ;now points to INST PU value
                    BCLR  INST_FLAGS,INST_OFF_BIT ;be sure INST is on

INST_HOMEWORK_DONE        EQU               $
                    RTS                      ;GO BACK TO MAIN

;IIIIIIIIIIIIIIIIIIIIIIIIIIIIIIIIIIIIIIIIIIIIIIIIIIIIIIIIIIIIIIIIIIIIIIIIIIII
```

```
.PAGE

;TTTTTTTTTTTTTTTTTTTTTTTTTTTTTTTTTTTTTTTTTTTTTTTTTTTTTTTTTTTTTTTTTTTTTTTTTT
;; THIS SUBROUTINE READS PU SWITCHES AND DETERMINES TYPE OF TRIP UNIT
;                   ACCA & ACCB are used in this routine and not restored.
;
;                   CALLED:Without any preset conditions. Reads ST & GF pickup and delay
;                         switches.
;
;                   RETURNS: Serial communications buffers set for switch positions.
;                         If ST or GF is 'not installed' that bit is set in RP_OPTIONS
;                         for communications.
;   If M.P. & LRC in position 9 or 10, LRC is forced to on in position 1 or 2.
;*************************************************************************

SET_TYPE_OF_TRIP_UNIT   EQU     $
                  LDAB  STPUSW            ;GET STPU SWITCH VALUE
                  ANDB  #SWITCH_MASK      ;MASK OFF BIT 0
                  CMPB  #MAX_SW_POS       ;CHECK FOR OFF POSITION
                  BLS   WE_HAVE_ST        ;IF < 14 WE HAVE ST INSTALLED
                  BRCLR RP_OPTIONS,MOTOR_PROT_BIT,ALLOW_OFF
                  ANDB  #MAX_SW_POS       ;mask high bit if M.P.
                  JMP   WE_HAVE_ST        ;switch is OK do LRC comm
ALLOW_OFF         EQU   $
                  BSET  FLAGS$,NO_ST_BIT  ;SET FLAG TO SHOW ST NOT INSTALLED
                  CLR   ST_SWITCHES       ;no ST installed so clear switch values
                  BSET  RP_OPTIONS,NO_ST_BIT    ;SET BIT TO SHOW ST NOT INSTALLED
                  JMP   NO_ST             ;branch around switch set code
WE_HAVE_ST        EQU   $
                  LSRB                    ;do shift to get PU in correct position
                  LDAA  STDELSW           ;get delay value
                  ANDA  #MAX_SW_POS       ;mask off unused bits
                  LSLA                    ;shift to bits 3-5
                  LSLA                    ;shift to bits 3-5
                  ABA                     ;add to PU switch value
                  STAA  ST_SWITCHES       ;store in xmit location
                  BCLR  FLAGS$,NO_ST_BIT  ;CLEAR FLAG BIT TO SHOW ST INSTALLED
                  BCLR  RP_OPTIONS,NO_ST_BIT    ;CLEAR BIT TO SHOW ST INSTALLED
NO_ST             EQU   $
                  LDAB  GFPUSW            ;GET GFPU SWITCH VALUE
                  ANDB  #SWITCH_MASK      ;MASK OFF BIT 0
                  CMPB  #MAX_SW_POS       ;CHECK FOR OFF POSITION
                  BLS   WE_HAVE_GF        ;IF < 14 GF IS INSTALLED
                  BSET  FLAGS$,NO_GF_BIT  ;WE HAVE NO GROUND FAULT
                  CLR   GF_SWITCHES       ;no GF installed so clear switch values
                  BSET  RP_OPTIONS,NO_GF_BIT    ;SET BIT TO SHOW GF NOT INSTALLED
                  JMP   NO_GF             ;branch around switch set code
WE_HAVE_GF        EQU   $
                  LSRB                    ;do shift to get PU to low 3 bits
                  LDAA  GFDELSW           ;get delay value
                  ANDA  #MAX_SW_POS       ;mask off unused bits
                  LSLA                    ;shift to bits 3-5
                  LSLA                    ;shift to bits 3-5
                  ABA                     ;add to PU switch value
                  STAA  GF_SWITCHES       ;store in xmit location
                  BCLR  FLAGS$,NO_GF_BIT  ;CLEAR FLAG BIT TO SHOW GF INSTALLED
                  BCLR  RP_OPTIONS,NO_GF_BIT    ;CLEAR BIT TO SHOW GF INSTALLED
NO_GF             EQU   $
                  BCLR  RP_OPTIONS,$0F    ;clear rating plug bits
                  LDAA  RATING_PLUG       ;read the rating plug
                  ANDA  #SWITCH_MASK      ;mask off unused bits
                  LSRA                    ;move to correct location for xmit byte
                  ORAA  RP_OPTIONS        ;combine with rest of the byte
                  STAA  RP_OPTIONS        ;put it back to xmit byte
                  RTS                     ;the party's over bye-bye
;TTTTTTTTTTTTTTTTTTTTTTTTTTTTTTTTTTTTTTTTTTTTTTTTTTTTTTTTTTTTTTTTTTTTTTTTTT

;================ ALL E SQUARED CODE IS IN THIS SECTION ======================
;EEEEEEEEEEEEEEEEEEEEEEEEEEEEEEEEEEEEEEEEEEEEEEEEEEEEEEEEEEEEEEEEEEEEEEEEEE
;;******************** THIS SUBROUTINE ERASES THE EEPROM **********************
;                   Only IX is used, besides doesn't make any difference. Breaker is
;                         tripped after E^2 is erased.
;
;                   CALLED:This is called when breaker type switch is set to $0F on
;                         power-up.
;
;                   RETURNS:NEVER!! - Trips the breaker.
```

```
;*****************************************************************************

EEPROM_ERASE        EQU   $
                    LDX   #PU_TRIP_CNT        ;GET START OF AREA TO ERASE
KEEP_CLRING         EQU   $
                    CLR   0,X                 ;clear data location
                    INX
                    CPX   #LT_MEM_RATIO       ;compare to last location
                    BLO   KEEP_CLRING
                    JSR   ADDRESS_WEE         ;address EEPROM to start write
                    JSR   WRITE_EE            ;write all 0s to EEPROM
;                   SEI                       ;turn off interrupts
WAIT_FOR_WDOG       EQU   $
                    JSR   RESET_COP           ;don't want softdog trips
                    JSR   EE_WAIT             ;delay
                    JMP   WAIT_FOR_WDOG       ;branch to keep softdog happy
;EEEEEEEEEEEEEEEEEEEEEEEEEEEEEEEEEEEEEEEEEEEEEEEEEEEEEEEEEEEEEEEEEEEEEEEEEEEEE

;RSTRSTRSTRSTRSTRSTRSTRSTRSRTRSTRSTRSTRSTRSTRSTRSTRSTRSTRSTRSTRSTRSTRSTRSTRSTR
;;This routine sends 8 start pulses to reset the E^2 part before reading data.
;                   IX and ACCB are used and not restored in this routine.
;
;                   CALLED:From initialization with SPI shut off.
;
;                   RETURNS: With E squared reset and ready to recieve the rest of the
;                         code to read data from the EEPROM.
;*****************************************************************************

RESET_EE            EQU   $
                    LDX   #REGSTART           ;get onboard register start
                    BSET  PORTD,X,SDA+SCL     ;set clock & data lines high
                    BSET  DDRD,X,SDA+SCL      ; set data direction to output
                    BCLR  SPCR,X,$40          ;disable SPI connect port D
                    LDAB  #08                 ;set for 8 clock cycles
SEND_NEXT_CLOCK     EQU   $
                    BCLR  PORTD,X,SCL         ;clock = low
                    NOP
                    NOP
                    BSET  PORTD,X,SDA         ;clock = high
                    BSET  PORTD,X,SCL         ;clock = high
                    NOP
                    BCLR  PORTD,X,SDA         ;clock = low start
                    DECB                      ;count down to 0
                    BNE   SEND_NEXT_CLOCK     ;if not 8 clocks send next clock
                    RTS                       ;return with clock high
;RSTRSTRSTRSTRSTRSTRSTRSTRSRTRSTRSTRSTRSTRSTRSTRSTRSTRSTRSTRSTRSTRSTRSTRSTRSTR

;ADDRADDRADDRADDRADDRADDRADDRADDRADDRADDRADDRADDRADDRADDRADDRADDRADDRADDRADDR
;
;; This Subroutine sends the correct address to send data to, and
;; tells the EEPROM to wake up.
; Called with no parameters set, ACCA, ACCB, IX, & IY are not restored.
; Uses a portion of the WRITE_EE routine to address the EEPROM.
;**IMPORTANT - THIS ROUTINE MUST BE CALLED BEFORE CALLING EE_READ or EE_WRITE**
;*****************************************************************************

ADDRESS_WEE         EQU   $
                    LDY   #$F000              ;mark to leave after sending address
                    LDX   #REGSTART           ;load IX with start of regs to send data
                    BSET  PORTD,X,SDA+SCL     ;set clock & data line high to prepare for sta
bit
                    BSET  DDRD,X,SDA+SCL      ;set serial data for output
                    BCLR  SPCR,X,$40          ;shut down spi & connect portD to output
                    NOP                       ;insert no ops for timing
                    NOP                       ;to make sure delay is long enough for start
                    BCLR  PORTD,X,SDA         ;pull data line low for start bit
                    LDAA  #$A0                ;send address for serial EE & write to addr 0
                    JSR   SEND_ADDR           ;go send first address byte
                    CLRA                      ;clear ACCA for data start location
                    JSR   SEND_ADDR           ;go send start address
                    RTS                       ;return to calling routine
;ADDRADDRADDRADDRADDRADDRADDRADDRADDRADDRADDRADDRADDRADDRADDRADDRADDRADDRADDR

;WRIWRIWRIWRIWRIWRIWRIWRIWRIWRIWRIWRIWRIWRIWRIWRIWRIWRIWRIWRIWRIWRIWRIWRIWRIWRI
;;                  THIS SUBROUTINE WRITES THE DATA POINTED TO BY IY TO THE EEPROM .
;;
```

```
;;                IF THE ROUTINE IS USED TO ADDRESS THE E^2, ACCA HOLDS THE DATA AND IY
;;                      MUST BE SET TO $F000 OR GREATER TO EXIT CORRECTLY.
;;
;;                THE ENTIRE HISTORICAL DATA FROM THE RAM WILL BE WRITTEN TO THE EEPROM
;;                      IF THE ROUTINE IS ENTERED AT WRITE_EE.
;*****************************************************************************
WRITE_EE          EQU   $
                  LDY   #PU_TRIP_CNT      ;GET FIRST BYTE ADDRESS TO STORE
                  LDX   #REGSTART         ;get onboard register address for clock & data
LOAD_NEXT_BYTE    EQU   $
                  LDAA  0,Y               ;load indexed from IY
;; a jump to this point sends only what is already loaded into ACCA
SEND_ADDR         EQU   $
                  BCLR  PORTD,X,SCL       ;set clock line low
                  BSET  DDRD,X,SDA        ;turn data into an output
                  CLC                     ;clear carry to use as hi/low bit indicator
                  LDAB  #08               ;load # of shifts for 1 byte
SET_CLOCK         EQU   $                 ;set clock low for loading bit onto serial bus
                  BCLR  PORTD,X,SCL       ;set clock line low
                  LSLA                    ;shift high bit to carry
                  BCC   DATA_LOW          ;if carry is low branch
                  BSET  PORTD,X,SDA       ;carry is set so set data bit high
                  JMP   DEC_B             ;go decrement bit counter
DATA_LOW          EQU   $
                  BCLR  PORTD,X,SDA       ;carry was clear so clear data bit
DEC_B             EQU   $
                  BSET  PORTD,X,SCL       ;set clock high to set in data
                  DECB                    ;decrement byte loop counter
                  BNE   SET_CLOCK         ;if not 0 go send the next byte
                  BCLR  PORTD,X,SCL       ;set clock low for acknowledge bit
                  BCLR  DDRD,X,SDA        ;turn portd to input for ack bit
                  LDAA  #$F0              ;load a max wait
                  LDAB  #SDA              ;get mask
WAIT_FOR_ACK      EQU   $
                  DECA                    ;dec max time
                  BEQ   NO_ACK            ;if time out leave
                  ANDB  PORTD,X           ;read port d for ack bit
                  BNE   WAIT_FOR_ACK      ;EEPROM not ready yet
NO_ACK            EQU   $
                  NOP
                  BSET  PORTD,X,SCL       ;set clock line high for acknowledge bit
                  INY                     ;increment IY to next byte?
                  CPY   #LT_MEM_RATIO     ;first byte thats not history data
                  BLO   LOAD_NEXT_BYTE    ;get ready to write next byte
                  CPY   #$F000            ;compare to address flag
                  BLO   SEND_STOP         ;if not address go send stop byte
                  BCLR  PORTD,X,SCL+SDA   ;set clock & data lines low
                  RTS                     ;return to address routine
SEND_STOP         EQU   $
                  BCLR  PORTD,X,SCL+SDA   ;set the clock low to prepare for stop command
                  BSET  DDRD,X,SDA        ;set data line to output
                  BSET  PORTD,X,SCL       ;set clock biut high
                  BSET  PORTD,X,SDA       ;set data bit high to signal stop

                  BSET  SPCR,X,$40        ;turn SPI on again
                  RTS                     ;return to calling routine
;WRIWRIWRIWRIWRIWRIWRIWRIWRIWRIWRIWRIWRIWRIWRIWRIWRIWRIWRIWRIWRIWRIWRIWRIWRI


;READREADREADREADREADREADREADREADREADREADREADREADREADREADREADREADREADRERAD
;
;;                THIS ROUTINE READS THE EEPROM AND STORES THE DATA INTO THE CORRECT RAM
;;                      LOCATIONS FOR HISTORICAL DATA.
;;
;;                ADDRESS_WEE MUST BE CALLED FIRST TO POSITION THE DATA POINTER TO THE
;;                      CORRECT DATA BYTE.
;;
;;                CALLED WITH ACCA, ACCB, IX, OR IY SET TO ANYTHING, ALL VARIABLES IN
;;                      THESE LOCATIONS ARE DESTROYED!!
;*****************************************************************************
READ_EE           EQU   $
                  LDY   #$F000            ;value to indicate sending an address
                  LDX   #REGSTART         ;index location for port D
                  BSET  PORTD,X,SDA       ;set clock & data lines high
                  BSET  DDRD,X,SCL+SDA    ;set data & clock for output
                  BSET  PORTD,X,SCL       ;set the clock high
                  NOP                     ;need to add delay for EE timing
```

```
                NOP                        ;this is to make sure start timing
                NOP                        ;has sufficient time
                BCLR  PORTD,X,SDA          ;set data line low for start bit

                LDAA  #$A1                 ;address for reading data
                JSR   SEND_ADDR            ;go send read command
;; after returning, the scl line is low
                LDY   #PU_TRIP_CNT         ;start of historical RAM locations
UNLOAD_EE       EQU   $
                LDAB  #08                  ;8 bits/byte
GET_NEXT_BIT    EQU   $
                BSET  PORTD,X,SCL          ;set clock high to hold data
                BRCLR PORTD,X,SDA,CLRC_BIT    ;see if this works to replace next 3 lin
                      ;brset takes 2 less instruction cycles
                SEC                        ;set carry for 1
                JMP    ROTATE_DATA         ;go rotate data into RAM
CLRC_BIT        EQU   $
                CLC                        ;clr carry to rotate a 0 into RAM
ROTATE_DATA     EQU   $
                ROL   0,Y                  ;rotate data into RAM pointed to by IY
                BCLR  PORTD,X,SCL          ;set the clock low
                DECB                       ;decrement bit counter
                BNE   GET_NEXT_BIT         ;not 8 bits yet so get next bit
;; THE ACKNOWLEDGE BIT IS SENT HERE.
                BCLR  PORTD,X,SDA          ;set data kline low
                BSET  DDRD,X,SDA           ;turn data to output
                BSET  PORTD,X,SCL          ;set clock high to catch acknowledge
                INY                        ;increment the byte pointer
                CPY   #LT_MEM_RATIO        ;compare to 1st non_hysterical byte
                BHS   GO_STOP              ;if all bytes recvd - send stop bit
                BCLR  PORTD,X,SCL          ;set the clock low
                BCLR  DDRD,X,SDA           ;return data line to an input
                JMP   UNLOAD_EE            ;go get the next byte

GO_STOP         EQU   $
                BSET  PORTD,X,SDA          ;set data & clk high for stop

                BSET  SPCR,X,$40           ;turn SPI on again
                RTS                        ;data all recalled so return
;READREADREADREADREADREADREADREADREADREADREADREADREADREADREADREADREADREADRERAD


EE_WAIT         EQU   $
                RTS                        ;GENERATES A WAIT WHILE WAITING FOR E^2 ERASE
                                           ; TO TRIP.
;=================== END OF ALL E SQUARED CODE ===================

;COPCOPCOPCOPCOPCOPCOPCOPCOPCOPCOPCOPCOPCOPCOPCOPCOPCOPCOPCOPCOPCOPCOPCOPCOPCOPCO
;               This routine resets the microP. onboard COP (computer operating
;                    propperly).
;               CALLED: With nothing preset to any conditions.
;
;               RETURNS: With IX set to start of onboard registers, ACCA equal to $AA.
;*******************************************************************************


RESET_COP       EQU   $
                LDX   #REGSTART
                LDAA  #$55                 ;LOAD A 01010101 TO ACCA
                STAA  COPRST,X             ;WRITE IT TO COP RESET REGISTER
                LDAA  #$AA                 ;LOAD A 10101010 TO ACCA
                STAA  COPRST,X             ;FINISH RESETTING THE COP
                RTS
;COPCOPCOPCOPCOPCOPCOPCOPCOPCOPCOPCOPCOPCOPCOPCOPCOPCOPCOPCOPCOPCOPCOPCOPCOPCOPCO


;STISTISTISTISTISTISTISTISTISTISTISTISTISTISTISTISTISTISTISTISTISTISTISTISTISTI
;;******************************************************************************
;               THIS SUBROUTINE SET_TBL_INDX,READS THE BREAKER ID AND THE SWITCH
;                    POSITION AND CALCULATES THE CORRECT POSITION IN A 1 WORD OR A
;                    2 WORD DELAY TABLE.
;               CALLED:
;               THE X REGISTER MUST CONTAIN THE CORRECT START OF TABLE.
;               THE Y REGISTER MUST CONTAIN THE CORRECT SWITCH ADDRESS.
;               THE A ACCUM CONTAINS THE NUMBER TO MULTIPLY ACCB BY TO FIND THE ROW.
;               IF FLAGS$ WORD_ALIGN_BIT IS SET TO 1,CREATE A 1 WORD INDEX.
;               IF FLAGS$ WORD_ALIGN_BIT IS A ZERO,CREATE A 2 WORD INDEX.
```

```
;
;                   RETURNS:
;                   THE X REGISTER POINTS TO THE CORRECT TABLE VALUE UPON RETURN
;                   ACCA & ACCB are not set to any given value. IY is not changed.
;*****************************************************************************

SET_TBL_INDX        EQU   $
                    JSR   READ_BREAKER_SW      ;go read the breakr type switch
CONT_TO_SET_INDX    EQU   $
                    LSRB                       ;from word to a byte boundary
                    DECB                       ;make type 0,1,2,3,4,5
                    BLE   READ_SW_IN_REG_Y
MULT_BY_TWO         EQU   $
                    MUL                        ;MULTIPLY TO FIND CORRECT ROW FOR BREAKER TYPE
                    ABX                        ;add breaker offset to x register
;; read and calculate the switch position,to add to the x resgister
READ_SW_IN_REG_Y    EQU   $
                    LDAB  0,Y                  ;read the switch value
                    ANDB  #MAX_SW_POS          ;MASK OFF BIT 0
                    BRSET FLAGS$,WRD_ALIGN_BIT,NOT_DBLWRD    ;IF SET BRANCH & DON'T SHIFT
                    LSLB                       ;2 word boundary
NOT_DBLWRD          EQU   $
                    ABX                        ;ADD ACCB TO INDEX X TO POINT TO CORRECT VALUE
                    RTS                        ;GO HOME
;STISTISTISTISTISTISTISTISTISTISTISTISTISTISTISTISTISTISTISTISTISTISTISTISTISTI


;ADJUST_LT_VOLTSADJUST_LT_VOLTSADJUST_LT_VOLTSADJUST_LT_VOLTSADJUST_LT_VOLTS
;;******************* ADJUST_LT_VOLTS ****************************************
;;                  THIS SUBROUTINE CALCULATES THE LONG TIME MEMORY CAP ACCUMULATOR VALUE,
;                         THEN COMPARES IT TO THE LONG TIME ACCUMULATOR AND ADJUSTS
;                         THE VOLTAGE ACCORDINGLY (turns portD bit 5 on or off).
;
;                   THIS ROUTINE IS CALLED WITH INDEX X SET FOR FLC OR LT RATIO TABLE,
;                         or on power up to 97% ratio tables.
;
;                   If SET_ACCUM_BIT is set, we have powered up with a voltage
;                         on the LT/FLC memory cap, and the LTA is restored.
;                   RESULT is used to return accumulator value from memory cap.
;!!!!!!!!!!!!!!!!!!!!!!!! RESULT USED !!!!!!!!!!!!!!!!!!!!!!!!!!!!!!
;*****************************************************************************

ADJUST_FLC_VOLTS    EQU   $
ADJUST_LT_VOLTS           EQU                  $
                    BRCLR LT_FLAGS,SET_ACCUM_BIT,ACCUM_ALREADY_SET
; If SET_ACCUM_BIT is high then we need to reconstruct a LT/FLC accumulator
                    JSR   CALC_LT_ACCUM        ;GO GET MEMORY RATIO VOLTAGE & FIGURE ACCUMULA
                    LDD   RESULT               ;load LT rebuilt accumulator result hi word
                    STD   LT_ACCUM             ;store LT accumulator into memory
                    LDD   RESULT+2             ;load rebuilt low word
                    STD   LT_ACCUM+2           ;store low word to memory
;; SET THE LT_ACCUM GREATER THAN ZERO FLAG IN LT_FLAGS
                    BSET  LT_FLAGS,LT_GTZ_BIT
                    BCLR  LT_FLAGS,SET_ACCUM_BIT  ;clear bit since Accum is calculated
                    RTS                        ;all done so leave

ACCUM_ALREADY_SET   EQU   $
                    JSR   CALC_LT_ACCUM        ;GO GET MEMORY RATIO VOLTAGE & FIGURE ACCUMULA
                    LDY   #RESULT              ;CALCULATED LT OR FLC ACCUMULATOR
                    LDX   #LT_ACCUM            ;HI WORD OF LT OR FLC ACCUMULATOR
                    JSR   COMP_DBL_WORD        ;COMPARE ACCUMULATOR VALUES
                    CMPA  #00                  ;ARE HIGH WORDS THE SAME
                    BGT   ADJUST_DOWN          ;RATIO >> LT_ACCUM/FLC ACCUM
                    BLT   ADJUST_UP            ;RATIO << LT_ACCUM/FLC ACCUM
;; IF WE GET HERE BOTH CALCULATED AND LT_ACCUM ARE EQUAL
                    RTS
ADJUST_UP           EQU   $
;; SET PORT BIT HIGH TO ADJUST VOLTAGE LEVEL UP
                    LDX   #REGSTART            ;GET ONBOARD REGISTER LOCATIONS
                    BSET  PORTD,X,$20          ;TURN ON OUTPUT TO INCREASE MEM DELAY
                    RTS
ADJUST_DOWN         EQU   $
;; SET PORT BIT LOW TO ADJUST VOLTAGE LEVEL DOWN
                    LDX   #REGSTART            ;GET ONBOARD REGISTER LOCATIONS
                    BCLR  PORTD,X,$20          ;TURN OFF OUTPUT TO DECREASE MEM DELAY
                    RTS
;ADJUST_LT_VOLTSADJUST_LT_VOLTSADJUST_LT_VOLTSADJUST_LT_VOLTSADJUST_LT_VOLTS
```

```
;;******************** COMP_DBL_WORDS ****************************************
;; THIS ROUTINE COMPARES TWO 4 BYTE VALUES, IY POINTS TO FIRST 4 BYTE VALUE
;;                    AND IX POINTS TO THE SECOND 4 BYTE VALUE.
;                  ACCA RETURNS THE RESULT OF THE COMPARE AS FOLLOWS:
;                       IF FIRST VALUE == 2ND VALUE THEN ACCA=0 ON RETURN
;                       IF 1ST VALUE >> 2ND VALUE THEN ACCA=2 ON RETURN
;                       IF 1ST VALUE << 2ND VALUE THEN ACCA=-1 ON RETURN

COMP_DBL_WORD     EQU   $
                  LDD   0,Y              ;HI WORD OF 1ST VALUE
                  CPD   0,X              ;HI WORD OF 2ND VALUE
                  BHI   SET_HIGHER       ;Y > X SET HIGHER BIT
                  BLO   SET_LOWER        ;X > Y SET LOWER BIT
HI_WRD_EQUAL      EQU   $
                  LDD   2,Y              ;LOW WORD OF 1ST VALUE
                  CPD   2,X              ;LOW WORD OF 2ND VALUE
                  BHI   SET_HIGHER       ;Y > X SET HIGHER BIT
                  BLO   SET_LOWER        ;X > Y SET LOWER BIT
LOW_WRD_EQUAL     EQU   $
                  CLRA                   ;1ST AND 2ND ARE EQUAL
                  RTS
SET_HIGHER        EQU   $
                  LDAA  #02              ;1ST IS GREATER THAN 2ND
                  RTS
SET_LOWER         EQU   $
                  LDAA  #$80             ;1ST IS LESS THAN 2ND
                  RTS

;;*************** CALC _LT_ACCUM *********************************************
;; THIS SUBROUTINE CALCULATES THE LONG TIME MEMORY CAPACITOR EQUIVALENT
;; ACCUMULATOR VALUE. THE LONG TIME DELAY SWITCH IS USED TO LOOK UP
;; THE CORRECT MULTIPLIER FROM THE TABLE LOCATION IN IX.
;;
;; THE MUL_16X16 SUBROUTINE IS USED FOR THE MULTIPLICATION THE RESULT IS PUT
;; INTO A 4 BYTE RAM LOCATION CALLED RESULT.
;;
;;CALLED WITH ACCX SET FOR EITHER LT OR FLC REBUILDING TABLE.
;!!!!!!!!!!!!!!!!!!!!!!!! RESULT USED !!!!!!!!!!!!!!!!!!!!!!!!!!!!!


CALC_LT_ACCUM     EQU   $

                  LDAB  LTDELSW          ;read the delay switch
                  ANDB  #MAX_SW_POS      ;mask off invalid #
                  ABX                    ;add to index
                  JSR   READ_BREAKER_SW  ;find if brkr SE or PB
                  CMPB  #$08             ;0A = SE
                  BLS   READ_RATIO       ;index correct so read ratio
                  LDAB  #16              ;get offset for next row
                  ABX                    ;add it to index
READ_RATIO        EQU   $

;; X REGISTER IS NOW POINTING TO THE PROPER TABLE POSITION
                  LDY   #MEM_RATIO       ;Y points to A/D MEM DELAY CAP VALUE
                  JSR   MUL_16X16        ;GO FIGURE MEM DELAY DIGITAL VALUE
;; mem ratio drops the least significant byte,so adjust the result
;; one byte to the left (multiply by $FF)
                  LDD   RESULT+1         ;GET LOW BYTE HIGH WORD
                  STD   RESULT           ;STORE IT TO HIGH BYTE HIGH WORD
                  LDD   RESULT+3         ;GET LOW BYTE LOW WORD + EXTRA BYTE
                  STD   RESULT+2         ;STORE TO LOW WORD DATA HAS BEEN SHIFTED
                  LDAB  MEM_RATIO+1      ;get memory ratio
                  LDAA  #$64             ;get 100 into ACCA
                  MUL                    ;multiply for percent
                  STAA  LT_MEM_RATIO     ;store byte for transmission
                  RTS

;**************************PHASE UNBALANCE**********************************
;; THIS SUBROUTINE CALCULATES PHASE UNBALANCE FOR ANY OF THE THREE PHASES
;;
;;                CALLED: IX points to phase of unbalance wanted
;;
;;                RETURNS: ACCB holds percent of unbalance*2 (used for .5% precision)
;;
;;                USED: ACCA, ACCB, IX
;!!!!!!!!!!!!!!! TEMP USED !!!!!!!!!!!!!!!
```

```
;!!!!!!!!!!!!!!!!!!!!!!!! RESULT USED !!!!!!!!!!!!!!!!!!!!!!!!!!!!!!
;*********************************************************************

PHASE_UNBALENCE     EQU   $
                    LDD   PHASA_SQRT        ;GET A PHASE SQUARE ROOT
                    ADDD  PHASB_SQRT        ;ADD B PHASE
                    ADDD  PHASC_SQRT        ;ADD C PHASE
                    STD   THREE_PHASE_SUM   ;STORE THE RESULT
;; WE HAVE SUMED UP ALL THREE PHASES,NOW GET 3*PHASE VALUE '
                    LDD   0,X               ;LOAD PHASE UNBALANCE IS WANTED FOR
                    ADDD  0,X               ;ADD IT TO ITSELF
                    ADDD  0,X               ;DO IT AGAIN SAM
                    STD   TEMP              ;save 3* phase value
;; now see if sum Of phases or 3* phases is greater value
                    CPD   THREE_PHASE_SUM   ;COMPARE SUM OF 3 PHASES TO 3*PHASE
                    BLO   SUM_IS_GREATER    ;BRANCH IF 3 PHASE SUM IS GREATER
                    SUBD  THREE_PHASE_SUM   ;SUBTRACT 3 PHASE SUM FROM 3*PHASE
                    STD   RESULT            ;3*phase - three_phase_sum
                    JMP   CONT_PHASE
SUM_IS_GREATER      EQU   $
                    LDD   THREE_PHASE_SUM   ;PUT 3 PHASE SUM IN ACCD
                    SUBD  TEMP              ;SUBTRACT 3*PHASE FROM 3 PHASE SUM
                    STD   RESULT            ;three_phase_sum - 3*phase
;; COMPARE RESULT TO THREE PHASE SUM
CONT_PHASE          EQU   $
                    CPD - THREE_PHASE_SUM   ;is ratio of phase > sum
                    BLO   FIND_THE_%        ;GO FIND UNBALANCE
;; SET % TO 99 WHICH IS THE MAXIMUM FOR PHASE UNBALENCE
                    LDAB  #199              ;maximum percent
                    JMP   BIT_DONE          ;return to main
FIND_THE_%          EQU   $
                    LDX   THREE_PHASE_SUM   ;diff of three phase sum & 3*phase
                    LDD   RESULT            ;numerator is three_phase_sum
                    FDIV                    ;do a fractional divide
                    XGDX                    ;put result into double register
                    CLRB                    ;clear ACCB for percent
                    LSLA                    ;shift into carry
                    BCC   BIT_2             ;go check bit 2
                    ADDB  #100              ;if set add 2^(-1)
BIT_2               EQU   $
                    LSLA                    ;shift into carry
                    BCC   BIT_3             ;go check bit 3
                    ADDB  #50               ;if set add 2^(-2)
BIT_3               EQU   $
                    LSLA                    ;shift into carry
                    BCC   BIT_4             ;go check bit 4
                    ADDB  #25               ;if set add 2^(-3)
BIT_4               EQU   $
                    LSLA                    ;shift into carry
                    BCC   BIT_5             ;go check bit 5
                    ADDB  #12               ;add 2^(-4)
BIT_5               EQU   $
                    LSLA                    ;shift into carry
                    BCC   BIT_6             ;go check bit 6
                    ADDB  #6                ;add 2^(-5)
BIT_6               EQU   $
                    LSLA                    ;shift into carry
                    BCC   BIT_7             ;go check bit 7
                    ADDB  #3                ;add 2^(-6)
BIT_7               EQU   $
                    LSLA                    ;shift into carry
                    BCC   BIT_8             ;all done so leave
                    ADDB  #2                ;add 2^(-7)
BIT_8               EQU   $
                    LSLA                    ;shift into carry
                    BCC   BIT_DONE          ;all done so leave
                    ADDB  #1                ;add 2^(-7)
BIT_DONE            EQU   $
                    RTS                     ; result in ACCB = 2x percent


;;********************** GLOBAL_TRIP *******************
;;THIS IS THE GLOBAL TRIP ROUTINE,CALLED BY ALL THE INDIVIDUAL TRIP ROUTINES
;;
;;          CALLED: MAX_IDENT = phase causing trip or GF
;;                  TRIP_FLAG = value for trip indicator
;;
;;
```

```
;;              RETURNS: nothing - reinitializes breaker code if no current for
;;                                 more than 128 mSec.
;;
;;!!!!!!!!!!!!!!!!! TEMP USED !!!!!!!!!!!!!!!!!

GLOBAL_TRIP     EQU   $
                JSR   RESET_COP          ;resest the watchdog
                BSET  IFLAGS,TRIPPING    ;set tripping flag so INST isn't run in interr
                CLR   T_250MS            ;clear 250 mSec timer
                LDX   #REGSTART          ;GET START OF ONBOARD REGISTERS
                BCLR  PORTD,X,MEM_CAP_BIT     ;turn off LT memory cap charging
                LDAA  #$02               ;get packet 2
                STAA  PACKET_PTR         ;tripping so only send packet #2
                STAA  PACKET_HOLDER      ;tripping so only send packet #2
                CLR   BYTE_PTR           ;reset to byte 0
                CLR   CHECK_SUM          ;clear checksum to start again
                JSR   SERIAL             ;go send first byte to tell of trip
                LDAA  RATING_PLUG        ;check for UTS
                ANDA  #SWITCH_MASK       ;mask unused bits
                CMPA  #$1C                     ;compare to tester or RP
                BGE   NO_EE_WRITE        ;if tester or UTS don't write to EE
                JSR   RESET_COP          ;reset the softdog timer
;; THIS SECTION PASSES ALL THE CURRENT DATA BEFORE WRITING TO EEPROM
                LDX   #A_PHASE_RMS       ;GET POINTER FOR CURRENT
                LDY   #A_PHASE_TRIP_I    ;get historical data pointer
MOVE_DATA       EQU   $
                LDD   0,X                ;get current data
                STD   0,Y                ;store it to history
                LDAB  #$02               ;current is a 16 bit word
                ABX                      ;add to pointer
                ABY                      ;add to pointer
                CPX   #OVPU_SCRIN        ;compare to odd byte
                BNE   HISTORY_CLASS_OVER      ;see if all data xfered
                INX                      ;go past odd byte
                INY                      ;do it to me too
HISTORY_CLASS_OVER    EQU                $
                CPX   #SC_PU_GF_PU       ;are we pointing past the last byte
                BLO   MOVE_DATA          ;no move next word
                LDX   MAX_PHASE_I        ;load max peak of phases
                LDAB  MAX_IDENT          ;get phase causing trip/max current
                ANDB  #$03               ;mask for trip phases only
                CMPB  #$03               ;compare for GF trip cause
                BLO   NOT_GF_CAUSE       ;trip not caused by GF
                LDX   GF_CURRENT         ;GF trip so save it to historical data
NOT_GF_CAUSE    EQU   $
                STX   LAST_MAX_I         ;store to EEPROM saved RAM
                CLR   TRIP_CAUSE         ;clear phase bits
                LDAA  OVPU_SCRIN         ;get phases > ovld
                ANDA  #$38               ;mask all but ovld
                STAA  TRIP_CAUSE         ;save it
                LDAA  SC_PU_GF_PU        ;SC pick up phases
                ANDA  #$07               ;maskall but SCPU
                ORAA  TRIP_CAUSE         ;combine
                STAA  TRIP_CAUSE         ;sc & ovld saved
                LDX   #REGSTART          ;onboard reg locations
                LDAA  PORTA,X            ;read restraints
                ANDA  #$06               ;mask for restraint lines
                CMPA  #$06               ;compare for  restr
                BEQ   NO_RESTRAINT       ;no active restraints
                BSET  TRIP_CAUSE,$40     ;both high = no restr
                JMP   SAVE_DATA          ;
NO_RESTRAINT    EQU   $
                BCLR  TRIP_CAUSE,$40     ;set bit restraint is off
SAVE_DATA       EQU   $
                JSR   ADDRESS_WEE        ;address the EEPROM for listening
                JSR   WRITE_EE           ;go write to EEPROM

NO_EE_WRITE     EQU   $
                JSR   RESET_COP          ;go reset the COP
                CLI                      ;TURN INTERRUPTS BACK ON
                LDAB  MAX_IDENT          ;get max phase to send
                ANDB  #$03               ;mask off unwanted data
                CMPB  #$03               ;is this GF
                BLO   DO_NORM_PEAK       ;no GF don't do prebyte multiply
                JSR   DO_GF_CONV         ;go do GF xmit conversion
                LDD   GF_CURRENT         ;get conversion result
                STD   MAX_PHASE_I        ;store to max phase/cause of trip current
```

```
                JMP   CHECK_TRIP_V      ;go check trip voltage
DO_NORM_PEAK    EQU   $
                LDY   #ST_PEAK          ;point to value
                LDX   #MAX_PHASE_I      ;point to storage
                JSR   I_CONVERSION      ;go convert to xmit format
CHECK_TRIP_V    EQU   $
                BRSET FLAGS$,KILL_WATCHDOG_BIT,KILL_TRIP_V;if soft trip don't send tri
signal
                LDX   #REGSTART         ;get start of onboard regs
                LDY   #TRIP_SUPPLY      ;get trip supply location
                BRCLR 0,Y,TRIP_VOLTS_OK,KILL_TRIP_V ;if low voltage kill trip coil vol
                LDAB  TRIP_FLAG         ;get cause of trip
                LDAA  PORTA,X           ;read the portA lines
                ANDA  #TRIP_BIT_O       ;check for trip bit
                ABA                     ;add in trip cause
                STAA  PORTA,X           ;write out to portA
                BSET  PORTA,X,TRIP_BIT_O     ;turn or keep trip volts on
                JMP   CHECK_SERIAL      ;see if ready for next byte
KILL_TRIP_V     EQU   $
                BCLR  PORTA,X,TRIP_BIT_O     ;low voltage kill trip signal
CHECK_SERIAL    EQU   $
                BRCLR SCSR,X,TRANSMIT_DONE,CHECK_RESET    ;if TDRE is not set wait
                JSR   SERIAL            ;TDRE is set so transmit
CHECK_RESET     EQU   $
                LDX   #HI_PHASEA        ;get pointer for current A/D
CHECK_AGAIN     EQU   $
                LDAB  0,X               ;get current A/D value
                CMPB  #$10              ;compare to A/D value of 10 - allow for noise
                BLS   NEXT_PHASE        ;if lower check next phase
                CLR   T_250MS           ;clear timer
                JMP   REPETE            ;not time to re-initialize yeti
NEXT_PHASE      EQU   $
                INX                     ;by 1 for 8 bit words
                CPX   #NEW_GF           ;compare to memory location
                BLS   CHECK_AGAIN       ;check until all phases have been checked
                LDAA  T_250MS           ;get timer for reinitialize
                BMI   RE_INIT           ;if we go 128 mSec w/ no current initialize TU
REPETE          EQU   $
                JMP   NO_EE_WRITE       ;play it again, Sam  till we die.
RE_INIT         EQU   $
                JMP   INITIALIZE        ;no current flowing so reinitialize the TU


;;*************************************************************************
.PAGE
;*************************************************************************
;               ROUTINE TO CHECK VT LINE BEFORE TRIPPING
;
;               Called with IY set for delay ( 1 pass equals 7uSec.)
;*************************************************************************
VT_CHECK        EQU   $
                LDX   #TRIP_SUPPLY      ;get trip supply location
IS_CAP_CHARGED  EQU   $
                BRCLR 0,X,TRIP_VOLTS_OK,RECHECK_CAP ;(7)if low voltage decrement & try
                BRA   GLOBAL_JUMP       ;return & trip
RECHECK_CAP     EQU   $
                DEY                     ;(4)
                BNE   IS_CAP_CHARGED    ;(3)check cap voltage again
GLOBAL_JUMP     EQU   $
                LDX   #REGSTART         ;start of registers
                BSET  PORTA,X,TRIP_BIT_O     ;TRIP BREAKER
                JMP   GLOBAL_TRIP



;;*********************** L O N G   T I M E *********************************
;; THIS SUB ROUTINE IS CALLED EVERY 64 MS BY THE EXEC
;; IF PEAK_SQRT IS ABOVE PICK_UP TABLE VALUE,PEAK SQUARE IS ADDED TO LT_ACCUM
;; IT COMPARES THE LT_ACCUM TO THE TRIP ACCUMULATION TABLE VALUE
;; IF THE LT_ACCUM IS > TABLE, A TRIP SEQUENCE IS EXEXCUTED
;;
;;              CALLED: When all 3 phase RMS values have been computed
;;
```

```
;;              RETURNS: With any Long Time pick up flags set
;;
;;              USES: ACCA, ACCB, IX, IY     RESTORES: nothing!!
; !!!!!!!!!!!!!!!!! TEMP USED !!!!!!!!!!!!!!!!
;!!!!!!!!!!!!!!!!!!!!!!!! RESULT USED !!!!!!!!!!!!!!!!!!!!!!!!!!!!

LONG_TIME       EQU   $
                LDX   #LT_PU_TBL
                LDAB  LTPUSW            ;READ LT  PU SW SETTING
                ANDB  #MAX_SW_POS       ;MASK OFF BIT ZERO
                STAB  TEMP              ;SAVE SWITCH VALUE
                ABX                     ;SET X TO OFFSET IN LT PU TABLE
                LDD   PEAK_SQRT         ;PEAK FOR LAST 64 MS
                CPD   0,X               ;COMP TO TABLE SW POSITION
                BHS   LT_PICK_UP        ;IN PICK UP STATE
                BCLR  LT_FLAGS,LT_PU_BIT      ;CLEAR PU STATE BIT
                LDX   #LT_PU90%_TBL     ;SET X TO POINT TO 90% PU TBL
                LDAB  TEMP              ;GET SAVED LT SWITCH VALUE
                ABX                     ;ACCB IS SW INDEX
                LDD   PEAK_SQRT         ;RELOAD PEAK SQUARE ROOT
                CPD   0,X               ;TEST FOR 90% PICK UP
                BHS   LT_GT_90%         ;WE ARE IN 90% PU STATE
                BCLR  LT_FLAGS,LT_PU90%_BIT   ;CLEAR 90% PU BIT
                JMP   DO_SWITCHES       ;ALL DONE SPARKY

LT_PICK_UP      EQU   $
                BSET  LT_FLAGS,LT_PU_BIT;SET STATE TO LT PICK UP
                BSET  LT_FLAGS,LT_GTZ_BIT     ;SET LT ACCUM > ZERO BIT
                BCLR  LT_FLAGS,LT_PU90%_BIT   ;IF IN 100% STATE CANT'T BE IN 90%
                LDX   #REGSTART         ;set index to start of 6811 registers
                BSET  PORTA,X,LED_BIT_O ;we have pick up,so set led on
                LDX   #PEAK_SQRT        ;SET X REGISTER FOR MULTIPLY
                LDY   #PEAK_SQRT        ;SET Y REGISTER FOR MULTIPLY
                JSR   I_SQUARE          ;SQUARE THE RMS ROOT
                LDD   RESULT+2          ;GET THE I SQUARE LOW WORD
                LDX   #LT_ACCUM         ;X POINTS TO LT ACCUM
                JSR   ACCUM4_ADD        ;ADD I**2 TO LT ACCUM
                LDD   RESULT            ;GET HI WORD OF CURRENT SQUARED
                ADDD  LT_ACCUM          ;ADD HI WORD OF LT_ACCUM
                STD   LT_ACCUM          ;STORE IN HI WORD OF LT_ACCUM
                LDX   #LT_DEL_TBL       ;DELAY TABLE START ADDRESS IN X
                LDY   #LTDELSW          ;LT_DELSW ADDRESS IN Y
                LDAA  #32               ;MULTIPLY BY 32,5 SHIFT LEFTS
                BCLR  FLAGS$,WRD_ALIGN_BIT    ;CLEAR BIT 1 FOR DBL WORD INDEX
                JSR   SET_TBL_INDX      ;CREATE 4 BYTE INDEX POINTER
;; COMPARE THE LT ACCUMULATOR TO THE DELAY TABLE
                LDY   #LT_ACCUM         ;1ST COMPARE VALUE IN Y
                JSR   COMP_DBL_WORD     ;COMP THE DOUBLE WORDS
                CMPA  #00               ;IF ACCA >= 0 TIME TO TRIP
                BGE   LT_TRIP           ;LT_ACCUM >> TABLE DELAY VALUE
                JMP   DO_SWITCHES       ;WE ARE STILL ALIVE
LT_GT_90%       EQU   $                 ;90% PICK UP SEQUENCE
                BSET  LT_FLAGS,LT_PU90%_BIT   ;SET STATE TO 90% PICK UP
DO_SWITCHES     EQU   $
;**SWITCH COMMUNICATIONS MUST BE KEPT HERE OR TEMP MUST HOLD LT SWITCH VALUE**
                JSR   DO_LT_FLC_SW_COMM ;GO DO SERIAL COMM FOR SWITCHES
                RTS                     ;RETURN TO MAIN FLOW

;***************IF WE EXCEED LT DELAY VALUE WE END UP HERE*******************
LT_TRIP         EQU   $
                SEI                     ;NO MORE INTERUUPTS PLEASE!
                JSR   RESET_COP         ;go reset the softdog
                LDX   #REGSTART
                BCLR  TRIP_STATUS_BYTE,$70    ;CLEAR TRIP CAUSE
                BSET  TRIP_STATUS_BYTE,$10    ;SET CAUSE OF TRIP AS LT TRIP
COMMON_LONG     EQU   $
                LDAA  LT_TRIP_CNT       ;increment # of LT trips
                ANDA  #63               ;mask off unused bits
                CMPA  #63               ;max trip #
                BHS   CLR_LT_TRIPS      ;if high bit clear leave
                INC   LT_TRIP_CNT       ;still room - increment counters
                JMP   GO_GLBAL          ;continue
CLR_LT_TRIPS    EQU   $
                CLR   LT_TRIP_CNT       ;clear counter for rollover

GO_GLBAL        EQU   $
                BCLR  FLAGS$,KILL_WATCHDOG_BIT      ;not a soft trip so clr kill bit
```

```
                    LDX    #REGSTART           ;onboard register locations
                    LDAA   #LED_BIT_O          ;get value to turn on LT trip line
                    STAA   PORTA,X             ;turn line on
                    STAA   TRIP_FLAG           ;SAVE FOR TRIP OUTDICATOR
                    BSET   LT_TRIP_CNT,$40     ;cause of trip = long time
                    BCLR   PU_TRIP_CNT,$40     ;cause of trip =! phase unbal
                    BCLR   SC_TRIP_CNT,$40     ;cause of trip =! short circuit
                    BCLR   GF_TRIP_CNT,$40     ;cause of trip =! gnd fault
                    BCLR   SOFT_TRIP_CNT,$40   ;cause of trip =! soft dog
                    LDY    #DELAY_32MS                  ;
                    JMP    VT_CHECK            ;GO CHECK TRIP VOLTAGE


;;************************** ACCUM4_ADD ****************************************
;;
;; ADDS I**2 IN THE DBL ACCUM TO THE 4-BYTE ACCUM POINTED TO BY X
;; X POINTS TO ANY 4 BYTE ACCUMULATOR
;; DBL REGISTER CONTAINS THE 16 BIT VALUE TO ADD TO THE ACCUMULATOR

ACCUM4_ADD          EQU    $
                    ADDD   2,X                 ;ADD DBL ACCUM TO LOW WORD
                    STD    2,X                 ;STORE LOW WORD OF 4 BYTE ACCUM
                    BCC    ACCUM4_RET          ;NO CARRY BIT,ALL DONE
                    LDD    0,X                 ;GET HI WORD OF 4 BYTE ACCUM
                    ADDD   #1                  ;ADD CARRY BIT TO HI WORD
                    STD    0,X                 ;STORE DBL ACCUM IN HI WORD
ACCUM4_RET          EQU    $
                    RTS


;;********************** LT_DEC_ACCUM ******************************************
;; THIS ROUTINE IS CALLED BY THE EXEC EVERY 12 MS
;; IF PEAK_SQRT IS BELOW PICK_UP,IT WILL DEC LT_ACCUM BY ONE OF THE FOLLOWING
;; IF LT_ACCUM > 22 SECONDS IT WILL SUBTRACT LT_ACCUM/2**19 FROM LT_ACCUM
;; ELSE IT WILL SUBTRACT LT_ACCUM/2**16 FROM THE LT_ACCUM
;;
;;                  CALLED: According to description above
;;
;;                  RETURNS: Nothing, works on LT_ACCUM memory location.
;;
;;                  USES: ACCA, ACCB, IX    RESTORES Nothing!!

;!!!!!!!!!!!!!!! TEMP USED !!!!!!!!!!!!!!!!!

FLC_DEC_ACCUM       EQU    $
LT_DEC_ACCUM        EQU    $
;; TEST FOR LT_ACCUM > 22 SECONDS

                    LDD    LT_ACCUM            ;LOAD HI WORD LT_ACCUM
                    BEQ    HI_WORD_IS_ZERO     ;is hi word = 0 branch
                    CPD    #$051C              ;COMP TO 22 SECONDS
                    BHI    LT_GT_22SECS        ;YES IT'S ABOVE 22 SECONDS
                    BLO    CONT_LT_DEC         ;lower so dec by 1/(2**16)
                    LDD    LT_ACCUM+2          ;GET LOW WORD OF LT_ACCUM
                    BNE    LT_GT_22SECS        ;HI WORD =$051C,LOW WORD >0
                    JMP    CONT_LT_DEC         ;low word = 0
HI_WORD_IS_ZERO     EQU    $
;; SUBTRACT 1 FROM LOW WORD OF 4 BYTE ACCUM IF HI WORD =0 & LOW <> 0
                    LDD    LT_ACCUM+2          ;GET LOW WORD OF 4 BYTE ACCUM
                    BNE    LT_SUB_1            ;NOT ZERO YET
                    BCLR   LT_FLAGS,LT_GTZ_BIT     ;CLEAR LT_ACCUM GT ZERO BIT
                    RTS
LT_SUB_1            EQU    $
                    SUBD   #1                  ;SUB ONE
                    STD    LT_ACCUM+2          ;PUT IN LOW WORD OF 4 BYTE ACCUM
                    BNE    LT_RETURN           ;NOT ZERO
                    BCLR   LT_FLAGS,LT_GTZ_BIT     ;CLEAR LT_ACCUM GT ZERO BIT
LT_RETURN           EQU    $
                    RTS                        ;ZERO HI WORD,RETURN
CONT_LT_DEC         EQU    $
                    LDX    #LT_ACCUM           ;SET X TO ADDRESS OF LT_ACCUM
                    JSR    SUB_2__16           ;DEC LT_ACCUM BY 2**16
                    RTS                        ;ALL DONE,RETURN TO EXEC

LT_GT_22SECS        EQU    $
;; SUBTRACT 2**19 FROM LT_ACCUM
                    LDD    LT_ACCUM            ;LOAD HI WORD OF LT_ACCUM
```

```
                LSRD                            ;DIVIDE BY 2
                LSRD                            ;DIVIDE BY 4
                LSRD                            ;DIVIDE BY 2 = 2**19
                STD    TEMP                     ;SAVE 2**16 IN TEMP
                LDD    LT_ACCUM+2               ;get LT_ACCUM
                SUBD   TEMP                     ;subtract LTA/2^19
                STD    LT_ACCUM+2               ;Save TO LT_ACCUM
                BCC    DONE_W_SUBT              ;no carry needed so done
                LDX    LT_ACCUM                 ;SET X BACK TO LT_ACCUM
                DEX
                STX    LT_ACCUM                 ;SET X BACK TO LT_ACCUM
DONE_W_SUBT     EQU    $
                RTS

;;**************** SUB_2**16 SUBROUTINE ****************************************
;; SUBTRACTS 2**16 FROM ANY 4 BYTE ACCUM POINTED TO BY X

SUB_2__16       EQU    $
                LDD    2,X                      ;GET LOW WORD OF 4 BYTE ACCUM
                SUBD   0,X                      ;SUBTRACT HI WORD OF 4 BYTE ACCUM
                STD    2,X                      ;STORE LOW WORD OF 4 BYTE ACCUM
                BCC    SUB_RETRN                ;IF CARRY BIT CLEAR,ALL DONE
                LDD    0,X                      ;GET HI WORD OF 4 BYTE ACCUM
                SUBD   #1                       ;SUBTRACT CARRY BIT
                STD    0,X                      ;STORE HI WORD OF 4 BYTE ACCUM
SUB_RETRN       EQU    $
                RTS
;*****************************************************************************
;*************** END OF LONG TIME ACCUMULATOR DECREMENT *******************

;*********************** FIND_SQRT_PK ************************
;****THIS ROUTINE SETS THE PEAK RMS OF THE THREE PHASES  ****
;               CALLED: No values passed, uses square root memory values
;
;               RETURNS: With PEAK_SQRT holding maximum square root value
;
;               USES: IX                        RESTORES: Nothing!!
;**************************************************************
FIND_SQRT_PK    EQU    $
                LDX    PHASA_SQRT               ;get A phase root
                CPX    PHASB_SQRT               ;compare it to B phase
                BHS    CHECK_PHASEC             ;if A is high or = branch
                LDX    PHASB_SQRT               ;else load B phase
CHECK_PHASEC    EQU    $
                CPX    PHASC_SQRT               ;compare to C phase
                BHS    STORE_NU_PEAK            ;if current double still high go store it
                LDX    PHASC_SQRT               ;else get phase C current
STORE_NU_PEAK   EQU    $
                STX    PEAK_SQRT                ;store double to SQRT PEAK
                RTS                             ;RETURN WITH DATA

;********************* DO_LT_FLC_SW_COMM ************************
;***THIS SECTION DOES THE COMMON SWITCH COMMUNICATIONS FOR LT & FLC SWITCHES***
;               CALLED: No variables passed to routine
;
;               RETURNS: LT_SWITCHES set to Long Time PU & delay values
;
;               USES: ACCA, ACCB        RESTORES NOTHING!!
;********************************************************

DO_LT_FLC_SW_COMM EQU  $
                LDAA   LTPUSW                   ;get PU position
                ANDA   #MAX_SW_POS              ;mask off unwanted bits
                LSRA                            ;shift to low 3 bits
                LDAB   LTDELSW                  ;get delay switch value
                ANDB   #MAX_SW_POS              ;mask off unwanted bits
                LSLB                            ;shift to high 3 bits
                LSLB                            ;same as above
                ABA                             ;combine bits from ACCA & ACCB
                STAA   LT_SWITCHES              ;save for xmit  10-4
                RTS

;*************************** LT_SERIAL_BITS **********************************
;*****************THIS SECTION SETS LT PU COMMUNICATION BITS*******************
```

```
;
;                   CALLED: Without any values passed
;
;                   RETURNS: Overload pick up information for each phase in OVPU_SCRIN
;                                communication buffer memory.
;
;                   USES: ACCA, ACCB, IX, IY       RESTORES: Nothing!!
;***************************************************************************
LT_SERIAL_BITS     EQU   $
                   BRSET LT_FLAGS,LT_PU_BIT,PHASE_IN_PU      ;if in PU find phases
                   BRSET LT_FLAGS,LT_PU90%_BIT,PHASE_IN_PU   ;if > 90% PU find phases
                   BCLR  OVPU_SCRIN,$3F    ;clear all 90% & PU bits
                   JMP   BITS_SET          ;done so leave
PHASE_IN_PU        EQU   $
                   LDX   #LT_PU_TBL        ;GET TABLE LOCATION
                   LDY   #LT_PU90%_TBL     ;check 90 % pu
NOT_MTR_CODE       EQU   $
                   LDAB  LTPUSW            ;READ LONG TIME PU SWITCH
                   ANDB  #MAX_SW_POS       ;mask off unused readings
                   ABX                     ;add offset directly to IX
                   ABY                     ;add it to IY
                   LDD   PHASA_SQRT        ;get A phase square root
                   CPD   0,X               ;compare to pick up
                   BLO   CLR_COMM_BITS     ;if lower no pickup
                   BSET  OVPU_SCRIN,$09    ;set for A phase pick up
                   JMP   TRY_BPHASE        ;go check next
CLR_COMM_BITS      EQU   $
                   BCLR  OVPU_SCRIN,$09    ;clear PU bits
                   LDD   PHASA_SQRT        ;get value
                   CPD   0,Y               ;compare it
                   BLO   TRY_BPHASE        ;if low do next phase
                   BSET  OVPU_SCRIN,$01    ; set 09 % pu in communications
TRY_BPHASE         EQU   $
                   LDD   PHASB_SQRT        ;get A phase square root
                   CPD   0,X               ;compare to pick up
                   BLO   CLR_SER_BITS      ;if lower no pickup
                   BSET  OVPU_SCRIN,$12    ;set for A phase pick up
                   JMP   TRY_CPHASE        ;go check next
CLR_SER_BITS       EQU   $
                   BCLR  OVPU_SCRIN,$12    ;clear PU bits
                   LDD   PHASB_SQRT        ;get value
                   CPD   0,Y               ;compare it
                   BLO   TRY_CPHASE        ;if low do next phase
                   BSET  OVPU_SCRIN,$02    ; set 09 % pu in communications
TRY_CPHASE         EQU   $
                   LDD   PHASC_SQRT        ;get A phase square root
                   CPD   0,X               ;compare to pick up
                   BLO   CLEAR_SER_BITS    ;if lower no pickup
                   BSET  OVPU_SCRIN,$24    ;set for A phase pick up
                   JMP   BITS_SET          ;go check next
CLEAR_SER_BITS     EQU   $
                   BCLR  OVPU_SCRIN,$24    ;clear PU bits
                   LDD   PHASC_SQRT        ;get value
                   CPD   0,Y               ;compare it
                   BLO   BITS_SET          ;if low do next phase
                   BSET  OVPU_SCRIN,$04    ; set 09 % pu in communications
BITS_SET           EQU   $
                   RTS                     ;return to calling routine

;;;***************** END  L O N G   T I M E  R O U T I N E S****************
.PAGE

;;!!!!! S H O R T  T I M E  R O U T I N E S  S T A R T  H E R E !!!!!
;;************************ ST_ISQ_IN *************************
;;                  CALLED: Every 11mSec. when a ST I^2 in delay calculation is needed
;;
;;                  RETURNS: Returns with ST_ACCUM increased by Ipeak^2, or
;;                        never returns and trips the breaker.
;;
;;                  USED: ACCA, ACCB, IX, & IY    RESTORES: NOTHING!!!!!
;!!!!!!!!!!!!!!!!!!!!!!!! RESULT USED !!!!!!!!!!!!!!!!!!!!!!!!!!!!!

ST_ISQ_IN          EQU   $
                   LDX   #ST_PEAK          ;POINT TO LATEST PEAK PHASE IN X REG
                   LDY   #ST_PEAK          ;POINT TO LATEST PEAK PHASE IN Y REG
                   JSR   I_SQUARE          ;MULT X TIMES Y
DOUBLE_FOR_INIT    EQU   $
```

```
                LDX   #ST_ACCUM          ;SET X REG TO ST ACCUMULATER
                LDD   RESULT+2           ;GET LOW WORD OF I SQUARE RESULT
                JSR   ACCUM4_ADD         ;ADD I**2 TO 4 BYTE ST ACCUMULATER
                LDD   RESULT             ;HI WORD OF I SQUARE
                ADDD  ST_ACCUM           ;ADD HI WORD OF ST_ACCUM
                STD   ST_ACCUM           ;PUT RESULT IN ST_ACCUM
                BRCLR ST_FLAGS,DOUBLE_ST_I2_BIT,CALCULATE_ST_TRIP
;*********** if double bit not set don't double I^2 addition ************
                BCLR  ST_FLAGS,DOUBLE_ST_I2_BIT     ;clear before rerun I^2 add
                JMP   DOUBLE_FOR_INIT    ;go double I^2 accumulation
CALCULATE_ST_TRIP
                LDX   #ST_ISQ_DEL        ;SET X REG TO ST I**2 DEL TABLE
                LDY   #STDELSW           ;SET Y REGISTER TO ST DELAY SW
                LDAA  #32                ;MULT BY 16,SHIFT LEFT 4
                BCLR  FLAGS$,WRD_ALIGN_BIT    ;SET FOR DBL WORD BOUNDARY REQUEST
                JSR   SET_TBL_INDX        ;CALL TABLE INDEX ROUTINE
                LDY   #ST_ACCUM           ;1ST COMPARE VALUE IN Y
                JSR   COMP_DBL_WORD       ;COMPARE ST_ACCUM TO DELAY TABLE
                CMPA  #00
                BGE   ST_TRIP             ;ST_ACCUM >= TABLE DELAY
                RTS                       ;RETURN FROM ST I**2 CODE TO MAIN

;;************* S H O R T   T I M E   T R I P ******************************
;;
;;              CALLED: From any SHORT TIME routine that needs to generate a trip.
;;                   INST & LRC call the portion of this routine that starts at
;;                   DO_SC_TRIP to finish setting up historic data before jumping
;;                   to GLOBAL_TRIP.
;;
;;              RETURNS: Jumps to GLOBAL_TRIP with historic data locations ready to be
;;                   stored to EEPROM.
;;
;;              USED: ACCA, ACCB, & IX       RESTORED: NOTHING - TRIPS BREAKER
;;
;;*****************************************************************************


ST_TRIP         EQU   $
                SEI                                        ;NO MORE INTERUUPTS PLEASE!

;**THIS SECTION CONTAINS TRIP CODE FOR SHORT TIME. ***********
COMMON_ST       EQU   $
                BCLR  SC_PU_GF_PU,$07    ;clear SC PU bits to set phase(s) > PU
                LDX   ST_TABLE_POS       ;get saved table position
                LDD   0,X                ;get pick up value in double
                CPD   A_PHASEX6          ;compare to A phase for comm bits
                BHI   TEST_NEXT_PHASE    ;if PU > value try next phase
                BSET  SC_PU_GF_PU,$01    ;SET A PHASE SC BIT
TEST_NEXT_PHASE EQU   $
                CPD   B_PHASEX6          ;compare to B phase for comm bits
                BHI   TEST_C_PHASE_NEXT  ;if PU > value try next phase
                BSET  SC_PU_GF_PU,$02    ;SET B PHASE SC BIT
TEST_C_PHASE_NEXT EQU $
                CPD   C_PHASEX6          ;compare to C phase for comm bits
                BHI   DO_SC_TRIP         ;if PU > value try next phase
                BSET  SC_PU_GF_PU,$04    ;SET C PHASE SC BIT

;;******* INST & LRC TRIP USE COMMON CODE FROM THIS POINT ON **************
DO_SC_TRIP      EQU   $
                JSR   RESET_COP          ;reset the softdog - keep it happy
                LDX   #REGSTART
                BCLR  TRIP_STATUS_BYTE,$70     ;CLEAR TRIP CAUSE
                BSET  TRIP_STATUS_BYTE,$20     ;SET CAUSE OF TRIP AS SC TRIP
                LDAA  SC_TRIP_CNT        ;get # of trips
                ANDA  #63                ;max # trips to store
                CMPA  #63                ;compare to max # of trips
                BHS   CLR_SC_CNT         ;clear count
                INC   SC_TRIP_CNT        ;increment # of SC TRIPS
                JMP   GO_GLOBAL          ;if high bit clear leave
CLR_SC_CNT      EQU   $
                CLR   SC_TRIP_CNT        ;clear counter for rollover

GO_GLOBAL       EQU   $
                LDX   #REGSTART
```

```
                LDAA  #SC_RESTR_BIT_OUT ;get value to turn on SC trip line
                STAA  PORTA,X           ;turn line on
                STAA  TRIP_FLAG         ;save for trip outdicator display use
                BCLR  LT_TRIP_CNT,$40   ;cause of trip =! long time
                BCLR  PU_TRIP_CNT,$40   ;cause of trip =! phase unbal
                BSET  SC_TRIP_CNT,$40   ;cause of trip = short circuit
                BCLR  GF_TRIP_CNT,$40   ;cause of trip =! gnd fault
                BCLR  SOFT_TRIP_CNT,$40 ;cause of trip =! soft dog
                BCLR  FLAGS$,KILL_WATCHDOG_BIT      ;not a soft trip so clr kill bit
                LDY   #DELAY_2MS        ;get 2 mS delay
                JMP   VT_CHECK          ;GO CHECK TRIP VOLTAGE

;;***************      C H E C K   S T   1 2 M S     *********************
;;
;;              CALLED: Every 12mSec to do Short Time peak function checks.
;;                   No preset conditions are required for calling.
;;                   Motor Protection shares part of the same routine to
;;                   clear its peak LRC values.
;;
;;              RETURNS: Peak phase currents for all 3 phases are cleared. ST_PEAK
;;                   is cleared. GF desense and ST pick up are set or cleared as
;;                   needed.
;;
;;              USED: ACCA, ACCB, IX          RESTORED: NOTHING !!!!!!
;;
;;***************************************************************************

CHECK_ST_12MS   EQU   $
                BRSET ST_FLAGS,NO_ST_BIT,SHORT_TIME_NOT_INSTALLED
;IF ST NOT INSTALLED JUST CLEAR STPU BIT DON'T CHECK FOR PU
                LDX   ST_TABLE_POS      ;get saved table position
                LDD   ST_PEAK           ;get latest ST peak
                CPD   0,X               ;compare to pu tbl
                BLS   SHORT_TIME_NOT_INSTALLED     ;<= table, no pick-up clear flag
;                                        if in STPU turn on super desense
                BSET  GF_FLAGS,SUPER_DESENSE  ;turn on super desense
                BRA   SET_DESENSE_FLAG  ;turn on normal flag

;;*********** IF WE GET HERE WE DO NOT HAVE A SHORT TIME PICK UP ************
SHORT_TIME_NOT_INSTALLED                EQU   $
                BCLR  ST_FLAGS,ST_PU_BIT;WE DON'T HAVE A PU SO CLEAR IT
                BCLR  SC_PU_GF_PU,$07   ;no pickup so clear all phase pickups


;; MOTOR PROTECTION WILL CALL AT THIS POINT TO CLEAR PEAK OF PHASES
RETURN_CLEARED  EQU   $
                LDD   ST_PEAK           ;GET PEAK OF LAST 11 mSEC
                BRSET INST_FLAGS,INST_OFF_BIT,CHECK_FOR_3XP     ;IF INST OFF DON'T CHE
                LDX   INST_TABLE_VAL    ;get inst PU value

;; turn Desense ON or OFF as appropriate via the ST_PEAK value determined
;; in the MAIN task.  This gives the desense a less reactive appearance.

                CPD   0,X               ;compare to Inst pick up value
                BLO   CHECK_FOR_3XP     ;check for norm desense
                BSET  GF_FLAGS,SUPER_DESENSE  ;turn on super desense
                BRA   SET_DESENSE_FLAG  ;turn on normal flag
CHECK_FOR_3XP   EQU   $
                BCLR  GF_FLAGS,SUPER_DESENSE  ;if < 6xP turn super desense off
                CPD   #DESENSE_THRESHOLD;compare to Desense threshold
                BLO   CLR_DESENSE       ;if below - jump
SET_DESENSE_FLAG EQU  $
                BSET  GF_FLAGS,TURN_ON_DESENSE      ;turn on desense
                JMP   CLR_PK_VALS       ;go clear ST peaks for next 11mS values
CLR_DESENSE     EQU   $

                BCLR  GF_FLAGS,TURN_ON_DESENSE      ;turn off desense
                LDX   #REGSTART         ;point to registers
                BCLR  PORTD,X,GF_DESENSE_BIT_OUT    ;turn off desense

CLR_PK_VALS     EQU   $
                LDD   #00               ;GET VALUE OF 0 FOR PEAK RESET
                STD   ST_PEAK           ;RESET ST_PEAK FOR NEXT 12 mSEC PEAK
                STD   A_PHASEX6         ;clear peak of A phase
                STD   B_PHASEX6         ;clear peak of B phase
                STD   C_PHASEX6         ;clear peak of C phase
                RTS                     ;STPU IS EITHER CLEARED OR LEFT SET SO RETURN
```

```
;;TTTTTTTTTTTTTTTTTTTTTTTTTTT ST_RETN_TIMOUT TTTTTTTTTTTTTTTTTTTTTTTTTTTTT
;;
;;                  CALLED: From a 36mSec. ST retention timer time out.
;;
;;                  RETURNS: ST accumulator cleared, ST I^2 out timer cleared,
;;                       Unrestrained ST timer, & Double Accumulator flag cleared.
;;
;;                  USED: ACCA, & ACCB            RESTORED: NOTHING !!!!!
;;*************************************************************************
ST_RETN_TIMOUT      EQU   $
                    LDAA  #33               ;st fast timer value = 33ms
                    STAA  ST_FTIMER         ;reset st fast timer to 33ms
                    LDD   #$FFFF            ;load timer null value
                    STD   ST_I2_OUT_TIMER   ;null I^2 out timer
                    STAA  ST_RETN_TIMER     ;null ST retention timer
CLR_ST_ACCUM        EQU   $                 ;clear I^2in accumulator here
                    LDD   #0000
                    STD   ST_ACCUM          ;set hi word st accum to zero
                    STD   ST_ACCUM+2        ;set low word st accum to zero
                    BCLR  ST_FLAGS,DOUBLE_ST_I2_BIT     ;don't double I^2 values
                    RTS                     ;return to caller

;;TTTTTTTTTTTTT 10 MS RESTRAINT TIME OUT TTTTTTTTTTTTTTTTTTTTTTTTTTTTTTTTTTTTT
;;
;;                  CALLED: From an 11mSec ST restraint timer time out.
;;
;;                  RETURNS: SC_RESTRN_TIMER reset to $FF.
;;
;;                  USED: IX                        RESTORED: NOTHING !!!!!!!!!!
;;*************************************************************************
SC_RESTRN_OFF       EQU   $
;; IF WE GET HERE THERE ARE NO SC PICK UPS SO CLEAR SC RESTRAINT OUTPUT
                    LDX   #REGSTART
                    BCLR  PORTA,X,SC_RESTR_BIT_OUT      ;clear restraint bit
                    BSET  SC_RESTRN_TIMER,$FF      ;set timer number to null
                    RTS
;**********************END OF SHORT TIME ROUTINES****************************
.PAGE


;; A L L   G R O U N D   F A U L T   R O U T I N E S   A R E   H E R E

;;********************** CHECK_FOR_GF ******************************
;;
;;                  CALLED: Every 2mSec. from breaker or motor protection code.
;;                       No preset conditions or values passed in any registers.
;;
;;                  RETURNS: Condition of GF restr in line. 2mSec. GF peak cleared.
;;                       2mSec GF peak is passed to the 13mSec GF peak location(maybe)
;;                       GF pick up bit set if in pick up. GF switches stored for
;;                       communication purposes. Starts GF retention timer if needed,
;;                       and appropriate GF delay timer/accumulator
;;
;;                  USED: ACCA, ACCB, IX, & IY    restored: NOTHING !!!!!!!
; !!!!!!!!!!!!!!!!!!!!!!!! TEMP USED !!!!!!!!!!!!!!!!!!!!!!!!!!!!!!!!!!!
CHECK_FOR_GF        EQU   $
                    LDX   #REGSTART         ;GET ONBOARD REGISTER START
                    BRCLR PORTA,X,GF_RES_IN,SET_BIT     ;IF WE HAVE GF REST IN SET BIT
                    BCLR  MAX_IDENT,GF_REST_ACTIVE      ;NO GF REST SO CLEAR GF REST XMIT
                    JMP   IS_GF_INSTALLED   ;DONE SO CONTINUE WITH GF CHECKS
SET_BIT             EQU   $
                    BSET  MAX_IDENT,GF_REST_ACTIVE      ;RECEIVING GF REST SO SET GF REST
BIT
IS_GF_INSTALLED           EQU               $
                    BRCLR FLAGS$,NO_GF_BIT,SET_GF_PEAK  ;BIT 0 SET,GO DO ST
                    JMP   EXIT_GF           ;GF NOT INSTALLED LEAVE GF SECTION

SET_GF_PEAK         EQU   $
                    LDAB  CUR_GF            ;LOAD CURRENT GF VALUE
                    CLR   CUR_GF            ;CLEAR 2mSEC GF PEAK MEMORY
                    CMPB  GF_PEAK           ;COMPARE NEW GF TO GF PEAK DATA
                    BLS   GF_INSTALLED      ;IF NEW VALUE IS LOWER BRANCH
                    STAB  GF_PEAK           ;NEW IS HIGHER SO MAKE IT PEAK
;;; GF PHASE STORE NEW GF PEAK ATOD ;;;;;;;;;;;;;;;;;;;;;;;;;;;;;;;;;;;;

GF_INSTALLED        EQU   $
```

```
                        LDAB   SENSOR              ;READ SENSOR SWITCH IN THE B ACCUM
                        ANDB   #SWITCH_MASK        ;mask bits above 1E
                        CMPB   #$1A                ;1A = max sensor
                        BLS    CONTINUE_WITH_GFPU_CHK
                        LDAB   #$1A                ;load max sensor
CONTINUE_WITH_GFPU_CHK  EQU                        $
                        SUBB   #$10                ;SUBTRACT $10, for 1600 A sensor
                        BMI    SET_TO_ZERO         ;if sensor < 1600A result is neg so branch
                        LSRB                       ;SHIFT ACCUM B TO THE RIGHT,DIVIDE BY 2
                        LDAA   #16                 ;16 BYTES IN TABLE FOR EACH SENSOR
                        MUL                        ;GET TABLE POSITION FOR THIS SENSOR
                        JMP    ADD_TEMP            ;GO ADD START OF TABLE,PLACED IN TEMP
;; CLEAR THE DOUBLE ACCUMULATOR IF SENSOR VALUE IS ZERO
SET_TO_ZERO             EQU    $
                        CLRA
                        CLRB
ADD_TEMP                EQU    $
                        ADDD   #GF_PU_TBL          ;ADD GF_PU_TBL ADDRESS TO SENSOR CALCULATION
                        XGDX                       ;TABLE POSITION IN DBL ACCUM,SET IN X REG.
                        LDAB   GFPUSW              ;READ GF PICK UP SWITCH IN ACCUM B
                        ANDB   #MAX_SW_POS         ;MASK ALL BITS EXCEPT VALID SWITCH BITS
                        ABX                        ;ADD SWITCH VALUE TO TABLE INDEX
                        STX    GF_TABLE_POS        ; save for comparison in GF 13mS routine
                        CLRA                       ;clear high byte
                        LDAB   GF_PEAK             ;GET PEAK OF GF VALUES FOR LAST 1/2 CYCLE
                        CPD    0,X                 ;COMPARE ATOD VALUE TO TABLE
                        BHS    GF_PICK_UP          ;ATOD IS ABOVE THE TABLE RUN GF ROUTINES
                        JMP    GF_OFF
GF_PICK_UP              EQU    $
; GF PICK UP CAN BE SET HERE BUT ONLY CLEARED IN THE 13 mSEC PEAK ROUTINE
                        LDX    #REGSTART         ;6811 REGISTER BASE ADDRESS
                        BSET   PORTA,X,GF_RES_OUT      ;TURN ON GF RESTRAINT LINE
                        BSET   GF_FLAGS,GF_PU_BIT      ;SET PU BIT - WE HAVE GFPU
                        BSET   SC_PU_GF_PU,$40   ;SET BIT FOR GFPU IN XMIT BUFFER
;; set/reset the 11 mSec restraint timer & the retention timer
                        LDAA   #11               ;11 MS TIMER
                        STAA   GF_RESTRN_TIME
                        LDX    #5000             ;5 Sec TIMER
                        STX    GF_RETN_TIME
                        LDAB   GFDELSW                 ;READ GF DELAY SWITCH
                        ANDB   #MAX_SW_POS       ;MASK OFF BIT 0
;A1- THE LDAB ABOVE IS TO ALLOW TIME FOR THE SLEW RATE OF THE RESTRAINT OUT LINE
; The filter slows the restraint line down so much that 2mSec pass before TU
;                       realizes it is self restrained.
TEST_GF_DELAYS          EQU    $                 ;test for GFRI line active here (active low )
                        LDX    #REGSTART         ;get start of onboard registers
                        BRCLR PORTA,X,GF_RES_IN,GF_RESTRN_DELAYS  ;if GFRI active use restrain
;; WE DO NOT HAVE RESTRAINED DELAYS ,USE GF FAST TIMER
                        DEC    GF_FTIMER         ;decrement fast timer
                        DEC    GF_FTIMER         ;decrement fast timer
                        BGT    EXIT_GF           ;timer != 0 branch
                        JMP    GF_TRIP           ;else go trip

GF_RESTRN_DELAYS        EQU    $
;A1 THE VALUE IN ACCB FROM BEFORE TEST_GF_DELAYS IS USED HERE SO BE CAREFUL
                        CMPB   #06               ; IF > 6,I**2 DELAY
                        BHI    EXIT_GF           ;IT IS GF I**2 IN - RUN ON 13mSEC TIME FRAME
;; GROUND FAULT RESTRAINED FIXED DELAYS,CHECK FOR ACTIVE TIMER
                        LDD    GF_LONG_TIME      ;get Isq out timer
                        CPD    #$FFFF            ;do we even have a timer
                        BEQ    GF_SCHED_TIMER    ;go start a timer
                        BCLR   GF_LONG_TIME,T_INACTIVE_BIT   ;wake timer up if asleep
                        JMP    EXIT_GF           ;CONTINUE IN MAIN FLOW

GF_SCHED_TIMER          EQU    $
                        LDX    #GF_FIXED_DEL     ;GET START LOCATION OF FIXED DELAY TABLE
                        LDY    #GFDELSW          ;GF SWITCH ADDRESS
                        LDAA   #8                ;MULT BY 8 FOR # OF ENTRIES PER ROW
                        BSET   FLAGS$,WRD_ALIGN_BIT     ;1 WORD BOUNDARY
                        JSR    SET_TBL_INDX      ;CALL INDEX ROUTINE
                        LDX    0,X               ;LOAD TIMER VALUE FROM TABLE
                        STX    GF_LONG_TIME      ;save to timer
;                       JMP    EXIT_GF           ;DONE GO BACK TO MAIN FLOW
GF_OFF                  EQU    $


EXIT_GF                 EQU    $
```

```
                RTS                         ;return to main/motor routine

;;------------------ END OF MAIN GROUND FAULT ROUTINE ----------------


;;**************** G R O U N D  F A U L T  I**2 *****************************
;;
;;              CALLED: Every 13mSec. from main/motor flow when a GF I^2 in accum
;;                  calculation is needed.
;;
;;              RETURNS: Either updated accum. value or never returns and trips
;;                  the breaker. If sensor is greater than 1600 Amps a branch
;;                  is taken to execute exception code.
;;
;;              USED: ACCA, ACCB, IX, IY      RESTORED: NOTHING !!!!!!!!!!!!!!!!!!
;!!!!!!!!!!!!!!!!!!!!!!!! RESULT USED !!!!!!!!!!!!!!!!!!!!!!!!!!!!!!!!!!!!!!!!!!

GF_ISQ_IN       EQU   $
                LDAB  SENSOR            ;read GF sensor code
                ANDB  #SWITCH_MASK      ;mask it to max switch
                CMPB  #$1A              ;1A = 4000A sensor none bigger
                BLS   CONT_GFISQ_CALC
                LDAB  #$1A              ;load max sensor
CONT_GFISQ_CALC EQU   $
                CMPB  #$12              ;compare to 2000A frame
                BHS   GF_SPECIAL        ;if 0E or > frame size is => 2000A

;; THE FOLLOWING CODE IS THE NORMAL GROUND FAULT I SQUARE SOFTWARE
NORMAL_GF_ISQ   EQU   $
                LDAA  GF_PEAK           ;get GF peak in ACCA
                TAB                     ;move GF peak to ACCB
                MUL                     ;square it, ACCD = ACCA * ACCB
                STD   RESULT            ;use RESULT as a holding register
ADD_IT_AGAIN    EQU   $
                LDX   #GF_ACCUM         ;set X to the gf accumulater
                JSR   ACCUM4_ADD        ;add i**2 to 4 byte gf accumulater
                BRCLR GF_FLAGS,DOUBLE_I2_BIT,CHECK_I2_TRIP
                BCLR  GF_FLAGS,DOUBLE_I2_BIT  ;clear double bit
                LDD   RESULT            ;get saved value back
                JMP   ADD_IT_AGAIN      ;double I^2 value for init time
CHECK_I2_TRIP   EQU   $
                LDX   #GF_ISQ_DEL       ;address of gf i**2 table in X
                LDY   #GFDELSW          ;address of gf delay switch in Y
                LDAA  #32               ;MULT BY 16,SHIFT LEFT 4
                BCLR  FLAGS$,WRD_ALIGN_BIT    ;set for double word boundary
                JSR   SET_TBL_INDX      ;call table index routine
                LDY   #GF_ACCUM         ;Y points to gf_accum
                JSR   COMP_DBL_WORD     ;comp gf_accum to delay table
                CMPA  #00
                BLT   NO_TRIP_RETURN    ;not tripping so return
                JMP   GF_TRIP           ;GF_ACCUM >= DELAY TABLE
NO_TRIP_RETURN  EQU   $
                RTS                     ;return to main flow

;; ************* CODE FOR SENSORS > 1600 AMPS BEGINS HERE **************
;; THE FOLLOWING CODE IS THE SPECIAL GF CODE FOR SENSOR => 2000 AMPS
;; JUMPED TO WITH ACCB HOLDING THE SENSOR SIZE OF THE BREAKER
;!!!!!!!!!!!!!!!!!!!!!!!! RESULT USED !!!!!!!!!!!!!!!!!!!!!!!!!!!!!

GF_SPECIAL      EQU   $
                SUBB  #$12              ;convert to 0,2,4,6 for >= 2000A frame
                STAB  TEMP              ;SAVE (SENSOR - $0E) IN TEMP
                LDX   #MAX_GF_ATOD_TBL  ;get location of max GF table
                ABX                     ;add frame offset to location
                LDD   0,X               ;get max GF value
                CMPB  GF_PEAK           ;compare GF to max GF value
                BHS   NORM_ADD          ;if GF < max GF run normal square
SPECIAL_GF_ISQ  EQU   $
                LDX   #MAX_GF_ISQ_TBL   ;GF PEAK > max allowed get max allowed
                LDAB  TEMP              ;GET (SENSOR - $0E) FROM TEMP
                ABX                     ;ADD SENSOR OFFSET INTO INDEX
                LDD   0,X               ;get max GF^2
                STD   RESULT            ;use result as holding reg, temp in use alread
                JMP   ACCUMUL_8         ;go add to G.F.A.
NORM_ADD        EQU   $
                LDAB  GF_PEAK           ;get GF value
                TBA                     ;move it to ACCA
```

```
                    MUL                         ;square it double now has GFI^2
                    STD   RESULT                ;use result as holding reg, temp in use alread
ACCUMUL_8           EQU   $
                    LDX   #GF_ACCUM             ;ADDRESS OF GF ACCUMULATER
                    JSR   ACCUM4_ADD            ;ADD GF I SQUARE TO THE GF ACCUMULATER
                    BRCLR GF_FLAGS,DOUBLE_I2_BIT,CHECK_SPEC_I2_TRIP
                    BCLR  GF_FLAGS,DOUBLE_I2_BIT  ;clear double bit
                    LDD   RESULT                ;get saved value back
                    JMP   ACCUMUL_8             ;double I^2 value for init time
CHECK_SPEC_I2_TRIP        EQU                   $
;; NOW CALCULATE THE INDEX INTO THE GF_ISQ_DELAY TABLE TO TEST FOR TRIP

                    JSR   READ_BREAKER_SW       ;go read the breaker type
                    CMPB  #$08                  ;mask off bit 4
                    BHS   GOOD_BRKR             ;if PE or > value is good
                    LDAB  #$08                  ;set for PE
GOOD_BRKR           EQU   $
                    SUBB  #$08                  ;subtract PE & below Brkrs
                    BNE   NOT_A_PE              ;PE breaker type is 8
                    CLRA                        ;set top byte of ACCD to 0
                    LDAB  TEMP                  ;get sensor size
                    BEQ   ADD_DELSW             ;brkr is PE2000
                    LDX   #PE2500_TRIP_TBL      ;get trip table for 2500A PE
                    JMP   READ_DELAY_VALU       ;IX has start of I^2 in table
NOT_A_PE            EQU   $
                    LSRB                        ;divide by 2 for 0,1,2 values
                    ADDB  TEMP                  ;ACCB = sensor + masked brkr type
                    LDAA  #16                   ;16 bytes per row entry
                    MUL                         ;ACCD = row offset for brkr & sensor
ADD_DELSW           EQU   $
                    ADDD  #GF_I_SQ_DEL_TBL      ;add table location
                    XGDX  .                     ;move ACCD to IX
READ_DELAY_VALU     EQU   $
; AT THIS POINT IX POINTS TO THE CORRECT ROW OF THE CORRECT I^2 IN DELAY TABLE
                    LDAB  GFDELSW               ;get the del switch setting
                    ANDB  #MAX_SW_POS           ;mask off bit 0 & high nibble
                    SUBB  #$08                  ;align for GF I^2 table
                    LSLB                        ;values are 4 bytes so shift left (2x)
                    ABX                         ;add location to row pointer
;;ACCX now holds the location of the GF I^2in trip value******************
CHECK_FOR_GFTRIP    EQU   $
                    LDY   #GF_ACCUM             ;get accumulator location
                    JSR   COMP_DBL_WORD         ;go compare accumulator to trip value
                    CMPA  #00                   ;compare
                    BGE   GF_TRIP               ;if positive trip
                    RTS                         ;return from routine

;;*************** G R O U N D   F A U L T   T R I P ***************************
;;
;;                  CALLED: From any Ground Fault routines that are allowed to generate
;;                        a Ground Fault trip'
;;
;;                  RETURNS: Doesn't - trips the breaker.
;;
;;                  USED: ACCA, & IX              RESTORES: NOTHING !!!!!!!!!!!!!
;;**********************************************************************

GF_TRIP             EQU   $
                    SEI                         ;NO MORE INTERUUPTS PLEASE!
                    JSR   RESET_COP             ;stroeb SD
                    BCLR  TRIP_STATUS_BYTE,$70     ;CLEAR TRIP CAUSE
                    BSET  TRIP_STATUS_BYTE,$40     ;SET CAUSE OF TRIP AS gf TRIP
                    BSET  MAX_IDENT,$03         ;clear max phase
                    LDAA  GF_TRIP_CNT           ;get # of trips
                    ANDA  #63                   ;max # trips to store
                    CMPA  #63                   ;check for max trips
                    BHS   CLR_GF_CNT            ;clear count
                    INC   GF_TRIP_CNT           ;increment # of SC TRIPS
                    JMP   G_GLBAL               ;go set up for jump to global trip
CLR_GF_CNT          EQU   $
                    CLR   GF_TRIP_CNT           ;clear counter for rollover

G_GLBAL             EQU   $
                    LDX   #REGSTART
                    LDAA  #GF_RES_OUT           ;get value to turn on GF trip line
                    STAA  PORTA,X               ;turn line on
```

```
                STAA   TRIP_FLAG          ;save for display
                BCLR   LT_TRIP_CNT,$40    ;cause of trip =! long time
                BCLR   PU_TRIP_CNT,$40    ;cause of trip =! phase unbal
                BCLR   SC_TRIP_CNT,$40    ;cause of trip =! short circuit
                BSET   GF_TRIP_CNT,$40    ;cause of trip = gnd fault
                BCLR   SOFT_TRIP_CNT,$40 ;cause of trip =! soft dog
                BCLR   FLAGS$,KILL_WATCHDOG_BIT      ;not a soft trip so clr kill bit
                LDY    #DELAY_32MS        ;get 32mS delay
                JMP    VT_CHECK           ;GO CHECK TRIP VOLTAGE


;;************************ CHECK_GF_13MS **********************************
;;
;;              CALLED: Every 13mSec. from main or motor flow code.
;;
;;              RETURNS: GF peak cleared, GFPU set/cleared as appropriate,
;;                   communicatiions bit set/cleared as needed, and sleeps I^2 out
;;                   timer if needed.
;;
;;              USED: IX, ACCA, ACCB          RESTORED: NOTHING !!!!!!!!!!!!!
;;
;;****************************************************************************
CHECK_GF_13MS   EQU    $
                LDX    GF_TABLE_POS       ;get GFPU table position in IX
                CLRA                      ;clear high byte
                LDAB   GF_PEAK            ;GET PEAK OF GF VALUES FOR LAST 13 mSEC
                CPD    0,X                ;COMPARE ATOD VALUE TO TABLE
                BHS    GF_IN_PU           ;ATOD IS ABOVE THE TABLE LEAVE PU ON
                BCLR   SC_PU_GF_PU,GF_PU_BIT   ;CLEAR PU BIT IN XMIT BUFFER
                BCLR   GF_FLAGS,GF_PU_BIT;CLEAR PU BIT
                BSET   GF_LONG_TIME,T_INACTIVE_BIT   ;put timer to sleep
GF_IN_PU        EQU    $
                CLR    GF_PEAK            ;CLEAR FOR NEW 13mSEC GF PEAK
                RTS                       ;RETURN TO CALLING LOCATION
.PAGE
;;TTTTTTTTTTT 11MS RESTRAINT TIME OUT TTTTTTTTTTTTTTTTTTTTTTTTTTTTTTTTTTTTTTTTTT
;;
;;              CALLED: When the GF restraint timer times out.
;;
;;              RETURNS: GF restraint timer set to $FF. (RESET VALUE)
;;
;;              USED: IX                      RESTORED: NOTHING !!!!!!!!!!!!!
;;
;;****************************************************************************
;; THIS CODE CAN ONLY BE REACHED VIA A 11 MS GF RESTRAINT HOLD TIME OUT
GF_RESTRN_OFF   EQU    $
                LDX    #REGSTART
                BCLR   PORTA,X,GF_RES_OUT       ;CLEAR GF RESTRAINT OUTPUT BIT
                BSET   GF_RESTRN_TIME,$FF       ;SET TIMER NUMBER TO NULL
                RTS


;;TTTTTTTTTT GROUND FAULT RETENTION TIME OUT TTTTTTTTTTTTTTTTTTTTTTTTTTTTTTTTT
;;
;;              CALLED: When the GF retention timer counts down to 0 after a GF pick
;;                   up. No registers are passed into the routine.
;;
;;              RETURNS: GF accumulator cleared, restrained delay timer set to $FFFF,
;;                   unrestrained timer set to 33, and the DOUBLE_I2 bit cleared
;;
;;              USED: ACCA, ACCB              RESTORED: Nothing
;;
;;TTTTTTTTTTTTTTTTTTTTTTTTTTTTTTTTTTTTTTTTTTTTTTTTTTTTTTTTTTTTTTTTTTTTTTTTTTTTTTT

GF_RETN_TIMOUT  EQU    $

                LDD    #0000
                STD    GF_ACCUM           ;CLEAR HI WORD OF GF ACCUMULATER
                STD    GF_ACCUM+2         ;CLEAR LOW WORD OF GF ACCUMULATER
                LDAA   #33                ;34 MS GF FAST TIMER VALUE
                STAA   GF_FTIMER          ;SET IN GF FAST TIMER
;; CHECK FOR GROUND FAULT FIXED DELAY TIMER ACTIVE,IF SO THEN CANCEL IT
                LDD    #$FFFF             ;GET NULL VALUE
                STD    GF_LONG_TIME       ;RESET FIXED RSTRN DELAY
                STD    GF_RETN_TIME       ;NULL RETENTION TIMER
                BCLR   GF_FLAGS,DOUBLE_I2_BIT  ;don't double I^2 calculations
                RTS
```

```
; ****************** END OF GROUND FAULT ROUTINES ****************************
.PAGE

;;************************* MUL_16X16 ***************************************************
;;
;;                  CALLED: From long time accum calculation, serial data conversion
;;                       routine, & locked rotor routines with IX and IY pointing to
;;                       the memory location of the 16 bit multiplier and multiplicand.
;;
;;                  RETURNS: Result of the multiplication in 32 bit location called RESULT
;;                       If called at I_SQUARE the routine will do an I^2 on the values,
;;                       (!!!! both IX & IY must point to same location for I^2 !!!!).
;;
;;                  USED: ACCA, ACCB, IX, IY          RESTORED: IX & IY return as set
;;
;; !!!!!!!!!!!!!!!!!!!!!!!!!!!!! RESULT USED !!!!!!!!!!!!!!!!!!!!!!!!!!!!!!!!!

I_SQUARE          EQU   $
                  BSET  FLAGS$,I_SQ_BIT   ;SET BIT FOR I SQUARE INSTEAD OF MUL 16X16
MUL_16X16         EQU   $
                  CLR   RESULT            ;CLEAR HI BYTE OF HI WORD OF RESULT
                  CLR   RESULT+1          ;CLEAR LOW BYTE OF HI WORD OF RESULT
                  LDAA  1,X               ;LOW BYTE OF MULTIPLIER
                  LDAB  1,Y               ;LOW BYTE OF MULTIPLICAND
                  MUL                     ;MULTIPLY IT
                  STD   RESULT+2          ;STORE IN LOW WORD OF RESULT
                  LDAA  1,X               ;LOW BYTE OF MULTIPLIER
                  LDAB  0,Y               ;HI BYTE OF MULTIPLICAND
                  BEQ   MUL_NEXT_BYTE     ;IF HIGH BYTE = 0 WHY MULTIPLY GO TO NEXT ROUT
;; TEST FOR I_SQUARE BIT
                  MUL                     ;MULTIPLY IT
                  BRCLR FLAGS$,I_SQ_BIT,ADD_RESULT    ;IF BIT CLEAR THIS ISN'T A SQUARE
                  LSLD                    ;WE HAVE I_SQ REQUEST so double 2nd product
ADD_RESULT        EQU   $
                  ADDD  RESULT+1          ;ADD RESULT IN TO COVER DOUBLE WORD BOUNDARY
                  STD   RESULT+1          ;STORE ANSWER BACK TO LOCATION
                  LDAA  RESULT            ;GET HIGH BYTE - HIGH WORD
                  ADCA  #00               ;ADD WITH CARRY TO BRING IN ANY CARRY
                  STAA  RESULT            ;STORE BACK TO RAM
MUL_NEXT_BYTE     EQU   $
                  BRSET FLAGS$,I_SQ_BIT,MUL_LAST_BYTE ;IF SQUARING DON'T DO THIS MULTIPL
                  LDAA  0,X               ;HI BYTE OF MULTIPLIER
                  BEQ   MUL_RETURN        ;IF HIGH BYTE = 0 we are finished
                  LDAB  1,Y               ;LOW BYTE OF MULTIPLICAND
                  MUL                     ;MULTIPLY IT
                  ADDD  RESULT+1          ;ADD RESULT TO COVER DOUBLE WORD BOUNDARY
                  STD   RESULT+1          ;STORE BACK INTO RAM
                  LDAA  RESULT            ;GET HIGH BYTE HIGH WORD
                  ADCA  #00               ;ADD WITH CARRY TO BRING IN ANY CARRY
                  STAA  RESULT            ;STORE BACK TO RAM
MUL_LAST_BYTE     EQU   $
                  LDAA  0,X               ;HI BYTE OF MULTIPLIER
                  BEQ   MUL_RETURN        ;IF ACCA = 0 WE'RE DONE
                  LDAB  0,Y               ;HI BYTE OF MULTIPLICAND
                  BEQ   MUL_RETURN        ;IF ACCB = 0  WE'RE DONE
                  MUL                     ;MULTIPLY HIGH BYTES
                  ADDD  RESULT            ;ADD TO HIGH WORD
                  STD   RESULT            ;STORE HIGH WORD BACK TO RAM
MUL_RETURN        EQU   $
                  BCLR  FLAGS$,I_SQ_BIT   ;CLEAR SQUARE BIT
                  RTS                     ;RETURN

.PAGE

;
;*******************************************************************************
;AVG: takes the values in SUMSQ and does 1 rotate left, and drops the low byte
;                  to get the average of the square (/128). X is loaded with the offset
;                  for sum location before the call. The average is used to calculate
;                  the square root by the NEWTON-RAPHSON METHOD.
;
;                 CALLED: From main with IX pointing to the memory location of the value
;                      to find the root mean square for. Square sum location is assumed
be
;                      a 32 bit value (4 contiguous memory locations ).
```

```
;
;               RETURNS: Root Mean Square root of number in location RMS_SQROOT.
;                    Routine makes assumption that 128 values have squared and
;                    summed before this calculation is made.
;
;               COMMENTS: Entered from MAIN with 128 values summed from the SQSUM
;                    routine. takes the average and puts it in MEAN. Then
;                    uses that value to calculate the.square root. Index X equals
;                    the location of the sum of the squares for the phase to be
;                    calculated.
;
;
;
;               USED: ACCA, ACCB, IX, IY          RESTORED: IX
;
;************************************************************************

;               PSEUDO CODE FOR MEAN/SQUARE ROUTINE
;******         THIS IS WRITTEN IN C ***********************************************
;#include<stdlib.h>
;#include<stdio.h>
;#include<math.h>

;int x, pass, min_pass, max_pass, avg_pass, z, i;  /*global variables*/
;long sum_tbl[3], avg, pass_sum, rms_mean, rms_sqroot, w, guess[18] - {255, 443,\
;                572, 677, 768, 849, 923, 991, 1055, 1116, 1173, 1228, 1279, 1330,\
;                1379, 1425, 1471, 1511};  /* global variables*/

;avg()
;{
;               int y;

;               long temp1, temp2, temp3, result, remainder, temp_rt;
;               /*routine dependant variables*/

;               rms_mean = sum_tbl[x] / 128;  /*find mean of sums for current channel*

;               y = rms_mean / 131072;  /* find lookup table position*/

;               y = y & 17;  /* mask off any high bits*/

;               rms_sqroot = guess[y];  /* get guess into rms_sqroot */

;               do    {                       /* start of iteration loop */

;                    temp1 = rms_mean / 256;  /* take only upper 16 bits */

;                    temp2 = (rms_mean % 256)/16;  /* mask off low nibble of low byte

;                    temp3 = rms_mean - (temp1 * 256 + temp2 * 16); /* get final rema
*/

;                    result = temp1 / rms_sqroot; /* get result of initial division*/

;                    remainder = temp1 % rms_sqroot; /* get remainder */

;                    temp2 += (remainder * 16);  /* shift remainder and add next 4 bi

;                    result = result * 16 + temp2/rms_sqroot; /* get 2nd result */

;                    remainder = temp2 % rms_sqroot; /* get 2nd remainder */

;                    temp3 += (remainder * 16);  /* get next dividend */

;                    result = result * 16 + temp3 / rms_sqroot; /* final result */

;                    remainder = temp3 % rms_sqroot; /* final remainder */

;                    remainder *= 2;  /* double the remainder */

;               if(remainder >= rms_sqroot)  /* if remainder > .5 increment result */
;                    result++;

;                    result = (result + rms_sqroot) / 2;  /* find next guess */

;                    temp_rt = rms_sqroot;  /* temporary storage */
```

```
;                rms_sqroot = result;  /* put result into rms_sqroot for next
;                                                    iteration */

;                remainder = abs(result - temp_rt);  /* find guess & iteration
;                                                              difference */

;                }                   /* end of do/while loop */

;          while (remainder > 1);  /* iterations are +/- 1 */

;}         /* end of average/square root routine */
;******** End of C simulation of square root routine *************************
;!!!!!!!!!!!!!!!!!!!!!!!!! RESULT USED !!!!!!!!!!!!!!!!!!!!!!!!!!!!!!

AVG:
        LDD    0,X               ; get high word for 0 check
        BNE    CONT_AVG          ;if not 0 continue
        LDD    2,X               ;get low word & check for 0
        CPD    #$7F              ;low 7 bits get masked off so $7F = 0
        BHI    CONT_AVG          ; if > $7F do square root
        LDD    #0000             ;get 0 for result
        STD    RMS_SQROOT        ;store 0 for result
        RTS
CONT_AVG:
        LSL    3,X               ;shift low byte for carry (mult by 2)
        ROL    2,X               ;rotate next byte for carry
        ROL    1,X               ;rotate to pull in carry
        ROL    0,X               ;rotate to get carry bit
        LDD    1,X               ;change word boundary to drop lowest byte
        STD    RMS_MEAN_LW       ;store into mean variable location
        LDAB   0,X               ;get high byte of average
        CLRA                     ;clear out high byte for mean value
        STD    RMS_MEAN          ;store high byte of the mean
        PSHX                     ;save X for later use
        ;**** AVERAGE IS FINISHED BEING CALCULATED ****
        LSLB                     ;shift left for guess value
        LDY    #GUESS            ;load Y with GUESS location
        ABY                      ;add in offset from accb
        LDX    0,Y               ;load indexed guess into IX
        STX    RMS_SQROOT        ;store off initial guess(in case of luck)
SQRCAL:
        LDX    RMS_SQROOT        ;reload guess
        LDD    RMS_MEAN+1        ;get mean for dividend
        IDIV                     ;do the division
        LSLD                     ;start shifting to clear low
        LSLD                     ;nibble to bring in next
        LSLD                     ;nibble to continue division process
        LSLD                     ;all shifts done low nibble is clear
        STD    REMAINDER         ;save remainder for use
        XGDX                     ;put ACCX into ACCD to work with quotient
        LSLD                     ;start shifting quotient
        LSLD                     ;to make room for next
        LSLD                     ;division result
        LSLD                     ;least significant nibble now clear
        STD    RESULT            ;store off the result
        LDAB   RMS_MEAN+3        ;get low byte of mean value
        LSRB                     ;do 4 shifts to move
        LSRB                     ;the high nibble to
        LSRB                     ;the low nibble
        LSRB                     ;shifts are all done
        CLRA                     ;clear out high byte
        ADDD   REMAINDER         ;add remainder to low nibble for new dividend
        LDX    RMS_SQROOT        ;get divisor again for next divide
        IDIV                     ;divide
        LSLD                     ;shift the remainder
        LSLD                     ;to make room for
        LSLD                     ;the final nibble
        LSLD                     ;low nibble now 0
        STD    REMAINDER         ;store off remainder for later use
        XGDX                     ;swap to get quotient into ACCD
        ADDD   RESULT            ;add new result to last result
        LSLD                     ;do four shifts
        LSLD                     ;to make room for
        LSLD                     ;the next nibble
        LSLD                     ;shifting all done
        STD    RESULT            ;save the result
```

```
                LDAB  RMS_MEAN+3       ;get low byte
                ANDB  #0FH             ;mask off high nibble
                CLRA                   ;clear high byte of ACCD
                ADDD  REMAINDER        ;add low nibble to the remainder
                LDX   RMS_SQROOT       ;get divisor
                IDIV                   ;divide
                LSLD                   ;multiply remainder by 2
                CPD   RMS_SQROOT       ;is 2xREMAINDER> divisor
                BLS   NO_INC           ;no- don't increment quotient
                INX                    ;increment the quotient
NO_INC          EQU   $
                XGDX                   ;get quotient in ACCD
                ADDD  RESULT           ;finish result
                ADDD  RMS_SQROOT       ;add guess to quotient
                LSRD                   ;divide by 2
                CPD   RMS_SQROOT       ;if same we've found the root
                BEQ   QUIT             ;all done quit
                LDX   RMS_SQROOT       ;get the original divisor
                STD   RMS_SQROOT       ;store last iteration
                XGDX                   ;move old root into ACCD
                SUBD  RMS_SQROOT       ;find the difference between old & new
                ADDD  #0001            ;add 1 to allow +/-1 bit difference
                CPD   #0002            ;is result <=2
                BLS   QUIT             ;if so we're close enough
                JMP   SQRCAL           ;otherwise try again
QUIT            EQU   $
                PULX                   ;restore ACCY
                LDD   #0000            ;get value to clear
                STD   0,X              ;clear high word of squared sums
                STD   2,X              ;clear low word
                RTS
;*************** END OF SQUARE ROOT ROUTINE ********************************
.PAGE


;;************** ROUTINE TO CONVERT DATA FROM GF TO PHASE VALUES *************
;;
;;              CALLED: From GF communications routine to begin conversion of data fro
;;                   raw A/D format to serial comm. format.
;;
;;              RETURNS: This routine goes to the I_CONVERSION routine to finish
;;                   converting from A/D values to serial format values. Passes
;;                   GF_CURRENT to next routine as storage for result.
;;
;;                   USED: ACCA, ACCB, IX, IY      RESTORED: NOTHING !!!!!!
;!!!!!!!!!!!!!!!!!!!!!!!!!!!! TEMP USED !!!!!!!!!!!!!!!!!!!!!!!!
;!!!!!!!!!!!!!!!!!!!!!!!! RESULT USED !!!!!!!!!!!!!!!!!!!!!!!!!!!!
;;**************************************************************************
DO_GF_CONV      EQU   $
                LDAA  GF_PEAK          ;get peak of GF
                STAA  TEMP+1           ;store for use
                CLR   TEMP             ;clear high byte & GO DO IT
                LDY   #TEMP            ;get peak current location
                LDX   #GF_TO_PHASE     ;get conversion value location
                JSR   MUL_16X16        ;do conversion
                LDD   RESULT+1         ;get result/256 for integer math
                STD   TEMP             ;save for conversion to xmit value
                BSET  GF_FLAGS,USE_XS_BIT    ;set bit for 1xS in I conv routine
                LDY   #TEMP            ;get location of converted value
                LDX   #GF_CURRENT      ;get xmit buffer location
;;CONTINUE TO CURRENT CONVERSION ROUTINE
;;************** ROUTINE TO CONVERT DATA FROM RAW(?) A/D TO SERIAL FORMAT******
;;
;;              CALLED: With -
;;                   IY - LOCATION OF CURRENT TO CONVERT to serial format.
;;                   IX - LOCATION TO STORE CONVERTED CURRENT INTO (USUALLY XMIT
;;                    BUFFER).
;;                   SENSOR SIZE AND RATING PLUG ARE USED TO DETERMINE THE
;;                   CONVERSION VALUE.
;;                   USE_XS_BIT is set if conversion is done on a GF value.
;;
;;              RETURNS: Current in serial format in memory location pointed to by IX.
;;
;;              USED: ACCA, ACCB, IX, IY           RESTORED: NOTHING !!!!!!!!!
;;
;;**************************************************************************
```

```
;!!!!!!!!!!!!!!!!!!!!!!!! RESULT USED !!!!!!!!!!!!!!!!!!!!!!!!!!!!
;;*****************************************************************************

I_CONVERSION       EQU   $
                   PSHX                    ;save storage location for later use
                   LDAB  SENSOR            ;read the sensor size
                   ANDB  #SWITCH_MASK      ;mask unused bits
                   CMPB  #$1A              ;max sensor size
                   BLS   MULT_BY_14        ;sensor is OK go multiply
                   LDAB  #$1A              ;load max sensor
MULT_BY_14         EQU   $
; ACCB IS ALREADY SET FOR A WORD MULTIPLY SO ACCA EQUALS # OF WORDS
                   LDAA  #14               ;14 words per row
                   MUL                     ;find correct starting row
                   ADDD  #CURRENT_CONV_TBL ;add to start of conversion multiplier table
                   XGDX                    ;put into IX for index use
                   BRCLR GF_FLAGS,USE_XS_BIT,READ_THE_RPLUG  ;if GF bit clear read the RP
                   LDAB  #$1A              ;get value for GF calculations
                   JMP   WE_HAVE_PLUG      ;go do calculations
READ_THE_RPLUG     EQU   $
                   LDAB  RATING_PLUG       ;read rating plug value
                   ANDB  #SWITCH_MASK      ;mask it
                   CMPB  #$1C              ;check for UTS or PROD tester
                   BLO   WE_HAVE_PLUG      ;we have an honest to goodness RP
                   LDAB  #00               ;if tester default to .4 multiplier
WE_HAVE_PLUG       EQU   $
                   ABX                     ;add plug to row offset - points to value
                   JSR   MUL_16X16         ;go do multiplication
;;******RESULT IS NOW IN 32 BIT RESULT LOCATION******
                   PULX                    ;get storage location
                   LDD   RESULT+1          ;get result low byte
                   CPD   #MAX_SERIAL_I     ;max transmission value
                   BLS   SERIAL_DATA_OK    ;serial is in good range
                   LDD   #MAX_SERIAL_I     ;load max value to indicate full scale
SERIAL_DATA_OK     EQU   $
                   LSLD                    ;clear low bit, shift high bit to carry
                   LSRB                    ;shift low byte back to 7 bits
                   ANDA  #$7F              ;mask off high bit
                   STD   0,X               ;store high byte
                   RTS                     ;YO JOE WE'RE DONE - GO HOME


;;*******************SENSOR BREAKER ROUTINE FOR TRANSMISSION*****************
;;
;;                 CALLED: Once every second, no values are passed to routine.
;;
;;                 RETURNS: Sensor and Breaker type information in serial comm. buffer fo
;;                       transmission.
;;
;;                 USED: ACCB                      RESTORED: NOTHING !!!!!!!!
;;*****************************************************************************

SENSOR_BREAKR      EQU   $
                   BCLR  MAX_IDENT,$3C     ;clear breaker type in xmit byte
                   JSR   READ_BREAKER_SW
                   LSLB                    ;shift into correct position for xmit byte
                   ORAB  MAX_IDENT         ;combine with max phase data
                   STAB  MAX_IDENT         ;store back to xmit byte
                   LDAB  SENSOR            ;read the sensor
                   ANDB  #SWITCH_MASK      ;mask it
                   CMPB  #$1A              ;check for > max sensor
                   BLS   SHIFT_IT          ;sensor ok shift it
                   LDAB  #$1A              ;load good sensor
SHIFT_IT           EQU   $
                   LSRB                    ;shift for correct position in byte
                   STAB  SENSR_TU_ID       ;save to xmit buffer
                   BSET  SENSR_TU_ID,HARD_VERSION      ; hardware is version 1.3
                   RTS                     ;all done go back to main

;;******************* CHECK_LED SUBROUTINE ***********************************
;;
;;                 CALLED: Every .25 Sec. to check LTPU LED. No conditions are passed
;;                       into the routine. Routine reads Long Time flags for its
;;                      decisions.
;;
```

```
;;              RETURNS: Long Time LED either on or off depending on condition of
;;                  Long Time pick up flag.
;;
;;              USED: IX                        RESTORES: IX not changed
;; ***************************************************************************
CHECK_LED       EQU   $
                LDX   #REGSTART       ;set index to start of 6811 registers
                BRCLR LT_FLAGS,LT_PU_BIT,TRY_90%    ;if pickup bit is off try 90%
                BSET  PORTA,X,LED_BIT_O ;we have pick up,so set led on
                RTS
TRY_90%         EQU   $
                BRSET LT_FLAGS,LT_PU90%_BIT,TOGL_LED      ;if 90% pick up go toggle le
                BCLR  PORTA,X,LED_BIT_O ;else no pickup,so turn led off
                RTS
TOGL_LED        EQU   $
                BRSET PORTA,X,LED_BIT_O,CLEAR_LED
                BSET  PORTA,X,LED_BIT_O ;led is now off,so turn it on
                RTS
CLEAR_LED.      EQU   $
                BCLR  PORTA,X,LED_BIT_O ;turn led off
                RTS

;; SERIAL TRANSMISSION SUBROUTINE !!!!!!!!!!!!!!!!!!!!!!!!!!!!!!!!!!!!!!!!!!!!
;;
;;              CALLED: Every 7mSec. in normal operating mode, or as fast as possible
;;                  if breaker is in a tripping/tripped condition.
;;              RETURNS: No values, only sends a byte out the SPI & SCI ports.
;;
;;              USED: ACCA, ACCB, IX          RESTORED: NOTHING !!!!!!!!!!
;;
;               COMMENTS:
;           THE CALLING ROUTINE IS RESPONSIBLE TO MAKE SURE THE SCI REGISTER
; IS CLEAR BEFORE CALLING THIS ROUTINE (TDRE in SCSR is set) *************
;
;               This routine automatically runs through transmit buffer and sends data
;               out according to the serial comm spec.
;               Data is sent out SPI & SCI ports.
;               Data is sent  out in 8 byte packets.
;               Data transmission is in groups of rotating packets:
;               packet 0-1-2, 0-1-3, 0-1-4, 0-1-5, 0-1-6, 0-1-7,
;                   then repeated from 0-1-2, 0-1-3, ...
; !!!!!!!!!!!!!!!!!!!!!!! TEMP USED !!!!!!!!!!!!!!!!!!!!!!!!!!!!!!
;***************************************************************************

; Initial section checks byte pointer for byte 0, 6, or 7 exception bytes:
;               Byte 0 is always trip status byte & packet #.
;               Byte 6 is the trip unit address - upward compatability.
;               Byte 7 is always the checksum of the previous bytes.
;               Bytes 1 thru 5 are trip unit data, see serial comm. spec for details.

SERIAL          EQU   $
                LDX   #SERIAL_BUF       ;pointer for serial buffer
                LDAB  BYTE_PTR          ;pointer for byte to send
                BEQ   SEND_STATUS_BYTE  ;if byte = 0 send status byte
                CMPB  #06               ;if byte = 6 send address
                BEQ   SEND_ADDRESS      ;send address right before check sum
                BHI   LINDA_SUE         ;send checksum and go to next packet

; This section picks the correct byte from the correct packet, saves the
;pointer to check for word wide conversion conflicts, and masks the high
;               bit of the byte being sent (bytes 1-5).
                LDAB  PACKET_PTR        ;keep set to packet 0
                LDAA  #5                ;5 data bytes/packet
                MUL                     ;get packet base
                ADDB  BYTE_PTR          ;add pointer to correct byte
                ABX                     ;add to serial buffer base
                STX   SERIAL_POINTER    ;store for compare for 2 byte values
                INC   BYTE_PTR          ;set for next byte
                LDAA  0,X               ;put byte in ACCA
                ANDA  #$7F              ;mask off high bit
                JMP   DO_CHECKSUM       ;go do checksum before transmission

SEND_STATUS_BYTE EQU   $
;;set up status byte here, and start of checksum generation
                BCLR  TRIP_STATUS_BYTE,$0F    ;clear packet # in status
                LDAB  PACKET_PTR        ;get packet # being sent
                ORAB  TRIP_STATUS_BYTE  ;set correct status bits
```

```
                STAB   TRIP_STATUS_BYTE  ;store back to location
                BSET   TRIP_STATUS_BYTE,$80     ;set high bit to indicate byte 0
                LDAA   0,X               ;get status byte
                INC    BYTE_PTR          ;point to next byte
                CLR    CHECK_SUM         ;new packet - clear checksum
                JMP    DO_CHECKSUM       ;start checksum

SEND_ADDRESS    EQU    $
; not used in present series3 communications
                INC    BYTE_PTR          ;set for next byte
                LDAA   ADDRESS           ;load the address into ACCA
                ANDA   #$7F              ;mask off high bit
                JMP    DO_CHECKSUM       ;go do checksum before transmission

LINDA_SUE       EQU    $
; Clears byte and serial pointers, checks for packet pointer increment,
;               and if tripping locks at packet 2. Does housekeeping for pointers.

                CLR    BYTE_PTR          ;new packet so clear byte pointer
                CLR    SERIAL_POINTER+1  ;clear pointer to 0 before checksum
                LDAA   PACKET_PTR        ;get packet pointer
                BEQ    INC_PACKET        ;packet = 0 so increment to 1
                CMPA   #01               ;if packet is 1
                BEQ    LOAD_NEXT_PACKET  ;get next packet from packet holder
                LDAA   TRIP_STATUS_BYTE  ;are we in trip
                ANDA   #$70              ;mask all but trip bits
                BEQ    NORM_DATA         ;if = 0 we are not tripping
                CMPA   #$70              ;is this test data
                BEQ    NORM_DATA         ;yes transmit normally
                JMP    SEND_PACKET2      ;no we are tripping
NORM_DATA       EQU    $
                CLR    PACKET_PTR        ;no trip so clear packet pointer
                JMP    SEND_CHECKSUM     ;go send the checksum

INC_PACKET      EQU    $
; handles constant transition of packet 0 to 1. Bypassed if tripping

                INC    PACKET_PTR        ;packet pointer = 0 set to 1
                JMP    SEND_CHECKSUM     ;go send the checksum


LOAD_NEXT_PACKET EQU   $
; Packet_holder keeps track of packets 2-7. Packet pointer is used to point
;               into the correct position in the Serial buffer for the packet being
;               sent. Packet pointer values will follow a 0-1-2, 0-1-3, 0-1-4...
;               pattern. Hope the pattern looks familiar.

                LDAA   PACKET_HOLDER     ;get next packet to send
                STAA   PACKET_PTR        ;store to pointer for use
                CMPA   #07               ;if packet = 7
                BLO    NOT_TO_TOP_YET    ;don't reset not at top of buffer yet
                LDAA   #2                ;load reset value
                STAA   PACKET_HOLDER     ;save it to packet holder
                JMP    SEND_CHECKSUM     ;packet holder is reset go send checksum
NOT_TO_TOP_YET  EQU    $
                INC    PACKET_HOLDER     ;packet != 7 so increment packet
                JMP    SEND_CHECKSUM     ;go send checksum


SEND_PACKET2    EQU    $
; When tripping, we come here. "It's a good place to eat."
;!!!!!!!!!!!!! Makes sure only packet 2 is sent. !!!!!!!!!!!!!!!!
                LDAA   #2                ;load packet 2 for trip communication
                STAA   PACKET_PTR        ;save to packet pointer for use
                BSET   TRIP_STATUS_BYTE,$82     ;set status byte

;;*****NOW GO AHEAD AND SEND THE CHECKSUM**********

SEND_CHECKSUM   EQU    $
                LDAA   CHECK_SUM         ;get the checksum
                ANDA   #$7F              ;clear high bit
                JMP    DO_PARITY         ;go check parity

DO_CHECKSUM     EQU    $
; value to send is transferred to ACCB then checksum value is added to it
;               and stored back for next calculation.
```

```
                TAB                          ;MOVE ACCA TO ACCB FOR CHECKSUM TESTING
                ADDB  CHECK_SUM              ;add byte to checksum
                STAB  CHECK_SUM              ;save result to checksum buffer

DO_PARITY       EQU   $
; Temp holds the number of high bits for parity generation. ACCB is set to 9
;               since all parity checking is done after checking for ACCB = 0.

                CLR   TEMP                   ;clear location for checksum counting
                CLC                          ;clear carry for parity testing
                LDAB  #09                    ;set for 9 shifts
PARITY_CHK      EQU   $
                RORA                         ;put bit zero in carry bit
                DECB                         ;have we done all 8 bits?
                BEQ   PARITY_SET             ;ACCB = 0 on 9th shift so parity is done
                BCC   PARITY_CHK             ;this bit is a zero
                INC   TEMP                   ;this bit is a one
                JMP   PARITY_CHK             ;do all 8 bits


PARITY_SET      EQU   $
; Parity bit is set or cleared here depending on the 0 bit of TEMP.
;               Bit 0 = 1 set parity bit, bit 0 = 0, clear parity bit .

                LDX   #REGSTART              ;6811 io base address = 1000
                BRCLR TEMP,1,CLR_P_BIT       ;is bit zero a 0?
                BSET  SCCR1,X,$40            ;no,so set parity bit on
                JMP   TRANSMIT
CLR_P_BIT       EQU   $
                BCLR  SCCR1,X,$40            ;bits are even clear parity bit


TRANSMIT        EQU   $
; data should be all set up by here so send it to SPI & SCI transmit registers.

                LDAB  SCSR,X                 ;read SCI status register
                STAA  SCDR,X                 ;put data in sci data register & clr TDRE
                LDAB  SPSR,X                 ;read SPI status register
                LDAB  SPDR,X                 ;read data to clear SPIF flag (SPI finished)
                STAA  SPDR,X                 ;store to start transmission

SERIAL_DONE     EQU   $
                RTS

;*******THIS ROUTINE RESETS THE INST TIMER TO 100 mSEC AFTER AN INITIAL 100mS.
;;
;;              CALLED: When the INST_RESET_TIMER reaches 0.
;;
;;              RETURNS: INST_TIMER reset to 200, or leaves if an active counter is
;;                   encountered.
;;
;;              USED: ACCA                     RESTORED: NOTHING !!!!!!!!!!
;;
;*********OF OPERATION HAS BEEN COMPLETED.*****************************
INST_TIMER_RST  EQU   $
                BRSET INST_FLAGS,I_TIMR_BIT,GO_TO_MAIN    ;if there is an active timer
leave
                LDAA  #200                   ;get value to reset timer to 100 mSec
                STAA  INST_TIMER             ;reset the timer
GO_TO_MAIN      EQU   $
                LDAA  #$FF                   ;get value to null reset timer
                STAA  INST_RESET_TIMER       ;null the timer
                RTS                          ;RETURN TO MAIN

.PAGE
;***************************************************************************
;INTERRUPT: routine to handle Output Compare Register Interrupts
; THIS OUTPUT COMPARE REGISTER INTERRUPT IS PROGRAMMED TO OCCUR CONTINUOUSLY
; EVERY 500 MICRO SECONDS OR .5 MILLISECONDS.
;
;  THE INTERRUPT CODE DOES THE FOLLOWING:::
;
; E V E R Y   H A L F   M I L L I S E C O N D
;
; 1. CLEAR TIMER INTERRUPTS AND RESET THE OUTPUT COMPARE REGISTER TO ANOTHER
;    500 MICRO SECONDS BY ADDING 970 DECIMAL TO THE CURRENT FREE RUNNING
;    16 BIT TIMER COUNTER (970 takes into account interrupt latency time).
```

```
;
; 2. IF THERE ISN'T A SOFTDOG TRIP, STROBE HARDWARE WATCHDOG BIT ON.
;
; 3. INITIATE THE ATOD HI GAIN READ.
;
; 4. READ AND STORE ALL 3 LOW GAIN A/D CHANNELS & MEMORY CAP.
;
; 5. TURN SPI OFF AND TURN DESENSE ON or OFF AS REQUIRED
;
; 6. RUN INSTANTANEOUS TIMER AND PICKUP
;
; 7. READ EACH PHASE OF HI GAIN ATOD
;    COMPARE EACH PHASE TO THE MAXIMUM HI GAIN VALUE OF HEX F6 TO SELECT
;    HI OR LOW GAIN A/D VALUE TO SUM INTO RMS SQUARED SUMMATION TABLE
;
; 8. READ THE GROUND FAULT ATOD VALUE
;
; 9. RESET A/D HARDWARE FOR READING LOW GAIN CONTINUOSLY.
;
; 10. TEST THE ONE MILLISECOND BIT. IF BIT IS ON GOTO 11
;
;              ELSE GOTO 13
;
; E V E R Y  O N E  M I L L I S E C O N D
;
; 11. INCREMENT ALL FIXED DELAY TIMERS BY ONE MILLISECONDS.
;
; 12. GOTO 14
;
; 13. DECREMENT ALL VARIABLE QUE TIMERS BY ONE MILLISECOND.
;
; 14. STROBE HARDWARE WATCHDOG OFF, SET PORT BIT LOW.
;
; 15. TURN SPI ON.
;
; 16. RETURN FROM TIMER INTERRUPT.
;
;*****************************************************************************

T1_INTERRUPT    EQU   $
                LDX   #REGSTART        ;set 6811 io base register address
                LDAA  TFLG1,X          ;release all current interrupts
                STAA  TFLG1,X
;; RESET THE 500 USEC TIMER TTTTTTTTTTTTTTTTTTTTTTTTTTTTTTTTTTTTTTTTTTTTTTTT
                LDD   TCNT,X           ;get timer count
                ADDD  #970             ;(970 * .5usec) + 30 usec= 500usec interrupt
                STD   TOC1,X           ;load back into output compare register 1

;; strobe the watchdog bit high on each 500 usec interrupt
                BRSET FLAGS$,KILL_WATCHDOG_BIT,LOW_GAIN_RD;if we are in trip don't str
WD
                BSET  PORTA,X,WATCHDOG_BIT    ;set watchdog bit high


;;NOW SET THE ATOD FOR HI GAIN READ
;---- THE AREA BETWEEN THE COMMENTED "A" MUST TO BE KEPT TOGETHER. THE A/D  ----
;---  CONVERTER IS SWITCHED FROM LOW TO HIGH GAIN AND THE LOW GAIN VALUES ---
;---  MUST BE READ WITHIN 64 uSEC OR THEY WILL BE OVER WRITTEN WITH HIGH ----
;------------------------------ GAIN VALUES--------------------------------
;AAAAAAAAAAAAAAAAAAAAAAAAAAAAAAAAAAAAAAAAAAAAAAAAAAAAAAAAAAAAAAAAAAAAAAAAAAA
LOW_GAIN_RD     EQU   $
                LDAA  #$30             ;GET VALUE TO SET FOR HIGH GAIN A/D READ
                STAA  ADCTL,X          ;STORE TO ONBOARD TO START CONVERSION ON HI GN
; ********** A/D RATA TRANSFER STARTS HERE FOR THE LOW GAIN A/D **************
; Store & peak detect routine take 8uS/phase, A/D conversions take 16uS/phase
                LDAA  ADR1,X           ;READ LOW GAIN A/D A PHASE
                STAA  L_PHASEA         ;STORE A PHASE A/D TO RAM
                CMPA  LAST_APHASE      ;compare to last
                BLS   DO_BEE           ;if lower or same don't mess
                STAA  LAST_APHASE      ;if higher save new value
DO_BEE          EQU   $
                LDAA  ADR2,X           ;READ LOW GAIN A/D B PHASE
                STAA  L_PHASEB         ;STORE B PHASE A/D TO RAM
                CMPA  LAST_BPHASE      ;compare to last
                BLS   DO_CEE           ;if lower or same don't mess
                STAA  LAST_BPHASE      ;if higher save new value
DO_CEE          EQU   $
```

```
                 LDAA  ADR3,X              ;READ LOW GAIN A/D C PHASE
                 STAA  L_PHASEC            ;STORE C PHASE A/D TO RAM
                 CMPA  LAST_CPHASE         ;compare to last
                 BLS   RD_MEM_RATIO        ;if lower or same don't mess
                 STAA  LAST_CPHASE         ;if higher save new value
;* THE VALUES LAST_ A, B, CPHASE ARE LOW GAIN PASSED OUT WITHOUT 6x MULTIPLE *
;****** THESE VALUES ARE USED ONLY IN SHORT TIME & MULTIPLIED BEFORE USE *****
RD_MEM_RATIO     EQU   $
                 LDAA  ADR4,X              ;READ MEMORY RATIO A/D
                 STAA  MEM_RATIO+1         ;STORE MEMORY RATIO A/D TO RAM
;AAAAAAAAAAAAAAAAAAAAAAAAAAAAAAAAAAAAAAAAAAAAAAAAAAAAAAAAAAAAAAAAAAAAAAAAAAAAAA


;*************************** SPI IS TURNED OFF HERE ***************************
                 BSET  DDRD,X,$3E          ;set portD for all available outputs here
                 BSET  PORTD,X,SCL+SDA     ;set data & clock lines high
                 BRCLR GF_FLAGS,TURN_ON_DESENSE,FINISH_PORTD
                 BSET  PORTD,X,GF_DESENSE_BIT_OUT    ;turn on the desense line
FINISH_PORTD     EQU   $
                 BCLR  SPCR,X,$40          ;kill SPI and enable PORTD
                 BRCLR IFLAGS,TRIPPING,I_INSTANTANEOUS
                 JMP   WAIT_FOR_HI_ATOD    ;if we are tripping don't run INST
I_INSTANTANEOUS  EQU   $
                 BRSET INST_FLAGS, I_TIMR_BIT, CHK_I_TIMER ;if discriminator on timer i
                 BRCLR INST_FLAGS,INST_OFF_BIT,CHK_I_TIMER ;INST = on, check timer
                 JMP   WAIT_FOR_HI_ATOD  ;wait for hi gain A/D

CHK_I_TIMER      EQU   $
                 BRCLR INST_FLAGS,I_TIMR_BIT,CHK_INST_PU   ;no timer so check PU
;; IF WE GET HERE THE TIMER MUST BE ACTIVE
                 LDAA  INST_TIMER          ;get INST timer
                 DECA                      ;sub 1 ms from inst timer
                 BEQ   RESET_TIMER         ;timer = 0, so reset INST function
                 STAA  INST_TIMER          ;get timer for compare
                 CMPA  #(2*90)             ;is inst timer above 90ms
                 BLS   CHK_INST_PU         ;NO, so check for INST PU
                 CLR   INST_CNTR_4         ;reset inst pick up count
                 JMP   WAIT_FOR_HI_ATOD    ;yes, so forget instantaneous

;***** IF TIMER IS 0; RESET INST TIMER, TIMER FLAG, AND PICK UP COUNTER *****
RESET_TIMER      EQU   $
                 CLR   INST_CNTR_4         ;reset inst pick up count
                 LDAA  #(2*100)            ;GET RESET VALUE FOR INST TIMER
                 STAA  INST_TIMER          ;reset inst timer to 100 ms
                 BCLR  INST_FLAGS,I_TIMR_BIT    ;make timer not active


;***** THIS SECTION GETS THE INST PU LOCATION FROM MEMORY STORED POINTERS *****
CHK_INST_PU      EQU   $
                 LDX   INST_TABLE_VAL      ;get table row & column in IX
                 LDAA  1,X                 ;get INST PU value in ACCA for compare
                 CMPA  L_PHASEA            ;compare to A phase
                 BLS   INST_PICK_UP        ;if phase current greater we have P.U.
                 CMPA  L_PHASEB            ;compare to B phase
                 BLS   INST_PICK_UP        ;if phase current greater we have P.U.
                 CMPA  L_PHASEC            ;compare to C phase
                 BLS   INST_PICK_UP        ;if phase current greater we have P.U.

                 CLR   INST_CNTR_4         ;reset inst pu counter
                 BCLR  INST_FLAGS,INST_PU_BIT  ;clear inst pu bit
                 JMP   WAIT_FOR_HI_ATOD    ;GO wait for A/D to get done

INST_PICK_UP     EQU   $
                 BSET  INST_FLAGS,INST_PU_BIT  ;set inst pu flag
                 BSET  INST_FLAGS,I_TIMR_BIT   ;set inst timer active bit
                 LDX   #REGSTART           ;set 6811 io reg base in x
                 BSET  PORTA,X,SC_RESTR_BIT_OUT      ;set restraint output
                 INC   INST_CNTR_4         ;step pu counter
                 LDAB  INST_CNTR_4         ;get current inst pu counter
                 CMPB  #2                  ;test for limit of 2
                 BLO   WAIT_FOR_HI_ATOD    ;not reached 2 yet
; *************** THIS SECTION RUN ONLY IF WE ARE TRIPPING ******************
                 BCLR  SC_PU_GF_PU,$07     ;clear before setting phase(s) > SCPU
                 CMPA  L_PHASEA            ;check if A phase > INST PU
                 BHI   CHECK_B_FOR_PU      ;if A phase low check B phase
                 BSET  SC_PU_GF_PU,$01     ;set bit for A phase > SC PU
```

```
CHECK_B_FOR_PU      EQU   $
                    CMPA  L_PHASEB          ;check if B phase > INST PU
                    BHI   CHECK_C_FOR_PU    ;if B phase low check C phase
                    BSET  SC_PU_GF_PU,$02   ;set bit for B phase > SC PU
CHECK_C_FOR_PU      EQU   $
                    CMPA  L_PHASEC          ;check if C phase > INST PU
                    BHI   FINISH_INST       ;if C phase low continue
                    BSET  SC_PU_GF_PU,$04   ;set bit for C phase > SC PU
FINISH_INST         EQU   $

*********************** FIND THE PEAK OF 3 PHASES HERE ***********************
                    LDAA  L_PHASEA          ;check if A phase max
                    CMPA  L_PHASEB          ;check if B phase max
                    BHI   IS_C_INST_PEAK    ;A is > so branch
                    LDAA  L_PHASEB          ;B is phase max
IS_C_INST_PEAK      EQU   $
                    CMPA  L_PHASEC          ;check if C phase max
                    BHI   C_ISNT_INST_PEAK  ;previous is > so branch
                    LDAA  L_PHASEC          ;B is phase max
C_ISNT_INST_PEAK    EQU   $
                    LDAB  #06               ;get multiplier
                    MUL                     ;do it
                    STD   ST_PEAK           ;save max current of trip

;*************** WE ARE TRIPPING SO CLEAN UP THE STACK ***********************
                    TSX                     ;move stack pointer to IX
                    LDAB  #09               ;9 bytes are on stack so load ACCB
                    ABX                     ;add 9 to stack pointer
                    TXS                     ;put it back in the Stack Pointer
; ************ STACK IS CLEANED UP AT THIS POINT - NOW GO TRIP *********
                    SEI                     ;set so don't interrupt tripping
                    LDY   #ST_PEAK          ;point to value
                    LDX   #MAX_PHASE_I      ;point to storage
                    JSR   I_CONVERSION      ;go convert to xmit format
                    JMP   DO_SC_TRIP        ;tripping so leave don't finish A/D


;;; W A I T   F O R   A T O D   R E A D   T O   C O M P L E T E
WAIT_FOR_HI_ATOD  EQU   $
;******* CUR_PHASEA, B, or C ARE ONLY VALUES USED OUTSIDE OF INTERRUPT ******
;******** L_PHASE & HI_PHASE ARE USED AS INTERMEDIATES IN INTERRUPT ********
                    LDAB  ADR1+REGSTART     ;GET PHASE A HIGH GAIN A/D
                    STAB  HI_PHASEA         ;save value for check in trip routine
                    CMPB  #$F6
                    BLS   USE_HI_PHASEA
                    ;use the low gain A/D value for I^2 summation
                    LDAA  L_PHASEA
                    LDAB  #6
                    MUL
                    STD   CUR_PHASEA
                    JMP   DO_PHASEA_SUMMATION     ;go do I^2 summation
USE_HI_PHASEA       EQU   $
                    CLR   CUR_PHASEA
                    STAB  CUR_PHASEA+1      ;PUT IN CUR ATOD PTR TABLE
DO_PHASEA_SUMMATION       EQU         $
; AT THIS POINT EITHER LOW OR HIGH GAIN HAS BEEN STORED TO CUR_PHASEA FOR USE
                    TBA                     ;move low byte to ACCA for 0 check
                    BEQ   LAST_A_ADD
                    MUL                     ;multiply low byte by low byte
                    ADDD  RMS_SUMSQ_1       ;add double to low 16 bits
                    STD   RMS_SUMSQ_1       ;save it
                    BCC   HI_WORD_OK
                    LDX   RMS_SUMSQH_1      ;if carry set increment
                    INX                     ;the high byte
                    STX   RMS_SUMSQH_1      ;and save it
HI_WORD_OK          EQU   $
                    LDAA  CUR_PHASEA+1      ;get low byte
                    LDAB  CUR_PHASEA        ;get high byte for 0 check
                    BEQ   A_I_SQUARE_DONE   ;if high byte = 0 we's done
                    MUL
                    LSLD
; result is shifted to multiply by 2 - same as 2 multiplies & an add
                    ADDD  RMS_SUMSQH_1+1    ;add low * high to middle 16 bits
                    STD   RMS_SUMSQH_1+1    ;and save it
                    BCC   LAST_A_ADD
                    INC   RMS_SUMSQH_1      ;Carry was set, increment the high byte
```

```
LAST_A_ADD          EQU   $
                    LDAA  CUR_PHASEA         ;get high byte
                    BEQ   A_I_SQUARE_DONE    ;if 0 we're finished
                    TAB                      ;move to ACCB
                    MUL                      ;multiply for last value
                    ADDD  RMS_SUMSQH_1       ;add to high 16 bits
                    STD   RMS_SUMSQH_1       ;store back to accumulator
A_I_SQUARE_DONE     EQU   $
;** AT THIS POINT A PHASE I^2 SUMMATION IS FINISHED AND B PHASE IS STARTED **
                    LDAB  ADR2+REGSTART      ;GET PHASE B HIGH GAIN A/D
                    STAB  HI_PHASEB          ;save value for check in trip routine
                    CMPB  #$F6
                    BLS   USE_HI_PHASEB
                    ;; USE LOW GAIN PHASEB SQUARE IT & ADD TO THE SUM OF PHASEB SQUARES
                    LDAA  L_PHASEB
                    LDAB  #6
                    MUL
                    STD   CUR_PHASEB
                    JMP   DO_PHASEB_SUMMATION     ;go do I^2 summation
USE_HI_PHASEB       EQU   $
                    CLR   CUR_PHASEB
                    STAB  CUR_PHASEB+1
DO_PHASEB_SUMMATION       EQU                $
; AT THIS POINT EITHER LOW OR HIGH GAIN HAS BEEN STORED TO CUR_PHASEB FOR USE
                    TBA                      ;move low byte to ACCA for 0 check
                    BEQ   LAST_B_ADD
                    MUL                      ;multiply low byte by low byte
                    ADDD  RMS_SUMSQ_2        ;add double to low 16 bits
                    STD   RMS_SUMSQ_2        ;save it
                    BCC   HI_WORD_B_OK
                    LDX   RMS_SUMSQH_2       ;if carry set increment
                    INX                      ;the high byte
                    STX   RMS_SUMSQH_2       ;and save it
HI_WORD_B_OK        EQU   $
                    LDAA  CUR_PHASEB+1       ;get low byte
                    LDAB  CUR_PHASEB         ;get high byte for 0 check
                    BEQ   B_I_SQUARE_DONE    ;if high byte = 0 we's done
                    MUL
                    LSLD                     ;
; result is shifted to multiply by 2 - same as 2 multiplies & an add
                    ADDD  RMS_SUMSQH_2+1     ;add low * high to middle 16 bits
                    STD   RMS_SUMSQH_2+1     ;and save it
                    BCC   LAST_B_ADD
                    INC   RMS_SUMSQH_2       ;Carry was set, increment the high byte
LAST_B_ADD          EQU   $
                    LDAA  CUR_PHASEB         ;get high byte
                    BEQ   B_I_SQUARE_DONE    ;if 0 we're finished
                    TAB                      ;move to ACCB
                    MUL                      ;multiply for last value
                    ADDD  RMS_SUMSQH_2       ;add to high 16 bits
                    STD   RMS_SUMSQH_2       ;store back to accumulator
B_I_SQUARE_DONE     EQU   $
;** AT THIS POINT B PHASE I^2 SUMMATION IS FINISHED AND C PHASE IS STARTED **
                    LDAB  ADR3+REGSTART      ;GET PHASE C HIGH GAIN A/D
                    STAB  HI_PHASEC          ;save value for check in trip routine
                    CMPB  #$F6
                    BLS   USE_HI_PHASEC
                    ;; USE LOW GAIN PHASEC, SQUARE IT AND ADD IT TO THE PHASEC SQUARE SUM
                    LDAA  L_PHASEC
                    LDAB  #6
                    MUL
                    STD   CUR_PHASEC
                    JMP   DO_PHASEC_SUMMATION     ;go do I^2 summation
USE_HI_PHASEC       EQU   $
                    CLR   CUR_PHASEC
                    STAB  CUR_PHASEC+1
DO_PHASEC_SUMMATION       EQU                $
; AT THIS POINT EITHER LOW OR HIGH GAIN HAS BEEN STORED TO CUR_PHASEC FOR USE
                    TBA                      ;move low byte to ACCA for 0 check
                    BEQ   LAST_C_ADD
                    MUL                      ;multiply low byte by low byte
                    ADDD  RMS_SUMSQ_3        ;add double to low 16 bits
                    STD   RMS_SUMSQ_3        ;save it
                    BCC   HI_WORD_C_OK
                    LDX   RMS_SUMSQH_3       ;if carry set increment
                    INX                      ;the high byte
                    STX   RMS_SUMSQH_3       ;and save it
```

```
HI_WORD_C_OK     EQU   $
                 LDAA  CUR_PHASEC+1       ;get low byte
                 LDAB  CUR_PHASEC         ;get high byte for 0 check
                 BEQ   C_I_SQUARE_DONE    ;if high byte = 0 we's done
                 MUL
                 LSLD                     ;
; result is shifted to multiply by 2 - same as 2 multiplies & an add
                 ADDD  RMS_SUMSQH_3+1     ;add low * high to middle 16 bits
                 STD   RMS_SUMSQH_3+1     ;and save it
                 BCC   LAST_C_ADD
                 INC   RMS_SUMSQH_3       ;Carry was set, increment the high byte
LAST_C_ADD       EQU   $
                 LDAA  CUR_PHASEC         ;get high byte
                 BEQ   C_I_SQUARE_DONE    ;if 0 we're finished
                 TAB                      ;move to ACCB
                 MUL                      ;multiply for last value
                 ADDD  RMS_SUMSQH_3       ;add to high 16 bits
                 STD   RMS_SUMSQH_3       ;store back to accumulator
C_I_SQUARE_DONE  EQU   $

;; Read the Ground fault data
GET_GRD_FLT      EQU   $
                 LDAB  ADR4+REGSTART      ;GET GROUND FAULT A/D in low byte
                 BRCLR GF_FLAGS,SUPER_DESENSE,NORM_GF     ;read A/D as normal if clear
                 LSRB                     ;do 3 shift
                 LSRB                     ;rights to divide
                 LSRB                     ;result by eight
NORM_GF          EQU   $
                 STAB  NEW_GF             ;save new value for trip use
                 CMPB  CUR_GF             ;is new GF larger
                 BLS   RESET_LOW_GN       ;old is larger so leave as is
                 STAB  CUR_GF             ;new is larger so save it

;; RESET THE ATOD FOR THE LOW GAIN READ
RESET_LOW_GN     EQU   $
                 LDAA  #$34               ;GET VALUE TO SET A/Ds FOR LOW GAIN AMPs
                 STAA  ADCTL+REGSTART     ;STORE IT TO ONBOARD TO DO CORRECT A/Ds

;; TEST FOR ONE MS TOGGLE FLAG TO DECREMENT ALL TIMERS
TEST_FOR_1MS     EQU   $

                 BRSET IFLAGS,ONE_MSBIT,ONE_MILS     ;IF 1mSEC BIT SET DO 1 mSEC STUFF
                 BSET  IFLAGS,ONE_MSBIT   ;SET 1 mSEC BIT
                 JMP   DECREMENT_Q_TIMERS      ;go do the Que timers

ONE_MILS         EQU   $
                 BCLR  IFLAGS,ONE_MSBIT   ;WE ARE AT 1 mSEC SO CLEAR 1 mSEC BIT

;; INCREMENT ALL POSITIVE MS TIMERS FROM SMALLEST TO LARGEST *********
                 INC   T_2MS_ST           ;increment 2ms ST timer
                 INC   T_2MS_GF           ;increment 2ms GF timer
                 INC   T_07MS             ;INCREMENT 17 mSEC TIMER
                 INC   T_11MS             ;INCREMENT 11 mSEC TIMER
                 INC   T_12MS             ;INCREMENT 12 mSEC TIMER
                 INC   T_13MS             ;INCREMENT 13 mSEC TIMER
                 INC   T_PHASEA_RMS       ;INCREMENT PHASE A RMS TIMER
                 INC   T_PHASEB_RMS       ;INCREMENT PHASE B RMS TIMER
                 INC   T_PHASEC_RMS       ;INCREMENT PHASE C RMS TIMER
                 INC   T_64MS             ;INCREMENT 64 mSEC TIMER
                 INC   T_250MS            ;INCREMENT 250 mSEC TIMER
                 JMP   STROBE_WDOG        ;leave interrupt

;;*********************************************************************
;; DECREMENT ALL QUEUED TIMERS
DECREMENT_Q_TIMERS      EQU               $

                 LDAA  INST_RESET_TIMER   ;get the timer
                 BLE   RETAIN_ST          ;if negative bit set it is asleep/off
                                          ;if = 0, bypass
                 DECA
                 STAA  INST_RESET_TIMER
RETAIN_ST        EQU   $
                 LDAA  ST_RETN_TIMER      ;get retention timer value
                 BLE   TRY_TO_RESTRAIN_YOURSELF      ;if negative it is asleep/off
                 DECA
                 STAA  ST_RETN_TIMER
TRY_TO_RESTRAIN_YOURSELF                  EQU   $
```

```
                LDAA  SC_RESTRN_TIMER
                BLE   TRY_OUT_I2          ;if negative we are asleep/off
                DECA
                STAA  SC_RESTRN_TIMER
TRY_OUT_I2      EQU   $
                LDX   ST_I2_OUT_TIMER
                BLE   DEC_GF_TIMERS       ;branch if asleep, off, or 0
                DEX
                STX   ST_I2_OUT_TIMER
DEC_GF_TIMERS   EQU   $
                BRSET FLAGS$,NO_GF_BIT,STROBE_WDOG  ;if no GF bypasss
                LDAA  GF_RESTRN_TIME      ;get restraint timer
                BLE   CHK_RETN_TIMR       ;if asleep or null bypass
                DECA                      ;decrement
                STAA  GF_RESTRN_TIME      ;save value
CHK_RETN_TIMR   EQU   $
                LDX   GF_RETN_TIME        ;get restraint timer
                BLE   CHK_LONG_TIMR       ;if asleep or null bypass
                DEX                       ;decrement
                STX   GF_RETN_TIME        ;save value
CHK_LONG_TIMR   EQU   $
                LDX   GF_LONG_TIME        ;get restraint timer
                BLE   STROBE_WDOG         ;if asleep or null bypass
                DEX                       ;decrement
                STX   GF_LONG_TIME        ;save value
;***************ALL GF TIMERS DONE DECREMENTED AT THIS POINT********************
STROBE_WDOG     EQU   $
                LDX   #REGSTART
                BCLR  PORTA,X,WATCHDOG_BIT    ;set watchdog bit low
                BSET  SPCR,X,$5E           ;turn SPI back on for transmissions
                RTI
;*********************END OF .5mSEC INTERRUPT ROUTINE *************************
.PAGE


;*************** FOLLOWING ARE THE SOFTDOG ERROR / TRIP ROUTINES ***************
;;
;;              CALLED: From any interrupt except timer output compare1 (TOC1)
;;                   and RESET_VECTOR.
;;
;;              RETURNS: Doesn't return, this routine reinitializes the trip unit to
;;                   try to run code normally. If 3 soft errors occur in 10 minutes,
;;                   the breaker will trip.
;;
;;              USED: ACCA, ACCB, IX    RESTORED: NOTHING !!!!!!!
;;
;;***************************************************************************
SOFTDOG_INTERRUPT EQU   $
                SEI                       ;set interrupts to stop any incoming
                LDX   #REGSTART           ;get start of onboard regs
                LDAA  TFLG1,X             ;clear timer any interrupt
                STAA  TFLG1,X             ;now it's clear
                LDAA  #$89                ;setup value for option register
                STAA  OPTION,X            ;reset option register in case of trash
                LDAA  SOFT_DOG_CNTR       ;get # of soft errors
                CMPA  #$FF                ;compare to reset value
                BNE   NEXT_ERROR          ;already have 1 or more errors
                LDD   #600                ;600 seconds = 10 minutes
                STD   SOFT_DOG_TIMER1     ;start 1st soft timer
                LDAA  #$01                ;load 1 error
                STAA  SOFT_DOG_CNTR       ;clr flag + 1 error
                JMP   INIT_1              ;go reinitialize the trip unit
NEXT_ERROR      EQU   $
                LDAA  SOFT_DOG_CNTR       ;get # of errors
                CMPA  #$02                ;see if we have 2 errors already
                BHS   SOFT_TRIP           ;this is error #3 go trip
                INC   SOFT_DOG_CNTR       ;only 2nd error inc counter
                LDD   #600                ;get value for 2nd timer
                STD   SOFT_DOG_TIMER2     ;save it to the 2nd timer
                JMP   INIT_1              ;reinitialize trip unit

SOFT_TRIP       EQU   $
                SEI                       ;turn interrupts off
                JSR   RESET_COP           ;reset the softdog
                BSET  FLAGS$,KILL_WATCHDOG_BIT     ;we are in trip don't strobe WD
                LDAA  #$E2                ;CAUSE OF TRIP & PACKET 2
                STAA  TRIP_STATUS_BYTE    ;SAVE TO TRIP CAUSE LOCATION
```

```
                LDAA  SOFT_TRIP_CNT      ;get # of trips
                ANDA  #63                ;max # trips to store
                CMPA  #63                ;max # of trips
                BHS   CLR_SF_CNT         ;clear count
                INC   SOFT_TRIP_CNT      ;increment # of SC TRIPS
                JMP   GO_TRIP            ;if high bit clear leave
CLR_SF_CNT      EQU   $
                CLR   SOFT_TRIP_CNT      ;else clear soft trips
GO_TRIP         EQU   $
                LDX   #REGSTART          ;start of onboard regs
                CLR   PORTA,X            ;wait for watchdog trip
                BCLR  LT_TRIP_CNT,$40    ;cause of trip =! long time
                BCLR  PU_TRIP_CNT,$40    ;cause of trip =! phase unbal
                BCLR  SC_TRIP_CNT,$40    ;cause of trip =! short circuit
                BCLR  GF_TRIP_CNT,$40    ;cause of trip =! gnd fault
                BSET  SOFT_TRIP_CNT,$40  ;cause of trip = soft dog
                JMP   GLOBAL_TRIP        ;go to global trip & wait for watch dog
;;**********SOFTDOG DECREMENT ROUTINE*********************************
;;
;;              CALLED: From the one second timer whenever there is an active softdog
;;                   timer.
;;
;;              RETURNS: Clears any errors that have timed out. If no remaining errors
;;                   exist, resets the error counter.
;;
;;              USED: ACCA, ACCB, IX          RESTORED: NOTHING !!!!!!!!!!!!
;;
;;*****************************************************************
DEC_SOFT_DOG    EQU   $
                LDX   SOFT_DOG_TIMER1    ;get timer value
                DEX                      ;decrement it
                STX   SOFT_DOG_TIMER1    ;save it back again
                BNE   CHECK_SOFT_T2      ;timer 1 hasn't timed out go do 2
                LDX   SOFT_DOG_TIMER2    ;get timer 2 value
                STX   SOFT_DOG_TIMER1    ;put it into timer 1
                LDD   #0000              ;load 0 to clear
                STD   SOFT_DOG_TIMER2    ;clear timer 2
                DEC   SOFT_DOG_CNTR      ;decrement the softdog counter
                BNE   GO_HOME            ;we still have more errors
                LDAA  #$FF               ;get softdog reset value
                STAA  SOFT_DOG_CNTR      ;reset the counter
                JMP   GO_HOME            ;return to routine
CHECK_SOFT_T2   EQU   $
                LDX   SOFT_DOG_TIMER2    ;get timer 2
                BEQ   GO_HOME            ;timer is already 0 so leave
                DEX                      ;decrement counter
                STX   SOFT_DOG_TIMER2    ;restore timer
GO_HOME         EQU   $
                RTS                      ;return

.PAGE
;;TTTTTTTTTTTT ALL PICK UP AND DELAY TABLES ARE IN THIS LOCATION TTTTTTTTTTTTT
.COMMENT
 TTTTTTTT       A        BBBB    L        EEEEEEE   SSSSSSS
    T           A        B   B   L        E         S
    T          A A       B   B   L        E         S
    T         AAAAA      BBBB    L        EEEEEEE   SSSSSSS
    T        A     A     B   B   L        E               S
    T       A       A    B   B   L        E               S
    T      A         A   BBBB    LLLLLLL  EEEEEEE   SSSSSSS

;;TTTTTTTTTTTTTTTTTTTTTT INSTANTANEOUS PICK UP TABLES TTTTTTTTTTTTTTTTTTTTT
;; FOR ALL BREAKERS EXCEPT THE PE
INST_PU_TBL     EQU   $
                DW    41,61,82,102,123,164,205,246

;; FOR THE PE BREAKER
INST_PE_PU_TBL  EQU   $
                DW    41,51,61,82,102,123,143,164

INST_2000A_PE   EQU   $
                DW    41,51,61,72,82,92,103,123

LI_INST_2500A_PE EQU  $
                DW    41,45,51,61,72,82,92,102
```

```
;table is shifted to allow for working of INST routine
;with ST, INPU switch value is shifted up 1 position

;;TTTTTTTTTTTTTTTTTTTTT SHORT TIME PU TABLE TTTTTTTTTTTTTTTTTTTTTTTTTTTTTTTT
ST_PU_TBL         EQU   $
                  DW    246,308,370,493,617,740,987,1234

ST_PE_PU_TBL      EQU   $                    ;PU TABLE FOR PE BREAKER ONLY

                  DW    246,308,370,493,617,740,863,987

ST_2000A_PE       EQU   $                    ;PU TABLE FOR 2000A PE BREAKER ONLY
                  DW    246,308,370,430,493,553,617,740

ST_2500A_PE       EQU   $                    ;PU TABLE FOR 2500A PE BREAKER ONLY
                  DW    246,270,308,370,430,493,553,617

;;TTTTTTTTTTTTTTTTTTTTTTTSHORT TIME DELAY TABLETTTTTTTTTTTTTTTTTTTTTTTTTTTTT
ST_FIXED_DEL      EQU   $
GF_FIXED_DEL      EQU   $
                  DW    78, 173, 287, 458        ;LE
                  DW    78, 173, 287, 458        ;ME
                  DW    74, 169, 283, 454        ;NE
                  DW    58, 153, 267, 438        ;PE
                  DW    67, 162, 276, 447        ;SE
                  DW    40, 135, 249, 420        ;DS

;
; SHORT TIME I^2 IN TABLES ARE 5% ABOVE NOMINAL TO HELP ADJUST FOR EXTENDED
;                  BREAKER OPENNING TIMES AT CURRENT VALUES LESS THAN 12xP

ST_ISQ_DEL        EQU   $
                  LONG   $00000000,$00000000,$00000000,$00000000  ;LE
                  LONG   85756673, 53672191, 32282535, 14457823

                  LONG   $00000000,$00000000,$00000000,$00000000  ;ME
                  LONG   85756673, 53672191, 32282535, 14457823

                  LONG   $00000000,$00000000,$00000000,$00000000  ;NE
                  LONG   84964464, 52879981, 31490326, 13665613

                  LONG   $00000000,$00000000,$00000000,$00000000  ;PE
                  LONG   81795626, 49711143, 28321488, 10496775

                  LONG   $00000000,$00000000,$00000000,$00000000  ;SE
                  LONG   83578097, 51493615, 30103959, 12279247

                  LONG   $00000000,$00000000,$00000000,$00000000  ;DS
                  LONG   78230684, 46146201, 24756545, 6931833

;TABLES ARE PADDED WITH 0's SO SET_TBL_INDEX ROUTINE WORKS CORRECTLY

;;TTTTTTTTTTTTTTTTTTTT G R O U N D  F A U L T  PU TABLE TTTTTTTTTTTTTTTTTTTTTT
GF_PU_TBL         EQU   $
SENSOR_<1600A     DW    45,56,68,79,102,124,147,170
SENSOR_2000A      DW    72,81,90,99,108,118,127,136
SENSOR_2500A      DW    58,65,72,79,86,94,101,108
SENSOR_3000A      DW    48,54,60,66,72,78,85,90
SENSOR_3200A      DW    45,50,57,62,68,73,79,85
SENSOR_400A       DW    36,41,45,50,54,59,63,68

;;TTTTTTTTTTTTTTT G R O U N D  F A U L T  D E L A Y  TABLE TTTTTTTTTTTTTTTTTT
;                 DW    $4E,$AD,$11F,$1CA
;                 DW    $4E,$AD,$11F,$1CA
;                 DW    $4A,$A9,$11B,$1C6
;                 DW    $3A,$99,$10B,$1B6
;                 DW    $43,$A2,$114,$1BF
;                 DW    $28,$87,$F9,$1A4

GF_ISQ_DEL        EQU   $
                  LONG   $00000000,$00000000,$00000000,$00000000  ;LE
                  LONG   2115172, 1323814, 796242, 356599

                  LONG   $00000000,$00000000,$00000000,$00000000  ;ME
                  LONG   2115172, 1323814, 796242, 356599

                  LONG   $00000000,$00000000,$00000000,$00000000  ;NE
                  LONG   2095632, 1304274, 776703, 337060
```

```
              LONG    $00000000,$00000000,$00000000,$00000000  ;PE
              LONG    2017473, 1226116, 698544, 258901

              LONG    $00000000,$00000000,$00000000,$00000000  ;SE
              LONG    2061438, 1270080, 742508, 302865

              LONG    $00000000,$00000000,$00000000,$00000000  ;DS
              LONG    1929545, 1138187, 610615, 170972

;TABLES ARE PADDED WITH 0's SO SET_TBL_INDEX ROUTINE WORKS CORRECTLY

;********* tables below are used to limit I^2in values to 2000 A max for GF
;                     delay calculations ****************************************

MAX_GF_ATOD_TBL EQU   $
S2000           DW    252
S2500           DW    201
S3000           DW    168
S3200           DW    157
S4000           DW    126

MAX_GF_ISQ_TBL  EQU   $
SENS2000        DW    $F810
SENS2500        DW    $9DD1
SENS3000        DW    $6E40
SENS3200        DW    $6049
SENS4000        DW    $3E04

GF_I_SQ_DEL_TBL EQU   $

PE_2000         LONG  2017473 , 1226116 , 698544 , 258901

SE_2000         LONG  2061438 , 1270080 , 742508 , 302865

DS_2000         LONG  1929545 , 1138187 , 610615 , 170972

SE_2500         LONG  1319320, 812851, 475205, 193834

DS_2500         LONG  1234909, 728440, 390794, 109422

SE_3000         LONG  916194, 564480, 330004, 113460

DS_3000         LONG  857575, 505861, 271385, 75988

SE_3200         LONG  805249, 496125, 290042, 118307

DS_3200         LONG  753728, 444604, 238522, 66786

SE_4000         LONG  515359, 317520,  185627, 75716

DS_4000         LONG  482386, 284547, 152654, 42743

PE2500_TRIP_TBL EQU   $                 ;these values are used with 2500A PE
                LONG  1291183, 784714, 447068, 165697

;;TTTTTTTTTTTTTTTTTTTTT LONG TIME PU TABLE TTTTTTTTTTTTTTTTTTTTTTTTTTTTTTTTTT

LT_PU_TBL       DW    45,55,64,68,73,82,88,91

;;TTTTTTTTTTTTTTTTTTTTT LONG TIME 90% PU TABLE TTTTTTTTTTTTTTTTTTTTTTTTTTTTTT

LT_PU90%_TBL    DW    40,49,57,61,65,74,79,82

;;TTTTTTTTTTTTTTTTTTTTT LONG TIME RATIO TABLES TTTTTTTTTTTTTTTTTTTTTTTTTTTTTT
```

```
LT_RATIO_TABLE      DW      $6D,$A4,$F7,$181,$25D,$371,$44E,$52B

LT_RATIO_SE         DW      $6D,$A4,$F7,$181,$25D,$371,$530,$7C8

;********************** LONG TIME 97% RATIO TABLES ***************************

LT_97%_RATIO        DW      104,155,234,365,574,836,1046,1256     ;THIS ROW AND

SE_LT_97%_RATIO     DW      104,158,237,370,582,852,1275,1729     ;THIS ROW MUST
                                                                  ;BE CONTIGUOUS
;****************************************************************************


LT_DEL_TBL          EQU     $
LT_LE               LONG    7161217,10777994,16203159,25245100

                    LONG    39712206,57796089,72263195,86730301

LT_ME               LONG    7161217,10777994,16203159,25245100

                    LONG    39712206,57796089,72263195,86730301

LT_NE               LONG    7144197,10760974,16186138,25228080

                    LONG    39695186,57779069,72246175,86713281

LT_PE               LONG    7076116,10692893,16118058,25159999

                    LONG    39627106,57710988,72178095,86645201

LT_SE               LONG    7114412,10731188,16156353,25198295

                    LONG    39665401,57749284,86683496,130084815

LT_DS               LONG    6999526,10616302,16041467,25083409

                    LONG    39550515,57634398,86568610,129969929


;;TTTTTTTTTTTTTTTTTTTTTTTTTTTTTTTTTTTTTTTTTTTTTTTTTTTTTTTTTTTTTTTTTTTTTTTTTT
;;THIS IS THE TABLE FOR CONVERTING RAW A/D TO CURRENT VALUES
;*****  Tables have been adjusted 3% high for low communication values. *****
;***** Single bit accuracy can be found by dividing table value by 256. *****
CURRENT_CONV_TBL    EQU     $
I_200_AMP           DW      244,303,342,354,363,380,406,416,457,487,507,533,549,609
I_250_AMP           DW      304,380,429,444,456,475,508,533,571,609,634,665,679,761
I_400_AMP           DW      487,609,685,710,731,761,813,853,914,974,1015,1066,1096,1219
I_600_AMP           DW      731,914,1030,1065,1096,1143,1219,1280,1370,1463,1523,1600,1644,1
I_630_AMP           DW      767,960,1081,1119,1152,1199,1280,1344,1439,1536,1598,1679,1728,1
I_800_AMP           DW      974,1219,1372,1421,1462,1524,1626,1706,1829,1950,2030,2133,2194,
I_1200_AMP          DW      1462,1829,2057,2131,2194,2285,2437,2540,2742,2925,3045,3200,3290
I_1250_AMP          DW      1524,1905,2144,2221,2285,2380,2540,2666,2857,3047,3173,3332,3427
I_1600_AMP          DW      1949,2437,2748,2842,2924,3047,3252,3413,3656,3900,4060,4265,4392
I_2000_AMP          DW      2437,3047,3430,3553,3656,3808,4064,4265,4570,4875,5077,5332,5485
I_2500_AMP          DW      3047,3808,4289,4441,4570,4760,5081,5332,5712,6093,6345,6732,6925
I_3000_AMP          DW      3656,4570,5146,5329,5485,5712,6096,6398,6856,7313,7614,7998,8227
I_3200_AMP          DW      3900,4875,5490,5684,5850,6094,6503,6825,7313,7800,8122,8532,8774
I_4000_AMP          DW
                    4975,6094,6862,7106,7313,7617,8129,8532,9142,9750,10153,10664,10970,12

GF_TO_PHASE         DW      $7B                    ;value to make current conversion usable w/ GF
;****************************************************************************
;GUESS:             This is a first guess table for the seed for the square root
;                   routine

GUESS:              EQU $
                    DW      $0B
                    DW      $139
                    DW      $194
                    DW      $1DE
                    DW      $21F
                    DW      $258
                    DW      $28C
                    DW      $2BD
                    DW      $2EA
                    DW      $315
                    DW      $33D
```

```
                DW     $364
                DW     $389
                DW     $3AC
                DW     $3CE
                DW     $3EF
                DW     $40F
                DW     $42E
                DW     $44D
                DW     $46A
                DW     $487
                DW     $4A3
                DW     $4BE
                DW     $4D9
                DW     $4F3
                DW     $50C
                DW     $525
                DW     $53E
                DW     $556
                DW     $56E
                DW     $585
                DW     $59C
                DW     $5B3
                DW     $5C9
                DW     $5DF
                DW     $5F2

.PAGE

;************************ PRODUCTION TEST CODE IS HERE ************************

PRODUCTION_TEST  EQU    $
                 CLR    DDRD+REGSTART      ;set potrD to inputs
                 LDAA   PORTA+REGSTART     ;check for gf cap
                 ANDA   #$01               ;mask all but cap
                 BNE    WALK_A_1           ;if != 0 cap is discharged
                 JMP    CHECK_RAM_MEM_RETENTION

WALK_A_1         EQU    $
                 LDX    #RAM_END-1         ;point to GF RAM locations
                 LDD    #$55AA             ;load value

DECREMENT_AND_STORE     EQU                $
                 STD    0,X                ;store bit pattern
                 DEX                       ;back up 1
                 DEX                       ;do it again
                 CPX    #00                ;check for bottom
                 BGE    DECREMENT_AND_STORE      ;not done so store again
                 LDX    #RAM_END-3         ;point to  RAM locations
                 LDY    #LT_SWITCHES       ;error storage in case of error
                 JSR    CHECK_RAM_RETENTION
                 BSET   IN_PU_SWITCHES,$70       ;set to indicate not tested
                 BRA    GF_RAM_TEST_OK     ;branch around test

CHECK_RAM_MEM_RETENTION EQU                $
                 LDD    #$55AA             ;load value
                 LDX    #GF_LONG_TIME-1    ;point to GF RAM locations
                 LDY    #IN_PU_SWITCHES    ;error storage in case of error
                 JSR    CHECK_RAM_RETENTION


GF_RAM_TEST_OK   EQU    $
                 JSR    RESET_COP          ;keep the puppy happy
.PAGE

; ****************** CHECKSUM TEST DONE HERE ******************************
;This test takes roughly 81,000 clock cycles or 40 mSec. - will not trip COP
CHECKSUM_TEST    EQU    $
                 CLRB                      ;CLEAR FOR CHECKSUM
                 LDY    #CODESTART         ;get bottom of PROM
ADD_NEXT_BYTE    EQU    $
                 ADDB   0,X                ;add byte to ACCA
                 INY                       ;decrement IX
```

```
                BNE     ADD_NEXT_BYTE        ;go add next byte
                ADCB    #0                   ;add carry back in
                STAB    MAX_PHASE_I          ;all done so save it

;********************** EEPROM TEST DONE HERE ****************************
EEPROM_TEST     EQU     $
                JSR     RESET_COP            ;keep the puppy happy
                LDAA    PORTA+REGSTART       ;read portA
                ANDA    #$04                 ;mask for SC restraint
                BEQ     EEPROM_TEST          ;loop back
;********* THIS SECTION LOOPED BY PULLING THE ST RESTRAINT LINE HIGH *********

; ******************* RESTART INTERRUPTS AT THIS POINT ********************

                BSET    TRIP_STATUS_BYTE,$70     ;set for prod test
                LDX     #REGSTART            ;start of onboard registers
                BSET    DDRD,X,$3E           ;set up portd data direction
                BSET    PORTD,X,$3E          ;set up portd data
                LDAA    TFLG1,X              ;read interrupts
                STAA    TFLG1,X              ;clear interrupts
                LDD     TCNT,X               ;get timer
                ADDD    #970                 ;value for .5mSec interrrupt
                STD     TOC1,X               ;load output compare register
                BSET    TMSK1,X,$80          ;allow timer 1 interrupt
                BSET    IFLAGS,TRIPPING      ;shut down instantaneous
                BSET    FLAGS$,KILL_WATCHDOG_BIT      ;shut down watchdog
                CLI                          ;allow interrupts

.PAGE
; ********************** MULTI TESTING DONE HERE ****************************

MULTI_TEST      EQU     $
                LDAA    PACKET_PTR
                BEQ     TRY_NEXT_ATD_VAL     ;if 0 don't corrupt data
                LDX     #HI_PHASEA           ;start of retrieval
                LDY     #A_PHASE_RMS         ;storage location start
                JSR     MOVE_TO_SERIAL       ;move raw A/D data

TRY_NEXT_ATD_VAL EQU    $
                LDAA    PACKET_PTR           ;get packet for check
                DECA                         ;subtract 1 to check for data conflict
                BEQ     READ_PORTA           ;if = go read porta input
                LDX     #L_PHASEA            ;retrieve from
                LDY     #C_PHASE_RMS         ;store to
                JSR     MOVE_TO_SERIAL       ;move raw A/D data

READ_PORTA      EQU     $
                LDAA    PORTA+REGSTART       ;read port A
                STAA    MAX_IDENT            ;save to serial buffer

CHECK_FOR_DESENSE EQU   $
                BRCLR   MAX_IDENT,$02,DESENSE_THE_GF  ;if clr restraint is high
                CLR     GF_FLAGS             ;no restraint so clear
                LDX     #REGSTART            ;get start of registers
                BCLR    PORTD,X,GF_DESENSE_BIT_OUT    ;clr restraint line
                BRA     GF_DESENSE_SET
DESENSE_THE_GF  EQU     $
                BSET    GF_FLAGS,TURN_ON_DESENSE      ;set flag for desense
GF_DESENSE_SET  EQU     $

TRY_TRANSMIT    EQU     $
                LDAA    T_2MS_ST             ;get 2 mSec timer
                CMPA    #2
                BLO     TOGGLE_PORTA         ;if < 2 branch
                CLR     T_2MS_ST
                JSR     SERIAL
                JSR     RESET_COP

TOGGLE_PORTA    EQU     $
                LDAA    T_250MS              ;get timer
                CMPA    #50                  ;check for 50 mSec
                BLO     RETURN_TO_TEST_TOP       ;start repeating tests again
                CLR     T_250MS              ;clr timer
                LDAA    PORTA+REGSTART       ;get portA values
```

```
                    COMA                          ;complement portA values
                    BRSET MAX_IDENT,$04,STORE_INVERSE  ;SC restr off don't mask
                    ANDA  #$B8                    ;don't reset watchdog
STORE_INVERSE       EQU   $
                    STAA  PORTA+REGSTART          ;store the inverse

RETURN_TO_TEST_TOP        EQU                     $
                    JMP   MULTI_TEST              ;go to top & run again

.PAGE

;****************** TEST SUBROUTINES ARE HERE ************************

MOVE_TO_SERIAL      EQU   $
                    LDAA  #4                      ;# OF PASSES
                    STAA  TEMP                    ;save it
                    CLRA                          ;clr for rebuilding data
DO_NEXT_BYTE        EQU   $
                    LDAB  0,X                     ;load ACCB from pointer
                    LSLD                          ;format data
                    LSRB                          ;finish format
                    STAB  0,Y                     ;save off ACCB
                    INX
                    INY                           ;increment pointers
                    CPX   #MEM_RATIO              ;are we pointing at memory ratio
                    BNE   X_IS_OK                 ;no
                    INX                           ;move to correct position
X_IS_OK             EQU   $
                    DEC   TEMP                    ;count down
                    BNE   DO_NEXT_BYTE            ;move next byte
                    STAA  0,Y                     ;all done store high bits
                    RTS

;*********************** RAM RETENTION TEST DONE HERE ************************

CHECK_RAM_RETENTION       EQU                     $
                    CPD   0,X                     ;COMPARE DATA FOR GOOD VALUE
                    BNE   RAM_FAILURE             ;if not 0 RAM was bad
                    DEX
                    DEX                           ;
                    CPX   #00                     ;bottom of RAM
                    BGE   CHECK_RAM_RETENTION        ;next 16 bit check
                    CLRA                          ;clear so error bit not set
                    BRA   RAM_REMEMBERS           ;passed test

RAM_FAILURE         EQU   $
                    XGDX                          ;move for formatting
                    LSLD                          ;set up for
                    LSRB                          ;transmit format
                    ORAA  #$10                    ;set error bit

RAM_REMEMBERS       EQU   $
                    STD   0,Y                     ;store error
                    RTS                           ;return good or error set

.PAGE

.ORIGIN $FFC0

RESERVED1           FDB   SOFTDOG_INTERRUPT ;FFC0
RESERVED2           FDB   SOFTDOG_INTERRUPT ;FFC2
RESERVED3           FDB   SOFTDOG_INTERRUPT ;FFC4
RESERVED4           FDB   SOFTDOG_INTERRUPT ;FFC6
RESERVED5           FDB   SOFTDOG_INTERRUPT ;FFC8
RESERVED6           FDB   SOFTDOG_INTERRUPT ;FFCa
RESERVED7           FDB   SOFTDOG_INTERRUPT ;FFCC
RESERVED8           FDB   SOFTDOG_INTERRUPT ;FFCE
RESERVED9           FDB   SOFTDOG_INTERRUPT ;FFD0
RESERVEDA           FDB   SOFTDOG_INTERRUPT ;FFD2
RESERVEDB           FDB   SOFTDOG_INTERRUPT ;FFD4
SCI_INT             FDB   SOFTDOG_INTERRUPT ;FFD6
SPIE_INT            FDB   SOFTDOG_INTERRUPT ;FFD8
PAII_INT            FDB   SOFTDOG_INTERRUPT ;FFDA
PAOVI_INT           FDB   SOFTDOG_INTERRUPT ;FFDC
```

```
TOV_INT           FDB   SOFTDOG_INTERRUPT ;FFDE
TOC5_INT          FDB   SOFTDOG_INTERRUPT ;FFE0
TOC4_INT          FDB   SOFTDOG_INTERRUPT ;FFE2
TOC3_INT          FDB   SOFTDOG_INTERRUPT ;FFE4
TOC2_INT          FDB   SOFTDOG_INTERRUPT ;FFE6
TOC1_INT          FDB   T1_INTERRUPT      ;FFE8
TIC3_INT          FDB   SOFTDOG_INTERRUPT ;FFEA
TIC2_INT          FDB   SOFTDOG_INTERRUPT ;FFEC
TIC1_INT          FDB   SOFTDOG_INTERRUPT ;FFEE
RTI_INT           FDB   SOFTDOG_INTERRUPT ;FFF0
IRQ_INT           FDB   SOFTDOG_INTERRUPT ;FFF2
XIRQ_INT          FDB   SOFTDOG_INTERRUPT ;FFF4
SWI_INT           FDB   SOFTDOG_INTERRUPT ;FFF6
ILLEGAL_OP_INT    FDB   SOFTDOG_INTERRUPT ;FFF8
COP_FAIL_INT      FDB   SOFTDOG_INTERRUPT ;FFFA
CLOCK_FAIL_INT    FDB   SOFTDOG_INTERRUPT ;FFFC
RESET_VECTOR      FDB   INITIALIZE        ;FFFE

.END
```

APPENDIX B

```
##########################################################################
#     SERIES III TRIP UNIT - ADD-ON AMMETER MODULE LISTING  12-21-88     #
#                                                                        #
#           ASSEMBLER: NEC ASM75                                         #
#           DESIGNER: ANDY HAUN                                          #
#           SQUARE D PART NO. 48155-166-01                               #
#                                                                        #
##########################################################################

        ORG     00H

;INITIALIZE THE SYSTEM - ONLY DONE AT START-UP

;INITIALIZE MEMORY

RESET:  LAI     00H
        LHLI    0FH
R1:     ST
        DLS
        GJMP    R1
        LAI     08H     ;INITIALIZE STACK POINTER TO 7F
        TAMSP
        ST              ;POWER UP IN PHASE A

        LAI     0FH
        XADR    OPT     ;INITIALIZE OPTIONS TO INVALID VALUE FORCING A
                        ;AMPERE RATING UPDATE

        GJMP    INIT    ;INITIALIZE SYTEM


        ORG     10H     ;TIMER (SOFTDOG) ROM VECTOR ADDRESS
        PSHHL
        PSHDE
        CALL    TISR    ;CALL TIMER INTERRUPT SERVICE ROUTINE
        POPDE
        POPHL
        EI      00H
        RTPSW

        ORG     20H     ;INT0/S (SERIAL) ROM VECTOR ADDRESS
        PSHHL
        PSHDE
        CALL    SISR    ;CALL SERIAL INTERRUPT SERVICE ROUTINE
        POPDE
        POPHL
        EI      00H
        RTPSW
```

```
ORG    30H     ;INT1 (SWITCH) ROM VECTOR ADDRESS
PSHHL
PSHDE
CALL   PSISR   ;CALL PHASE SELECT INTERRUPT SERVICE ROUTINE
POPDE

       POPHL
       EI      00H
       RTPSW

;&&&&&&&&&&&&&&&&&&&&&&&&&&&&&&&&&&&&&&&&&&&&&&&&&&&&&&&&&&&
;&                                                          &
;&     ROM LOOKUP ROUTINE FOR LONG TIME SWITCH - ENTER AT "LS"  &
;&                                                          &
;&&&&&&&&&&&&&&&&&&&&&&&&&&&&&&&&&&&&&&&&&&&&&&&&&&&&&&&&&&&

       ORG     40H
       DB      038H,059H,071H,07BH,083H,091H,097H,09CH,0,0,0,0,0,0,0,0
       DB      07BH,080H,085H,089H,08EH,093H,098H,09CH
LS:    LAMT
       RT

;- SERIAL PORT INITIALIZATION
INIT:  LAI     0101B   ;SERIAL SETUP DATA
       OP      0FH     ;ACC TO SERIAL MODE SELECT REGISTER (MSR)

;- TIMER INITIALIZATION
       LAI     0FH     ;LOAD ACCUMULATOR WITH HIGH MODULO NIBBLE
       LHLI    LMOD    ;LOAD HL WITH POINTER TO LOW MODULO NIBBLE
       ST              ;STORE ACC IN MEM POINTED TO BY HL
       TAMMOD                  ;TRANSFER ACC AND (HL) TO MODULO REGISTER

       LAI     0000B   ;LCD DISPLAY FRAME CLOCK FREQUENCY = FCL/1024
       OP      0CH     ;ACC TO CLOCK MODE SELECT REGISTER
       TIMER           ;RESET TIMER COUNT
       EI      00H     ;IME F/F = 1 (INTERRUPT MASTER ENABLE)
       EI      07H     ;IER = 7 (INTERRUPT ENABLE REGISTER, ALL ENABLED)

       XADR    TCNT    ;ACC = 0, RESET SOFTDOG TIMER

       GJMP    INIT1   ;JUMP TO MEMORY INITALIZATION

;&&&&&&&&&&&&&&&&&&&&&&&&&&&&&&&&&&&&&&&&&&&&&&&&&&&&&&&&&&&&
;&                                                          &
;&     TISR - SOFTDOG TIMER INTERRUPT ROUTINE               &
;&                                                          &
;&&&&&&&&&&&&&&&&&&&&&&&&&&&&&&&&&&&&&&&&&&&&&&&&&&&&&&&&&&&&

TISR:  XADR    ACCTMP
       RC
       LHLI    TCNT
       LAI     03H
       ACSC
       GJMP    TS1
       GJMP    RESET
TS1:   ST
       XADR    ACCTMP
       RT
;&&&&&&&&&&&&&&&&&&&&&&&&&&&&&&&&&&&&&&&&&&&&&&&&&&&&&&&&&&&&
;&                                                          &
;&  ROM LOOKUP ROUTINE FOR BREAKER AMP RATING - ENTER AT "AMP0"  &
;&                                                          &
;&&&&&&&&&&&&&&&&&&&&&&&&&&&&&&&&&&&&&&&&&&&&&&&&&&&&&&&&&&&&

       ORG     80H
       DB      020H,0E8H,065H,08FH,0B0H,0E2H,035H,078H,0DCH,040H,083H,0D6H
       DB      008H,0D0H,0,0
       DB      03H,03H,04H,04H,04H,04H,05H,05H,05H,06H,06H,06H,07H,07H
AMP0:  LAMT
       RT
```

```
;&&&&&&&&&&&&&&&&&&&&&&&&&&&&&&&&&&&&&&&&&&&&&&&&&&&&&&&&&&&
;&                                                         &
;&CALCULATE BREAKER AMP RATING USING LONG TIME MULTILIER - "BRAT"&
;&                                                         &
;&&&&&&&&&&&&&&&&&&&&&&&&&&&&&&&&&&&&&&&&&&&&&&&&&&&&&&&&&&&

;GET THE LONG TIME OR FULL LOAD SWITCH VALUE
BRAT:   LHLI    LTEMPL  ;POINT TO LONG TIME SWITCH TEMP MEM LOCATION
        LADR    OPT     ;ACC = PACKET NUMBER
        SC
        SKABT   0       ;CHECK FOR MOTOR PROTECT TU
        RC              ;IF NOT MOTOR PROTECT TU, RESET CARRY
        LADR    LTS     ;ACC = LONG TIME SWITCH
        CALL    LS      ;GET SWITCH VALUE
        XADR    LTEMPH          ;LONG TIME-SWITCH HIGH NIBBLE

;SET TEMP STORAGE LOCATIONS TO ZERO
        LAI     00H     ;ACC = 0
        LHLI    BRL     ;LOW TRIP CURRENT SETTING NIBBLE
        ST
        LHLI    BRM     ;MIDDLE TRIP CURRENT SETTING NIBBLE
        ST
        LHLI    BRH     ;HIGH TRIP CURRENT SETTING NIBBLE

        GJMP    TCS


;&&&&&&&&&&&&&&&&&&&&&&&&&&&&&&&&&&&&&&&&&&&&&&&&&&&&&&&&&&&&
;&                                                          &
;& ROM LOOKUP ROUTINE FOR BREAKER AMP RATING - ENTER AT "AMP1"  &
;&                                                          &
;&&&&&&&&&&&&&&&&&&&&&&&&&&&&&&&&&&&&&&&&&&&&&&&&&&&&&&&&&&&&

        ORG     0C0H
        DB      0E8H,0E2H,07EH,0B2H,0DCH,01BH,083H,0D6H,053H,0D0H,023H,08CH
        DB      0CAH,0C4H,0,0
        DB      03H,04H,05H,05H,05H,06H,06H,06H,07H,07H,08H,08H,08H,09H
AMP1:   LAMT
        RT
;ADD COMPLEMENTED LTS VALUE TO AMP RATING TO CALCULATE BREAKER LT CURRENT
TCS:    ST              ;STORE DATA
        RC
        LHLI    TEMP1   ;POINT TO AMP LOW NIBBLE
        LADR    LTEMPL  ;ACC = COMPLEMENTED LONG TIME SWITCH LOW NIBBLE
        ACSC            ;ACC + (HL) + C
        NOP
        ST
        DLS             ;POINT TO AMP MIDDLE NIBBLE (TEMP2)
        LADR    LTEMPH          ;ACC = COMPLEMENTED LONG TIME SWITCH HIGH NIBBLE
        ACSC            ;ACC + (HL) + C
        NOP
        ST
        DLS             ;POINT TO AMP HIGH NIBBLE (TEMP3)
        LAI     0FH     ;ACC = COMPLEMENTED LONG TIME SWITCH HIGH NIBBLE
        ACSC            ;ACC + (HL) + C
        NOP
        ST
        DLS             ;POINT TO AMP VERY HIGH NIBBLE (TEMP4)
        LAI     0FH     ;COMPLEMENT NIBBLE FOR LOW 2 NIBBLES
        ACSC            ;ACC + (HL) + C
        NOP
        ST
        DLS             ;POINT TO AMP SUPER HIGH NIBBLE (TEMP5)
        LAI     0FH
        ACSC
        RT              ;IF NO CARRY, STOP ITTERATIONS, CALCULATION DONE
        ST
        GJMP    TCS2
```

```
;&&&&&&&&&&&&&&&&&&&&&&&&&&&&&&&&&&&&&&&&&&&&&&&&&&&&&&&&&&&&
;&                                                          &
;& ROM LOOKUP ROUTINE FOR BREAKER AMP RATING - ENTER AT "AMP2"  &
;&                                                          &
;&&&&&&&&&&&&&&&&&&&&&&&&&&&&&&&&&&&&&&&&&&&&&&&&&&&&&&&&&&&&

       ORG    100H
       DB     040H,0D0H,0CAH,01DH,060H,0C4H,06BH,0F0H,0B8H,080H,005H,0ACH
       DB     010H,0A0H,0,0
       DB     006H,007H,008H,009H,009H,009H,00AH,00AH,00BH,00CH,00DH,00DH
       DB     00EH,00FH
AMP2:  LAMT
       RT

;INCREMENT THE TRIP CURRENT SETTING COUNTER
TCS2:  RC
       LAI    01H    ;ACC = 1
       LHLI   BRL    ;POINT TO TRIP CURRENT SETTING LOW NIBBLE
       ACSC
       GJMP   T1CS   ;IF NO CARRY, STORE AND DO ANOTHER ITTERATION
       ST
       LAI    00H    ;ACC = 0

       LHLI   BRM    ;POINT TO TRIP CURRENT SETTING MIDDLE NIBBLE
       ACSC
       GJMP   T1CS   ;IF NO CARRY, STORE AND DO ANOTHER ITTERATION
       ST
       LAI    00H    ;ACC = 0
       LHLI   BRH    ;POINT TO TRIP CURRENT SETTING HIGH NIBBLE
       ACSC
T1CS:  GJMP   TCS    ;IF NO CARRY, STORE AND DO ANOTHER ITTERATION

       RT            ;IF CARRY, ERROR AND CONTINUE

;PERCENT BAR GRAPH DISPLAY CONTINUED
PCT1:  CALL   AS
       LAI    0FH
       ACSC
       GJMP   BO     ;IF NO CARRY, THEN STOP ITTERATIONS
       ST
       IES           ;INCREMENT COUNTER
       GJMP   PC     ;ANOTHER ITTERATION
       GJMP   PCT2


;&&&&&&&&&&&&&&&&&&&&&&&&&&&&&&&&&&&&&&&&&&&&&&&&&&&&&&&&&&&&
;&                                                          &
;& ROM LOOKUP ROUTINE FOR BREAKER AMP RATING - ENTER AT "AMP3"  &
;&                                                          &
;&&&&&&&&&&&&&&&&&&&&&&&&&&&&&&&&&&&&&&&&&&&&&&&&&&&&&&&&&&&&

       ORG    140H
       DB     060H,0B8H,034H,0ACH,010H,0A6H,0A0H,068H,094H,0C0H,088H,082H
       DB     018H,070H,0,0
       DB     009H,00BH,00DH,00DH,00EH,00EH,00FH,010H,011H,012H,013H,014H
       DB     015H,017H
AMP3:  LAMT
       RT

;&&&&&&&&&&&&&&&&&&&&&&&&&&&&&&&&&&&&&&&&&&&&&&&&&&&&&&&&&&&&
;&                                                          &
;&     CALCULATE BREAKER AMP RATING TIMES TEN - "TRAT"      &
;&                                                          &
;&&&&&&&&&&&&&&&&&&&&&&&&&&&&&&&&&&&&&&&&&&&&&&&&&&&&&&&&&&&&

;INITIALIZE MEMORY STORAGE AND COUNT VALUE
TRAT:  LAI    09H    ;COUNT FOR TEN
       TAE
```

```
LAI     00H     ;INITIALIZE DATA TO 00
LHLI    TEMP1
ST
DLS             ;TEMP2
ST
DLS             ;TEMP3
ST
DLS             ;TEMP4
ST
        DLS             ;TEMP5
        ST

;ADD NUMBER TO ITSELF FOR TEN ITTERATIONS
TRAT2:  RC              ;RESET CARRY
        LHLI    TEMP1
        LADR    BT1
        ACSC
        NOP
        ST
        DLS             ;TEMP2
        LADR    BT2
        ACSC
        NOP
        ST
        DLS             ;TEMP3
        GJMP    TRAT3

;&&&&&&&&&&&&&&&&&&&&&&&&&&&&&&&&&&&&&&&&&&&&&&&&&&&&&&&&&&&&&
;&                                                            &
;& ROM LOOKUP ROUTINE FOR BREAKER AMP RATING - ENTER AT "AMP4" &
;&                                                            &
;&&&&&&&&&&&&&&&&&&&&&&&&&&&&&&&&&&&&&&&&&&&&&&&&&&&&&&&&&&&&&

        ORG     180H
        DB      0D8H,04EH,0DEH,056H,0C4H,064H,068H,03AH,07AH,0B0H,082H,086H
        DB      026H,09CH,0,0
        DB      009H,00CH,00DH,00EH,00EH,00FH,010H,011H,012H,013H,014H,015H
        DB      016H,018H
AMP4:   LAMT
        RT

;MEMORY INITIALIZATION CONTINUED
INIT1:  SIO             ;SERIAL SETUP

        LAI     00H
        LHLI    ZERO    ;POINT TO ZERO DATA MEM
        ST              ;INITIALIZE MEM LOC TO ZERO

        LAI     01H
        LHLI    ONE     ;POINT TO ONE DATA MEM
        ST              ;INITIALIZE MEM LOC TO 1

        LAI     00H
        LHLI    TLLSN
        ST
        DLS
        ST
        DLS
        ST
        DLS
        ST
        XADR    HMSN    ;INITIALIZE FOR BCD CONVERSION
```

```
:- I/O PORTS INITIALIZATION

        LAI     00      ;PORT 6 MODE SELECT REGISTER SET TO INPUT MODE
        OP      0EH     ;OUTPUT TO MSR

:- LCD DISPLAY INITIALIZATION
        LAI     0010B   ;DISPLAY SETUP DATA
        OP      08H     ;ACC TO DISPLAY MODE SELECT REGISTER (MSR)

        GJMP    MAIN    ;JUMP TO MAIN ROUTINE

;&&&&&&&&&&&&&&&&&&&&&&&&&&&&&&&&&&&&&&&&&&&&&&&&&&&&&&&&&&&&&&&&
;&                                                              &
;&  ROM LOOKUP ROUTINE FOR BREAKER AMP RATING - ENTER AT "AMP5" &
;&                                                              &
;&&&&&&&&&&&&&&&&&&&&&&&&&&&&&&&&&&&&&&&&&&&&&&&&&&&&&&&&&&&&&&&&

        ORG     1C0H
        DB      080H,0A0H,094H,03EH,0C0H,088H,0D2H,0E0H,070H,000H,00EH,058H
        DB      020H,040H,0,0
        DB      00CH,00FH,011H,012H,012H,013H,014H,015H,017H,019H,01AH,01BH
        DB      01CH,01FH
AMP5:   LAMT
        RT

;$$$$$$$$$$$$$$$$$$$$$$$$$$$$$$$$$$$$$$$$$$$$$$$$$$$$$$$$$$$$$$$$$$$$$$$
;$                                                                     $
;$      PSISR - PHASE SELECT INTERRUPT SERVICE ROUTINE                 $
;$                                                                     $
;$$$$$$$$$$$$$$$$$$$$$$$$$$$$$$$$$$$$$$$$$$$$$$$$$$$$$$$$$$$$$$$$$$$$$$$

;ROTATE THE LCD PHASE ADDRESS RIGHT FOUR TIMES TO POINT TO NEXT PHASE
PSISR:  XADR    ACCTMP

        TIMER           ;RESET SOFTWARE RESET TIMER

        LADR    0FH     ;ACC = PHASE INDICATOR
        RC              ;RESET CARRY
        RAR
        SKAEI   00H     ;IF ACC = 0 SET FOR A PHASE
        GJMP    PS1
PS11:   LAI     08H     ;SET FOR PHASE A
PS1:    XADR    0FH     ;SAVE SELECTED PHASE
        LADR    0FH
        SKAEI   01H     ;IF GF SELECT, CHECK TO SEE IF GF IS INSTALLED
        GJMP    PS2
        LADR    OPT
        SKABT   2       ;GF OPTION INSTALLED
        GJMP    PS2
        GJMP    PS11
PS2:    RC
        LAI     00H
        LHLI    TCNT
        ST
        GJMP    PS21

;&&&&&&&&&&&&&&&&&&&&&&&&&&&&&&&&&&&&&&&&&&&&&&&&&&&&&&&&&&&&&&&&
;&                                                              &
;&  ROM LOOKUP ROUTINE FOR BREAKER AMP RATING - ENTER AT "AMP6" &
;&                                                              &
;&&&&&&&&&&&&&&&&&&&&&&&&&&&&&&&&&&&&&&&&&&&&&&&&&&&&&&&&&&&&&&&&

        ORG     200H
        DB      0C0H,070H,05EH,058H,020H,04CH,040H,0D0H,028H,080H,010H,004H
        DB      030H,0E0H,0,0
        DB      012H,017H,01AH,01BH,01CH,01DH,01FH,020H,023H,025H,027H,029H
        DB      02AH,02EH
AMP6:   LAMT
        RT
```

```
;PHASE SELECT ISR CONTINUED
PS21:  LAI    0FH     ;SET THE DEBOUNCE COUNT FOR 16
PS22:  TAD
       LAI    0FH
       TAE
       SKI    05H     ;SKIP IF TIMER INTERRUPT OCCURRED
       GJMP   PS3
       LAI    03H     ;START COUNTING
       ACSC
       GJMP   PS5
       GJMP   RESET

PS5:   ST             ;STORE COUNT
PS3:   IP     05H     ;GET PORT 5 INPUTS
       SKABT  00H     ;TEST SWITCH
       GJMP   PS4
       GJMP   PS21    ;WAIT FOR SWITCH RELEASE
PS4:   DES            ;DECREMENT COUNTER, RETURN IF UNDERFLOW
       GJMP   PS3

       TDA
       AISC   0FH
       GJMP   PSEX
       GJMP   PS22

PSEX:  XADR   ACCTMP
       RT

;&&&&&&&&&&&&&&&&&&&&&&&&&&&&&&&&&&&&&&&&&&&&&&&&&&&&&&&&&&&&
;&                                                          &
;& ROM LOOKUP ROUTINE FOR BREAKER AMP RATING - ENTER AT "AMP7"  &
;&                                                          &
;&&&&&&&&&&&&&&&&&&&&&&&&&&&&&&&&&&&&&&&&&&&&&&&&&&&&&&&&&&&&

       ORG    240H
       DB     088H,06AH,080H,07AH,04CH,082H,094H,02EH,0A4H,010H,0AAH,0BCH
       DB     0F2H,0D4H,0,0
       DB     013H,018H,01BH,01CH,01DH,01EH,020H,022H,024H,027H,028H,02AH
       DB     02BH,030H
AMP7:  LAMT
       RT

;$$$$$$$$$$$$$$$$$$$$$$$$$$$$$$$$$$$$$$$$$$$$$$$$$$$$$$$$$$$$$$$$$$$$$$$$
;$                                                                      $
;$     ARAT - GET AMP RATING MIDDLE AND HIGH NIBBLE                     $
;$                                                                      $
;$$$$$$$$$$$$$$$$$$$$$$$$$$$$$$$$$$$$$$$$$$$$$$$$$$$$$$$$$$$$$$$$$$$$$$$$

ARAT:  DLS            ;AMP RATING MIDDLE NIBBLE (BT2)
       ST             ;STORE MIDDLE AMP NIBBLE
       SC
       LADR   RPID    ;ACC = RATING PLUG POINTER
       DLS            ;AMP RATING HIGH NIBBLE (BT3)
       RT

;CONTINUE WITH 10X RATING CALCULATION (TRAT)
TRAT3: LADR   BT3
       ACSC
       NOP
       ST
       DLS            ;TEMP4
       LADR   BT4
       ACSC
       NOP
       ST
       DLS            ;TEMP5
       LAI    00H
```

```
        ACSC
        GJMP  TRAT1
        RT              ;RETURN IF OVERFLOW ERROR
TRAT1:  ST
        DES
        GJMP  TRAT2  ;ANOTHER ITTERATION
        RT              ;CALCULATION DONE

;&&&&&&&&&&&&&&&&&&&&&&&&&&&&&&&&&&&&&&&&&&&&&&&&&&&&&&&&&&&&&&
;&                                                            &
;& ROM LOOKUP ROUTINE FOR BREAKER AMP RATING - ENTER AT "AMP8"  &
;&                                                            &
;&&&&&&&&&&&&&&&&&&&&&&&&&&&&&&&&&&&&&&&&&&&&&&&&&&&&&&&&&&&&&&

        ORG   280H
        DB    000H,040H,028H,072H,080H,010H,0AEH,0C0H,0E0H,000H,012H,080H
        DB    040H,080H,0,0
        DB    019H,01FH,023H,024H,025H,027H,029H,02BH,02EH,032H,034H,036H
        DB    038H,03EH
AMP8:   LAMT
        RT
;$$$$$$$$$$$$$$$$$$$$$$$$$$$$$$$$$$$$$$$$$$$$$$$$$$$$$$$$$$$$$$$$$$$$$$$$$$$$
;$                                                                          $
;$      GETCON - GET BCD CONVERTED VALUE                                    $
;$                                                                          $
;$$$$$$$$$$$$$$$$$$$$$$$$$$$$$$$$$$$$$$$$$$$$$$$$$$$$$$$$$$$$$$$$$$$$$$$$$$$$

GETCON:       ST              ;STORE CONVERTED VALUE
        XADR  TEMP1  ;GET CONVERTED VALUE
        XADR  BT1    ;STORE CONVERTED VALUE
        XADR  TEMP2  ;GET CONVERTED VALUE
        XADR  BT2    ;STORE CONVERTED VALUE
        XADR  TEMP3  ;GET CONVERTED VALUE
        XADR  BT3    ;STORE CONVERTED VALUE
        IES          ;INCREMENT BCD VALUE
        RT
;&&&&&&&&&&&&&&&&&&&&&&&&&&&&&&&&&&&&&&&&&&&&&&&&&&&&&&&&&&&&&&
;&                                                            &
;&      CALCULATE RUNNING CURRENT TIMES TEN - "TAMP"          &
;&                                                            &
;&&&&&&&&&&&&&&&&&&&&&&&&&&&&&&&&&&&&&&&&&&&&&&&&&&&&&&&&&&&&&&
;INITIALIZE MEMORY STORAGE AND COUNT VALUE
TAMP:   LAI   09H    ;COUNT FOR TEN
        TAE
        LAI   00H    ;INITIALIZE DATA TO 00
        LHLI  TEMP1
        ST
        DLS          ;TEMP2
        ST
        DLS          ;TEMP3
        ST
        DLS          ;TEMP4
        ST
        DLS          ;TEMP5
        ST
        GJMP  TAMP2

;&&&&&&&&&&&&&&&&&&&&&&&&&&&&&&&&&&&&&&&&&&&&&&&&&&&&&&&&&&&&&&
;&                                                            &
;& ROM LOOKUP ROUTINE FOR BREAKER AMP RATING - ENTER AT "AMP9"  &
;&                                                            &
;&&&&&&&&&&&&&&&&&&&&&&&&&&&&&&&&&&&&&&&&&&&&&&&&&&&&&&&&&&&&&&

        ORG   2C0H
        DB    040H,010H,0F2H,096H,0E0H,0D4H,012H,0B0H,098H,080H,01EH,05CH
        DB    050H,020H,0,0
        DB    01FH,027H,02BH,02DH,02EH,030H,034H,036H,03AH,03EH,041H,044H
        DB    046H,04EH
AMP9:   LAMT
        RT
```

```
;CONTINUE WITH 10X RATING CALCULATION (TAMP)
;ADD NUMBER TO ITSELF FOR TEN ITTERATIONS
TAMP2:RC              ;RESET CARRY
        LHLI    TEMP1
        LADR    LLSN
        ACSC
        NOP
        ST
        DLS             ;TEMP2
        LADR    LMSN
        ACSC
        NOP
        ST
        DLS             ;TEMP3
        LADR    HLSN
        ACSC
        NOP
        ST
        DLS             ;TEMP4
        LADR    HMSN
        ACSC
        NOP
        ST
        DLS             ;TEMP5
        LAI     00H
        ACSC
        GJMP    TAMP1
        RT              ;RETURN IF OVERFLOW ERROR

;&&&&&&&&&&&&&&&&&&&&&&&&&&&&&&&&&&&&&&&&&&&&&&&&&&&&&&&&&&&&
;&                                                           &
;& ROM LOOKUP ROUTINE FOR BREAKER AMP RATING - ENTER AT "AMP10"  &
;&                                                           &
;&&&&&&&&&&&&&&&&&&&&&&&&&&&&&&&&&&&&&&&&&&&&&&&&&&&&&&&&&&&&

        ORG     300H
        DB      010H,0D4H,0ECH,0F4H,098H,00EH,01EH,05CH,03EH,020H,05EH,078H
        DB      0E4H,0A8H,0,0
        DB      027H,030H,036H,038H,03AH,03DH,041H,044H,049H,04EH,051H,055H
        DB      057H,061H
AMP10:          LAMT
        RT

;CONTINUE WITH TEN TIMES CURRENT CALCULATION (TAMP)
TAMP1:DES
        GJMP    TAMP2 ;ANOTHER ITTERATION
        RT              ;CALCULATION DONE


;$$$$$$$$$$$$$$$$$$$$$$$$$$$$$$$$$$$$$$$$$$$$$$$$$$$$$$$$$$$$$$$$$$$$$$$$$$$$
;$                                                                          $
;$      BAROFF - TURN OFF ALL BAR SEGMENTS                                  $
;$                                                                          $
;$$$$$$$$$$$$$$$$$$$$$$$$$$$$$$$$$$$$$$$$$$$$$$$$$$$$$$$$$$$$$$$$$$$$$$$$$$$$
BAROFF:         LHLI    0DH     ;40 PERCENT SEGMENT

        LAI     0EH
        ANL             ;RESET BIT 0
        ST              ;STORE
        LHLI    0AH     ;60 PERCENT SEGMENT
        LAI     0EH
        ANL             ;RESET BIT 0
        ST
        LHLI    07H     ;80 PERCENT SEGMENT
        LAI     0EH
        ANL             ;RESET BIT 0
        ST
        LHLI    04H     ;100 PERCENT SEGMENT
        LAI     0EH
```

```
        ANL            ;RESET BIT 0
        ST
        RT

;&&&&&&&&&&&&&&&&&&&&&&&&&&&&&&&&&&&&&&&&&&&&&&&&&&&&&&&&&&&&
;&                                                            &
;& ROM LOOKUP ROUTINE FOR BREAKER AMP RATING - ENTER AT "AMP11" &
;&                                                            &
;&&&&&&&&&&&&&&&&&&&&&&&&&&&&&&&&&&&&&&&&&&&&&&&&&&&&&&&&&&&&

        ORG   340H
        DB    0E0H,098H,0F0H,05CH,050H,03EH,020H,008H,0E4H,0C0H,0A8H,08AH
        DB    078H,030H,0,0
        DB    02EH,03AH,041H,044H,046H,049H,04EH,052H,057H,05DH,061H,066H
        DB    069H,075H
AMP11:        LAMT
        RT

;$$$$$$$$$$$$$$$$$$$$$$$$$$$$$$$$$$$$$$$$$$$$$$$$$$$$$$$$$$$$$$$$$$$$$$$$$$$$$$
;$                                                                           $
;$      COMP - COMPLEMENT THE BAR GRAPH DATA FOR SUBTRACTION                 $
;$                                                                           $
;$$$$$$$$$$$$$$$$$$$$$$$$$$$$$$$$$$$$$$$$$$$$$$$$$$$$$$$$$$$$$$$$$$$$$$$$$$$$$$

COMP:LHLI   ZERO   ;POINT TO ZERO VALUE
       SC          ;SET THE CARRY FLAG TO ADD 1
       LADR   BRL  ;ACC = BREAKER AMP LOW VALUE
       CMA         ;COMPLEMENT ACCUMULATOR
       ACSC        ;ADD 1
       NOP
       XADR   BRL  ;SAVE COMPLEMENTED VALUE
       LADR   BRM  ;ACC = BREAKER AMP MIDDLE VALUE
       CMA         ;COMPLEMENT ACCUMULATOR
       ACSC        ;ADD CARRY
       NOP
       XADR   BRM  ;SAVE COMPLEMENTED VALUE
       LADR   BRH  ;ACC = BREAKER AMP HIGH VALUE
       CMA         ;COMPLEMENT ACCUMULATOR

       ACSC        ;ADD CARRY
       NOP
       XADR   BRH  ;SAVE COMPLEMENTED VALUE
       RT

;PERCENT BAR GRAPH DISPLAY CONTINUED
BO1:   DES          ;DECREMENT COUNTER TWICE
       CALL   BARON
       RT           ;IF UNDERFLOW, DON'T TURN ON ANY BAR SEG'S

;&&&&&&&&&&&&&&&&&&&&&&&&&&&&&&&&&&&&&&&&&&&&&&&&&&&&&&&&&&&&
;&                                                            &
;& ROM LOOKUP ROUTINE FOR BREAKER AMP RATING - ENTER AT "AMP12" &
;&                                                            &
;&&&&&&&&&&&&&&&&&&&&&&&&&&&&&&&&&&&&&&&&&&&&&&&&&&&&&&&&&&&&

        ORG   380H
        DB    000H,080H,050H,0EEH,000H,020H,052H,080H,0C0H,000H,02EH,060H
        DB    080H,000H,0,0
        DB    032H,03EH,046H,048H,04BH,04EH,053H,057H,05DH,064H,068H,06DH
        DB    070H,07DH
AMP12:        LAMT
        RT

;$$$$$$$$$$$$$$$$$$$$$$$$$$$$$$$$$$$$$$$$$$$$$$$$$$$$$$$$$$$$$$$$$$$$$$$$$$$$$$
;$                                                                           $
;$      MERGE - MERGE TWO SEVEN BIT DATA BYTES                               $
;$                                                                           $
;$$$$$$$$$$$$$$$$$$$$$$$$$$$$$$$$$$$$$$$$$$$$$$$$$$$$$$$$$$$$$$$$$$$$$$$$$$$$$$

MERGE:        LADR   TLMSN  ;ACC = LOW BYTE MSN
```

```
         RAR          ;4XRAR = RAL
         RAR          ;BIT 0-2 SHIFT TO 1-3
         RAR
         RAR
         XADR  TLMSN  ;SAVE SHIFTED LEFT NIBBLE

         RC
         LADR  THMSN  ;ACC = HIGH BYTE MSN
         RAR          ;ROTATE RIGHT THRU CARRY
         XADR  THMSN  ;SAVE ROTATED NIBBLE

         LADR  THLSN  ;ACC = HIGH BYTE LSN
         RAR          ;ROTATE RIGHT THRU CARRY
         XADR  THLSN  ;SAVE ROTATED NIBBLE

         LADR  TLMSN  ;ACC = LOW BYTE MSN SHIFTED LEFT
         RAR          ;SHIFT CARRY INTO LMSN
         XADR  TLMSN

         RT

;&&&&&&&&&&&&&&&&&&&&&&&&&&&&&&&&&&&&&&&&&&&&&&&&&&&&&&&&&&&&&&&&&
;&                                                                &
;& ROM LOOKUP ROUTINE FOR BREAKER AMP RATING - ENTER AT "AMP13"    &
;&                                                                &
;&&&&&&&&&&&&&&&&&&&&&&&&&&&&&&&&&&&&&&&&&&&&&&&&&&&&&&&&&&&&&&&&&

         ORG   3C0H
         DB    080H,020H,0E4H,022H,0C0H,0A8H,02EH,060H,030H,000H,032H,0B8H
         DB    0A0H,040H,0,0
         DB    03EH,04EH,057H,05BH,05DH,061H,068H,06DH,075H,07DH,082H,088H
         DB    08CH,09CH
AMP13:         LAMT
         RT

;$$$$$$$$$$$$$$$$$$$$$$$$$$$$$$$$$$$$$$$$$$$$$$$$$$$$$$$$$$$$$$$$$$$$$$$$$$$$$$
;$                                                                            $
;$       TRANSFER TEMPORARY DATA INTO PERMANENT LOCATIONS                     $
;$                                                                            $
;$$$$$$$$$$$$$$$$$$$$$$$$$$$$$$$$$$$$$$$$$$$$$$$$$$$$$$$$$$$$$$$$$$$$$$$$$$$$$$

XFER:    LADR  TPAK   ;TRANSFER ONLY DATA IN THIS PACKET
         XADR  PAK
         LADR  PAK
         SKAEI 02H
         GJMP  XF1

;XFER PACKET 2 DATA
         LADR  TSID
         XADR  CSID
         LADR  TRPID
         XADR  CRPID
         LADR  TOPT
         XADR  COPT
         RT

;XFER PACKET 3 DATA
XF1:     SKAEI 03H
         GJMP  XF2
         LADR  TLTS
         XADR  CLTS
         RT

;&&&&&&&&&&&&&&&&&&&&&&&&&&&&&&&&&&&&&&&&&&&&&&&&&&&&&&&&&&&&&&&&&
;&                                                                &
;&       ROM LOOKUP ROUTINE FOR LCD DATA - RIGHT SIDE OF CHAR     &
;&                                                                &
;&&&&&&&&&&&&&&&&&&&&&&&&&&&&&&&&&&&&&&&&&&&&&&&&&&&&&&&&&&&&&&&&&
```

```
        ORG    400H
DRIGHT:        DB     6,6,4,6,6,2,2,6,6,6,0
RIGHT:  LAMT
        RT

;XFER PACKET 0 OR 1 DATA
XF2:    CALL   MERGE;MERGE 2X7 BIT BYTES INTO 1X6 AND 1X8 BIT BYTES

        LADR   THMSN ;LOAD TEMPORARY DATA BYTES INTO ACCUMULATOR
        LHLI   HMSN  ;SET HL TO ADDRESS OF PERM MEM LOCATION
        ST           ;STORE THE ACCUMULATOR AT ADDRESS POINTED TO BY HL
        LHLI   BT4
        ST
        LADR   THLSN
        LHLI   HLSN
        ST
        LHLI   BT3
        ST
        LADR   TLMSN
        LHLI   LMSN
        ST
        LHLI   BT2
        ST
        LADR   TLLSN
        LHLI   LLSN
        ST
        LHLI   BT1
        ST
        RT

;$$$$$$$$$$$$$$$$$$$$$$$$$$$$$$$$$$$$$$$$$$$$$$$$$$$$$$$$$$$$$$$$$$$$$$$$$$$$$
;$                                                                 $
;$      AS - DO AN ADDITION CALCULATION                            $
;$                                                                 $
;$$$$$$$$$$$$$$$$$$$$$$$$$$$$$$$$$$$$$$$$$$$$$$$$$$$$$$$$$$$$$$$$$$$$$$$$$$$$$

;ADDITION SEQUENCE
AS:     ACSC          ;ACC + (HL) + C
        NOP
        ST            ;STORE
        DLS           ;DECREMENT DATA MEMORY POINTER
        RT

;PERCENT BAR GRAPH DISPLAY CONTINUED
PCT2:   LAI    0AH    ;IF OVERFLOW, SET COUNTER TO TEN
        TAE

;TURN OFF ALL BAR SEGMENTS
BO:     CALL   BAROFF

;TURN ON ALL APPROPRIATE BAR SEGMENTS
        DES
        GJMP   BO1
        RT

;&&&&&&&&&&&&&&&&&&&&&&&&&&&&&&&&&&&&&&&&&&&&&&&&&&&&&&&&&&&&&&&&&&
;&                                                         &
;&      ROM LOOKUP ROUTINE FOR LCD DATA - CENTER OF CHAR   &
;&                                                         &
;&&&&&&&&&&&&&&&&&&&&&&&&&&&&&&&&&&&&&&&&&&&&&&&&&&&&&&&&&&&&&&&&&&
        ORG    440H
DCENT:DB       0AH,0,0EH,0EH,4,0EH,0EH,8,0EH,0EH,0
CENTER:        LHLI   TEMP1  ;POINT TO TEMP STORAGE
        LAMT
        XAM    HL     ;ACC = (TEMP1)

        RT
```

```
;$$$$$$$$$$$$$$$$$$$$$$$$$$$$$$$$$$$$$$$$$$$$$$$$$$$$$$$$$$$$$$$$$$$$$$$$$$$$$$$
;$                                                                           $
;$      BARON - TURN ON APPROPRIATE BAR SEGMENTS                             $
;$                                                                           $
;$$$$$$$$$$$$$$$$$$$$$$$$$$$$$$$$$$$$$$$$$$$$$$$$$$$$$$$$$$$$$$$$$$$$$$$$$$$$$$$

BARON:          LHLI    0DH     ;40 PERCENT SEGMENT
        LAI     01H
        ORL             ;SET BIT 0
        ST
        DES
        GJMP    BO2
        RT
BO2:    DES             ;DECREMENT COUNTER TWICE
        GJMP    BON2
        RT              ;IF UNDERFLOW RETURN

BON2:   LHLI    0AH     ;60 PERCENT SEGMENT
        LAI     01H
        ORL             ;SET BIT 0
        ST
        DES
        GJMP    BO3
        RT
BO3:    DES             ;DECREMENT COUNTER TWICE
        GJMP    BON3
        RT              ;IF UNDERFLOW RETURN

BON3:   LHLI    07H     ;80 PERCENT SEGMENT
        LAI     01H
        ORL             ;SET BIT 0
        ST
        DES
        GJMP    BO4
        RT
BO4:    DES             ;DECREMENT COUNTER TWICE
        GJMP    BON4
        RT              ;IF UNDERFLOW RETURN

BON4:   LHLI    04H     ;100 PERCENT SEGMENT
        LAI     01H
        ORL             ;SET BIT 3
        ST
        RT

;$$$$$$$$$$$$$$$$$$$$$$$$$$$$$$$$$$$$$$$$$$$$$$$$$$$$$$$$$$$$$$$$$$$$$$$$$$$$$$$
;$                                                                           $
;$      RAT1 - UPDATE BAR GRAPH VARIABLE LIST                                $
;$                                                                           $
;$$$$$$$$$$$$$$$$$$$$$$$$$$$$$$$$$$$$$$$$$$$$$$$$$$$$$$$$$$$$$$$$$$$$$$$$$$$$$$$

RAT1:   ST              ;STORE THE NEW VARIABLE
        LAI     01H     ;SET THE NEW VARIABLE CALCULATION FLAG
        XADR    TEMP1
        RT

;&&&&&&&&&&&&&&&&&&&&&&&&&&&&&&&&&&&&&&&&&&&&&&&&&&&&&&&&&&&&&&&&&&&&&&
;&                                                                    &
;&      ROM LOOKUP ROUTINE FOR LCD DATA - LEFT SIDE OF CHAR           &
;&                                                                    &
;&&&&&&&&&&&&&&&&&&&&&&&&&&&&&&&&&&&&&&&&&&&&&&&&&&&&&&&&&&&&&&&&&&&&&&

        ORG     480H
DLEFT:  DB      6,0,2,0,4,4,6,0,6,4,0
LEFT:   LAMT
        RT
```

```
;##########################################################################
;                                                                        ;
;  MAIN DATA ROUTINE - PROGRAM FLOW CONTROL AND DATA PROCESSING          ;
;                                                                        ;
;        SUBROUTINES CALLED: TIMR - SOFTWARE WATCHDOG RESET              ;
;                            PRCNT - PERCENT OF RATING CALC AND DISPLAY  ;
;                            BCD - BCD CONVERSION                        ;
;                            DSPLY - DISPLAY CURRENT IN AMPERES          ;
;                                                                        ;
;##########################################################################
        ORG   490H

MAIN:   TIMER          ;START/RESET THE SOFTWARE WATCHDOG TIMER
        LAI   00H
        XADR  TCNT

;WAIT FOR COMPLETE DATA PACKET TRANSMISSION. THE SERIAL ISR SETS THE
;DATA READY FLAG (RDY)
WAIT1:  LADR  RDY     ;WAIT FOR SERIAL DATA AVAILABLE
        SKAEI 01H
        GJMP  WAIT1   ;IF NOT READY, WAIT

;TRANSFER THE TEMPORARY CURRENT INFORMATION INTO PERMANENT MEMORY
LOCATIONS
;AFTER ALL PACKET DATA HAS BEEN SENT BY TRIP UNIT

XF:     CALL  XFER

;CLEAR THE DATA READY FLAG
        LAI   00H     ;SET ACCUMULATOR TO ZERO
        XADR  RDY     ;EXCHANGE ACCUMLATOR WITH DATA READY ADDRESS

;DON'T DISPLAY IF PAK 2 OR 3 WERE LAST RCV'D
        LADR  PAK
        SKAEI 00H
        GJMP  M1
        GJMP  M3
M1:     SKAEI 01H

        GJMP  MAIN

;CONVERT HEX DATA INTO BCD
M3:     CALL  BCD

;DISPLAY THE BREAKER OPERATION CURRENT
        CALL  DSPLY

;CALCULATE AND DISPLAY THE PERCENT OF RATING BAR SEGMENTS
        CALL  RATING

        CALL  PRCNT

        GJMP  MAIN    ;RESTART THE CYCLE


;$$$$$$$$$$$$$$$$$$$$$$$$$$$$$$$$$$$$$$$$$$$$$$$$$$$$$$$$$$$$$$$$$$$$$$$$$$$$$$$
;$
;$      SISR - SERIAL INTERRUPT SERVICE ROUTINE                          $
;$                                                                       $
;$$$$$$$$$$$$$$$$$$$$$$$$$$$$$$$$$$$$$$$$$$$$$$$$$$$$$$$$$$$$$$$$$$$$$$$$$$$$$$$
SISR:   XADR  ACCTMP

        LHLI  TSH     ;MEM POINT TO TEMP SERIAL HIGH BYTE
        TSIOAM              ;TRANSFER SERIAL DATA INTO MEM(HL) AND
ACCUMULATOR
        SIO           ;REINITIALIZE SERIAL
        TAD           ;TRANSFER SER HIGH TO D REGISTER
        XADR  TSH     ;ACCUMULATOR = SERIAL LOW
        TAE           ;E REGISTER = SERIAL LOW
        TDA           ;ACCUMULATOR = D REG = SERIAL HIGH
```

```
;TEST FOR PACKET NUMBER BYTE 0-2. IF SO, SETUP CHECKSUM AND BYTE COUNT
        SKABT  3       ;STATUS/PACKET BYTE? (BIT 3 SET?)
P1:     GJMP   B1      ;NOT PACKET NUM BYTE, TEST BYTE COUNT
        TEA            ;ACC = SERIAL LOW
        XADR   PTEMP   ;SAVE TEMP PACKET NUMBER
        TEA
        SKAEI  02H     ;PACKET 2 BYTE?
        GJMP   P2      ;PACKET 0 OR 1?

        XADR   CHK     ;CHECKSUM BYTE 0
        LAI    00H     ;DATA READY FLAG = 0
        XADR   RDY     ;RESET DATA READY FLAG
        SKAEI  00H     ;IF RDY WAS SET, XFER PREVIOUS PACKET
        CALL   XFER
        LAI    04H     ;BC1 = 4

P11:    XADR   BC1
        LAI    00H     ;BC = 0
        XADR   BC
        GJMP   E1

P2:     SKAEI  01H     ;PACKET 1 BYTE?
        GJMP   P3      ;PACKET 0 BYTE?
        XADR   CHK     ;CHECKSUM BYTE 0
        LADR   RDY     ;TEST FOR DATA READY FLAG
        SKAEI  00H     ;IF FLAG NOT SET, CONTINUE
        GJMP   E1              ;IF FLAG IS SET, RETURN
        LADR   0FH     ;ACC = PHASE SELECT BYTE
        SKAEI  02H     ;C PHASE?
        GJMP   P21
        LAI    01H     ;BC1 = 1 FOR C PHASE
        GJMP   P11

P21:    SKAEI  01H     ;GF PHASE?
        GJMP   E1              ;IF NEITHER C OR GF, RETURN
        LAI    03H     ;BC1 = 3 FOR GF PHASE
        GJMP   P11

P3:     SKAEI  00H     ;PACKET 0 BYTE?
        GJMP   P4
        XADR   CHK     ;CHECKSUM BYTE 0
        LADR   RDY     ;TEST FOR DATA READY FLAG
        SKAEI  00H     ;IF FLAG NOT SET, CONTINUE
        GJMP   E1              ;IF FLAG IS SET, RETURN
        LADR   0FH     ;ACC = PHASE SELECT BYTE
        SKAEI  08H     ;A PHASE?
        GJMP   P31
        LAI    01H     ;BC1 = 1 FOR A PHASE
        GJMP   P11

P31:    SKAEI  04H     ;B PHASE?
        GJMP   E1      ;IF NEITHER A OR B, RETURN
        LAI    03H     ;BC1 = 3 FOR B PHASE
        GJMP   P11

P4:     SKAEI  03H     ;PACKET 3 BYTE?
        GJMP   E1
        XADR   CHK     ;CHECKSUM BYTE 0
        LAI    00H     ;DATA READY FLAG = 0
        XADR   RDY     ;RESET DATA READY FLAG
        SKAEI  00H     ;IF RDY WAS SET, XFER PREVIOUS PACKET
        CALL   XFER
        LAI    01H     ;BC1 = 1 LONG TIME SWITCH
        GJMP   P11

;TEST FOR BYTE COUNT < 6. IF NOT, RETURN  IF IT IS, PROCESS THE DATA
B1:     LADR   BC      ;ACC = BC
        SKAEI  07H     ;BC = 7? RETURN
        GJMP   B2
        GJMP   E1
```

```
B2:    XAE            ;E = BC
       IES            ;E = E+1
       XAE            ;ACC = BC+1
       XADR  BC       ;STORE NEW BC
       LADR  BC       ;ACC = NEW BC
       SKAEI 07H      ;NEW BC = 7?
;VERIFY CHECKSUM AND SET DATA READY FLAG IF CORRECT
       GJMP  B3
       TEA            ;ACC = SERIAL LOW (CHECKSUM)
       LHLI  CHK      ;HL TO POINT TO CHECKSUM
       SKAEM          ;ACC = CHECKSUM?
       GJMP  E1
       LAI   01H      ;SET DATA READY FLAG
       XADR  RDY
       LADR  PTEMP
       XADR  TPAK
       GJMP  E1

;ADD CHECKSUM, SAVE DATA IF REQUIRED
B3:    LHLI  CHK      ;HL POINT TO CHECKSUM
       TEA            ;ACC = SERIAL LOW NIBBLE
       ASC            ;ACC = SERIAL LOW + CHECKSUM
       NOP
       ST             ;STORE CHECKSUM
       LHLI  BC1      ;HL POINT TO BYTE COUNT SELECTOR
       LADR  BC       ;ACC = BC
       SKAEM          ;BC = BC1?
       GJMP  B4
       LAI   04H      ;SENSOR BYTE
       SKAEM
       GJMP  HB
       GJMP  B5

;STORE HIGH DATA BYTE
HB:    LHLI  PTEMP ;IF PACKET 3, SAVE ONLY HIGH BYTE BIT 0-2
       LAI   03H   ;TO THE LONG TIME DATA BYTE
       SKAEM
       GJMP  HB1
       TEA            ;ACC = SERIAL HIGH BYTE
       XADR  TLTS
       LAI   07H      ;MASK BIT 3
       LHLI  TLTS
       ANL
       XADR  TLTS
       GJMP  E1       ;EXIT
HB1:   TEA            ;ACC = SERIAL HIGH BYTE LOW NIBBLE
       XADR  THLSN ;TEMP HIGH BYTE LSN
       TDA            ;ACC = SERIAL HIGH BYTE HIGH NIBBLE
       XADR  THMSN ;TEMP HIGH BYTE MSN
       GJMP  E1

;TEST AND STORE LOW DATA BYTE
B4:    LHLI  PTEMP ;IF PACKET 3 RETURN
       LAI   03H
       SKAEM
       GJMP  B41
       GJMP  E1
B41:   LADR  BC
       XAE            ;EXCHANGE ACC AND E REGISTERS
       DES            ;DECREMENT E REG (BC = BC-1)
       GJMP  B7
       GJMP  E1       ;RETURN IF UNDERFLOW
B7:    XAE            ;EXCHANGE ACC AND E REGISTERS
       LHLI  BC1
       SKAEM          ;BC-1 = BC1?
       GJMP  E1
       LAI   04H      ;RATING PLUG BYTE -1
       SKAEM
       GJMP  LB
       GJMP  B6
```

```
LB:     TEA             ;ACC = SERIAL LOW BYTE LOW NIBBLE
        XADR  TLLSN     ;TEMP LOW BYTE LSN
        TDA             ;ACC = SERIAL LOW BYTE HIGH NIBBLE
        XADR  TLMSN     ;TEMP LOW BYTE MSN
        GJMP  E1

;SAVE SENSOR ID
B5:     LHLI  TSID      ;HL POINT TO SENSOR ID
        TEA             ;ACC = SERIAL LOW NIBBLE
        ST              ;STORE SENSOR
        GJMP  E1

;SAVE RATING PLUG
B6:     TEA             ;ACC = SERIAL LOW
        XADR  TRPID     ;STORE RATING PLUG
        TDA             ;ACC = SERIAL HIGH
        XADR  TOPT      ;STORE TRIP UNIT OPTIONS

E1:     XADR  ACCTMP
        RT

;$$$$$$$$$$$$$$$$$$$$$$$$$$$$$$$$$$$$$$$$$$$$$$$$$$$$$$$$$$$$$$$$$$$$$$$$$$$$$$
;$                                                                           $
;$      BCD - HEX TO BCD CONVERSION ROUTINE                                  $
;$                                                                           $
;$$$$$$$$$$$$$$$$$$$$$$$$$$$$$$$$$$$$$$$$$$$$$$$$$$$$$$$$$$$$$$$$$$$$$$$$$$$$$$

;IF CURRENT >= 2700H, SET DISPLAY VALUE TO 9999
BCD:    LHLI  HMSN      ;HIGH BYTE MSN
        LAI   0EH       ;COMPLEMENT OF 2 FOR TEST
        RC              ;RESET CARRY
        ACSC            ;TEST FOR VALUE >= 2
        GJMP  CONV      ;IF LESS THAN 2, CONTINUE CONVERSION
        TAE
        RC
        DES             ;DECREMENT TEST VALUE
        GJMP  OFLW      ;IF GREATER THAN 2, SET VALUE TO 9999

;IF TEST VALUE = 2, TEST NEXT NIBBLE FOR >=7
        LHLI  HLSN      ;HIGH BYTE LSN
        LAI   09H       ;COMPLEMENT OF 7 FOR TEST
        RC
        ACSC            ;TEST FOR VALUE >= 7
        GJMP  CONV      ;IF LESS THAN 7, CONTINUE CONVERSION

;CURRENT TOO HIGH, SET VALUE TO 9999
OFLW:   LHLI  BCD4      ;POINT TO BCD DATA STORAGE
        LAI   09H       ;ACC = 9
        ST              ;1000'S DIGIT = 9
        LHLI  BCD3      ;POINT TO BCD DATA STORAGE
        ST              ;100'S DIGIT = 9
        LHLI  BCD2      ;POINT TO BCD DATA STORAGE
        ST              ;10'S DIGIT = 9
        LHLI  BCD1      ;POINT TO BCD DATA STORAGE
        ST              ;1'S DIGIT = 9
        RT

;CONTINUE WITH BCD COVERSION
;SUBTRACT 1000 UNTIL VALUE BECOMES NEGATIVE TO DETERMINE 1000'S DIGIT
CONV:   LAI   00H       ;RESET COUNT VALUE TO ZERO
        TAE

THOUS:  RC              ;RESET CARRY
        LHLI  BT1       ;POINT TO VALUE TO BE CONVERTED LOW BYTE LSN
        LAI   08H       ;VALUE TO BE ADDED FOR 1000 TO LOW BYTE LSN
        ACSC            ;ADD VALUES
        NOP
        LHLI  TEMP1     ;POINT TO TEMP STORAGE FOR CONVERTED VALUE
        ST              ;TEMP STORE CONVERTED VALUE
```

```
        LHLI  BT2    ;POINT TO VALUE TO BE CONVERTED LOW BYTE MSN
        LAI   01H    ;VALUE TO BE ADDED FOR 1000 TO LOW BYTE MSN
        ACSC         ;ADD VALUES
        NOP
        LHLI  TEMP2  ;POINT TO TEMP STORAGE FOR CONVERTED VALUE
        ST           ;TEMP STORE CONVERTED VALUE

        LHLI  BT3    ;POINT TO VALUE TO BE CONVERTED HIGH BYTE LSN
        LAI   0CH    ;VALUE TO BE ADDED FOR 1000 TO HIGH BYTE LSN
        ACSC         ;ADD VALUES
        NOP
        LHLI  TEMP3  ;POINT TO TEMP STORAGE FOR CONVERTED VALUE
        ST           ;TEMP STORE CONVERTED VALUE

        LHLI  BT4    ;POINT TO VALUE TO BE CONVERTED HIGH BYTE LSN
        LAI   0FH    ;VALUE TO BE ADDED FOR 1000 TO HIGH BYTE LSN
        ACSC         ;ADD VALUES
        GJMP  CHUND        ;CALCULATE HUNDREDS VALUE
        CALL  GETCON
        GJMP  THOUS

;SUBTRACT 100 UNTIL VALUE BECOMES NEGATIVE TO DETERMINE 100'S DIGIT

CHUND:        TEA          ;ACC = THOUSANDS DIGIT
        SKAEI 00H    ;IF DIGIT IS ZERO, SUPRESS THE CHARACTER
        GJMP  CH1
        LAI   0AH    ;POINT TO BLANK CHARACTER
CH1:    XADR  BCD4   ;SAVE THOUSANDS DIGIT
        LAI   00H    ;RESET COUNT VALUE TO ZERO
        TAE

HUNDS:        RC           ;RESET CARRY
        LHLI  BT1    ;POINT TO VALUE TO BE CONVERTED LOW BYTE LSN
        LAI   0CH    ;VALUE TO BE ADDED FOR 100 TO LOW BYTE LSN
        ACSC         ;ADD VALUES
        NOP
        LHLI  TEMP1  ;POINT TO TEMP STORAGE FOR CONVERTED VALUE
        ST           ;TEMP STORE CONVERTED VALUE

        LHLI  BT2    ;POINT TO VALUE TO BE CONVERTED LOW BYTE MSN
        LAI   09H    ;VALUE TO BE ADDED FOR 100 TO LOW BYTE MSN
        ACSC         ;ADD VALUES
        NOP
        LHLI  TEMP2  ;POINT TO TEMP STORAGE FOR CONVERTED VALUE
        ST           ;TEMP STORE CONVERTED VALUE

        LHLI  BT3    ;POINT TO VALUE TO BE CONVERTED HIGH BYTE LSN
        LAI   0FH    ;VALUE TO BE ADDED FOR 100 TO HIGH BYTE LSN
        ACSC         ;ADD VALUES
        NOP
        LHLI  TEMP3  ;POINT TO TEMP STORAGE FOR CONVERTED VALUE
        ST           ;TEMP STORE CONVERTED VALUE

        LHLI  BT4    ;POINT TO VALUE TO BE CONVERTED HIGH BYTE LSN
        LAI   0FH    ;VALUE TO BE ADDED FOR 100 TO HIGH BYTE LSN
        ACSC         ;ADD VALUES
        GJMP  CTENS  ;CALCULATE HUNDREDS VALUE
        CALL  GETCON
        GJMP  HUNDS

;SUBTRACT 10 UNTIL VALUE BECOMES NEGATIVE TO DETERMINE 10'S DIGIT
CTENS:  TEA          ;ACC = HUNDREDS DIGIT
        SKAEI 00H    ;IF 100'S AND 1000'S DIGITS ARE 0, SUPRESS CHARACTER
        GJMP  CT1
        LADR  BCD4   ;TEST 1000'S DIGIT FOR SUPRESSION
        SKAEI 0AH
        GJMP  CT1
        GJMP  CT2
CT1:    TEA
```

```
CT2:    XADR  BCD3   ;SAVE HUNDREDS DIGIT
        LAI   00H    ;RESET COUNT VALUE TO ZERO
        TAE

TENS:   RC           ;RESET CARRY
        LHLI  BT1    ;POINT TO VALUE TO BE CONVERTED LOW BYTE LSN
        LAI   06H    ;VALUE TO BE ADDED FOR 10 TO LOW BYTE LSN
        ACSC         ;ADD VALUES
      NOP
      LHLI  TEMP1 ;POINT TO TEMP STORAGE FOR CONVERTED VALUE
      ST          ;TEMP STORE CONVERTED VALUE

      LHLI  BT2   ;POINT TO VALUE TO BE CONVERTED LOW BYTE MSN
      LAI   0FH   ;VALUE TO BE ADDED FOR 10 TO LOW BYTE MSN
      ACSC        ;ADD VALUES
      NOP
      LHLI  TEMP2 ;POINT TO TEMP STORAGE FOR CONVERTED VALUE
      ST          ;TEMP STORE CONVERTED VALUE

      LHLI  BT3   ;POINT TO VALUE TO BE CONVERTED HIGH BYTE LSN
      LAI   0FH   ;VALUE TO BE ADDED FOR 10 TO HIGH BYTE LSN
      ACSC        ;ADD VALUES
      NOP
      LHLI  TEMP3 ;POINT TO TEMP STORAGE FOR CONVERTED VALUE
      ST          ;TEMP STORE CONVERTED VALUE

      LHLI  BT4   ;POINT TO VALUE TO BE CONVERTED HIGH BYTE LSN
      LAI   0FH   ;VALUE TO BE ADDED FOR 10 TO HIGH BYTE LSN
      ACSC        ;ADD VALUES
      GJMP  CONES ;CALCULATE HUNDREDS VALUE
      CALL  GETCON
      GJMP  TENS

;REMAINING LOW NIBBLE OF VALUE IS EQUAL TO ONES DIGIT
CONES:         TEA          ;ACC = TENS DIGIT
        SKAEI 00H    ;IF 10'S AND 100'S DIGITS ARE 0, SUPRESS CHARACTER
        GJMP  CO1
        LADR  BCD3   ;TEST 100'S DIGIT FOR SUPRESSION
        SKAEI 0AH
        GJMP  CO1
        GJMP  CO2
CO1:    TEA
CO2:    XADR  BCD2   ;SAVE TENS DIGIT
        XADR  BT1    ;GET LAST CONVERTED VALUE
        XADR  BCD1   ;STORE CONVERTED VALUE

        RT

;$$$$$$$$$$$$$$$$$$$$$$$$$$$$$$$$$$$$$$$$$$$$$$$$$$$$$$$$$$$$$$$$$$$$$$$$$$$$
;$                                                                          $
;$      DSPLY - DISPLAY BREAKER OPERATING CURRENT                           $
;$                                                                          $
;$$$$$$$$$$$$$$$$$$$$$$$$$$$$$$$$$$$$$$$$$$$$$$$$$$$$$$$$$$$$$$$$$$$$$$$$$$$$

;DISPLAY 1'S DIGIT
DSPLY:  RC           ;RESET CARRY
        LADR  BCD1   ;ACC = 1'S DIGIT
        LHLI  03H    ;POINT TO 1'S DIGIT RIGHT SIDE
        CALL  RIGHT  ;GET CHARACTER RIGHT SIDE DATA AND STORE

        LHLI  ONE    ;POINT TO VALUE 01H
        LADR  04H    ;ACC = CENTER OF CHAR
```

```
        ANL             ;MASK LOW 3 BITS
        LHLI    04H     ;POINT TO CENTER
        ST              ;STORE MASKED VALUE
        RC
        LADR    BCD1    ;ACC = 1'S DIGIT
        CALL    CENTER          ;GET CHARACTER CENTER DATA
        LHLI    04H     ;POINT TO CENTER VALUE FOR 1'S CHAR
        ORL
        ST              ;RESTORE BCD VALUE

        RC
        LADR    BCD1    ;ACC = 1'S DIGIT
        LHLI    05H     ;POINT TO 1'S DIGIT LEFT SIDE
        CALL    LEFT    ;GET CHARACTER LEFT SIDE DATA AND STORE

;DISPLAY 10'S DIGIT
        RC              ;RESET CARRY
        LADR    BCD2    ;ACC = 10'S DIGIT
        LHLI    06H     ;POINT TO 10'S DIGIT RIGHT SIDE
        CALL    RIGHT   ;GET CHARACTER RIGHT SIDE DATA AND STORE

        LHLI    ONE     ;POINT TO VALUE 01H
        LADR    07H     ;ACC = CENTER OF CHAR
        ANL             ;MASK LOW 3 BITS
        LHLI    07H     ;POINT TO CENTER
        ST              ;STORE MASKED VALUE
        RC
        LADR    BCD2    ;ACC = 10'S DIGIT
        CALL    CENTER          ;GET CHARACTER CENTER DATA
        LHLI    07H     ;POINT TO CENTER VALUE FOR 10'S CHAR
        ORL
        ST              ;RESTORE BCD VALUE

        RC
        LADR    BCD2    ;ACC = 10'S DIGIT
        LHLI    08H     ;POINT TO 10'S DIGIT LEFT SIDE
        CALL    LEFT    ;GET CHARACTER LEFT SIDE DATA AND STORE

;DISPLAY 100'S DIGIT
        RC              ;RESET CARRY
        LADR    BCD3    ;ACC = 100'S DIGIT
        LHLI    09H     ;POINT TO 100'S DIGIT RIGHT SIDE
        CALL    RIGHT   ;GET CHARACTER RIGHT SIDE DATA AND STORE

        LHLI    ONE     ;POINT TO VALUE 01H
        LADR    0AH     ;ACC = CENTER OF CHAR
        ANL             ;MASK LOW 3 BITS
        LHLI    0AH     ;POINT TO CENTER
        ST              ;STORE MASKED VALUE
        RC
        LADR    BCD3    ;ACC = 100'S DIGIT
        CALL    CENTER          ;GET CHARACTER CENTER DATA
        LHLI    0AH     ;POINT TO CENTER VALUE FOR 100'S CHAR
        ORL
        ST              ;RESTORE BCD VALUE

        RC
        LADR    BCD3    ;ACC = 100'S DIGIT
        LHLI    0BH     ;POINT TO 100'S DIGIT LEFT SIDE
        CALL    LEFT    ;GET CHARACTER LEFT SIDE DATA AND STORE

;DISPLAY 1000'S DIGIT
        RC              ;RESET CARRY
        LADR    BCD4    ;ACC = 1000'S DIGIT
        LHLI    0CH     ;POINT TO 1000'S DIGIT RIGHT SIDE
        CALL    RIGHT   ;GET CHARACTER RIGHT SIDE DATA AND STORE

        LHLI    ONE     ;POINT TO VALUE 01H
        LADR    0DH     ;ACC = CENTER OF CHAR
```

```
        ANL             ;MASK LOW 3 BITS
        LHLI    0DH     ;POINT TO CENTER
        ST              ;STORE MASKED VALUE
        RC
        LADR    BCD4    ;ACC = 1000'S DIGIT
        CALL    CENTER          ;GET CHARACTER CENTER DATA
        LHLI    0DH     ;POINT TO CENTER VALUE FOR 1000'S CHAR
        ORL
        ST              ;RESTORE BCD VALUE

        RC
        LADR    BCD4    ;ACC = 1000'S DIGIT
        LHLI    0EH     ;POINT TO 1000'S DIGIT LEFT SIDE
        CALL    LEFT    ;GET CHARACTER LEFT SIDE DATA AND STORE

        RT

;$$$$$$$$$$$$$$$$$$$$$$$$$$$$$$$$$$$$$$$$$$$$$$$$$$$$$$$$$$$$$$$$$$$$$$$$$$$$$$$$$$$$$$$
;$                                                                      $
;$      RATING - CALCULATE AMPERE RATING                                $
;$                                                                      $
;$$$$$$$$$$$$$$$$$$$$$$$$$$$$$$$$$$$$$$$$$$$$$$$$$$$$$$$$$$$$$$$$$$$$$$$$$$$$$$$$$$$$$$$

;LOOK UP THE RATING PLUG AND SENSOR VALUES
RATING:         LAI     00H
        XADR    TEMP1
        LHLI    SID
        LADR    CSID
        SKAEM
        CALL    RAT1
        LHLI    RPID
        LADR    CRPID
        SKAEM
        CALL    RAT1
        LHLI    LTS
        LADR    CLTS
        SKAEM
        CALL    RAT1
        LHLI    OPT
        LADR    COPT
        SKAEM
        CALL    RAT1
        XADR    TEMP1
        SKAEI   01H
        RT

        RC
        LADR    SID     ;GET SENSOR ID
        TAE             ;E REG = SENSOR
        LADR    RPID    ;ACC = RATING PLUG POINTER
        DES             ;E = E-1
        GJMP    SID0
        GJMP    ADDR0
SID0:   DES
        GJMP    SID1
        GJMP    ADDR1
SID1:   DES
        GJMP    SID2
        GJMP    ADDR2
SID2:   DES
        GJMP    SID3
        GJMP    ADDR3
SID3:   DES
        GJMP    SID4
        GJMP    ADDR4
SID4:   DES
        GJMP    SID5
        GJMP    ADDR5
SID5:   DES
```

```
        GJMP  SID6
        GJMP  ADDR6
SID6:   DES
        GJMP  SID7
        GJMP  ADDR7
SID7:   DES
        GJMP  SID8
        GJMP  ADDR8
SID8:   DES
        GJMP  SID9
        GJMP  ADDR9
SID9:   DES
        GJMP  SID10
        GJMP  ADDR10
SID10:  DES
        GJMP  SID11
        GJMP  ADDR11
SID11:  DES
        GJMP  ADDR13
        GJMP  ADDR12

;GET AMP RATING USING RATING PLUG AS OFFSET POINTER

ADDR0:        LHLI    BT1    ;AMP RATING LOW NIBBLE

        CALL  AMP0
        CALL  ARAT
        CALL  AMP0
        GJMP  CL      ;GOT RATING
ADDR1:        LHLI    BT1    ;AMP RATING LOW NIBBLE
        CALL  AMP1
        CALL  ARAT
        CALL  AMP1
        GJMP  CL      ;GOT RATING
ADDR2:        LHLI    BT1    ;AMP RATING LOW NIBBLE
        CALL  AMP2
        CALL  ARAT
        CALL  AMP2
        GJMP  CL      ;GOT RATING
ADDR3:        LHLI    BT1    ;AMP RATING LOW NIBBLE
        CALL  AMP3
        CALL  ARAT
        CALL  AMP3
        GJMP  CL      ;GOT RATING
ADDR4:        LHLI    BT1    ;AMP RATING LOW NIBBLE
        CALL  AMP4
        CALL  ARAT
        CALL  AMP4
        GJMP  CL      ;GOT RATING
ADDR5:        LHLI    BT1    ;AMP RATING LOW NIBBLE
        CALL  AMP5
        CALL  ARAT
        CALL  AMP5
        GJMP  CL      ;GOT RATING
ADDR6:        LHLI    BT1    ;AMP RATING LOW NIBBLE
        CALL  AMP6
        CALL  ARAT
        CALL  AMP6
        GJMP  CL      ;GOT RATING
ADDR7:        LHLI    BT1    ;AMP RATING LOW NIBBLE
        CALL  AMP7
        CALL  ARAT
        CALL  AMP7
        GJMP  CL      ;GOT RATING
ADDR8:        LHLI    BT1    ;AMP RATING LOW NIBBLE
        CALL  AMP8
        CALL  ARAT
        CALL  AMP8
        GJMP  CL      ;GOT RATING
ADDR9:        LHLI    BT1    ;AMP RATING LOW NIBBLE
```

```
        CALL   AMP9
        CALL   ARAT
        CALL   AMP9
        GJMP   CL      ;GOT RATING
ADDR10:        LHLI    BT1     ;AMP RATING LOW NIBBLE
        CALL   AMP10
        CALL   ARAT
        CALL   AMP10
        GJMP   CL      ;GOT RATING

ADDR11:        LHLI    BT1     ;AMP RATING LOW NIBBLE
        CALL   AMP11
        CALL   ARAT
        CALL   AMP11
        GJMP   CL      ;GOT RATING
ADDR12:        LHLI    BT1     ;AMP RATING LOW NIBBLE
        CALL   AMP12
        CALL   ARAT
        CALL   AMP12
        GJMP   CL      ;GOT RATING
ADDR13:        LHLI    BT1     ;AMP RATING LOW NIBBLE
        CALL   AMP13
        CALL   ARAT
        CALL   AMP13

CL:     DLS            ;POINT TO BT4
        ST             ;STORE RATING HIGH NIBBLE
        CALL   TRAT    ;CALCULATE RATING TIMES TEN
        CALL   BRAT    ;CALCULATE RATING BASED ON LTS
        CALL   COMP    ;COMPLEMENT TRIP CURRENT SETTING

        RT

;$$$$$$$$$$$$$$$$$$$$$$$$$$$$$$$$$$$$$$$$$$$$$$$$$$$$$$$$$$$$$$$$$$$$$$$$$$$$
;$                                                                          $
;$      PRCNT - PERCENT OF TRIP RATING BAR GRAPH DISPLAY                    $
;$                                                                          $
;$$$$$$$$$$$$$$$$$$$$$$$$$$$$$$$$$$$$$$$$$$$$$$$$$$$$$$$$$$$$$$$$$$$$$$$$$$$$

;COMPLEMENT THE AMP RATING TO PERFORM SUBTRACTION
PRCNT: CALL   TAMP    ;CALCULATE CURRENT TIMES TEN

;ADD THE COMPLEMENTED AMP RATING TO THE RUNNING CURRENT OVER AND OVER
UNTIL
;THE CURRENT IS EQUAL TO ZERO. THE NUMBER OF ITERATIONS IS THE NUMBER TIMES
;TEN PERCENT OF OPERATION
        LAI    00H     ;ACC = 0
        TAE            ;PERCENT = 0
PC:     RC             ;RESET CARRY
        LHLI   TEMP1   ;POINT TO LOW BYTE LSN
        LADR   BRL     ;ACC = COMPLEMENT AMP RATING LOW NIBBLE
        CALL   AS
        LADR   BRM     ;ACC = COMPLEMENT AMP RATING MIDDLE NIBBLE
        CALL   AS
        LADR   BRH     ;ACC = COMPLEMENT AMP RATING HIGH NIBBLE
        CALL   AS
        LAI    0FH     ;ACC = COMPLEMENT NIBBLE FOR LOW 3 NIBBLES
        GJMP   PCT1

;COPYRIGHT MESSAGE

        DB     '(','C',')',' ','1','9','8','8',' ','S'
        DB     'Q','U','A','R','E',' ','D',' ','C','O','.'

;&&&&&&&&&&&&&&&&&&&&&&&&&&&&&&&&&&&&&&&&&&&&&&&&&&&&&&&&&&&&&&
;&                                                            &
;&      RAM ADDRESS TABLE                                     &
;&                                                            &
;&&&&&&&&&&&&&&&&&&&&&&&&&&&&&&&&&&&&&&&&&&&&&&&&&&&&&&&&&&&&&&
```

```
BRH     SET     00H     ;CALCULATED RATING HIGH NIBBLE
BRM     SET     01H     ;CALCULATED RATING MIDDLE NIBBLE
BRL     SET     02H     ;CALCULATED RATING LOW NIBBLE

TOPT    SET     10H     ;TEMP TRIP UNIT OPTIONS
TLTS    SET     11H     ;TEMP LONG TIME SWITCH
TRPID   SET     12H     ;TEMP RATING PLUG ID
TSID    SET     13H     ;TEMP SENSOR ID
TSH     SET     14H     ;TEMPORARY SERIAL DATA HIGH
TCNT    SET     15H     ;TIMER INTERRUPT COUNTER
PTEMP   SET     16H     ;TEMPORARY PACKET NUMBER
TPAK    SET     17H     ;TEMPORARY PACKET NUMBER AFTER DATA READY
COPT    SET     18H     ;COMPARE OPTIONS MEMORY
CLTS    SET     19H     ;COMPARE LTS
CRPID   SET     1AH     ;COMPARE RPID
CSID    SET     1BH     ;COMPARE SID
BCD4    SET     1CH     ;MOST SIG DIGIT
BCD3    SET     1DH
BCD2    SET     1EH
BCD1    SET     1FH     ;LEAST SIG DIGIT

RDY     SET     20H     ;SERIAL DATA READY
BC      SET     21H     ;SERIAL BYTE COUNTER
BC1     SET     22H     ;SERIAL BYTE COUNTER TEST VALUE
THMSN   SET     23H     ;TEMP HIGH BYTE MSN
THLSN   SET     24H     ;TEMP HIGH BYTE LSN
TLMSN   SET     25H     ;TEMP LOW BYTE MSN
TLLSN   SET     26H     ;TEMP LOW BYTE LSN
ZERO    SET     27H     ;ZERO VALUE MEMORY LOCATION
ARH     SET     28H     ;AMPERE RATING HIGH NIBBLE
ARM     SET     29H     ;AMPERE RATING MIDDLE NIBBLE
ARL     SET     2AH     ;AMPERE RATING LOW NIBBLE

CHK     SET     30H     ;CHECKSUM (4 BIT)
NPCT    SET     31H     ;NUMBER OF TEN PERCENT OF BREAKER RATING
ACCTMP          SET     32H     ;INTERRUPT ROUTINE ACCUMULATOR STORAGE
VMSN    SET     33H     ;VERY MSN (FOR 10X CALC)
HMSN    SET     34H     ;HIGH BYTE MSN
HLSN    SET     35H     ;HIGH BYTE LSN
LMSN    SET     36H     ;LOW BYTE MSN
LLSN    SET     37H     ;LOW BYTE LSN

OPT     SET     40H     ;TRIP UNIT OPTIONS
PAK     SET     41H     ;PACKET NUMBER
ONE     SET     42H     ;EIGHT VALUE MEMORY LOCATION
BT5     SET     43H     ;TEMPORARY BINARY VALUE
BT4     SET     44H     ;TEMPORARY BINARY VALUE
BT3     SET     45H     ;TEMPORARY BINARY VALUE
BT2     SET     46H     ;TEMPORARY BINARY VALUE
BT1     SET     47H     ;TEMPORARY BINARY VALUE

LMOD    SET     50H     ;MODULO LOW NIBBLE FOR TIMER
SID     SET     51H     ;SENSOR LOOKUP ID
RPID    SET     52H     ;RATING PLUG LOOKUP ID
TEMP5   SET     53H     ;TEMP NIBBLE
TEMP4   SET     54H     ;TEMP NIBBLE
TEMP3   SET     55H     ;TEMP NIBBLE
TEMP2   SET     56H     ;TEMP NIBBLE
TEMP1   SET     57H     ;TEMP NIBBLE

LTS     SET     60H     ;LONG TIME SWITCH SETTING
LTEMPH          SET     61H     ;LONG TIME SWITCH STORAGE HIGH NIBBLE
LTEMPLSET       62H     ;LONG TIME SWITCH STORAGE LOW NIBBLE

        END
```

I claim:

1. A tripping system for interrupting a three phase current path having a ground path coincident therewith, comprising:

a set of current sensors, each situated adjacent the current path for sensing a respective phase of current therein and each providing a respective current signal therefrom;

summation means, coupled to the set of current sensors, for adding the current signals from the set of current sensors and for producing an output current signal therefrom in the presence of a ground fault;

a set of gain circuits, each responsive to a respective one of the current signals and each having:

a first gain section for amplifying the respective current signal by a first predetermined gain factor, and a second gain section for amplifying the respective current signal by a second predetermined gain factor;

a processor, responsive to the output current signal and the set of gain circuits, for analyzing the three phase current path by selectively receiving the respective current signal from either the first gain section or the second gain section at each gain circuit according to a predetermined resolution criteria, and for engaging the interruption means to interrupt the current path; and data memory means coupled to said processor for storing data representative of tripping characteristics, wherein the processor compares the rectified signal to the data and engages the interruption means if the rectified signal exceeds a threshold data level.

2. A tripping system, according to claim 1, further including first, second and third phase bridge rectifiers, each responsive to the current signal from a respective one of the current sensors, for rectifying the current signals before they are amplified by the set of gain circuits.

* * * * *